(12) United States Patent
Yoshimura et al.

(10) Patent No.: US 9,209,404 B2
(45) Date of Patent: Dec. 8, 2015

(54) MACROMOLECULAR COMPOUND

(75) Inventors: Ken Yoshimura, Tsukuba (JP); Kenichiro Ohya, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 609 days.

(21) Appl. No.: 13/504,091

(22) PCT Filed: Oct. 29, 2010

(86) PCT No.: PCT/JP2010/069257
§ 371 (c)(1), (2), (4) Date: Apr. 25, 2012

(87) PCT Pub. No.: WO2011/052710
PCT Pub. Date: May 5, 2011

(65) Prior Publication Data
US 2012/0217448 A1    Aug. 30, 2012

(30) Foreign Application Priority Data

Oct. 29, 2009 (JP) ................. 2009-248793
Mar. 11, 2010 (JP) ................. 2010-054221
Apr. 28, 2010 (JP) ................. 2010-104113

(51) Int. Cl.
| C09D 11/10 | (2014.01) |
| C08L 65/00 | (2006.01) |
| H01L 51/00 | (2006.01) |
| C08G 61/12 | (2006.01) |
| C08K 3/04 | (2006.01) |
| C09D 165/00 | (2006.01) |
| H01L 51/42 | (2006.01) |

(52) U.S. Cl.
CPC .......... *H01L 51/0036* (2013.01); *C08G 61/122* (2013.01); *C08G 61/123* (2013.01); *C08K 3/04* (2013.01); *C09D 11/10* (2013.01); *C09D 165/00* (2013.01); *C08G 2261/124* (2013.01); *C08G 2261/3246* (2013.01); *C08G 2261/344* (2013.01); *C08G 2261/411* (2013.01); *H01L 51/0043* (2013.01); *H01L 51/4253* (2013.01); *Y02E 10/549* (2013.01)

(58) Field of Classification Search
CPC ............... C08G 61/122; C08G 61/123; C08G 2261/124; C08G 2261/3246; C08G 2261/344; C09D 11/10; H01L 51/0036; H01L 51/0043; C08L 65/00
USPC ................... 252/500, 501.1, 519.4; 528/373
See application file for complete search history.

(56) References Cited

U.S. PATENT DOCUMENTS

| 2007/0014939 A1 | 1/2007 | Gaudiana et al. |
| 2007/0017571 A1 | 1/2007 | Gaudiana et al. |
| 2007/0020526 A1 | 1/2007 | Gaudiana et al. |
| 2007/0131270 A1 | 6/2007 | Gaudiana et al. |
| 2007/0158620 A1 | 7/2007 | Gaudiana et al. |
| 2007/0246094 A1 | 10/2007 | Brabec et al. |
| 2007/0267055 A1 | 11/2007 | Gaudiana et al. |
| 2008/0003422 A1 | 1/2008 | Ueda |
| 2008/0006324 A1 | 1/2008 | Berke et al. |
| 2008/0138651 A1 | 6/2008 | Doi et al. |
| 2009/0065770 A1 | 3/2009 | Miura et al. |
| 2010/0006154 A1 | 1/2010 | Kitazawa et al. |
| 2010/0084000 A1 | 4/2010 | Ueda |
| 2010/0180944 A1 | 7/2010 | Gaudiana et al. |
| 2011/0114183 A1 | 5/2011 | Uetani et al. |

FOREIGN PATENT DOCUMENTS

| CN | 1989169 A | 6/2007 | |
| EP | 1571170 | * 9/2005 | ............. C08G 61/00 |
| EP | 1571170 A1 | 9/2005 | |
| GB | 2432837 A | 6/2007 | |
| JP | 2004-168999 A | 6/2004 | |
| JP | 2006-063334 A | 3/2006 | |
| JP | 2008-109114 A | 5/2008 | |
| JP | 2009-506519 A | 2/2009 | |
| JP | 2009-096950 A | 5/2009 | |
| WO | 2007/105386 A1 | 9/2007 | |
| WO | 2008/044585 A1 | 4/2008 | |

OTHER PUBLICATIONS

Huo, Lijun, et al., "Bandgap and Molecular Level Control of the Low-Bandgap Polymers Based on 3/6-Dithiophen-2-yl-2,5-dihydropyrrolo[3,4-c]pyrrole-1,4-dione toward Highly Efficient Polymer Solar Cells", Macromolecules, 2009, pp. 6564-6571, vol. 42, No. 17.

Xiao, Shengqiang, et al., "Conjugated Polymers of Fused Bithiophenes with Enhanced π-Electron Delocalization for Photovoltaic Applications", Macromolecules, 2008, pp. 5688-5696, vol. 41, No. 15.

Zhou, Qingmei, et al., "Fluorene-based low band-gap copolymers for high performance photovoltaic devices", Applied Physics Letters, Mar. 8, 2004, pp. 1653-1655, vol. 84, No. 10.

Second Office Action issued Feb. 17, 2014 in corresponding Chinese Patent Application No. 201080048297.9 with English translation.

First Office Action issued Jul. 12, 2013 in corresponding Chinese Patent Application No. 201080048297.9 with English translation.

Office Action mailed Jun. 3, 2014 in corresponding Japanese Patent Application No. 2010-243448 with English translation.

Rejection Decision issued Sep. 2, 2014 in corresponding Chinese Patent Application No. 201080048297.9 with English translation.

Office Action issued on Mar. 2, 2015 in corresponding Chinese patent application No. 201080048297.9 with English translation.

Rejection Decision issued Sep. 23, 2015 in Chinese Patent Application No. 201080048297.9 with English translation.

\* cited by examiner

*Primary Examiner* — Brian P Mruk
(74) *Attorney, Agent, or Firm* — Sughrue Mion, PLLC

(57) ABSTRACT

The present invention provides a macromolecular compound by which the short-circuit current density and the photoelectric conversion efficiency are enhanced when the macromolecular compound is used in an organic layer contained in a photovoltaic device. Specifically, the present invention provides a macromolecular compound having a structural unit represented by Formula (1):

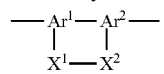

wherein $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —$SO_2$—, —C($R^{50}$)($R^{51}$)—, —Si ($R^3$)($R^4$)—, —N($R^5$)—, —B($R^6$)—, —P($R^7$)—, or —P(=O)($R^8$)—;

wherein the macromolecular compound has a light absorbing terminal wavelength of 700 nm or more.

8 Claims, No Drawings

MACROMOLECULAR COMPOUND

CROSS REFERENCE TO RELATED APPLICATIONS

This application is a National Stage of International Application No. PCT/JP2010/069257 filed Oct. 29, 2010, claiming priority based on Japanese Patent Application No. 2009-248793 filed Oct. 29, 2009, Japanese Patent Application No. 2010-054221 filed Mar. 11, 2010, and Japanese Patent Application No. 2010-104113 filed Apr. 28, 2010, the contents of all of which are incorporated herein by reference in their entirety.

TECHNICAL FIELD

The present invention relates to a macromolecular compound having a specific structure.

BACKGROUND ART

In recent years, for the prevention of the global warming, the reduction of $CO_2$ discharged into the atmosphere is required. For example, the transfer to a solar system using a pn junction-type silicon-based solar cell on the roof of a house and the like is put forward. However, monocrystalline, multicrystalline, and amorphous silicon that are used for the silicon-based solar cell have such a problem that they require conditions of a high temperature and high vacuum in their production process.

By contrast, an organic thin film solar cell that is one example of the photovoltaic device can omit a high temperature and high vacuum process used for a production process of a silicon-based solar cell and has the probability that it can be produced at low cost only by a coating process. Therefore, the organic thin film solar cell has been attracting attention in recent years. As the macromolecular compound used for an organic thin film solar cell, a macromolecular compound containing a repeated unit (A) and a repeated unit (B) is mentioned (Patent Literature 1).

[Chemical Formula 1]

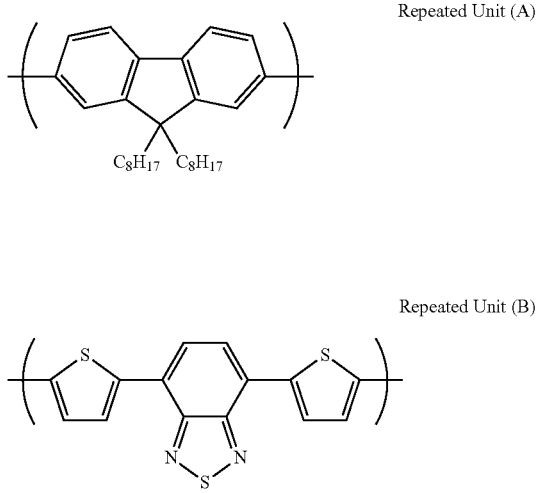

PRIOR ART LITERATURE

Patent Literature

Non-Patent Literature 1: Applied Physics Letters Vol. 84, No. 10, pp. 1653-1655 (2004)

SUMMARY OF THE INVENTION

Problem to be Solved by the Invention

However, a photovoltaic device having an organic layer containing the macromolecular compound does not necessarily have a satisfactory short-circuit current density and a satisfactory photoelectric conversion efficiency.

It is an object of the present invention to provide a macromolecular compound by which the short-circuit current density and the photoelectric conversion efficiency of a photovoltaic device are enhanced when the macromolecular compound is used for an organic layer contained in the photovoltaic device.

Means for Solving Problem

Accordingly, the present invention firstly provides a macromolecular compound having a structural unit represented by Formula (1), and having a light absorbing terminal wavelength of 700 nm or more. The structural unit represented by Formula (1) is a divalent group.

[Chemical Formula 2]

(1)

In the above Formula, $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^8$)—; $R^{50}$, $R^{51}$, $R^3$, $R^4$, $R^5$, $R^6$, $R^7$, and $R^8$ are the same as or different from each other and represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group;

wherein $X^1$ and $X^2$ are not the same as each other, and $X^1$ and $Ar^2$ are bonded with atoms adjacent to each other on a ring that constitutes $Ar^1$, and $X^2$ and $Ar^1$ are bonded with atoms adjacent to each other on a ring that constitutes $Ar^2$.

The present invention secondly provides a thin film comprising the above macromolecular compound.

The present invention thirdly provides a composition comprising the above macromolecular compound, and an electron acceptor compound.

The present invention fourthly provides a thin film comprising the above composition.

The present invention fifthly provides an ink comprising the above composition, and a solvent.

Effects of the Invention

The present invention is extremely useful since the photovoltaic device manufactured by using the macromolecular compound of the present invention has a large short-circuit current density and a large photoelectric conversion efficiency.

EMBODIMENT FOR CARRYING OUT THE INVENTION

Hereinafter, the present invention is described in detail.

The macromolecular compound of the present invention is characterized in that the macromolecular compound has a structural unit represented by Formula (1) and has an absorbing terminal wavelength of 700 nm or more.

In Formula (1), $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^8$)—, wherein $X^1$ and $X^2$ are not the same as each other.

Here, $R^{50}$, $R^{51}$, $R^3$, $R^4$, $R^5$, $R^6$, $R^7$, and $R^8$ are the same as or different from each other and represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group.

Here, the alkyl group may be linear or branched, or a cycloalkyl group. The number of carbon atoms of the alkyl group is generally 1 to 30. Specific examples of the alkyl group may include a chain alkyl group such as a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a 1-methylbutyl group, an n-hexyl group, an isohexyl group, a 3-methylpentyl group, a 2-methylpentyl group, a 1-methylpentyl group, a heptyl group, an octyl group, an isooctyl group, a 2-ethylhexyl group, a 3,7-dimethyloctyl group, a nonyl group, a decyl group, an undecyl group, a dodecyl group, a tetradecyl group, a hexadecyl group, an octadecyl group and an eicosyl group, and a cycloalkyl group such as a cyclopentyl group, a cyclohexyl group and an adamantyl group.

The alkyloxy group may be linear or branched, or a cycloalkyloxy group. The alkyloxy group optionally has a substituent. The number of carbon atoms of the alkyloxy group is generally around 1 to 20. Specific examples of the alkyloxy group may include a methoxy group, an ethoxy group, a propyloxy group, an isopropyloxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group, and a 2-methoxyethyloxy group.

Here, in the present specification, the term "optionally has(having) a substituent" for a certain group means that a part or all of hydrogen atoms that a group has is(are) optionally substituted with a substituent. The term "optionally has a substituent" may be rephrased as "is optionally substituted." For example, a "divalent organic group optionally having a substituent" refers to a divalent organic group in which a part or all of hydrogen atoms in the divalent organic group is(are) optionally substituted with a substituent or substituents, and may be rephrased as a "divalent organic group that is optionally substituted." For example, a "hydrocarbon group optionally having a substituent" refers to a hydrocarbon group in which a part or all of hydrogen atoms in the hydrocarbon group is(are) optionally substituted with a substituent or substituents, and may be rephrased as a "hydrocarbon group that is optionally substituted."

The alkylthio group may be linear or branched, or a cycloalkylthio group. The alkylthio group optionally has a substituent. The number of carbon atoms of the alkylthio group is generally around 1 to 20. Specific examples of the alkylthio group may include a methylthio group, an ethylthio group, a propylthio group, an iso-propylthio group, a butylthio group, an iso-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group, and a trifluoromethylthio group.

For the aryl group, the number of carbon atoms thereof is generally around 6 to 60, and the aryl group optionally has a substituent. Specific examples of the aryl group may include a phenyl group, a C1-C12 alkyloxyphenyl group (C1-C12 alkyl means that the number of carbon atoms of the alkyl is 1 to 12; the C1-C12 alkyl is preferably C1-C8 alkyl, more preferably C1-C6 alkyl; the C1-C8 alkyl means an alkyl having 1 to 8 carbon atoms and the C1-C6 alkyl means an alkyl having 1 to 6 carbon atoms; and specific examples of the C1-C12 alkyl, the C1-C8 alkyl, and the C1-C6 alkyl may include the alkyl groups explained and exemplified above with respect to the alkyl group and the same hereinafter), a C1-C12 alkylphenyl group, a 1-naphthyl group, a 2-naphthyl group, and a pentafluorophenyl group.

For the aryloxy group, the number of carbon atoms thereof is generally around 6 to 60, and the aryloxy group optionally has a substituent on an aromatic ring. Specific examples of the aryloxy group may include a phenoxy group, a C1-C12 alkyloxyphenoxy group, a C1-C12 alkylphenoxy group, a 1-naphthyloxy group, a 2-naphthyloxy group, and a pentafluorophenyloxy group.

For the arylthio group, the number of carbon atoms thereof is generally around 6 to 60, and the arylthio group optionally has a substituent on an aromatic ring. Specific examples of the arylthio group may include a phenylthio group, a C1-C12 alkyloxyphenylthio group, a C1-C12 alkylphenylthio group, a 1-naphthylthio group, a 2-naphthylthio group, and a pentafluorophenylthio group.

For the arylalkyl group, the number of carbon atoms thereof is generally around 7 to 60, and the arylalkyl group optionally has a substituent. Specific examples of the arylalkyl group may include a phenyl C1-C12 alkyl group, a C1-C12 alkyloxyphenyl C1-C12 alkyl group, a C1-C12 alkylphenyl C1-C12 alkyl group, a 1-naphthyl C1-C12 alkyl group, and a 2-naphthyl C1-C12 alkyl group.

For the arylalkyloxy group, the number of carbon atoms thereof is generally around 7 to 60, and the arylalkyloxy group optionally has a substituent. Specific examples of the arylalkyloxy group may include a phenyl C1-C12 alkyloxy group, a C1-C12 alkyloxyphenyl C1-C12 alkyloxy group, a C1-C12 alkylphenyl C1-C12 alkyloxy group, a 1-naphthyl C1-C12 alkyloxy group, and a 2-naphthyl C1-C12 alkyloxy group.

For the arylalkylthio group, the number of carbon atoms thereof is generally around 7 to 60, and the arylalkylthio group optionally has a substituent. Specific examples of the arylalkylthio group may include a phenyl C1-C12 alkylthio group, a C1-C12 alkyloxyphenyl C1-C12 alkylthio group, a C1-C12 alkylphenyl C1-C12 alkylthio group, a 1-naphthyl C1-C12 alkylthio group, and a 2-naphthyl C1-C12 alkylthio group.

For the acyl group, the number of carbon atoms thereof is generally around 2 to 20. Specific examples of the acyl group may include an acetyl group, a propionyl group, a butyryl group, an isobutyryl group, a pivaloyl group, a benzoyl group, a trifluoroacetyl group, and a pentafluorobenzoyl group.

For the acyloxy group, the number of carbon atoms thereof is generally around 2 to 20. Specific examples of the acyloxy group may include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

For the amido group, the number of carbon atoms thereof is generally around 2 to 20. The amido group refers to a group obtained by removing hydrogen atoms bonded to a nitrogen atom from an amide. Specific examples of the amido group may include a formamido group, an acetamido group, a propionamido group, a butyramido group, a benzamido group, a trifluoroacetamido group, a pentafluorobenzamido group, a diformamido group, a diacetamido group, a dipropionamido group, a dibutyramido group, a dibenzamido group, a ditrifluoroacetamido group, and a dipentafluorobenzamido group.

The acid imido group refers to a group obtained by removing hydrogen atoms bonded to a nitrogen atom from an acid imide. Specific examples of the acid imido group may include a succinimido group and a phthalic acid imido group.

For the substituted amino group, the number of carbon atoms thereof is generally around 1 to 40. Specific examples of the substituted amino group may include a methylamino group, a dimethylamino group, an ethylamino group, a diethylamino group, a propylamino group, a dipropylamino group, an isopropylamino group, a diisopropylamino group, a butylamino group, an isobutylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a C1-C12 alkyloxyphenylamino group, a di(C1-C12 alkyloxyphenyl)amino group, a di(C1-C12 alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl C1-C12 alkylamino group, a C1-C12 alkyloxyphenyl C1-C12 alkylamino group, a C1-C12 alkylphenyl C1-C12 alkylamino group, a di(C1-C12 alkyloxyphenyl C1-C12 alkyl)amino group, a di(C1-C12 alkylphenyl C1-C12 alkyl) amino group, a 1-naphthyl C1-C12 alkylamino group, and a 2-naphthyl C1-C12 alkylamino group.

Specific examples of the substituted silyl group may include a trimethylsilyl group, a triethylsilyl group, a tri-n-propylsilyl group, a tri-iso-propylsilyl group, a tert-butyldimethylsilyl group, a triphenylsilyl group, a tri-p-xylylsilyl group, a tribenzylsilyl group, a diphenylmethylsilyl group, a tert-butyldiphenylsilyl group, and a dimethylphenylsilyl group.

Specific examples of the substituted silyloxy group may include a trimethylsilyloxy group, a triethylsilyloxy group, a tri-n-propylsilyloxy group, a tri-iso-propylsilyloxy group, a tert-butyldimethylsilyloxy group, a triphenylsilyloxy group, a tri-p-xylylsilyloxy group, a tribenzylsilyloxy group, a diphenylmethylsilyloxy group, a tert-butyldiphenylsilyloxy group, and a dimethylphenylsilyloxy group.

Specific examples of the substituted silylthio group may include a trimethylsilylthio group, a triethylsilylthio group, a tri-n-propylsilylthio group, a tri-iso-propylsilylthio group, a tert-butyldimethylsilylthio group, a triphenylsilylthio group, a tri-p-xylylsilylthio group, a tribenzylsilylthio group, a diphenylmethylsilylthio group, a tert-butyldiphenylsilylthio group, and a dimethylphenylsilylthio group.

Specific examples of the substituted silylamino group may include a trimethylsilylamino group, a triethylsilylamino group, a tri-n-propylsilylamino group, a tri-iso-propylsilylamino group, a tert-butyldimethylsilylamino group, a triphenylsilylamino group, a tri-p-xylylsilylamino group, a tribenzylsilylamino group, a diphenylmethylsilylamino group, a tert-butyldiphenylsilylamino group, a dimethylphenylsilylamino group, a di(trimethylsilyl)amino group, a di(triethylsilyl)amino group, a di(tri-n-propylsilyl)amino group, a di(tri-iso-propylsilyl)amino group, a di(tert-butyldimethylsilyl)amino group, a di(triphenylsilyl)amino group, a di(tri-p-xylylsilyl)amino group, a di(tribenzylsilyl)amino group, a di(diphenylmethylsilyl)amino group, a di(tert-butyldiphenylsilyl)amino group, and a di(dimethylphenylsilyl)amino group.

Examples of the monovalent heterocyclic group may include groups obtained by removing one hydrogen atom from a heterocyclic compound such as furan, thiophene, pyrrole, pyrroline, pyrrolidine, oxazole, isoxazole, thiazole, isothiazole, imidazole, imidazoline, imidazolidine, pyrazole, pyrazoline, pyrazolidine, furazan, triazole, thiadiazole, oxadiazole, tetrazole, pyran, pyridine, piperidine, thiopyran, pyridazine, pyrimidine, pyrazine, piperazine, morpholine, triazine, benzofuran, isobenzofuran, benzothiophene, indole, isoindole, indolizine, indoline, isoindoline, chromene, chromane, isochromane, benzopyran, quinoline, isoquinoline, quinolizine, benzimidazole, benzothiazole, indazole, naphthyridine, quinoxaline, quinazoline, quinazolidine, cinnoline, phthalazine, purine, pteridine, carbazole, xanthene, phenanthridine, acridine, β-carboline, perimidine, phenanthroline, thianthrene, phenoxathiin, phenoxazine, phenothiazine, and phenazine. As the monovalent heterocyclic group, a monovalent aromatic heterocyclic group is preferred.

The heterocyclyloxy groups may include groups represented by Formula (11) in which an oxygen atom is bonded to the above monovalent heterocyclic group. The heterocyclylthio groups may include groups represented by Formula (12) in which a sulfur atom is bonded to the above monovalent heterocyclic group.

[Chemical Formula 3]

$$Ar^7-O-\quad(11)$$

$$Ar^7-S-\quad(12)$$

In Formula (11) and Formula (12), $Ar^7$ represents a monovalent heterocyclic group.

For the heterocyclyloxy group, the number of carbon atoms thereof is generally around 4 to 60. Specific examples of the heterocyclyloxy group may include a thienyloxy group, a C1-C12 alkylthienyloxy group, a pyrrolyloxy group, a furyloxy group, a pyridyloxy group, a C1-C12 alkylpyridyloxy group, an imidazolyloxy group, a pyrazolyloxy group, a triazolyloxy group, an oxazolyloxy group, a thiazoloxy group, and a thiadiazoleoxy group.

For the heterocyclylthio group, the number of carbon atoms thereof is generally around 4 to 60. Specific examples of the heterocyclylthio group may include a thienylmercapto group, a C1-C12 alkylthienylmercapto group, a pyrrolylmercapto group, a furylmercapto group, a pyridylmercapto group, a C1-C12 alkylpyridylmercapto group, an imidazolylmercapto group, a pyrazolylmercapto group, a triazolylmercapto group, an oxazolylmercapto group, a thiazolemercapto group, and a thiadiazolemercapto group.

For the arylalkenyl group, the number of carbon atoms thereof is generally 7 to 20, and specific examples of the arylalkenyl group may include a styryl group.

For the arylalkynyl group, the number of carbon atoms thereof is generally 7 to 20, and specific examples of the arylalkynyl group may include a phenylacetylenyl group.

Specific examples of the halogen atom may include a fluorine atom, a chlorine atom, a bromine atom, and an iodine atom.

From the viewpoint of the easiness of the production of the monomer, $X^1$ is preferably —O—, —S—, or —C(=O)—, more preferably —O— or —C(=O)—, further preferably —O—.

In Formula (1), $Ar^1$ and $Ar^2$ each independently represent a trivalent aromatic hydrocarbon group or a trivalent heterocyclic group. As illustrated in Formula (1), $Ar^1$ has three bonding sites and one of them is a bonding site with $Ar^2$, another is a bonding site with $X^1$, and the other is a bonding site with a hydrogen atom or other atoms. These other atoms may be a part of atoms constituting another constitutional unit. As illustrated in Formula (1), $Ar^2$ has three bonding sites and one of them is a bonding site with $Ar^1$, another is a bonding site with $X^2$, and the other is a bonding site with a hydrogen atom or other atoms. These other atoms may be a part of atoms constituting another constitutional unit.

Here, the trivalent aromatic hydrocarbon group refers to an atomic group obtained by removing three hydrogen atoms from a benzene ring or a condensed ring, and the number of carbon atoms thereof is generally 6 to 60, preferably 6 to 20. Examples thereof may include the trivalent groups below. Here, the trivalent aromatic hydrocarbon group optionally has a substituent on the aromatic hydrocarbon group and examples of the substituent may include a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, an arylalkenyl group, an arylalkynyl group, a carboxyl group, and a cyano group. In the number of carbon atoms of the trivalent aromatic hydrocarbon group, the number of carbon atoms of the substituent is not included. When the trivalent aromatic hydrocarbon group has a substituent and the substituent contains carbon atoms, the number of carbon atoms of the substituent is preferably 1 to 40, more preferably 1 to 20, further preferably 1 to 6.

[Chemical Formula 4]

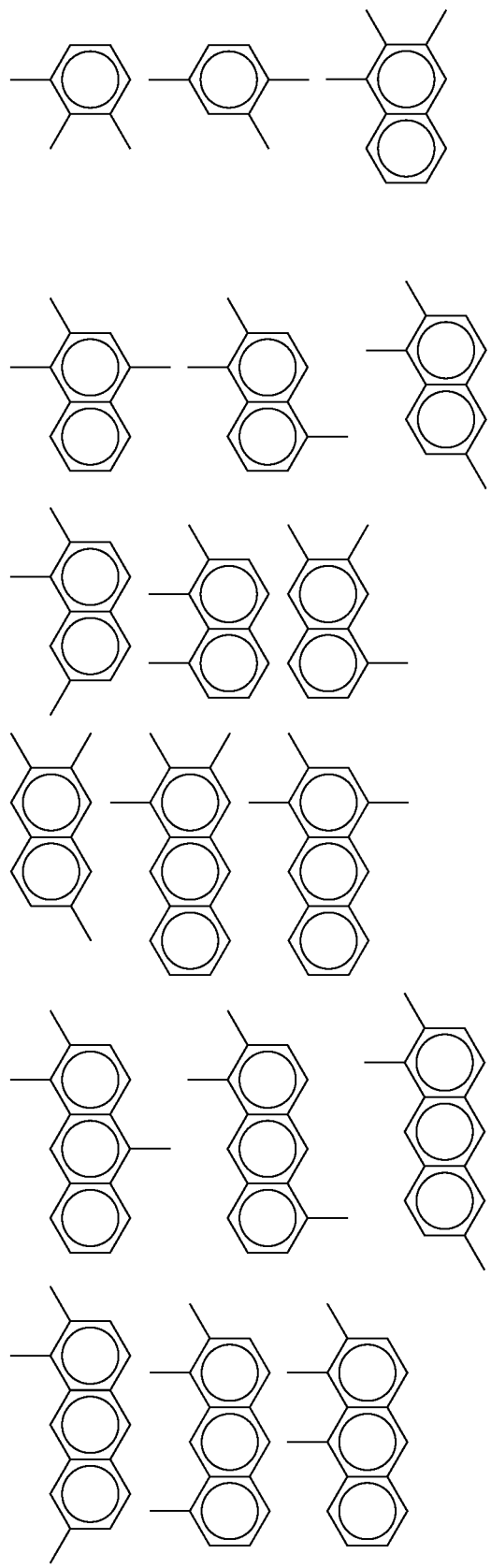

-continued

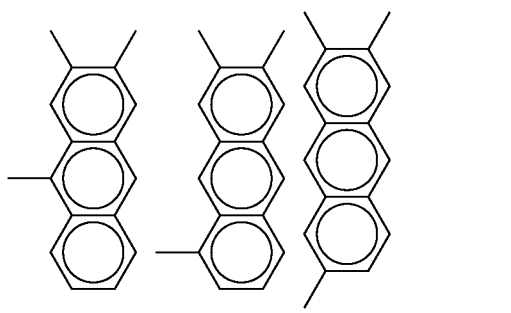

[Chemical Formula 5]

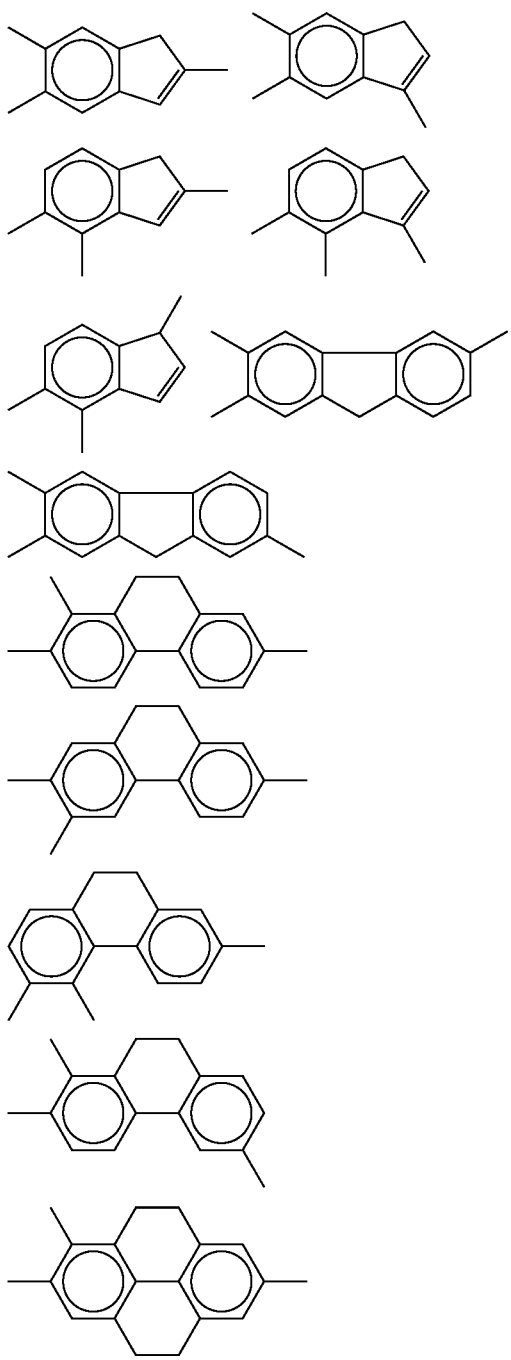

-continued

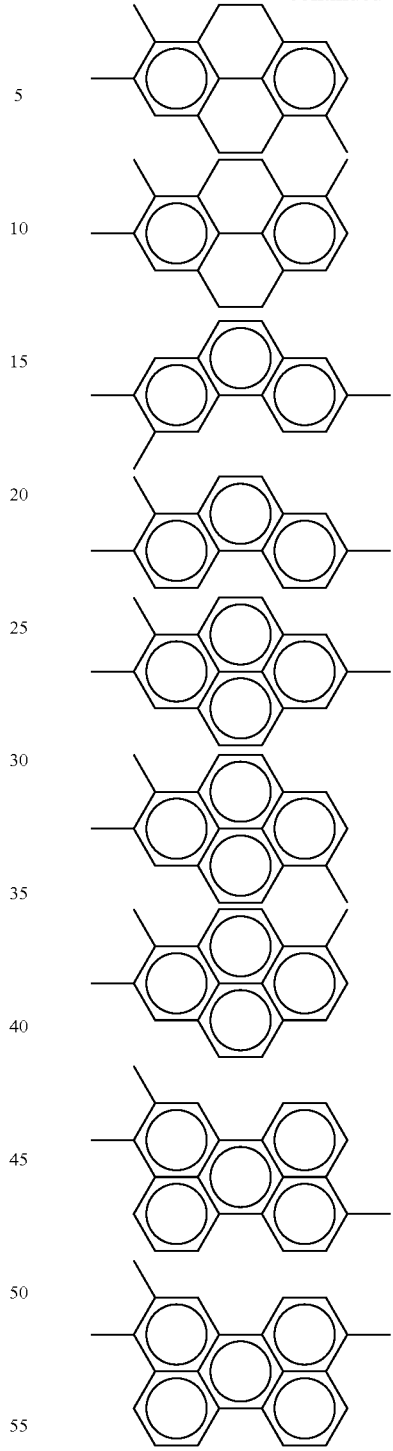

The trivalent heterocyclic group refers to an atomic group obtained by removing three hydrogen atoms from a heterocyclic compound, and the number of carbon atoms of the trivalent heterocyclic group is generally 4 to 60, preferably 4 to 20. The trivalent heterocyclic group optionally has a substituent on the heterocyclic group and the number of carbon atoms of the substituent is not included in the number of carbon atoms of the heterocyclic group. As the trivalent heterocyclic group, a trivalent aromatic heterocyclic group is preferred. When the trivalent heterocyclic group has a substituent and the substituent contains carbon atoms, the number of carbon atoms of the substituent is preferably 1 to 40, more preferably 1 to 20, further preferably 1 to 6.

Here, the heterocyclic compound refers to an organic compound containing, in the ring thereof, as an element constituting the ring, not only a carbon atom, but also a heteroatom such as an oxygen atom, a sulfur atom, a nitrogen atom, a phosphorus atom, and a boron atom, among organic compounds having a cyclic structure.

Examples of the trivalent heterocyclic group may include groups below.

[Chemical Formula 6]

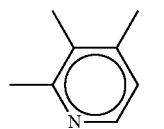 (201)

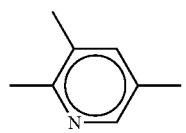 (202)

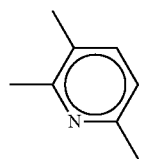 (203)

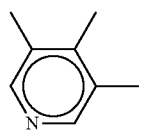 (204)

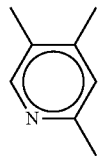 (205)

[Chemical Formula 7]

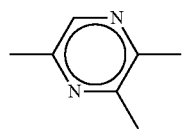 (206)

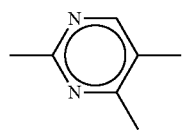 (207)

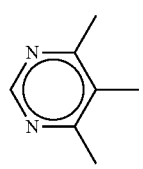 (208)

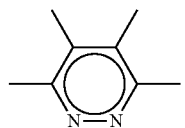 (209)

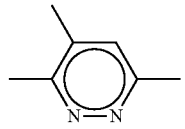 (210)

[Chemical Formula 8]

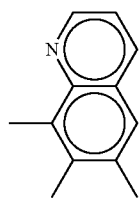 (211)

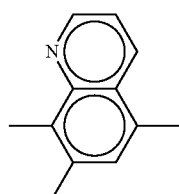 (212)

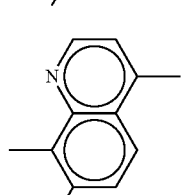 (213)

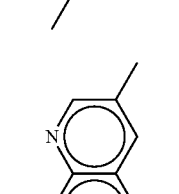 (214)

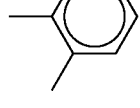 (215)

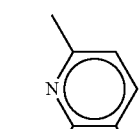 (216)

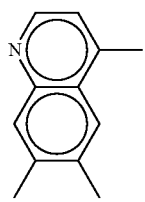 (217)
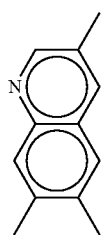 (218)
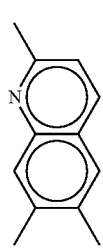 (219)
[Chemical Formula 9]
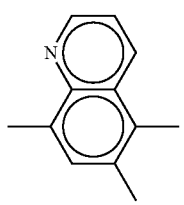 (220)
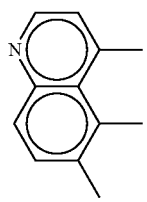 (221)
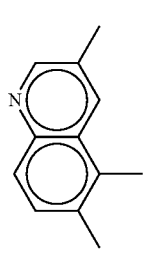 (222)
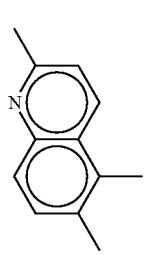 (223)
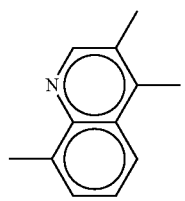 (224)
(225)
(226)
(227)
(228)
(229)
(230)

-continued
(231)
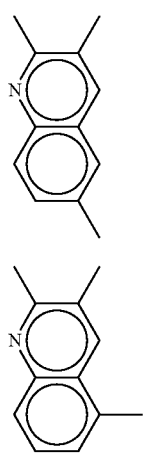
[Chemical Formula 10]
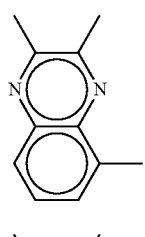
(232)
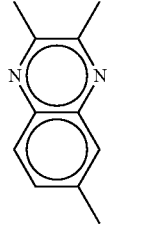
(233)
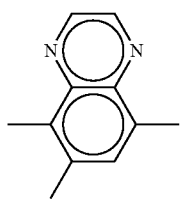
(234)
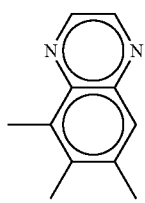
(235)
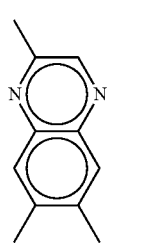
(236)
[Chemical Formula 11]
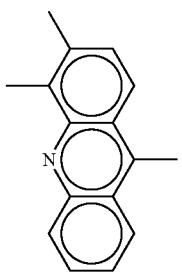
(237)
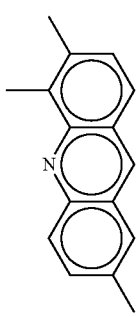
(238)
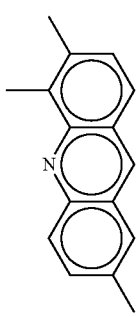
(239)
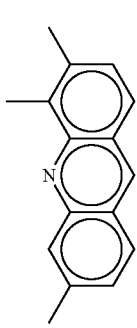
(240)
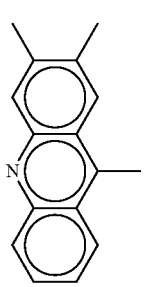
(241)
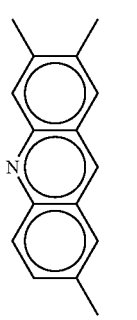
(242)

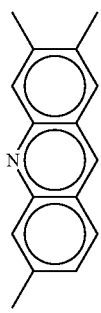
[Chemical Formula 12]
(244)
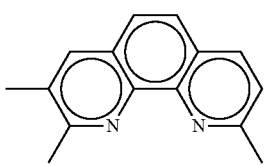
(245)
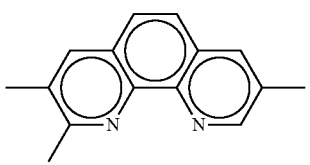
(246)
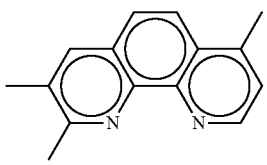
(247)
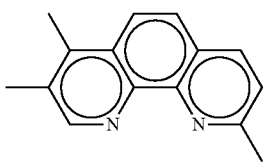
(248)
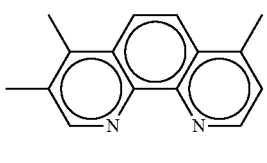
(249)
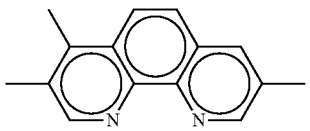
[Chemical Formula 13]
(250)
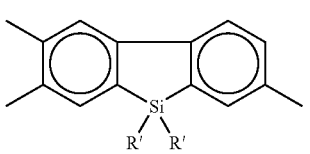
(251)
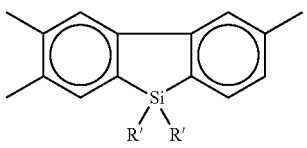
(252)
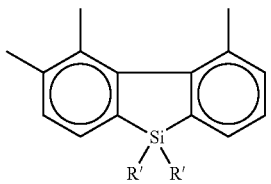
(253)
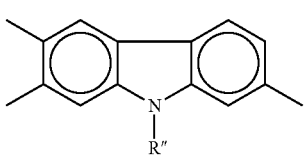
(254)
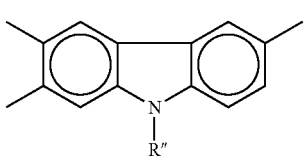
(255)
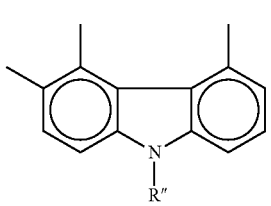
(256)
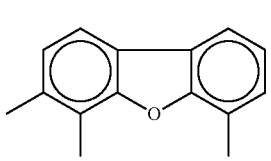
(257)
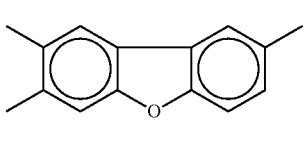
(258)
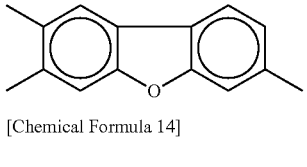
[Chemical Formula 14]
(259)
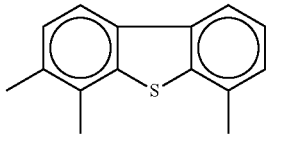
(260)
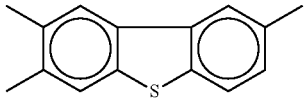

-continued
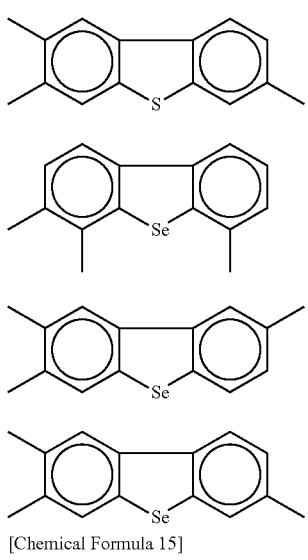
[Chemical Formula 15]
(261)
(262)
(263)
(264)
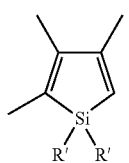
(265)
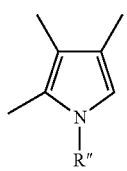
(266)
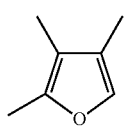
(267)
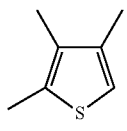
(268)
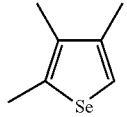
(269)
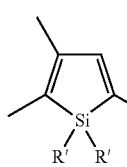
(270)
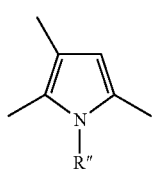
(271)
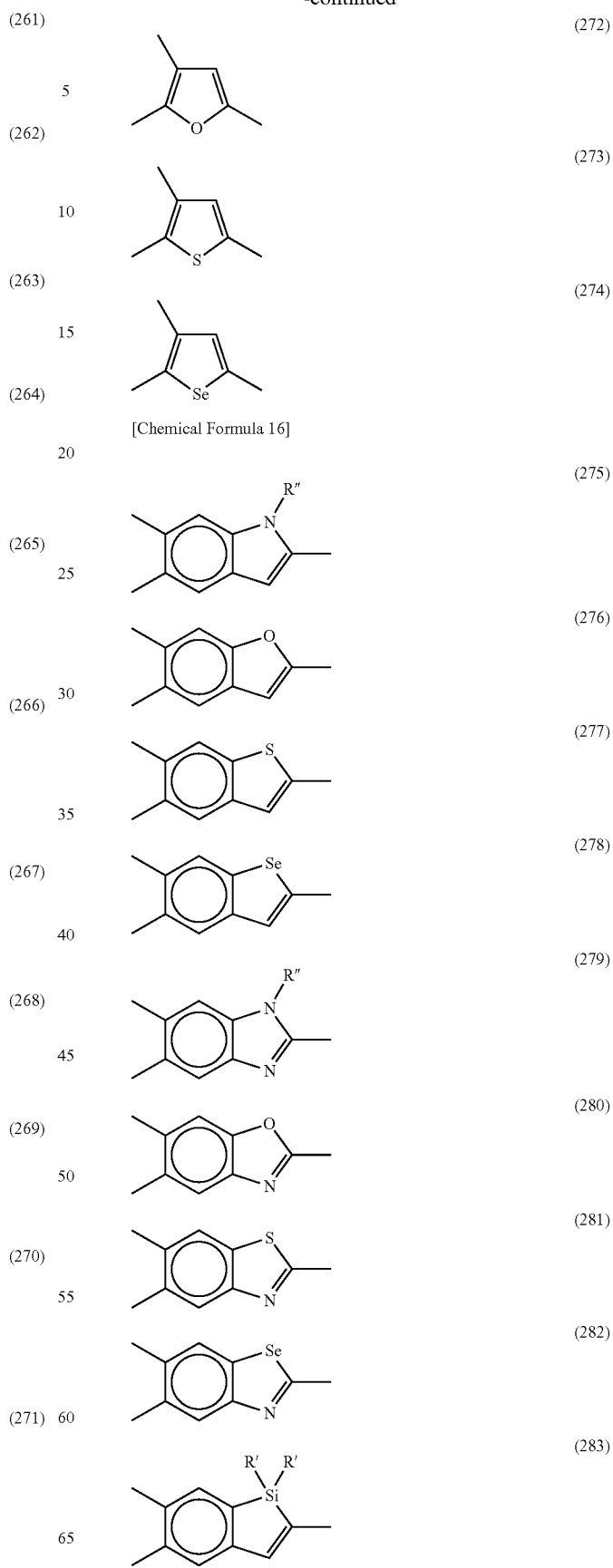
(272)
(273)
(274)
[Chemical Formula 16]
(275)
(276)
(277)
(278)
(279)
(280)
(281)
(282)
(283)

-continued (284)
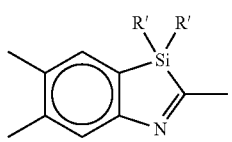

In Formula (201) to Formula (284), R's are the same as or different from each other and represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, a substituted amino group, an acyloxy group, an amido group, an arylalkenyl group, an arylalkynyl group, a monovalent heterocyclic group, or a cyano group.

R"s are the same as or different from each other and represent a hydrogen atom, an alkyl group, an aryl group, an arylalkyl group, a substituted silyl group, an acyl group, or a monovalent heterocyclic group.

The definition and specific examples of the halogen atom, the alkyl group, the alkyloxy group, the alkylthio group, the aryl group, the aryloxy group, the arylthio group, the arylalkyl group, the arylalkyloxy group, the arylalkylthio group, the substituted amino group, the acyloxy group, the amido group, the arylalkenyl group, the arylalkynyl group, or the monovalent heterocyclic group represented by R' are the same as the definition and specific examples of the halogen atom, the alkyl group, the alkyloxy group, the alkylthio group, the aryl group, the aryloxy group, the arylthio group, the arylalkyl group, the arylalkyloxy group, the arylalkylthio group, the substituted amino group, the acyloxy group, the amido group, the arylalkenyl group, the arylalkynyl group, or the monovalent heterocyclic group represented by the above $R^3$.

The definition and specific examples of the alkyl group, the aryl group, the arylalkyl group, the substituted silyl group, or the monovalent heterocyclic group represented by R" are the same as the definition and specific examples of the alkyl group, the aryl group, the arylalkyl group, the substituted silyl group, or the monovalent heterocyclic group represented by the above $R^3$.

In Formula (1), $X^1$ and $Ar^2$ are bonded with atoms (positions) adjacent to each other on a ring that constitutes $Ar^1$, and $X^2$ and $Ar^1$ are bonded with atoms (positions) adjacent to each other on a ring that constitutes $Ar^2$.

The structural unit represented by Formula (1) is preferably a structural unit (divalent group) represented by Formula (301) to Formula (464) or a structural unit having further a substituent on an aromatic hydrocarbon ring or a heterocycle contained in the above structural unit, more preferably a structural unit in which $Ar^1$ and $Ar^2$ are a trivalent heterocyclic group.

[Chemical Formula 17]

(301)
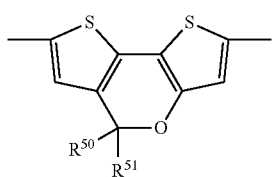

-continued (302)

(303)

(304)

(305)

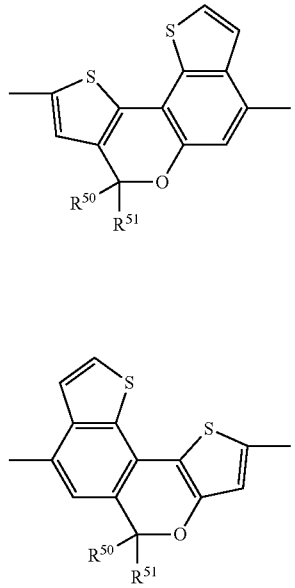

(306)
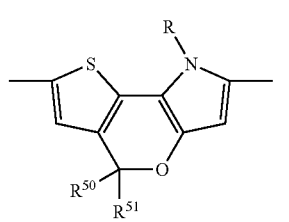

(307)
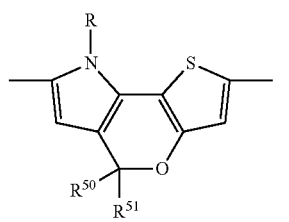

(308)
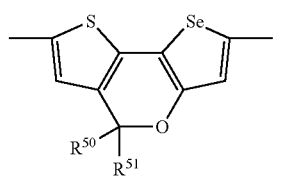

(309) 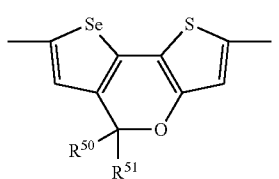
(310) 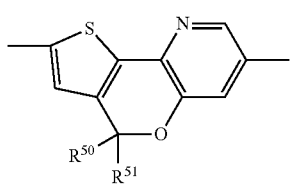
(311) 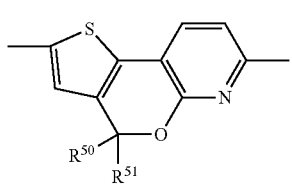
(312) 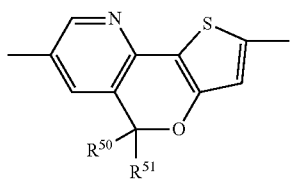
(313) 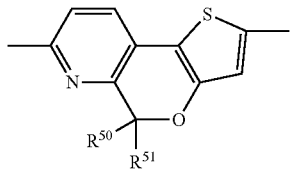
(314) 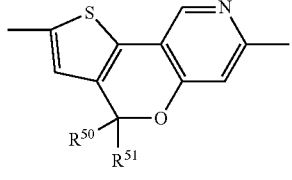
(315) 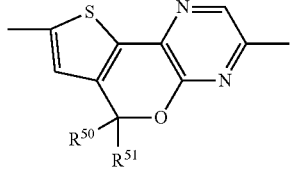
(316) 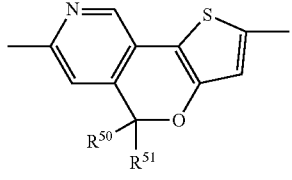
(317) 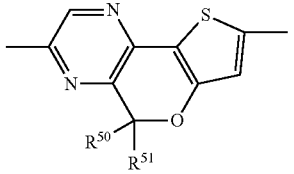
[Chemical Formula 18]
(318) 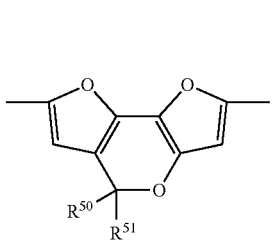
(319) 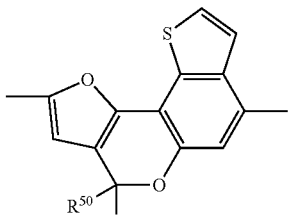
(320) 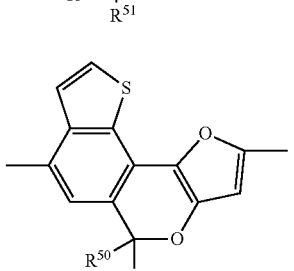
(321) 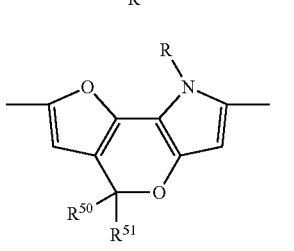
(322) 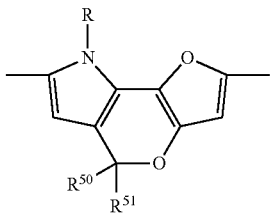
(323) 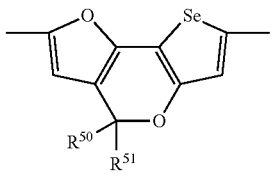

(324)
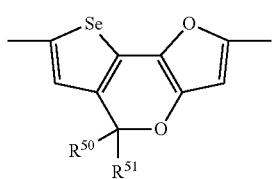
(325)
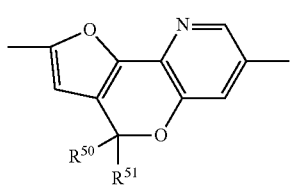
(326)
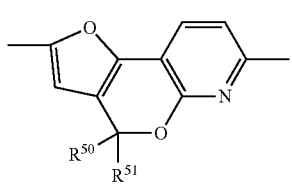
(327)
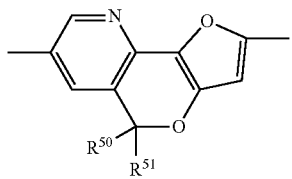
(328)
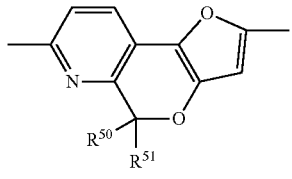
(329)
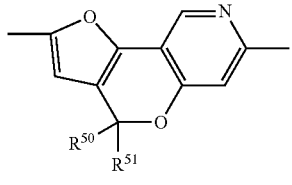
(330)
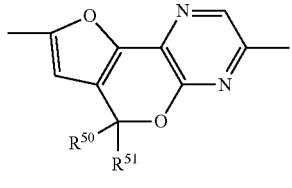
(331)
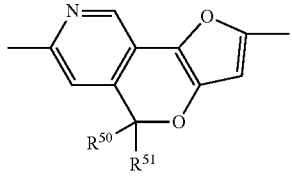
(332)
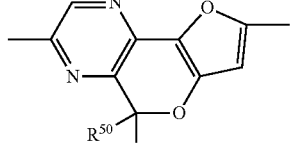
[Chemical Formula 19]
(333)
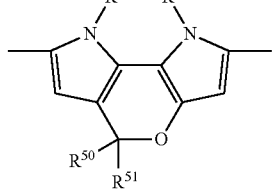
(334)
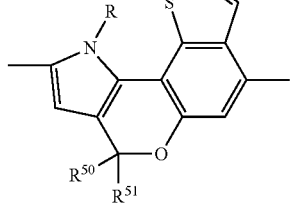
(335)
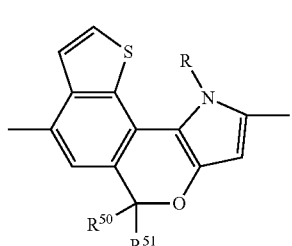
(336)
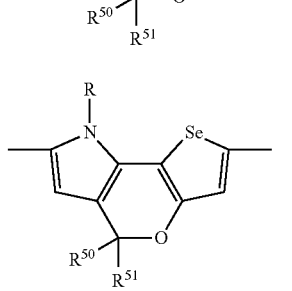
(337)
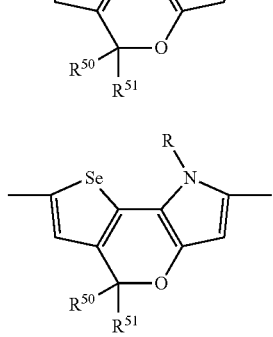
(338)
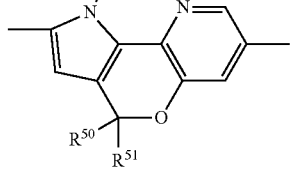

(339) 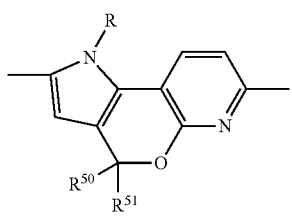
(340) 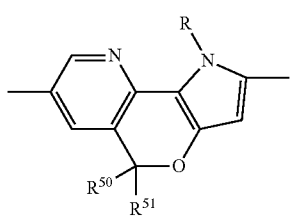
(341) 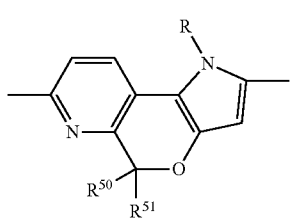
(342) 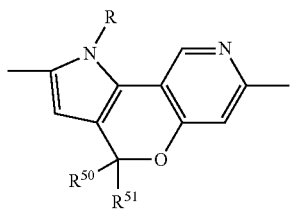
(343) 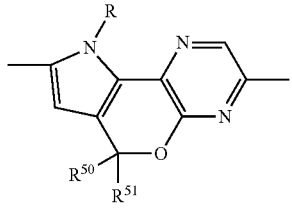
(344) 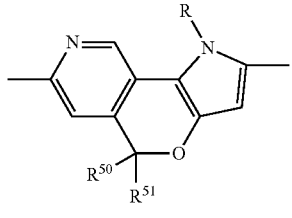
(345) 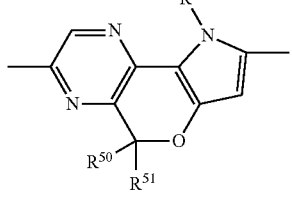
[Chemical Formula 20]
(346) 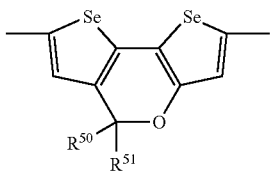
(347) 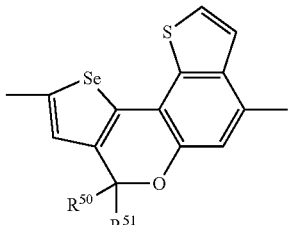
(348) 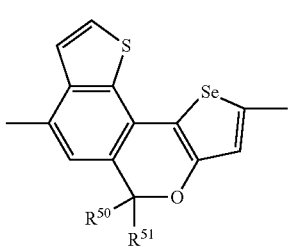
(349) 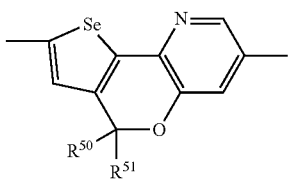
(350) 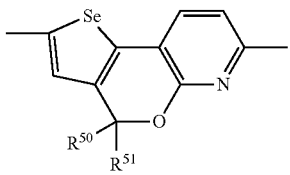
(351) 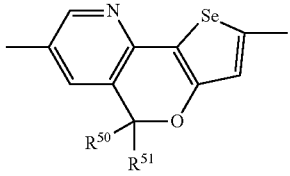
(352) 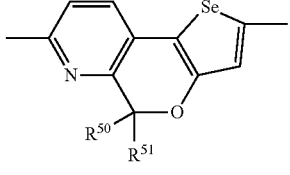
(353) 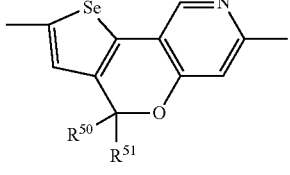

(354)
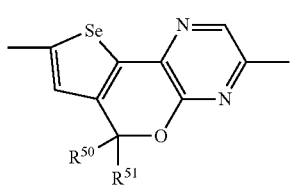
(355)
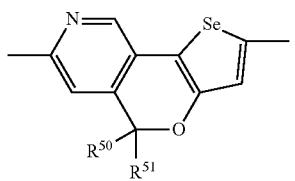
(356)
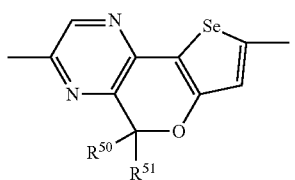
[Chemical Formula 21]
(357)
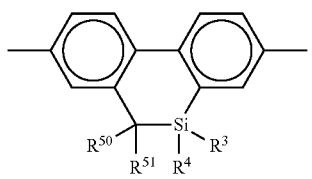
(358)
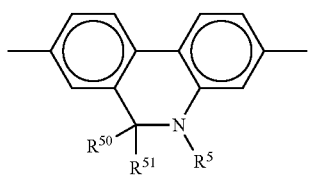
(359)
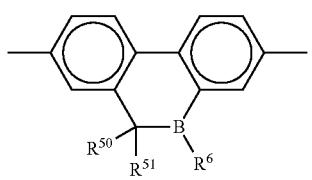
(360)
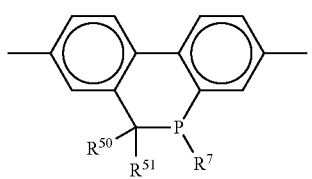
(361)
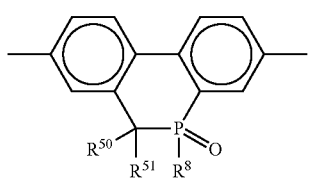
(362)
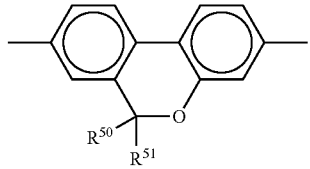
(363)
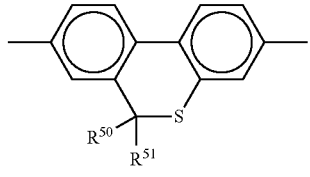
(364)
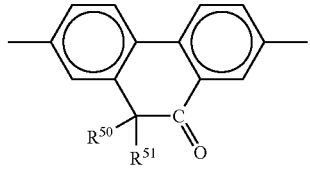
(365)
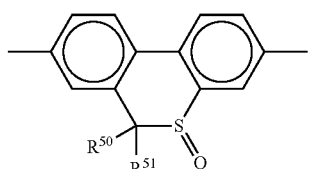
(366)
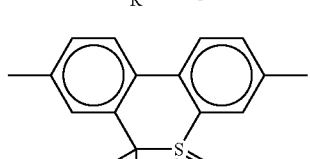
(367)
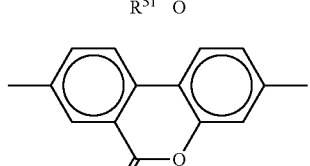
(368)
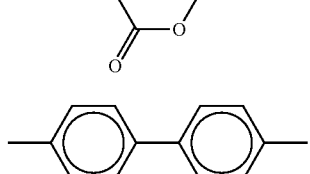
(369)
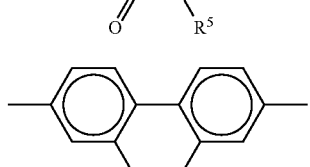
(370)
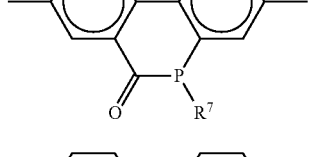

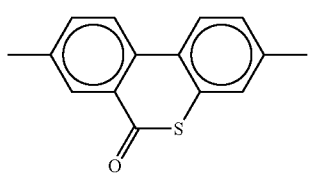
(371)
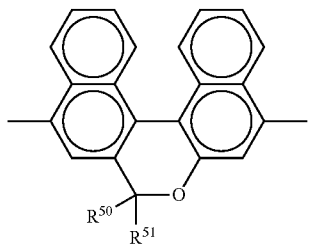
(372)
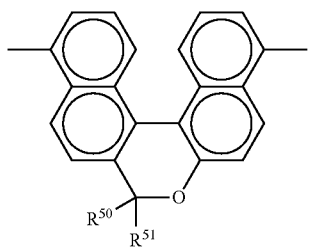
(373)
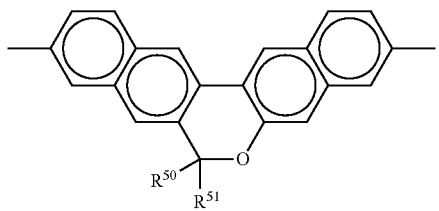
(374)
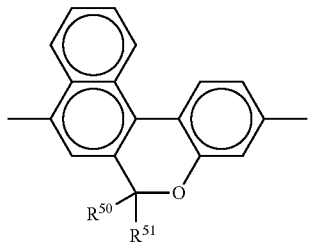
(375)
[Chemical Formula 22]
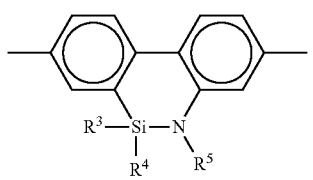
(376)
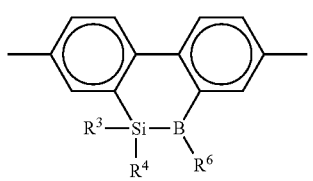
(377)
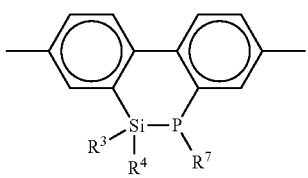
(378)
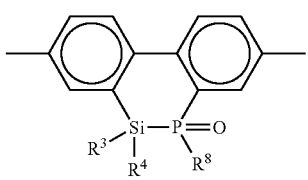
(379)
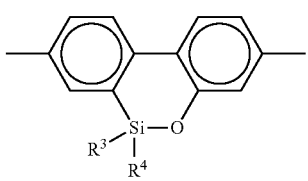
(380)
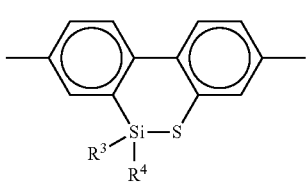
(381)
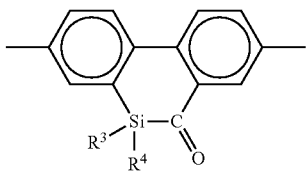
(382)
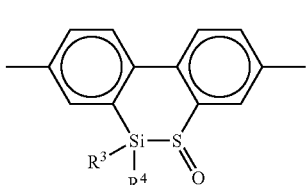
(383)
(384)
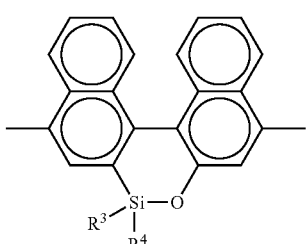
(385)

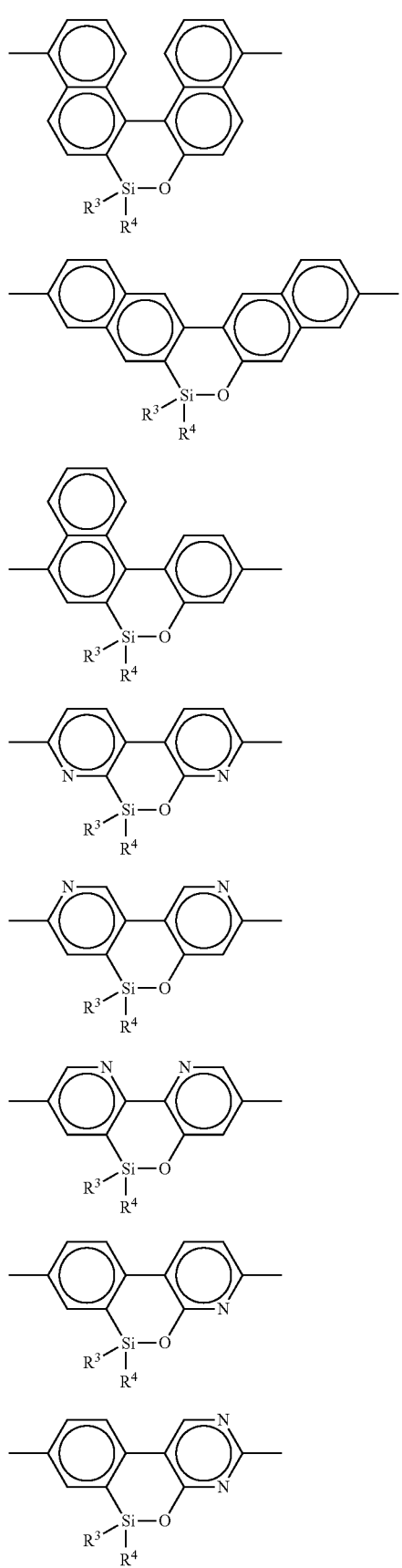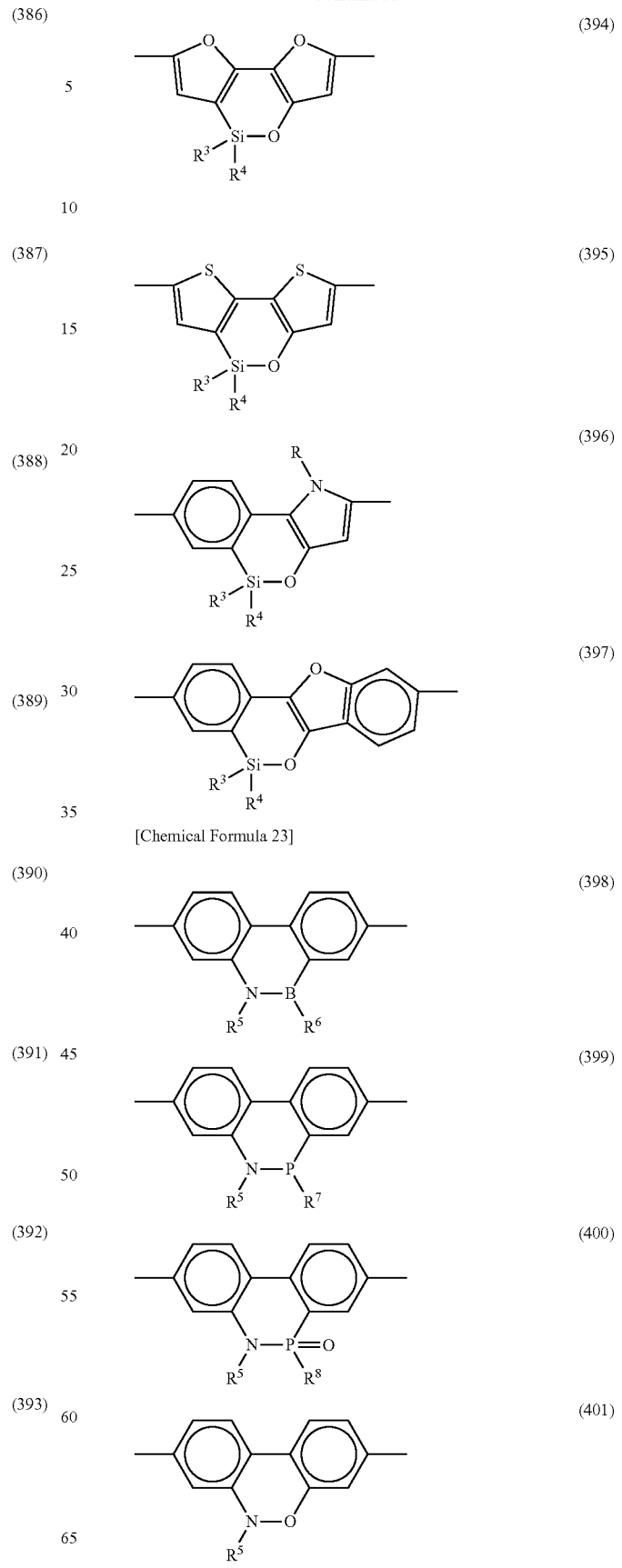

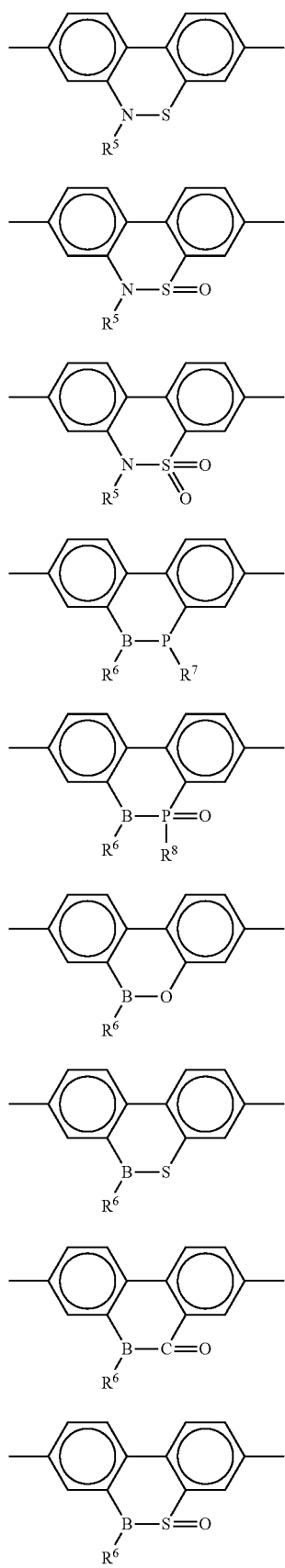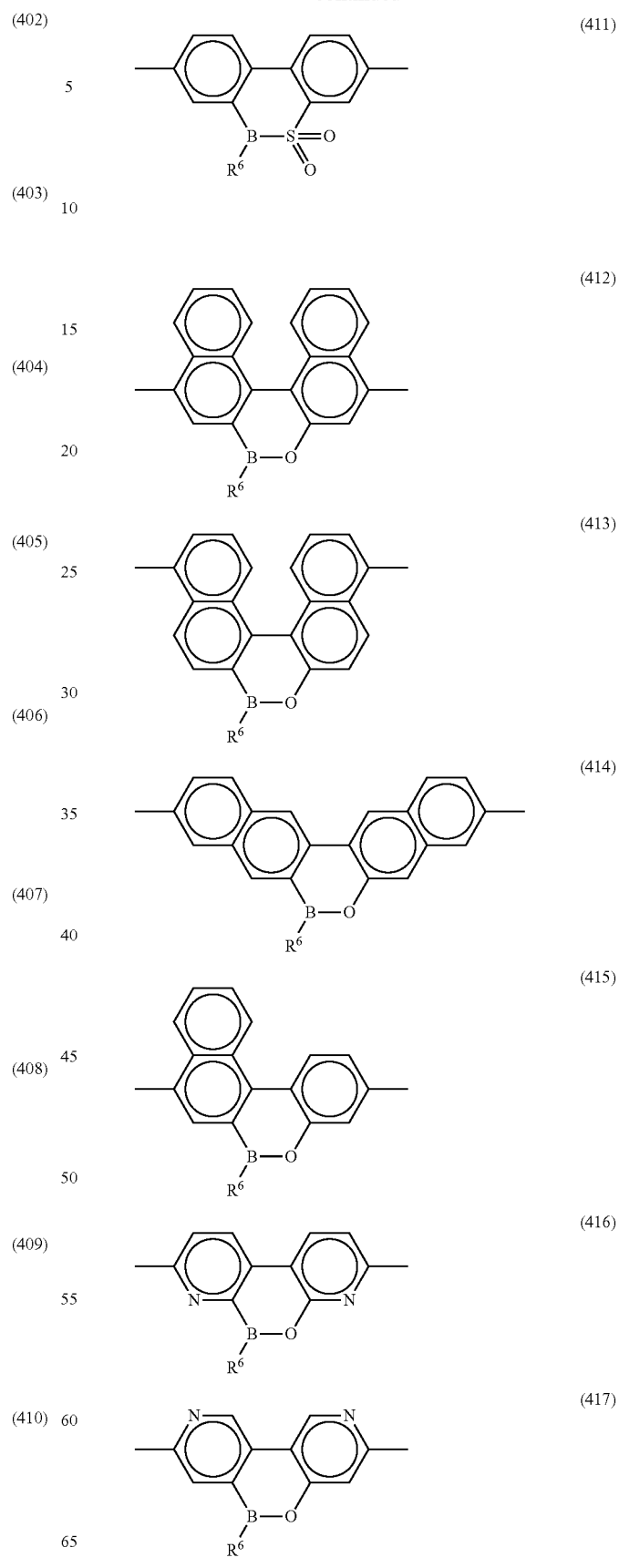

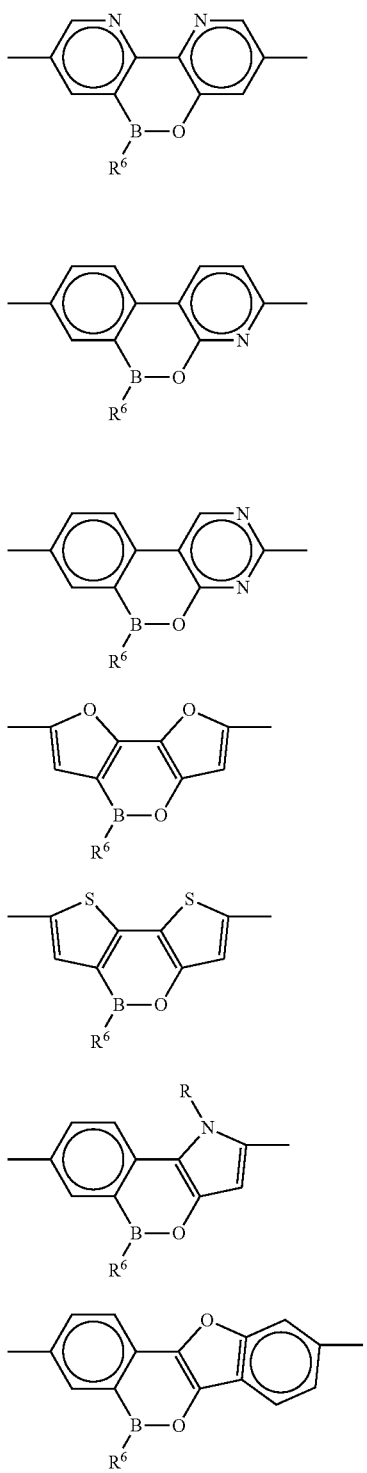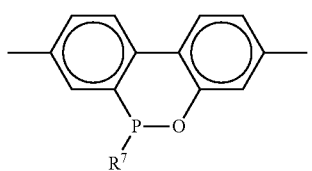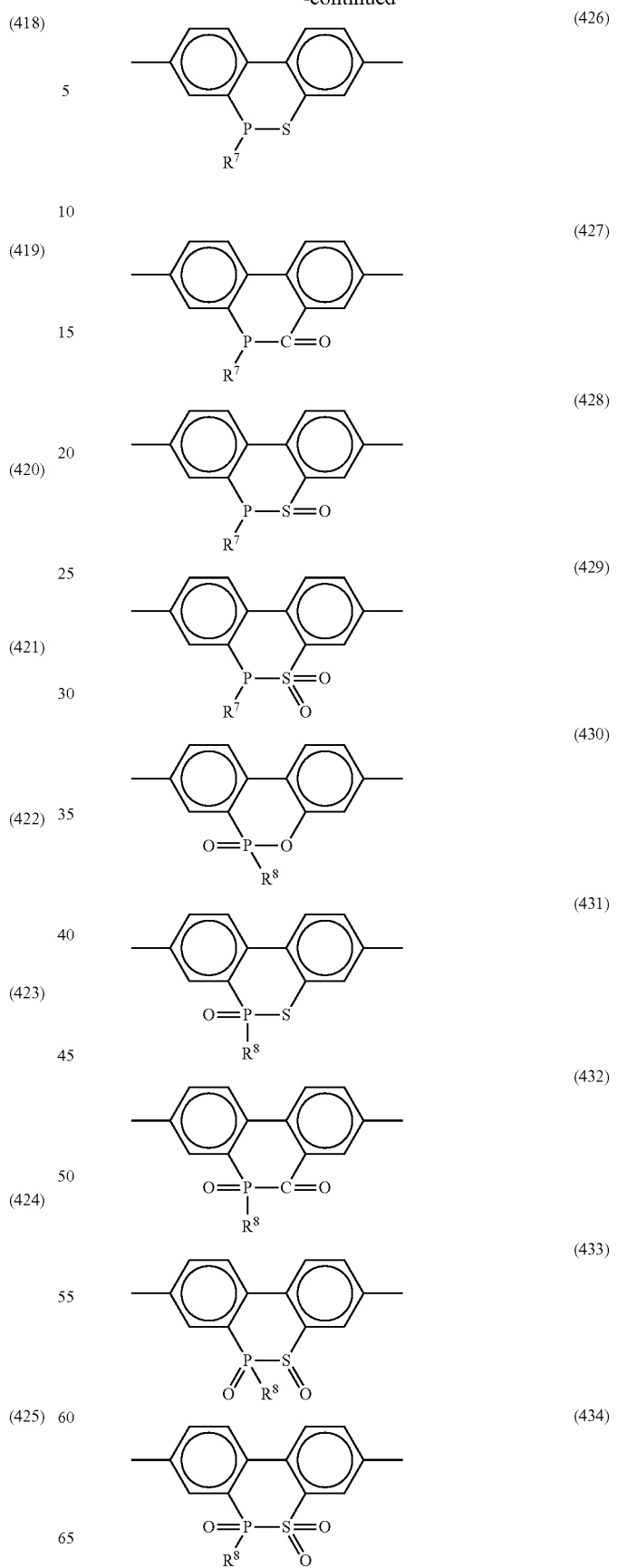

[Chemical Formula 25]
(435)
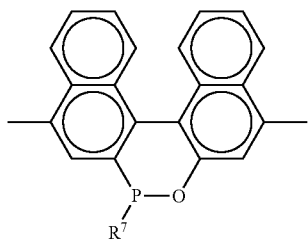
(436)
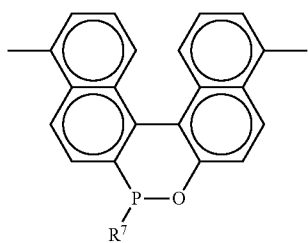
(437)
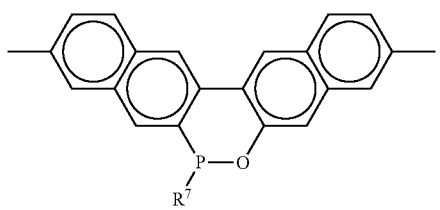
(438)
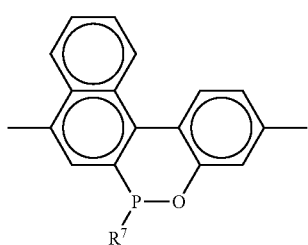
(439)
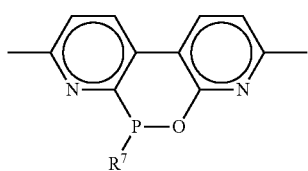
(440)
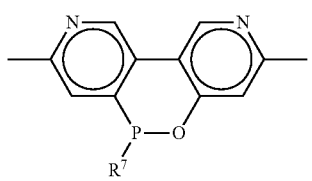
(441)
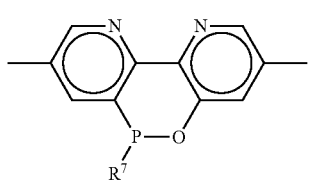
(442)
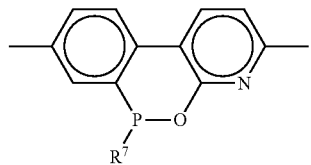
(443)
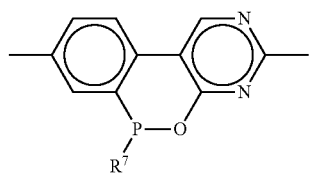
(444)
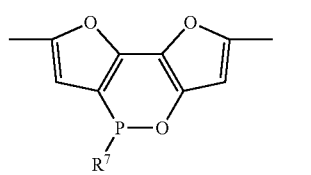
(445)
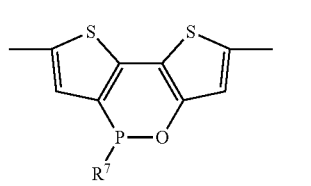
(446)
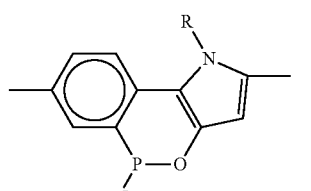
(447)
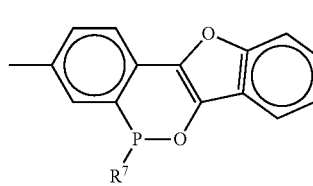
[Chemical Formula 26]
(448)
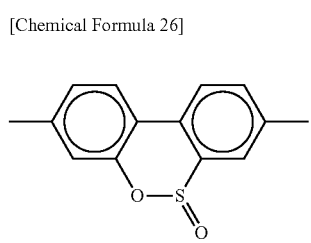
(449)
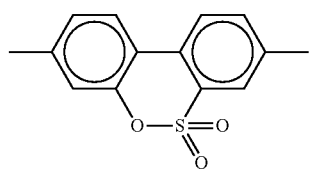

(450) 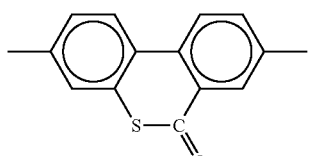

(451) 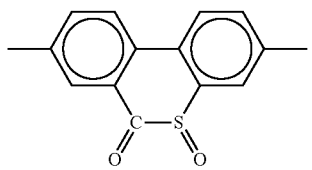

(452) 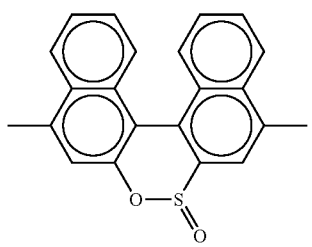

(453) 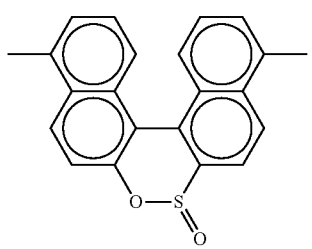

(454) 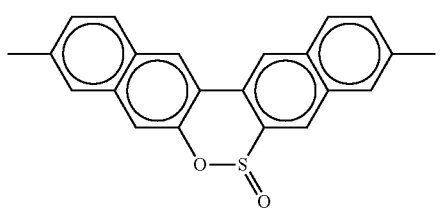

(455) 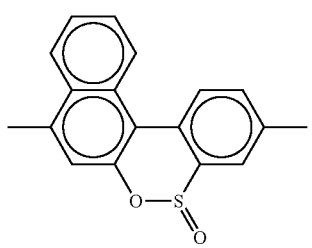

(456) 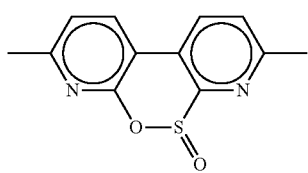

(457) 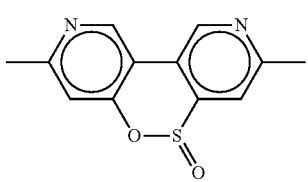

(458) 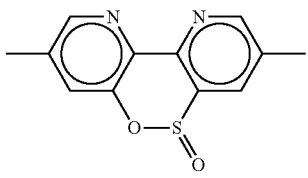

(459) 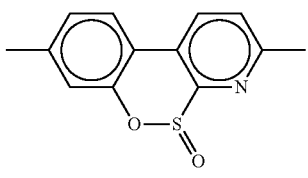

(460) 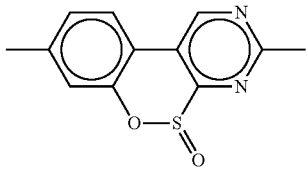

(461) 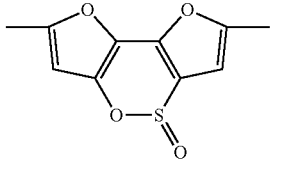

(462) 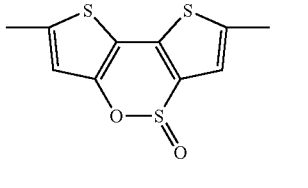

(463)

(464)

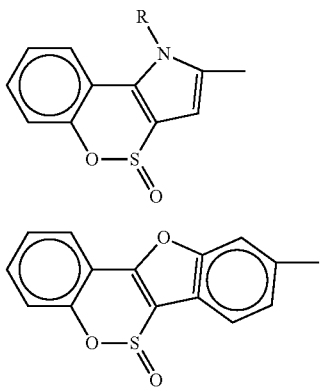

In Formula (301) to Formula (464), $R^{50}$, $R^{51}$, $R^3$, $R^4$, $R^5$, $R^6$, $R^7$, and $R^8$ represent the same as defined above.

In the formulae, R represents a hydrogen atom or a substituent. A plurality of Rs may be the same as or different from each other and may be bonded with each other to form a ring. When R is a substituent, examples of the substituent may include a group selected from an alkyl group, an alkyloxy group, an alkylthio group, an aryl group, an aryloxy group, an arylthio group, an arylalkyl group, an arylalkyloxy group, an arylalkylthio group, an arylalkenyl group, an arylalkynyl group, an amino group, a substituted amino group, a silyl group, a substituted silyl group, a halogen atom, an acyl group, an acyloxy group, an amido group, a monovalent heterocyclic group, a carboxyl group, a substituted carboxyl group, a nitro group, and a cyano group. A hydrogen atom contained in these substituents is optionally substituted with a fluorine atom.

The definition and specific examples of the alkyl group, the alkyloxy group, the alkylthio group, the aryl group, the aryloxy group, the arylthio group, the arylalkyl group, the arylalkyloxy group, the arylalkylthio group, the arylalkenyl group, the arylalkynyl group, the substituted amino group, the substituted silyl group, the halogen atom, the acyl group, the acyloxy group, the amido group, or the monovalent heterocyclic group represented by R are the same as the definition and specific examples of the alkyl group, the alkyloxy group, the alkylthio group, the aryl group, the aryloxy group, the arylthio group, the arylalkyl group, the arylalkyloxy group, the arylalkylthio group, the arylalkenyl group, the arylalkynyl group, the substituted amino group, the substituted silyl group, the halogen atom, the acyl group, the acyloxy group, the amido group, or the monovalent heterocyclic group represented by the above $R^3$.

The substituted carboxyl group which generally has 2 to 20 carbon atoms is used and examples thereof may include a group having a methyl ester structure, a group having an ethyl ester structure, and a group having a butyl ester structure.

The macromolecular compound of the present invention preferably has a structural unit different from the structural unit represented by Formula (1), in addition to the structural unit represented by Formula (1). In this case, it is preferred that the structural unit represented by Formula (1) and the structural unit different from the structural unit represented by Formula (1) form a conjugation. The conjugation in the present invention refers to a state in which: unsaturated bonds and single bonds are chained in the order of an unsaturated bond—a single bond—an unsaturated bond; two π bonds of π orbitals are adjacent to each other and π electrons of π bonds are arranged in parallel; and π electrons are not localized over a double bond or a triple bond, but spread over an adjacent single bond to be delocalized. Here, the unsaturated bond refers to a double bond or a triple bond.

The structural units different from the structural unit represented by Formula (1) may include an arylene group and a divalent heterocyclic group.

Here, the arylene group is an atomic group obtained by removing two hydrogen atoms from an aromatic hydrocarbon, and the number of carbon atoms constituting a ring of the arylene group is generally around 6 to 60, preferably 6 to 20. Here, the aromatic hydrocarbons include an aromatic hydrocarbon having a benzene ring, an aromatic hydrocarbon having a condensed ring, and an aromatic hydrocarbon in which two or more of independent benzene rings or condensed rings are bonded with each other either directly or through a group such as vinylene.

Examples of the arylene group may include a phenylene group (for example, Formulae 1 to 3 below), a naphthalene-diyl group (Formulae 4 to 13 below), an anthracene-diyl group (Formulae 14 to 19 below), a biphenyl-diyl group (Formulae 20 to 25 below), a terphenyl-diyl group (Formulae 26 to 28 below), and a condensed ring compound group (Formulae 29 to 38 below). The condensed ring compound group may include a fluorene-diyl group (Formulae 36 to 38 below).

The divalent heterocyclic group refers to an atomic group obtained by removing two hydrogen atoms from a heterocyclic compound and has the number of carbon atoms constituting a ring of the divalent heterocyclic group is generally around 3 to 60.

Here, the heterocyclic compound refers to an organic compound containing, in the ring thereof, as an element constituting the ring, not only a carbon atom, but also a heteroatom such as an oxygen atom, a sulfur atom, a nitrogen atom, a phosphorus atom, a boron atom, and an arsenic atom, among organic compounds having a cyclic structure.

Examples of the divalent heterocyclic group may include the followings:

a divalent heterocyclic group containing nitrogen as the heteroatom, including a pyridine-diyl group (Formulae 39 to 44 below), a diazaphenylene group (Formulae 45 to 48 below), a quinoline-diyl group (Formulae 49 to 63 below), a quinoxaline-diyl group (Formulae 64 to 68 below), an acridine-diyl group (Formulae 69 to 72 below), a bipyridyl-diyl group (Formulae 73 to 75 below), and a phenanthroline-diyl group (Formulae 76 to 78 below);

a group containing a silicon atom, a nitrogen atom, a sulfur atom, a selenium atom or the like as the heteroatom and having a fluorene structure (Formulae 79 to 93 below);

a 5-membered heterocyclic group containing a silicon atom, a nitrogen atom, a sulfur atom, a selenium atom, or the like as the heteroatom (Formulae 94 to 98 below);

a 5-membered ring-condensed heterocyclic group containing a silicon atom, a nitrogen atom, a sulfur atom, a selenium atom or the like as the heteroatom (Formulae 99 to 110 below);

a 5-membered heterocyclic group containing a silicon atom, a nitrogen atom, a sulfur atom, a selenium atom or the like as the heteroatom that is bonded with other 5-membered heterocycles at an α-position of the heteroatom to form a dimer or an oligomer (Formulae 111 and 112 below);

a 5-membered heterocyclic group containing a silicon atom, a nitrogen atom, a sulfur atom, a selenium atom or the like as the heteroatom that is bonded with phenyl groups at an α-position of the heteroatom (Formulae 113 to 119 below);

a group in which a 5-membered ring-condensed heterocyclic group containing an oxygen atom, a nitrogen atom, a sulfur atom, a selenium atom or the like as the heteroatom is substituted with a phenyl group, a furyl group, or a thienyl group (Formulae 120 to 127 below);

a group in which 5-membered heterocycles containing a nitrogen atom, a sulfur atom, a selenium atom or the like as the heteroatom are condensed with each other (Formulae 128 to 139 below); and a group in which benzene rings and thiophene rings are condensed with each other (Formulae 140 to 143 below); and the like.

[Chemical Formula 27]

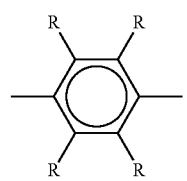

1

-continued
2
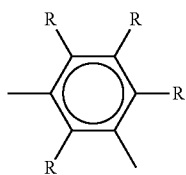
3
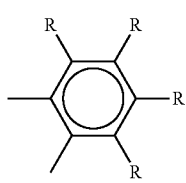
4
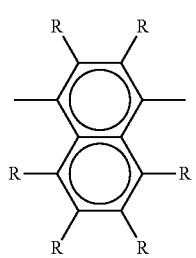
5
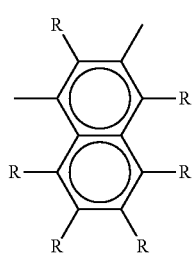
6
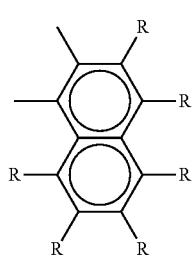
7
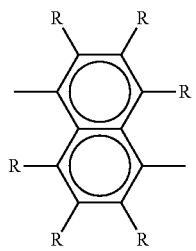
-continued
[Chemical Formula 28]
8
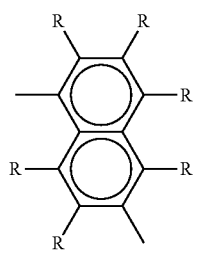
9
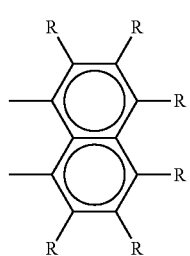
10
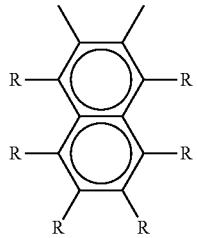
11
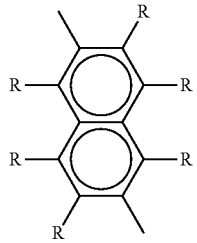
12
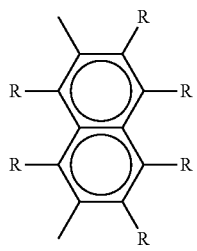
13

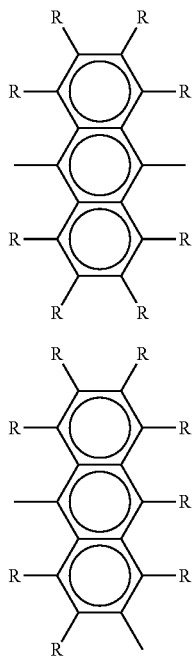
[Chemical Formula 29]
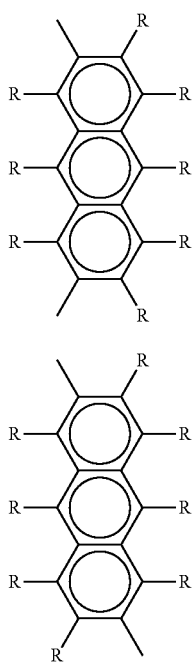
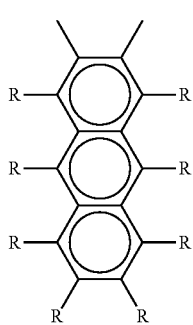
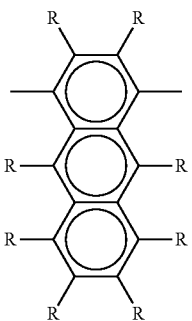
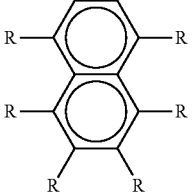
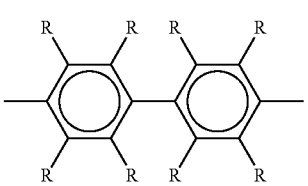
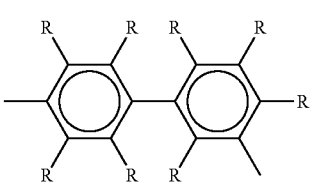
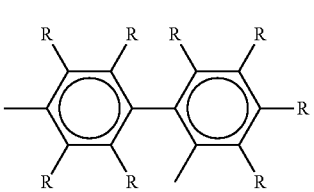
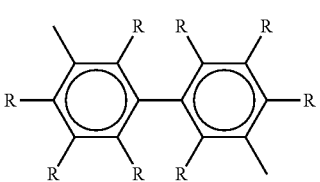
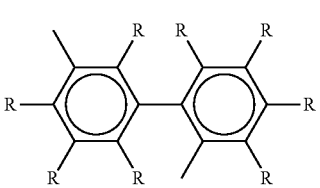
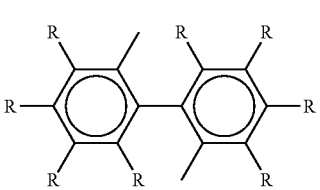
[Chemical Formula 30]
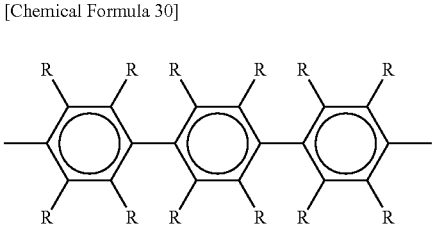

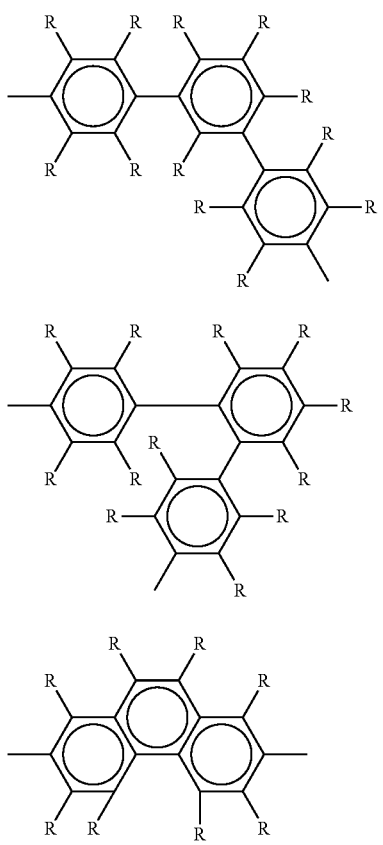
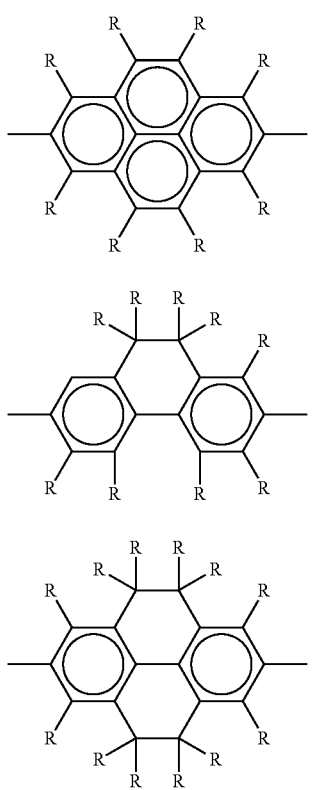
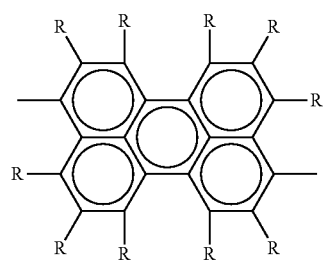
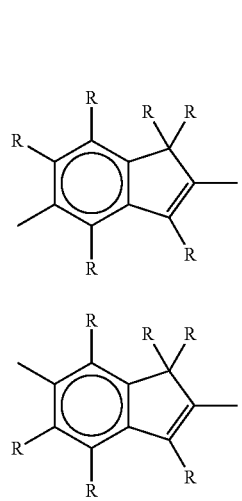
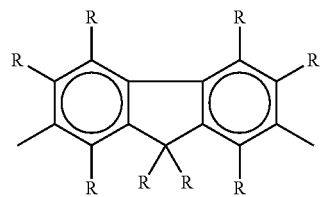
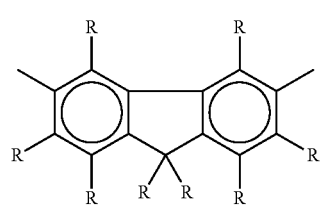
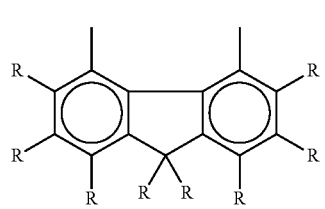
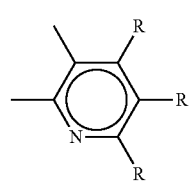
[Chemical Formula 31]
[Chemical Formula 32]

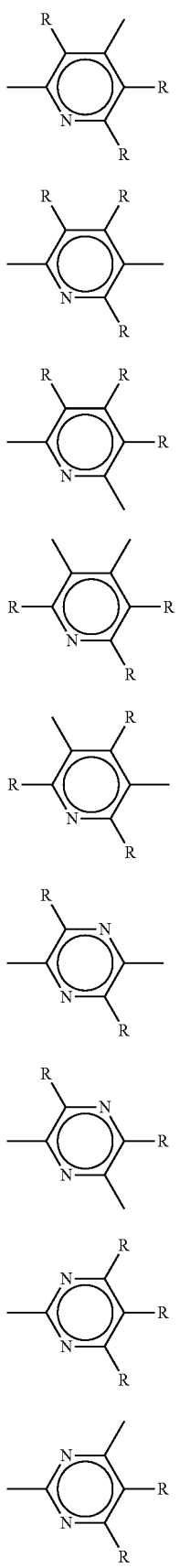
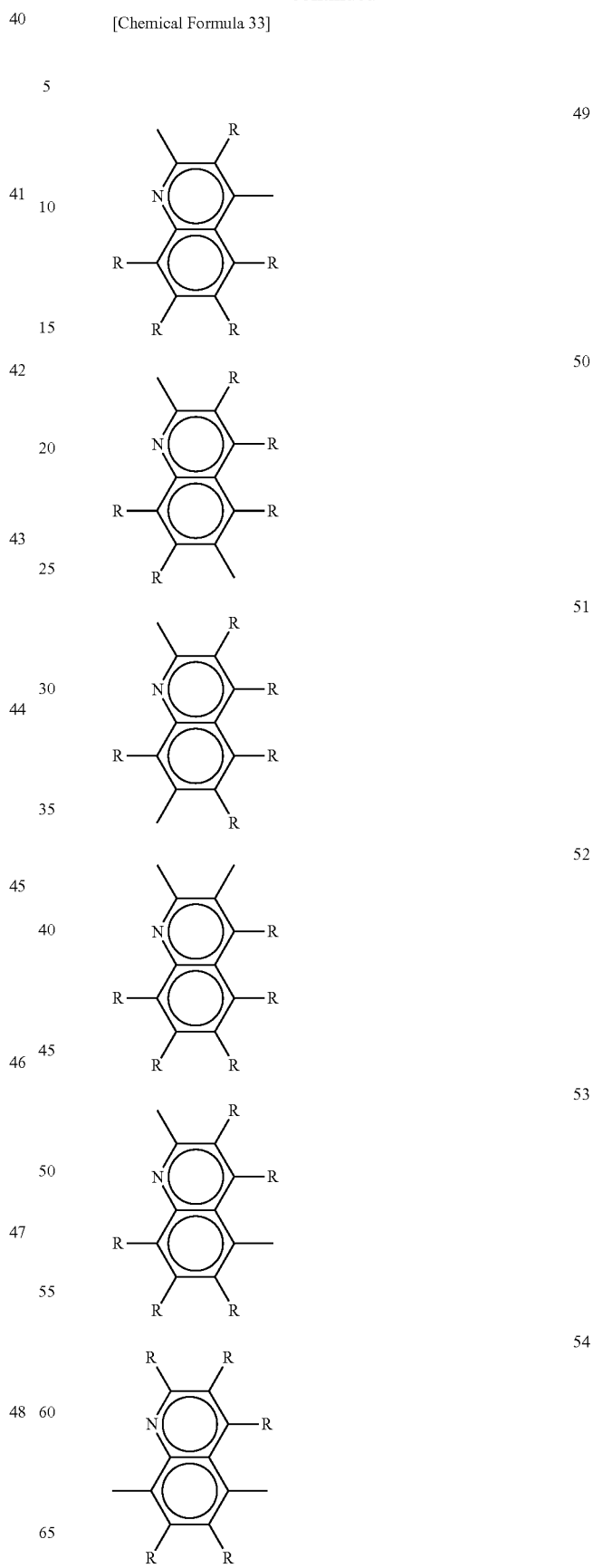

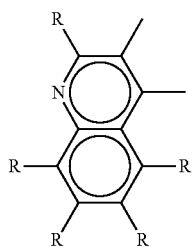
55
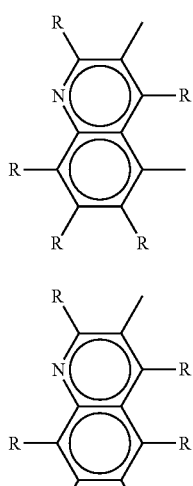
56
57
58
[Chemical Formula 34]
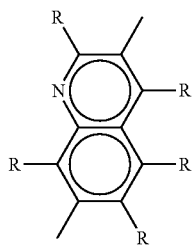
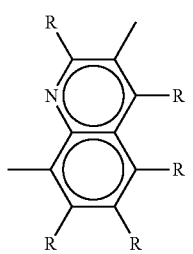
59
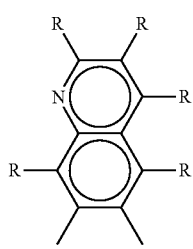
60
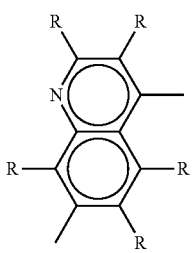
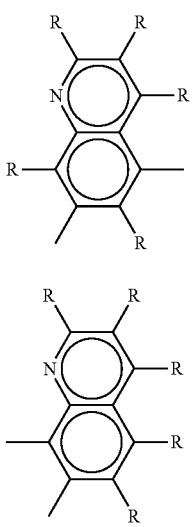
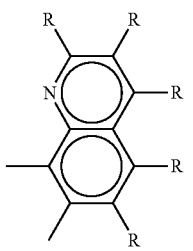
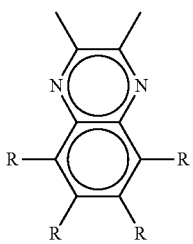
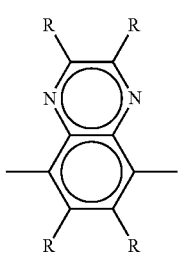
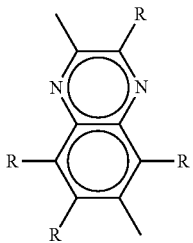
61
62
63
64
65
66

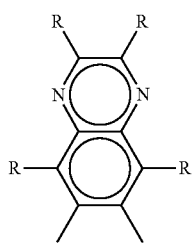
67
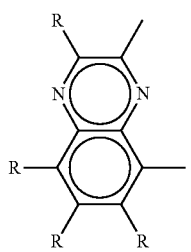
68
[Chemical Formula 35]
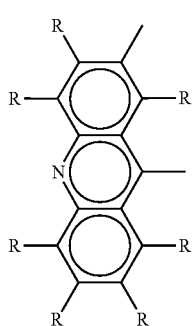
69
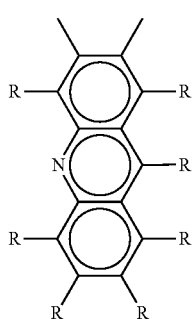
70
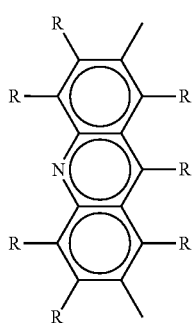
71
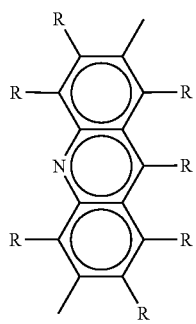
72
[Chemical Formula 36]
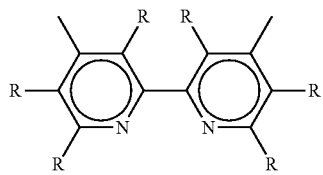
73
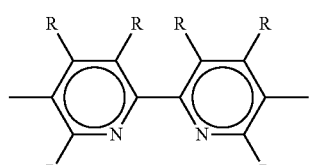
74
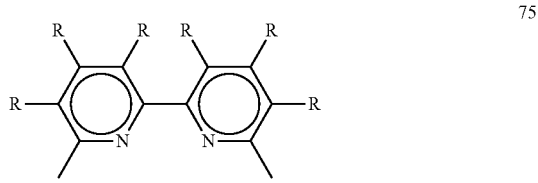
75
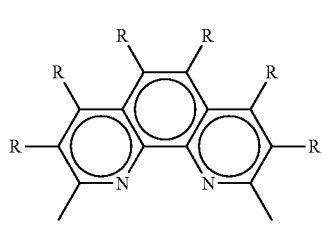
76
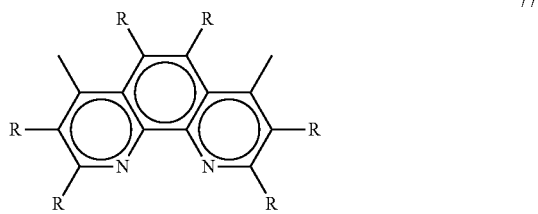
77
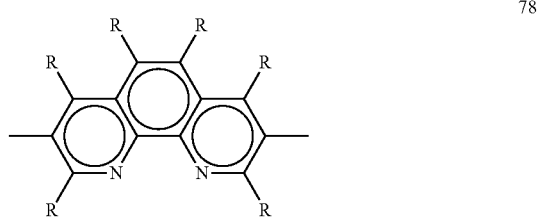
78

[Chemical Formula 37]
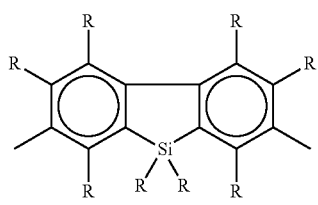
79
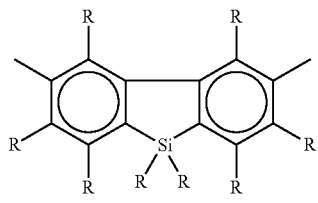
80
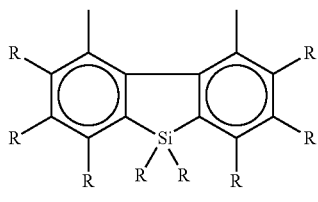
81
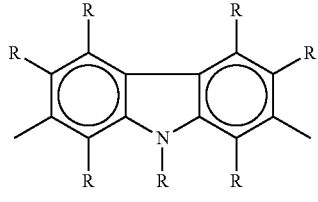
82
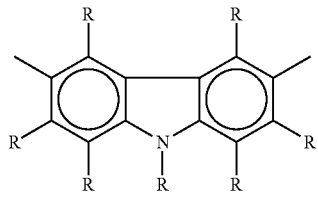
83
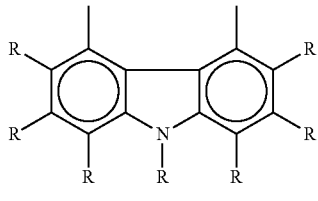
84
[Chemical Formula 38]
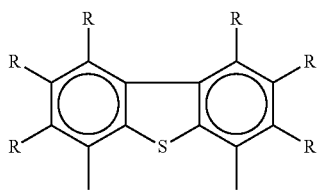
88
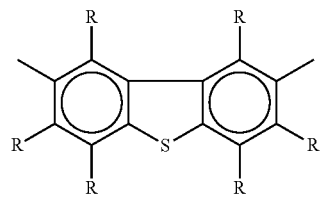
89
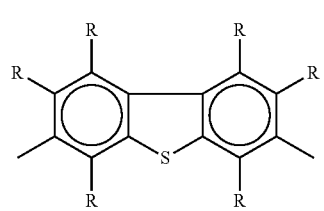
90
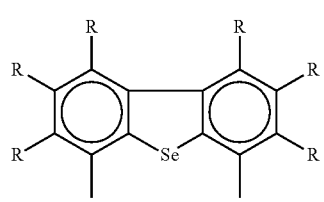
91
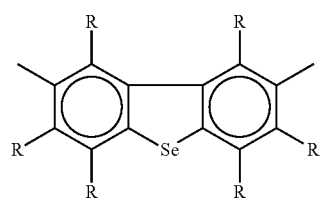
92
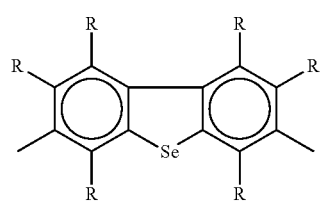
93
[Chemical Formula 39]
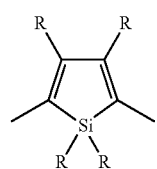
94
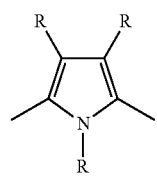
95
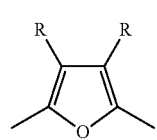
96

-continued
97 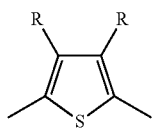
98 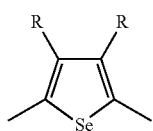
99 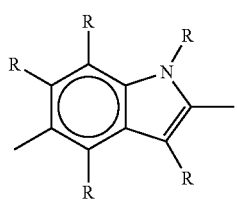
100 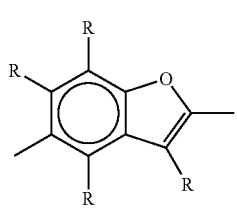
101 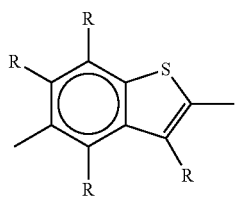
102 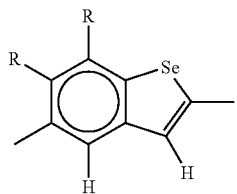
103 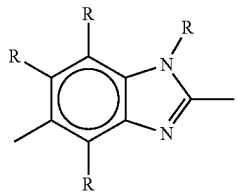
104 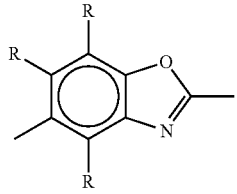
-continued
105 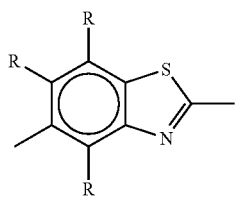
106 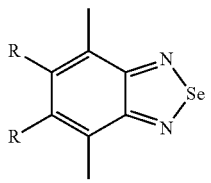
107 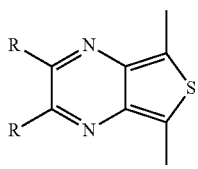
108 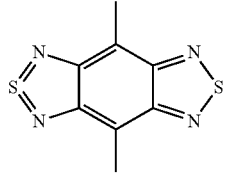
109 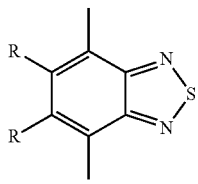
110 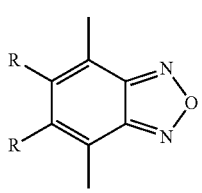
[Chemical Formula 40]
111 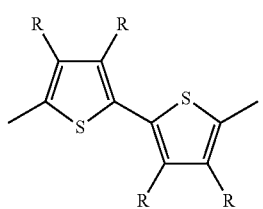
112 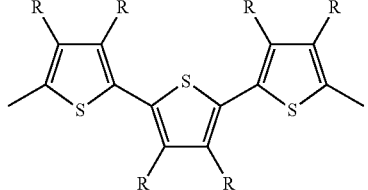

113 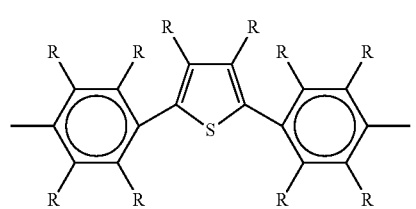
114 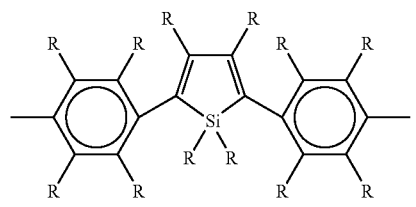
115 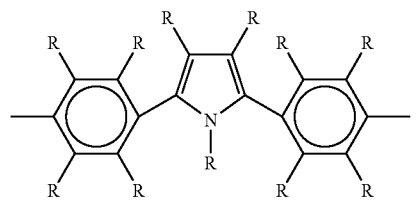
116 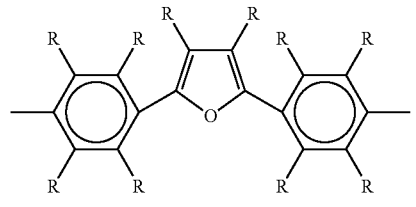
117 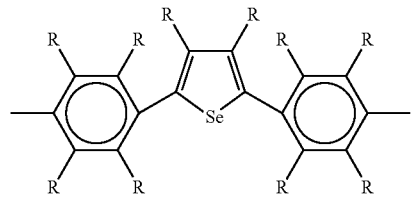
118 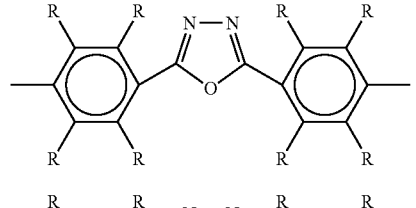
119 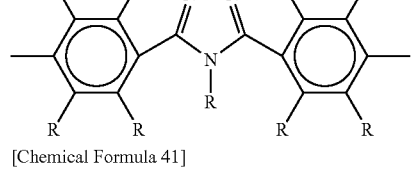
[Chemical Formula 41]
120 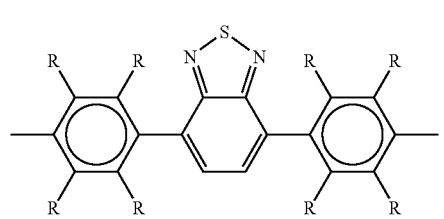
121 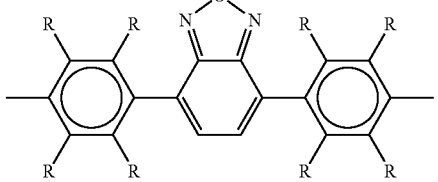
122 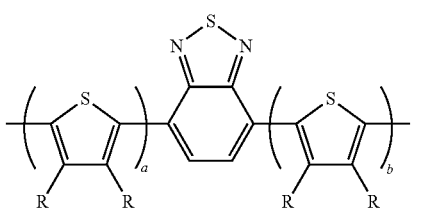
123 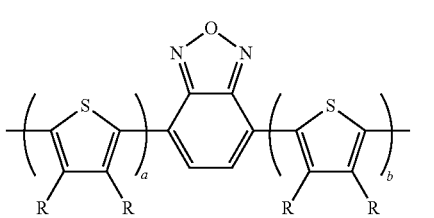
124 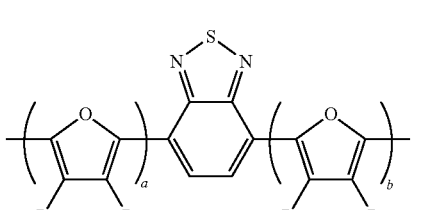
125 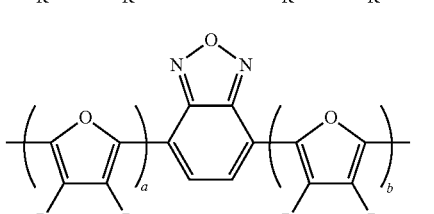
[Chemical Formula 42]
126 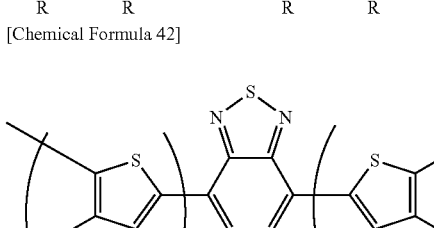
127 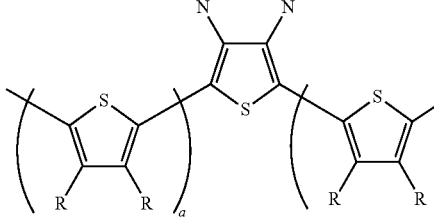

[Chemical Formula 43]
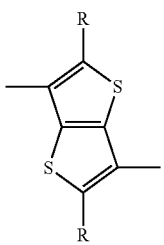
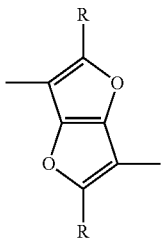
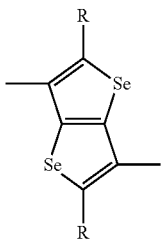
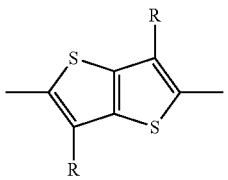
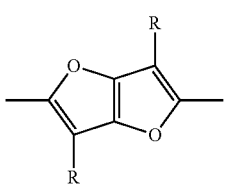
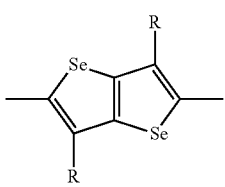
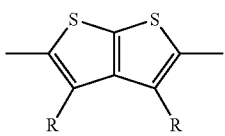
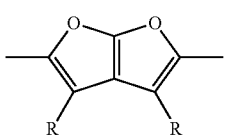
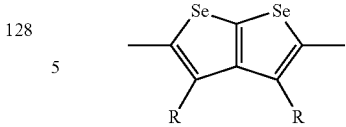
136
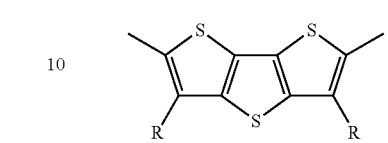
137
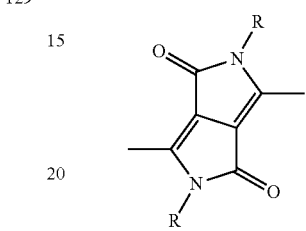
138
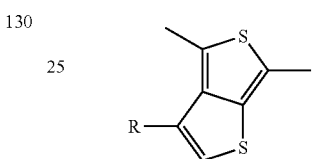
139
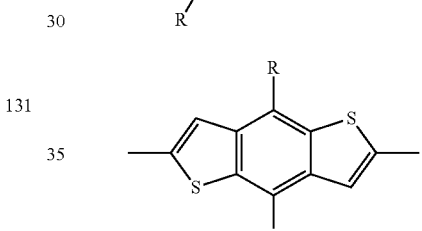
140
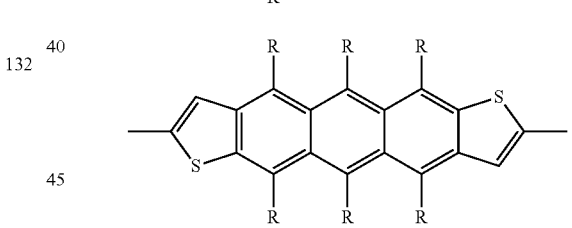
141
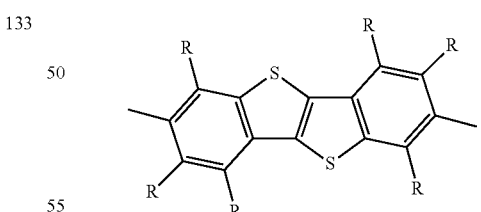
142
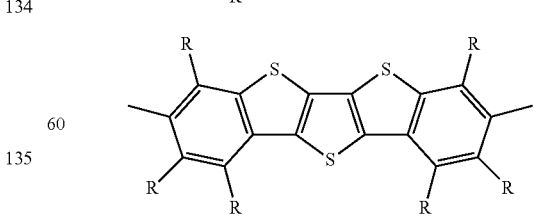
143
In Formula 1 to Formula 143, R represents the same as defined above. The symbols, a and b are the same as or different from each other and represent the number of repeating that is generally 1 to 5, preferably 1 to 3, particularly preferably 1.

As the structural unit different from the structural unit represented by Formula (1), the structural units represented by Formula (A-1) to Formula (E-1) in Group 1 below are preferred from the viewpoint of the photoelectric conversion efficiency.

(Group 1)

[Chemical Formula 44]

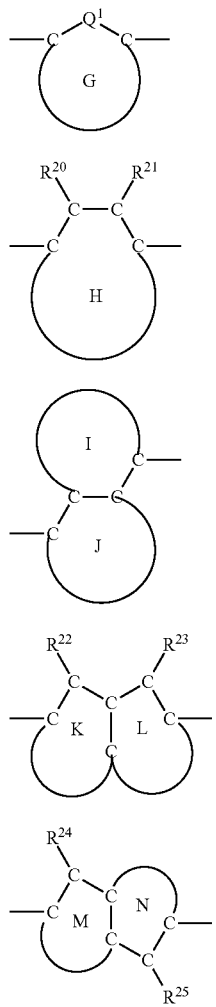

In Group 1, $Q^1$ represents a sulfur atom, an oxygen atom, a selenium atom, —N($R^{30}$)—, or —C$R^{31}$=C$R^{32}$— wherein $R^{30}$, $R^{31}$, and $R^{32}$ are the same as or different from each other and represent a hydrogen atom or a substituent; $R^{20}$ to $R^{25}$ are the same as or different from each other and represent a hydrogen atom or a substituent wherein $R^{20}$ and $R^{21}$ may be coupled with each other to form a cyclic structure; and a ring G to a ring N represent an aromatic ring.

The aromatic rings represented by the ring G to the ring N may be a monocyclic aromatic ring or a multicyclic aromatic ring. Examples of the monocyclic aromatic ring may include aromatic rings such as a benzene ring, a pyrrole ring, a furan ring, a thiophene ring, an oxazole ring, a thiazole ring, a thiadiazole ring, a pyrazole ring, a pyridine ring, a pyrazine ring, an imidazole ring, a triazole ring, an isoxazole ring, an isothiazole ring, a pyrimidine ring, a pyridazine ring, and a triazine ring. However, the ring G is not a benzene ring.

Examples of the multicyclic aromatic ring may include aromatic rings in which an arbitrary ring is condensed to the above monocyclic aromatic rings. Examples of the ring condensed to the monocyclic aromatic ring may include a furan ring, a thiophene ring, a pyrrole ring, a pyrroline ring, a pyrrolidine ring, an oxazole ring, an isoxazole ring, a thiazole ring, an isothiazole ring, a thiadiazole ring, an imidazole ring, an imidazoline ring, an imidazolidine ring, a pyrazole ring, a pyrazoline ring, a pyrazolidine ring, a furazan ring, a triazole ring, a thiadiazole ring, an oxadiazole ring, a tetrazole ring, a pyran ring, a pyridine ring, a piperidine ring, a thiopyran ring, a pyridazine ring, a pyrimidine ring, a pyrazine ring, a piperazine ring, a morpholine ring, a triazine ring, a benzofuran ring, an isobenzofuran ring, a benzothiophene ring, an indole ring, an isoindole ring, an indolizine ring, an indoline ring, an isoindoline ring, a chromene ring, a chromane ring, an isochromane ring, a benzopyran ring, a quinoline ring, an isoquinoline ring, a quinolizine ring, a benzimidazole ring, a benzothiazole ring, an indazole ring, a naphthyridine ring, a quinoxaline ring, a quinazoline ring, a quinazolidine ring, a cinnoline ring, a phthalazine ring, a purine ring, a pteridine ring, a carbazole ring, a xanthene ring, a phenanthridine ring, an acridine ring, a β-carboline ring, a perimidine ring, a phenanthroline ring, a thianthrene ring, a phenoxathiin ring, a phenoxazine ring, a phenothiazine ring, and a phenazine ring.

$R^{30}$, $R^{31}$, and $R^{32}$ represent a hydrogen atom or a substituent. When $R^{30}$, $R^{31}$, and $R^{32}$ are a substituent, a halogen atom such as a fluorine atom, a bromine atom, and a chlorine atom, and a group having 1 to 30 carbon atoms are preferred as the substituent. Examples of the group having 1 to 30 carbon atoms may include an alkyl group such as a methyl group, an ethyl group, a butyl group, a hexyl group, an octyl group, and a dodecyl group; an alkyloxy group such as a methoxy group, an ethoxy group, a butoxy group, a hexyloxy group, an octyloxy group, and a dodecyloxy group; and an aryl group such as a phenyl group and a naphthyl group.

In Group 1, $R^{20}$ to $R^{25}$ represent a hydrogen atom or a substituent. When $R^{20}$ to $R^{25}$ are a substituent, a halogen atom such as a fluorine atom, a bromine atom, and a chlorine atom, and a group having 1 to 30 carbon atoms are preferred as the substituent. Examples of the group having 1 to 30 carbon atoms may include an alkyl group such as a methyl group, an ethyl group, a butyl group, a hexyl group, an octyl group, and a dodecyl group; an alkyloxy group such as a methoxy group, an ethoxy group, a butoxy group, a hexyloxy group, an octyloxy group, and a dodecyloxy group; and an aryl group such as a phenyl group and a naphthyl group.

$R^{20}$ and $R^{21}$ may be coupled with each other to form a cyclic structure. Specific examples of the cyclic structure formed by coupling may include the structures of Formula (I) to Formula (III) below.

[Chemical Formula 45]

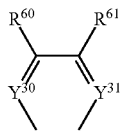

(I)

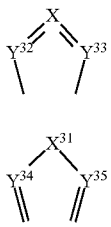

(II)

(III)

In Formula (I) to Formula (III), $R^{60}$ and $R^{61}$ are the same as or different from each other and represent a hydrogen atom or a substituent. When $R^{60}$ and $R^{61}$ are a substituent, a halogen atom such as a fluorine atom, a bromine atom, and a chlorine atom, and a group having 1 to 30 carbon atoms are preferred as the substituent. Examples of the substituent may include an alkyl group such as a methyl group, an ethyl group, a butyl group, a hexyl group, an octyl group, and a dodecyl group; an alkyloxy group such as a methoxy group, an ethoxy group, a butoxy group, a hexyloxy group, an octyloxy group, and a dodecyloxy group; and an aryl group such as a phenyl group and a naphthyl group.

$X^{30}$ and $X^{31}$ are the same as or different from each other and represent a sulfur atom or a selenium atom. $X^{30}$ and $X^{31}$ are preferably a sulfur atom. $Y^{30}$ to $Y^{35}$ are the same as or different from each other and represent a nitrogen atom or =CH—. $Y^{30}$ to $Y^{35}$ are preferably a nitrogen atom.

The ring G to the ring N optionally have a substituent other than $R^{20}$ to $R^{25}$, and examples of the substituent may include a halogen atom such as a fluorine atom, a bromine atom, and a chlorine atom; an alkyl group such as a methyl group, an ethyl group, a butyl group, a hexyl group, an octyl group, and a dodecyl group; an alkyloxy group such as a methoxy group, an ethoxy group, a butoxy group, a hexyloxy group, an octyloxy group, and a dodecyloxy group; and an aryl group such as a phenyl group and a naphthyl group.

Among the structural units included in Group 1, the structural units represented by Formula (A-2) to Formula (E-2) in Group 2 below are more preferred from the viewpoint of the photoelectric conversion efficiency.

(Group 2)

[Chemical Formula 46]

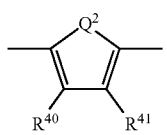

(A-2)

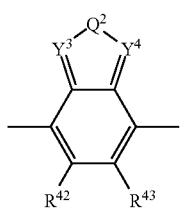

(B-2)

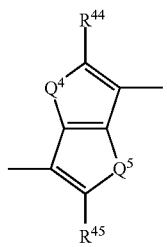

(C-2)

[Chemical Formula 47]

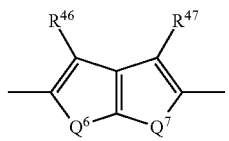

(D-2)

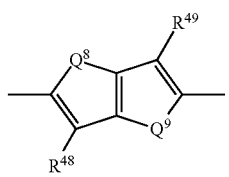

(E-2)

In Formula (A-2) to Formula (E-2), $Q^2$ to $Q^9$ are the same as or different from each other and represent a sulfur atom, an oxygen atom, a selenium atom, —N($R^{30}$)—, or —$CR^{31}$=$CR^{32}$—. $R^{30}$, $R^{31}$, and $R^{32}$ represent the same as defined above. $Q^2$ to $Q^9$ are preferably a sulfur atom. $Y^3$ and $Y^4$ are the same as or different from each other and represent a nitrogen atom or =CH—. $Y^3$ and $Y^4$ are preferably a nitrogen atom.

$R^{40}$ to $R^{49}$ are the same as or different from each other and represent a hydrogen atom or a substituent. When $R^{40}$ to $R^{49}$ are a substituent, preferred examples of the substituent may include a halogen atom such as a fluorine atom, a bromine atom, and a chlorine atom, and a group having 1 to 30 carbon atoms. Examples of the group having 1 to 30 carbon atoms may include an alkyl group such as a methyl group, an ethyl group, a butyl group, a hexyl group, an octyl group, and a dodecyl group; an alkyloxy group such as a methoxy group, an ethoxy group, a butoxy group, a hexyloxy group, an octyloxy group, and a dodecyloxy group; and an aryl group such as a phenyl group and a naphthyl group. $R^{40}$ and $R^{41}$, and $R^{42}$ and $R^{43}$ individually may be coupled with each other to form a cyclic structure.

Specific examples of the cyclic structures formed by coupling of $R^{40}$ and $R^{41}$, and $R^{42}$ and $R^{43}$ may include cyclic structures represented by Formula (I) and cyclic structures represented by Formula (II).

Preferably, the structural units represented by Formula (A-2) to Formula (E-2) may include groups represented by Formula (500) to Formula (528).

[Chemical Formula 48]
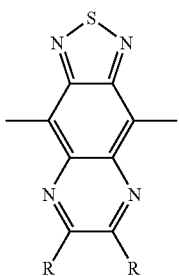 (500)
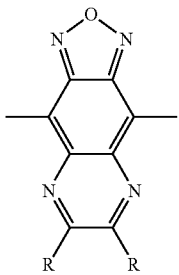 (501)
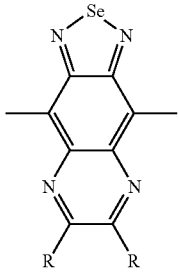 (502)
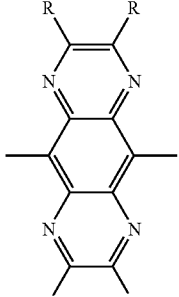 (503)
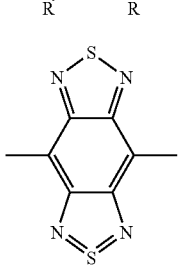 (504)
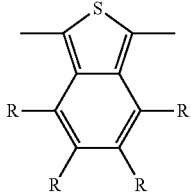 (505)
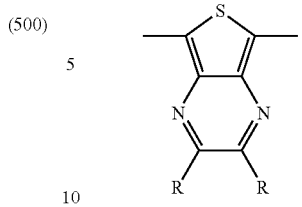 (506)
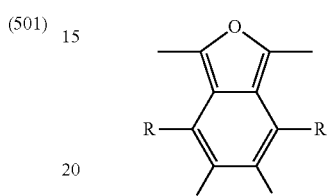 (507)
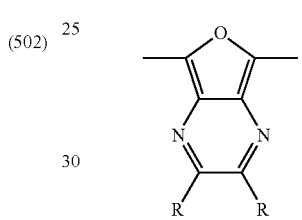 (508)
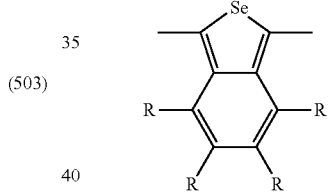 (509)
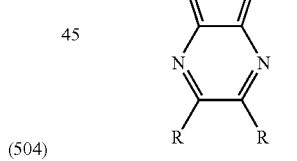 (510)
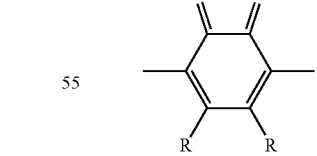 (511)
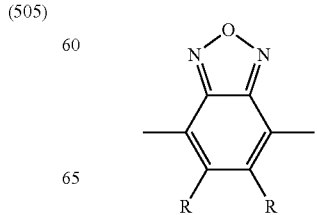 (512)

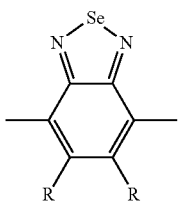
(513)
[Chemical Formula 49]
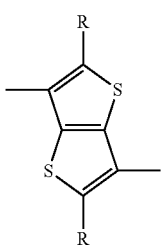
(514)
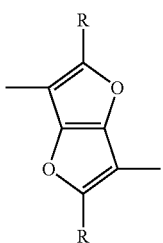
(515)
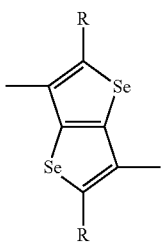
(516)
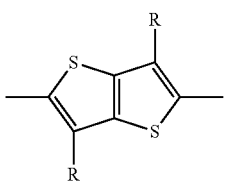
(517)
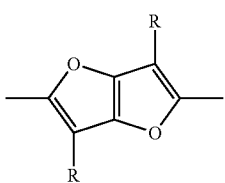
(518)
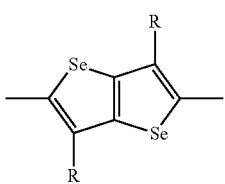
(519)
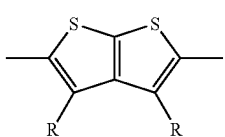
(520)
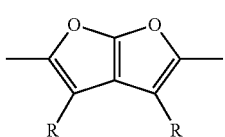
(521)
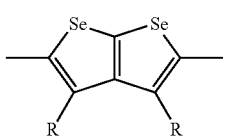
(522)
[Chemical Formula 50]
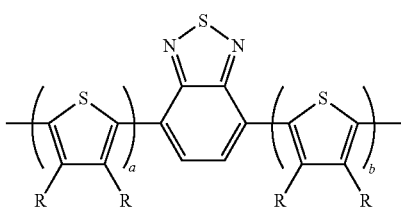
(523)
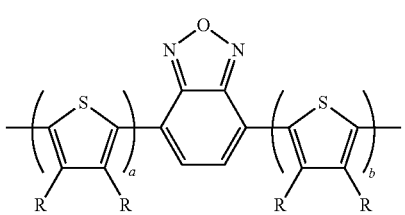
(524)
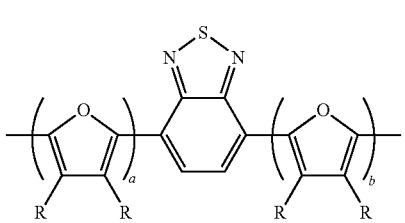
(525)
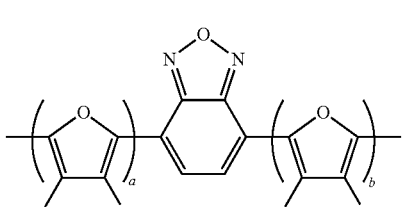
(526)
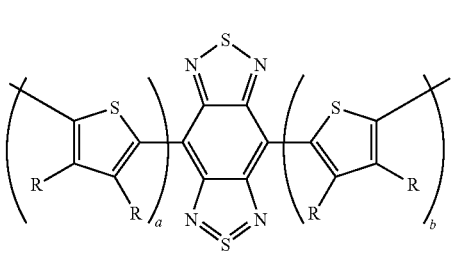
(527)

(528)
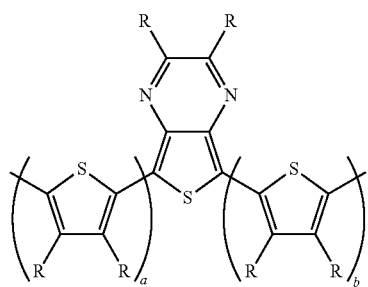
In the formulae, R, a, and b represent the same as defined above.
Examples of the structural unit contained in the macromolecular compound of the present invention may include structural units represented by Formula (601) to Formula (640).
[Chemical Formula 51]
(601)
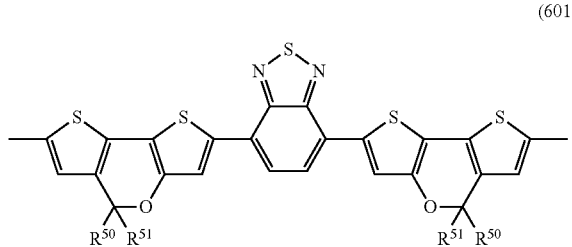
(602)
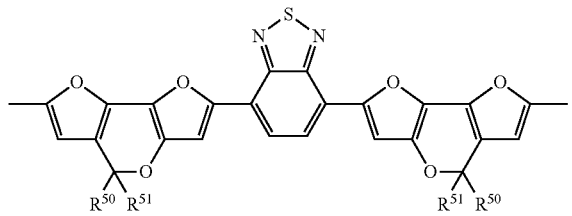
(603)
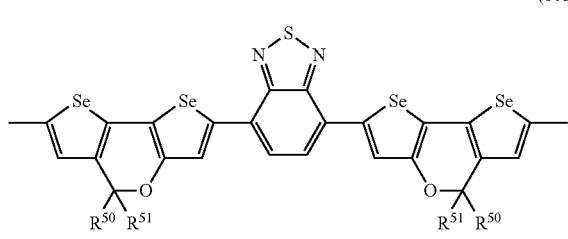
(604)
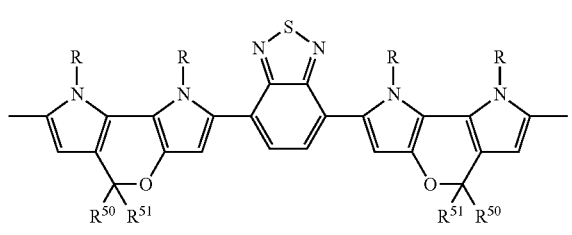
(605)
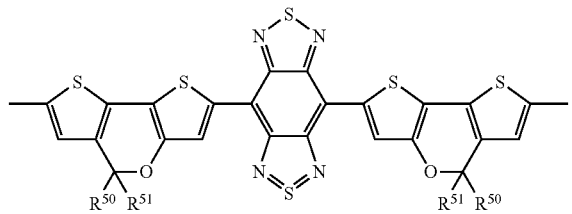
(606)
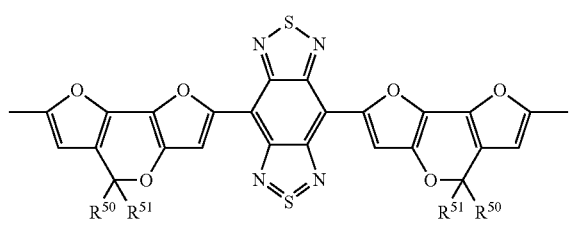
(607)
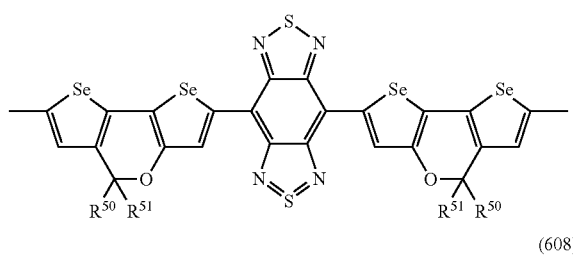
(608)
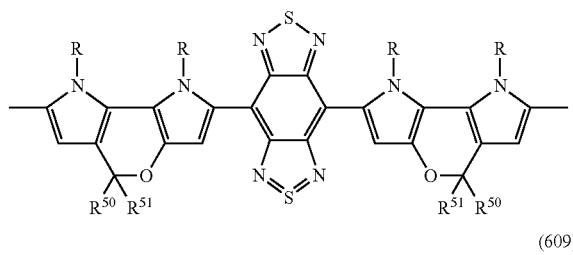
(609)
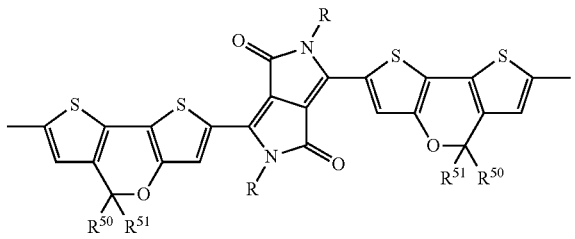
(610)
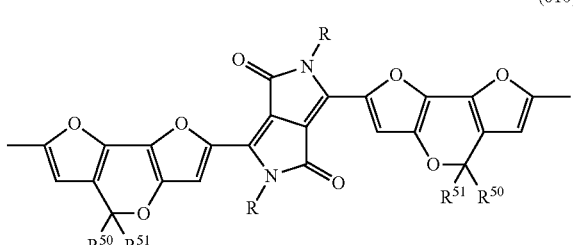

-continued
(611) 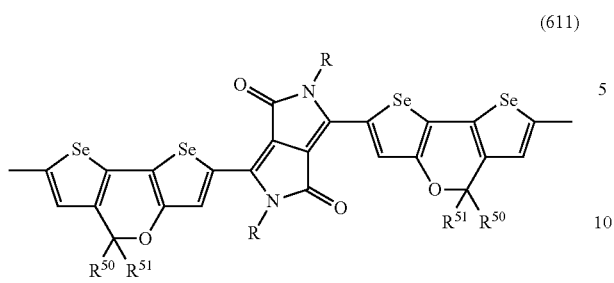
(612) 
(613) 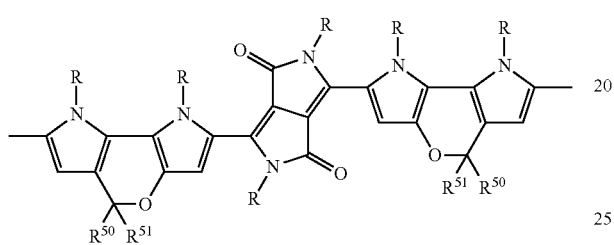
(614) 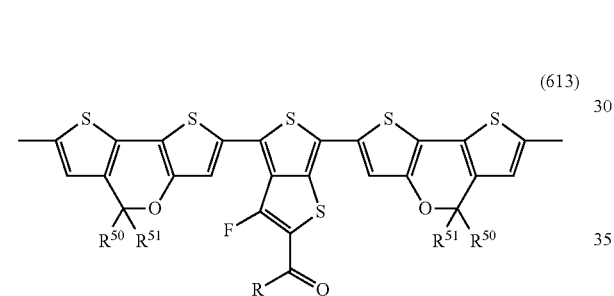
(615) 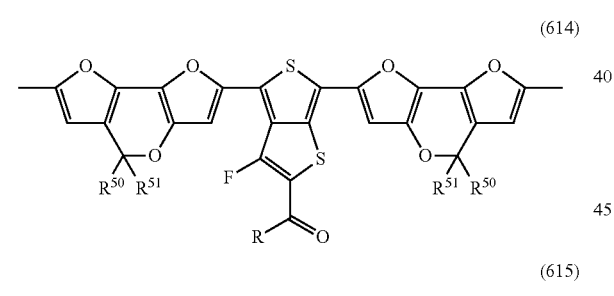
(616) 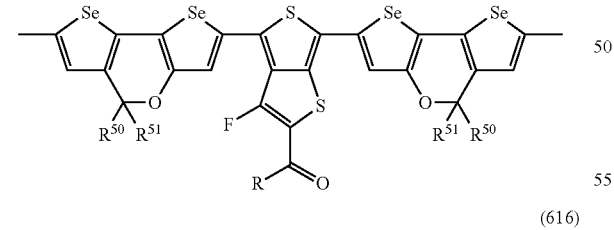
-continued
(617) 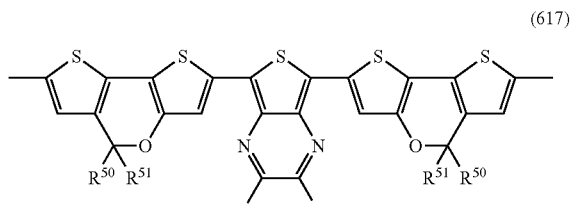
(618) 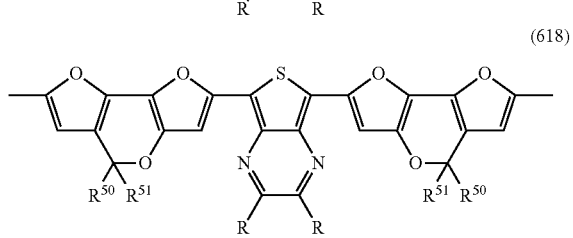
(619) 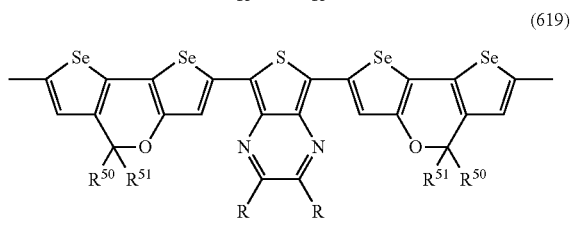
(620) 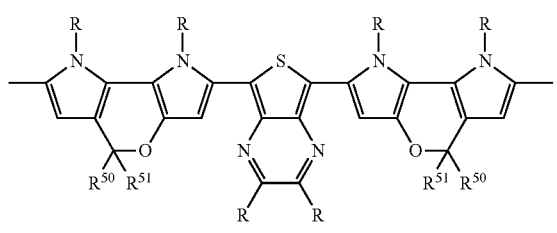
[Chemical Formula 52]
(621) 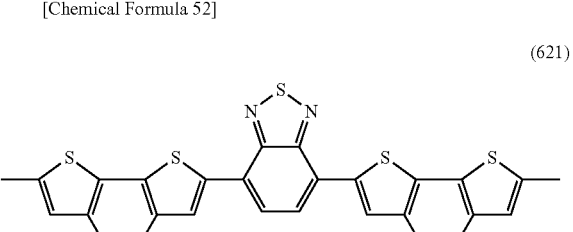
(622) 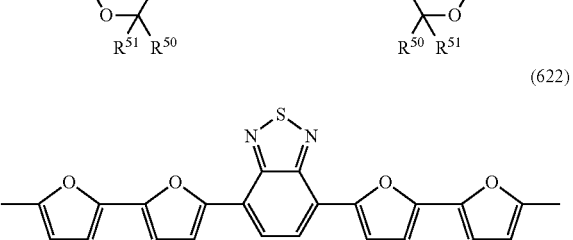
(623) 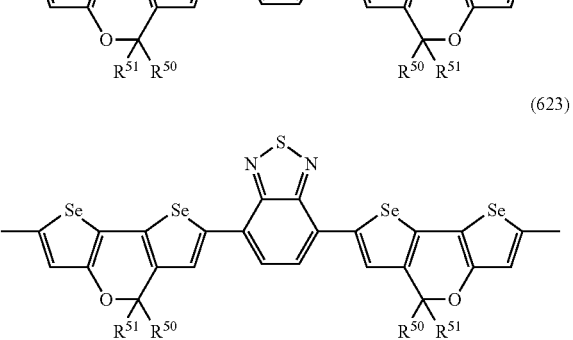

-continued
(624)
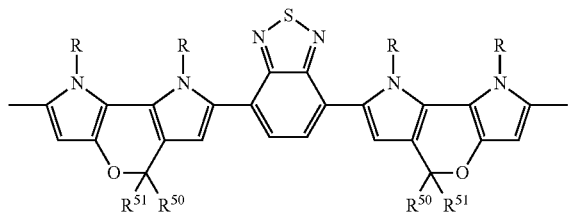
(625)
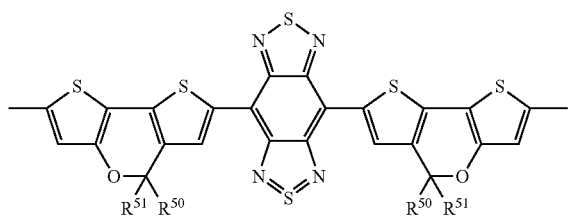
(626)
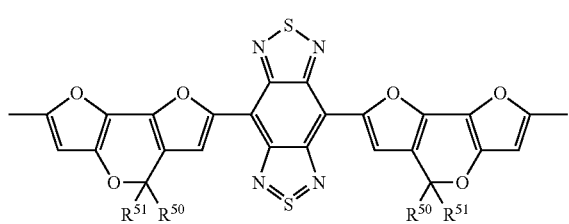
(627)
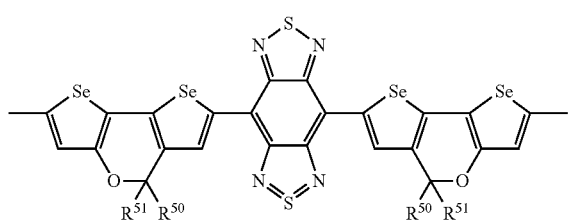
(628)
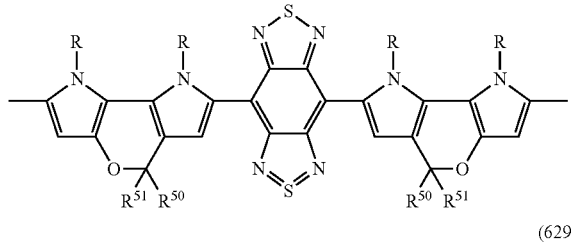
(629)
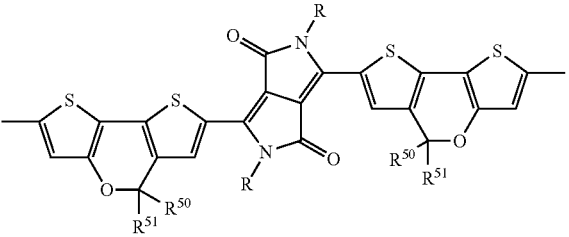
-continued
(630)
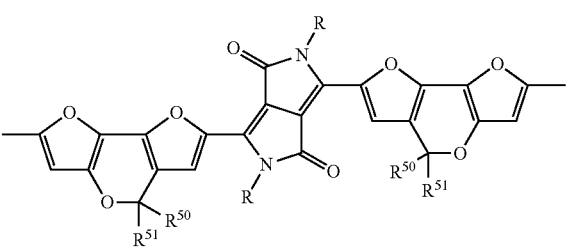
(631)
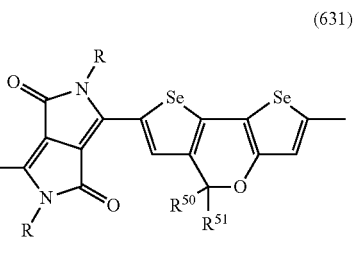
(632)
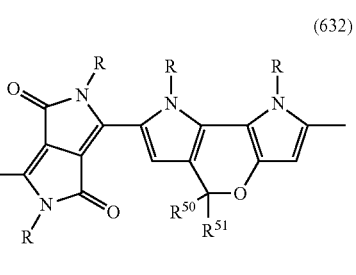
(633)
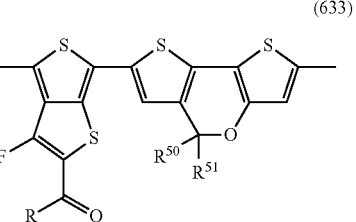
(634)
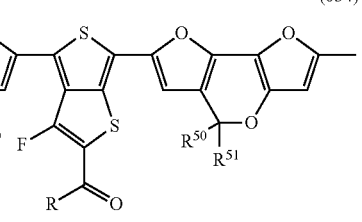
(635)
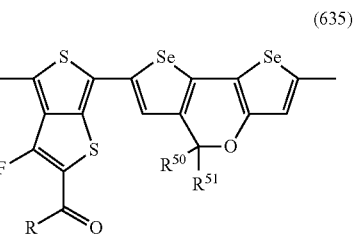

-continued

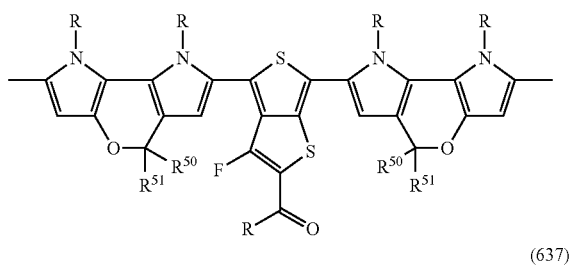
(636)

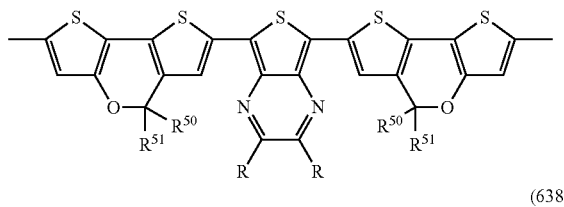
(637)

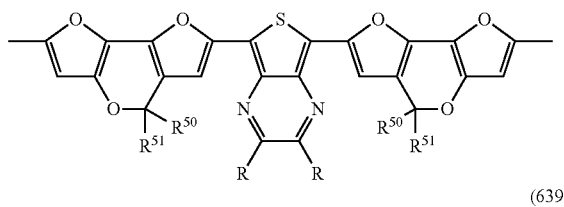
(638)

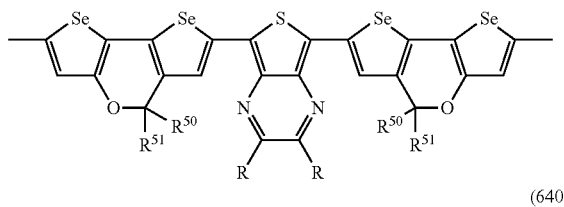
(639)

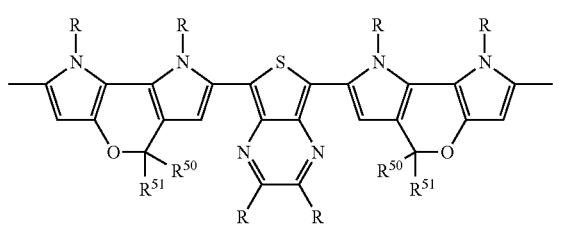
(640)

In the above formulae, $R^{50}$, $R^{51}$, and R are the same as defined above.

The macromolecular compound of the present invention may have the structural units represented by Formula (601) to Formula (640) as a repeated unit or may have a chain of the structural units. The macromolecular compound of the present invention may also have a divalent organic group in which the structural units are bonded with each other through an arylene group or a divalent heterocyclic group as a repeated unit, or may have a chain of the divalent organic group. Examples of the arylene group and the divalent heterocyclic group may include groups represented by Formula 1 to Formula 143 above.

The macromolecular compound of the present invention refers to a compound having a weight-average molecular weight (Mw) of 1,000 or more. A macromolecular compound having a weight-average molecular weight of 3,000 to 10,000,000 is preferably used. When the weight-average molecular weight is less than 3,000, there may be caused a defect in film formation during the production of a cell, a device or an element. When the weight-average molecular weight is more than 10,000,000, there may fall the solubility of the macromolecular compound in a solvent or the applicability of the macromolecular compound during the production of a cell, a device or an element. The weight-average molecular weight of the macromolecular compound is further preferably 8,000 to 5,000,000, particularly preferably 10,000 to 1,000,000.

Here, the weight-average molecular weight in the present invention refers to a weight-average molecular weight in terms of polystyrene measured using gel permeation chromatography (GPC) with a standard sample of polystyrene.

As the content of the structural unit represented by Formula (1) in the macromolecular compound of the present invention, it is satisfactory that at least one of the structural unit is contained in the compound. In the macromolecular compound, 2 or more structural units in average per one macromolecule chain are preferably contained. Further preferably, 3 or more structural units in average per one macromolecule chain are contained.

When the macromolecular compound of the present invention is utilized in a cell, a device or an element, it is desired that the macromolecular compound has a high solubility in a solvent in terms of the easiness of the production of a cell, a device or an element. Specifically, the macromolecular compound of the present invention preferably has a solubility capable of preparing a solution containing 0.01% by weight (wt) or more of the macromolecular compound, more preferably a solubility capable of preparing a solution containing 0.1 wt % or more of the macromolecular compound, further preferably a solubility capable of preparing a solution containing 0.4 wt % or more of the macromolecular compound.

Although the production method of the macromolecular compound of the present invention is not particularly limited, a method using the Suzuki coupling reaction and a method using the Stille coupling reaction are preferred in terms of the easiness of the synthesis of the macromolecular compound.

Examples of the method using the Suzuki coupling reaction may include a production method having a process of reacting one or more type(s) of compound represented by Formula (100):

$$Q^{100}\text{-}E^1\text{-}Q^{200} \quad (100)$$

In the above Formula, $E^1$ represents a divalent group containing an aromatic ring, and $Q^{100}$ and $Q^{200}$ are the same as or different from each other and represent a boronic acid residue or a boric acid ester residue;

with one or more type(s) of compound represented by Formula (200):

$$T^1\text{-}E^2\text{-}T^2 \quad (200)$$

In the above Formula, $E^2$ represents a structural unit containing the group represented by Formula (1), and $T^1$ and $T^2$ are the same as or different from each other and represent a halogen atom, an alkyl sulfonate group, an aryl sulfonate group, or an arylalkyl sulfonate group; in the presence of a palladium catalyst and a base. $E^1$ is preferably a divalent aromatic group, further preferably a group represented by the above Formula 1 to Formula 143.

In this case, the total number of moles of one or more type(s) of compound represented by Formula (200) used for the reaction is preferably excessive relative to the total number of moles of one or more type(s) of compound represented by Formula (100). When the total number of moles of one or more type(s) of compound represented by Formula (200) used for the reaction is assumed to be 1 mole, the total number of moles of one or more type(s) of compound represented by Formula (100) is preferably 0.6 to 0.99 moles, further preferably 0.7 to 0.95 moles.

Examples of the boric acid ester residue may include groups represented by Formulae:

[Chemical Formula 53]

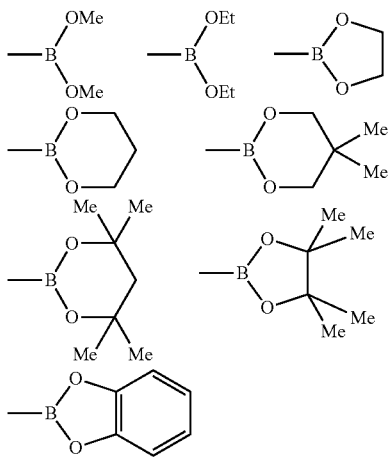

In the formulae, Me represents a methyl group and Et represents an ethyl group.

Examples of the halogen atom represented by $T^1$ and $T^2$ in Formula (200) may include a fluorine atom, a chlorine atom, a bromine atom, and an iodine atom. In terms of the easiness of the synthesis of the macromolecular compound, the halogen atom is preferably a bromine atom or an iodine atom, further preferably a bromine atom.

Examples of the alkyl sulfonate group represented by $T^1$ and $T^2$ in Formula (200) may include a methane sulfonate group, an ethane sulfonate group, and a trifluoromethane sulfonate group. Examples of the aryl sulfonate group may include a benzene sulfonate group and a p-toluene sulfonate group. Examples of the arylalkyl sulfonate group may include a benzyl sulfonate group.

Specifically, examples of the method for carrying out the Suzuki coupling reaction may include a method for carrying out the reaction using a palladium catalyst as a catalyst in any solvent in the presence of a base.

Examples of the palladium catalyst used for the Suzuki coupling reaction may include a Pd(0) catalyst and a Pd(II) catalyst. Specifically, examples of the palladium catalyst may include palladium [tetrakis(triphenylphosphine)], palladium acetates, dichlorobis(triphenylphosphine)palladium, palladium acetate, tris(dibenzylideneacetone)dipalladium, and bis(dibenzylideneacetone)palladium. From the viewpoints of the easiness of the reaction (polymerization) operation and the reaction (polymerization) rate, dichlorobis(triphenylphosphine)palladium, palladium acetate, and tris(dibenzylideneacetone)dipalladium are preferred.

The additive amount of the palladium catalyst is not particularly limited so long as it is an amount effective as the catalyst. It is generally 0.0001 moles to 0.5 moles, preferably 0.0003 moles to 0.1 moles, relative to 1 mole of the compound represented by Formula (100).

When palladium acetates are used as the palladium catalyst used for the Suzuki coupling reaction, for example, a phosphorus compound such as triphenylphosphine, tri(o-tolyl) phosphine, and tri(o-methoxyphenyl)phosphine can be added as a ligand. In this case, the additive amount of the ligand is generally 0.5 moles to 100 moles, preferably 0.9 moles to 20 moles, further preferably 1 mole to 10 moles, relative to 1 mole of the palladium catalyst.

Examples of the base used for the Suzuki coupling reaction may include inorganic bases, organic bases, and inorganic salts. Examples of the inorganic base may include potassium carbonate, sodium carbonate, and barium hydroxide. Examples of the organic base may include triethylamine and tributylamine. Examples of the inorganic salt may include cesium fluoride.

The additive amount of the base is generally 0.5 moles to 100 moles, preferably 0.9 moles to 20 moles, further preferably 1 mole to 10 moles, relative to 1 mole of the compound represented by Formula (100).

The Suzuki coupling reaction is carried out generally in a solvent. Examples of the solvent may include N,N-dimethylformamide, toluene, dimethoxyethane, and tetrahydrofuran. From the viewpoint of the solubility of the macromolecular compound used for the present invention, toluene and tetrahydrofuran are preferred. The base may be added as an aqueous solution thereof to carry out the reaction in a two phases-system. When an inorganic salt is used as the base, the inorganic salt is generally added as an aqueous solution thereof for the reaction from the viewpoint of the solubility of the inorganic salt.

When the base is added as an aqueous solution thereof to carry out the reaction in a two phases-system, a phase-transfer catalyst such as a quaternary ammonium salt may be added, if necessary.

Although the temperature for carrying out the Suzuki coupling reaction depends on the solvent, the temperature is generally around 50 to 160° C. Preferably, it is 60 to 120° C. from the viewpoint of making the molecular weight of the macromolecular compound higher. It is also possible to elevate the temperature to the near to the boiling point of the solvent to reflux. Although the reaction time may be terminated when the polymerization degree has reached an objective polymerization degree, the reaction time is generally around 0.1 hours to 200 hours. Preferably, it is around 1 hour to 30 hours for efficiency.

The Suzuki coupling reaction is carried out under an inactive atmosphere such as an argon gas and a nitrogen gas in a reaction system in which a Pd(0) catalyst is not inactivated. For example, the reaction is carried out in a system that is fully deaerated with an argon gas, a nitrogen gas, or the like. Specifically, the reaction is carried out by: fully purging the inside of a polymerization vessel (reaction system) with a nitrogen gas to deaerate the reaction system; then charging the compound represented by Formula (100), the compound represented by Formula (200), and dichlorobis(triphenylphosphine) palladium (II) into the polymerization vessel; further purging fully the polymerization vessel with a nitrogen gas to deaerate the reaction system; then adding a solvent such as toluene that has been deaerated by bubbling the solvent with a nitrogen gas beforehand into the reaction system; then dropping into the resultant solution, an aqueous solution of a base such as sodium carbonate that has been deaerated by bubbling the solution with a nitrogen gas beforehand; then heating the resultant reaction mixture to elevate the temperature of the reaction mixture; and performing the polymerization, for example, at a reflux temperature of the reaction mixture for 8 hours while maintaining the inactive atmosphere.

Examples of the method using the Stille coupling reaction may include a production method having a process of reacting one or more type(s) of compound represented by Formula (300):

$$Q^{300}\text{-}E^3\text{-}Q^{400} \qquad (300)$$

In the above Formula, $E^3$ represents a divalent group containing an aromatic ring, and $Q^{300}$ and $Q^{400}$ are the same as or different from each other and represent an organotin residue; with one or more type(s) of compound represented by the above Formula (200) in the presence of a palladium catalyst. $E^3$ is preferably a divalent aromatic group, further preferably a group represented by the aforementioned Formula 1 to Formula 143 above.

Examples of the organotin residue may include a group represented by —$SnR^{100}{}_3$. Here, $R^{100}$ represents a monovalent organic group. Examples of the monovalent organic group may include an alkyl group and an aryl group.

Examples of the alkyl group may include a chained alkyl group such as a methyl group, an ethyl group, an n-propyl group, an isopropyl group, an n-butyl group, an isobutyl group, an sec-butyl group, a tert-butyl group, an n-pentyl group, an isopentyl group, a 2-methylbutyl group, a 1-methylbutyl group, an n-hexyl group, an isohexyl group, a 3-methylpentyl group, a 2-methylpentyl group, a 1-methylpentyl group, a heptyl group, an octyl group, an isooctyl group, a 2-ethylhexyl group, a nonyl group, a decyl group, an undecyl group, a dodecyl group, a tetradecyl group, a hexadecyl group, an octadecyl group, and an eicosyl group; and a cycloalkyl group such as a cyclopentyl group, a cyclohexyl group, and an adamantyl group. Examples of the aryl group may include a phenyl group and a naphthyl group. The organotin residue is preferably —$SnMe_3$, —$SnEt_3$, —$SnBu_3$, or —$SnPh_3$, more preferably —$SnMe_3$, —$SnEt_3$, or —$SnBu_3$. In the above preferred examples, Me represents a methyl group, Et represents an ethyl group, Bu represents a butyl group, and Ph represents a phenyl group.

Examples of the halogen atom represented by $T^1$ and $T^2$ in Formula (200) may include a fluorine atom, a chlorine atom, a bromine atom, and an iodine atom. In terms of the easiness of the synthesis of the macromolecular compound, the halogen atom is preferably a bromine atom or an iodine atom.

Examples of the alkyl sulfonate group represented by $T^1$ and $T^2$ in Formula (200) may include a methane sulfonate group, an ethane sulfonate group, and a trifluoromethane sulfonate group. Examples of the aryl sulfonate group may include a benzene sulfonate group and a p-toluene sulfonate group. Examples of the aryl sulfonate group may include a benzyl sulfonate group.

Specifically, examples of the method may include a method for carrying out the reaction in the presence of a palladium catalyst as a catalyst in any solvent.

Examples of the palladium catalyst used for the Stille coupling reaction may include a Pd(0) catalyst and a Pd(II) catalyst. Specifically, examples of the palladium catalyst may include palladium [tetrakis(triphenylphosphine)], palladium acetates, dichlorobis(triphenylphosphine)palladium, palladium acetate, tris(dibenzylideneacetone)dipalladium, and bis(dibenzylideneacetone)palladium. Palladium [tetrakis(triphenylphosphine)] and tris(dibenzylideneacetone)dipalladium are preferred from the viewpoints of the easiness of the reaction (polymerization) operation and the reaction (polymerization) rate.

The additive amount of the palladium catalyst used for the Stille coupling reaction is not particularly limited so long as it is an amount effective as the catalyst. It is generally 0.0001 moles to 0.5 moles, preferably 0.0003 moles to 0.2 moles, relative to 1 mole of the compound represented by Formula (100).

In the Stille coupling reaction, a ligand and a co-catalyst can also be used, if necessary. Examples of the ligand may include a phosphorus compound such as triphenylphosphine, tri(o-tolyl)phosphine, tri(o-methoxyphenyl)phosphine, and tris(2-furyl)phosphine, and an arsenic compound such as triphenyl arsine and triphenoxy arsine. Examples of the co-catalyst may include copper iodide, copper bromide, copper chloride, and copper (I) 2-thenoate.

When the ligand or the co-catalyst is used, the additive amount of the ligand or the co-catalyst is generally 0.5 moles to 100 moles, preferably 0.9 moles to 20 moles, further preferably 1 mole to 10 moles, relative to 1 mole of the palladium catalyst.

The Stille coupling reaction is generally carried out in a solvent. Examples of the solvent may include N,N-dimethylformamide, N,N-dimethylacetamide, toluene, dimethoxyethane, and tetrahydrofuran. From the viewpoint of the solubility of the macromolecular compound used for the present invention, toluene and tetrahydrofuran are preferred.

Although the temperature for carrying out the Stille coupling reaction depends on the solvent, the temperature is generally around 50 to 160° C. Preferably, it is 60 to 120° C. from the viewpoint of making the molecular weight of the macromolecular compound higher. It is also possible to elevate the temperature to the near to the boiling point of the solvent to reflux.

Although the time for carrying out the reaction (reaction time) may be terminated when the polymerization degree has reached an objective polymerization degree, the reaction time is generally around 0.1 hours to 200 hours. Preferably, it is around 1 hour to 30 hours for efficiency.

The Stille coupling reaction is carried out under an inactive atmosphere such as an argon gas and a nitrogen gas in a reaction system in which a Pd catalyst is not inactivated. For example, the reaction is carried out in a system that is fully deaerated with an argon gas, a nitrogen gas or the like. Specifically, the reaction is carried out by: fully purging the inside of a polymerization vessel (reaction system) with a nitrogen gas to deaerate the reaction system; then charging the compound represented by Formula (300), the compound represented by Formula (200), and a palladium catalyst into the polymerization vessel; further purging fully the polymerization vessel with a nitrogen gas to deaerate the reaction system; then adding a solvent such as toluene that has been deaerated by bubbling with a nitrogen gas beforehand into the reaction system; then adding a ligand or a co-catalyst to the reaction system, if necessary; then heating the resultant reaction mixture to elevate the temperature of the reaction mixture; and performing the polymerization, for example, at a reflux temperature of the reaction mixture for 8 hours while maintaining the inactive atmosphere.

The number average molecular weight (Mn) of the macromolecular compound in terms of polystyrene is preferably $1 \times 10^3$ to $1 \times 10^8$. When the number average molecular weight in terms of polystyrene is $1 \times 10^3$ or more, a rigid thin film can easily be obtained. On the other hand, when the number average molecular weight is $10^8$ or less, the solubility of the macromolecular compound becomes high, so that the production of a thin film becomes easy.

A terminal group of the macromolecular compound of the present invention may be protected with a stable group, since there is the probability that the property or the lifetime of a cell, a device or an element obtained by using such a macromolecular compound for the production of the cell, device or element might be lowered if a polymerization active group remains. The terminal group preferably has a conjugated bond continuing from a conjugation structure of the main chain, or may have a structure having, for example, bonding with an aryl group or a heterocyclic group through a vinylene group.

Although the macromolecular compound of the present invention is characterized in that the macromolecular compound has a structural unit represented by Formula (1). For example, the macromolecular compound can be synthesized by using a compound represented by Formula (1-3) as one of the raw materials.

[Chemical Formula 54]

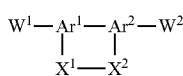
(1-3)

In Formula (1-3), $Ar^1$, $Ar^2$, $X^1$, and $X^2$ represent the same as defined above. $W^1$ and $W^2$ are the same as or different from each other and represent a hydrogen atom, a halogen atom, an alkyl sulfonate group, an aryl sulfonate group, an arylalkyl sulfonate group, a boric acid ester residue, a sulfonium methyl group, a phosphonium methyl group, a phosphonate methyl group, a monohalogenated methyl group, a boronic acid residue, a formyl group, a vinyl group, or an organotin residue.

When $W^1$ and $W^2$ are a hydrogen atom, a macromolecular compound having a structural unit represented by Formula (1) can be produced by performing an oxidation polymerization. In the oxidation polymerization, a catalyst is generally used. As such a catalyst, a publicly known catalyst can be used. For example, a metal halide, a mixture of a metal halide and an amine complex (metal halide/amine complex), or the like is used. Here, as the metal halide, for example, a monovalent-, divalent-, or trivalent-halide of a metal such as copper, iron, vanadium, and chromium can be used. Examples of the amine used for the production of the amine complex may include pyridine, lutidine, 2-methylimidazole, and N,N,N',N'-tetramethylethylenediamine. The metal halide/amine complex can be produced by mixing a metal halide with an amine in a solvent in the presence of oxygen and the mixing molar ratio of the metal halide and the amine is, for example, metal halide/amine=1/0.1 to 1/200, preferably around 1/0.3 to 1/100.

As the catalyst, iron chloride can also be used (Polym. Prep. Japan, Vol. 48, 309 (1999)). Further, by using a copper/amine catalyst system (J. Org. Chem., 64, 2264 (1999), J. Polym. Sci. Part A, Polym. Chem., 37, 3702 (1999)), the molecular weight of the macromolecular compound can be enhanced.

The solvent for the oxidation polymerization is not particularly limited to be used so long as the solvent is a solvent from which the catalyst does not suffer poisoning. Examples of such a solvent may include hydrocarbon solvents, ether solvents, and alcohols. Here, examples of the hydrocarbon solvent may include toluene, benzene, xylene, trimethylbenzene, tetramethylbenzene, naphthalin, and tetralin. Examples of the ether solvent may include diethyl ether, diisopropyl ether, tetrahydrofuran, 1,4-dioxane, diphenyl ether, and tert-butyl methyl ether. Examples of the alcohols may include methanol, ethanol, isopropanol, and 2-methoxyethanol.

The reaction temperature for the oxidation polymerization is generally around −100° C. to 100° C., preferably around −50 to 50° C.

Examples of the method for producing a copolymer may include a method of mixing two or more types of monomers to polymerize them and a method of polymerizing one type of monomer and then adding a second monomer. By using or combining these methods, a block copolymer, a random copolymer, an alternate copolymer, a multiblock copolymer, a graft copolymer, and the like can be produced.

From the viewpoint of the easiness of exchanging a functional group, it is preferred that $W^1$ and $W^2$ in Formula (1-3) are the same as or different from each other and are a halogen atom, an alkyl sulfonate group, an aryl sulfonate group, an arylalkyl sulfonate group, a boric acid ester residue, a boronic acid residue, or an organotin residue.

Although when $W^1$ and $W^2$ are a hydrogen atom, as the method for converting $W^1$ and $W^2$ into a bromine atom, a publicly known method can be used. Examples of the method may include a method of contacting a compound represented by Formula (1-3) in which $W^1$ and $W^2$ are a hydrogen atom with bromine or N-bromosuccinimide (NBS) to brominate the compound represented by Formula (1-3). Although the conditions for the bromination can optionally be set, for example, a method of reacting the compound with NBS in a solvent is desired since it exhibits a high brominaion rate and high selectivity of the position into which a bromine atom is introduced. Examples of the solvent used in this case may include N,N-dimethylformamide, chloroform, methylene chloride, and carbon tetrachloride. The reaction time is generally around 1 minute to 10 hours and the reaction temperature is generally around −50 to 50° C. The used amount of bromine is preferably around 1 to 5 moles relative to 1 mole of a compound represented by Formula (1-3) in which $W^1$ and $W^2$ are a hydrogen atom. After the reaction, for example, ordinary post-treatment is carried out including, for example, extraction of the product with an organic solvent and evaporation of the solvent after termination of the reaction by adding water. By the treatment, a compound represented by Formula (1-3) in which $W^1$ and $W^2$ are a bromine atom can be obtained. The isolation and the purification of the product can be performed by a method such as preparative isolation by chromatography and recrystallization.

One characteristic of the macromolecular compound of the present invention is to have a light absorbing terminal wavelength of 700 nm or more. The light absorbing terminal wavelength in the present invention means a value measured by the following method.

For the measurement, a spectrophotometer operating in wavelength regions of ultraviolet, visible, and near-infrared (for example, an ultraviolet-visible-near infrared spectrophotometer: JASCO-V670; manufactured by JASCO Corporation) is used. When JASCO-V670 is used, a range of measurable wavelength thereof is 200 to 1,500 nm. Therefore, the measurement is performed in this wavelength region. First, an absorption spectrum of a substrate used for the measurement is measured. The substrate such as a quartz substrate or a glass substrate is used. Next, on the substrate, a thin film comprising a first compound is formed from a solution containing the first compound or a melt containing the first compound. In the film formation from the solution, drying is performed after the film formation. Then, an absorption spectrum of the layered body of the thin film and the substrate is measured. The difference between the absorption spectrum of the layered body of the thin film and the substrate and the absorption spectrum of the substrate is obtained as the absorption spectrum of the thin film.

In the absorption spectrum of the thin film, the absorbance of the first compound is assigned on the ordinate axis and the wavelength is assigned on the abscissa axis. It is desired to control the film thickness of the thin film so that absorbance of the largest absorption peak becomes around 0.5 to 2. The absorbance of an absorption peak at the longest wavelength among absorption peaks is assumed to be 100%, and an intersection point of the absorption peak with a line parallel to the abscissa axis (wavelength axis) that passes through 50% of the absorbance, the intersection point being in a longer wavelength side than a peak wavelength of the absorption peak, is assumed to be a first point. An intersection point of the absorption peak with a line parallel to the wavelength axis that passes through 25% of the absorbance, the intersection point being in a longer wavelength side than a peak wavelength of the absorption peak, is assumed to be a second point. A wavelength for an intersection point of a line connecting the first point and the second point with the following standard line is defined as the light absorbing terminal wavelength. Here, the standard line refers to a line connecting a third point with a fourth point, which are defined as follows: the third point refers to a point on the absorption spectrum at a wavelength longer by 100 nm than the following standard wavelength; the fourth point refers to a point on the absorption spectrum at a wavelength longer by 150 nm than the following standard wavelength; and the standard wavelength refers to, when the absorbance of the absorption peak at the longest wavelength is assumed to be 100%, a wavelength for an intersection point of the absorption peak with a line parallel to the wavelength axis that passes through 10% of the absorbance, the intersection point being in a longer wavelength side than a peak wavelength of the absorption peak.

A macromolecular compound consisting of the repeated unit (A) and the repeated unit (B) that is the macromolecular compound described in the Patent Literature 1 had a light absorbing terminal wavelength of less than 700 nm.

From the viewpoint of making the light absorbing terminal wavelength a longer wavelength, the macromolecular compound of the present invention preferably contains a structural unit represented by Formula (A-1) to Formula (E-1), in addition to the structural unit represented by Formula (1). By having a structural unit represented by Formula (A-1) to Formula (E-1), a band gap between HOMO and LUMO of the compound becomes narrow, so that the light absorbing terminal wavelength becomes a longer wavelength.

Among the structural units represented by Formula (A-1) to Formula (E-1), from the viewpoint of making the light absorbing terminal wavelength a longer wavelength, a structural unit represented by Formula (A-1) is preferred and a structural unit represented by Formula (A-2) is more preferred. Among them, groups represented by Formula (511), Formula (523), and Formula (528) are further preferred and groups represented by Formula (511) and Formula (528) are particularly preferred. A ratio constituted by a structural unit different from the structural unit represented by Formula (1) in the macromolecular compound of the present invention is preferably 10% by weight (wt) or more and less than 90 wt %.

From the viewpoint of making the light absorbing terminal wavelength of the macromolecular compound of the present invention a longer wavelength, among the structural units represented by Formula (1), structural units represented by Formula (301), Formula (306), Formula (307), Formula (310), Formula (312), Formula (318), and Formula (362) are preferred; structural units represented by Formula (301), Formula (318), and Formula (362) are further preferred; and structural units represented by Formula (301) and Formula (362) are particularly preferred. A ratio constituted by the structural unit represented by Formula (1) in the macromolecular compound of the present invention is preferably 10% by weight or more and less than 90% by weight.

From the viewpoint of making the light absorbing terminal wavelength of the macromolecular compound of the present invention a longer wavelength, the macromolecular compound of the present invention preferably has a structural unit represented by Formula (701) to Formula (708).

[Chemical Formula 55]

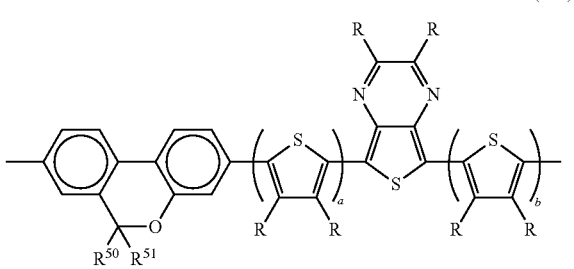

(701)

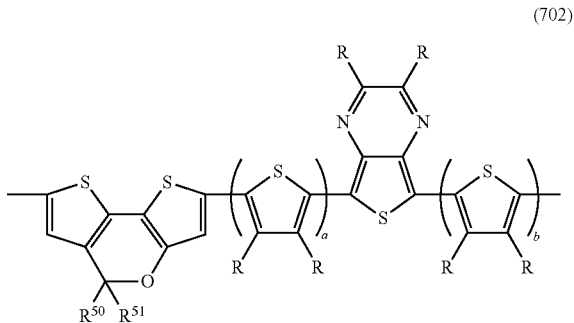

(702)

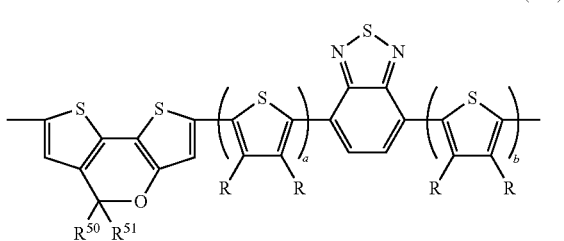

(703)

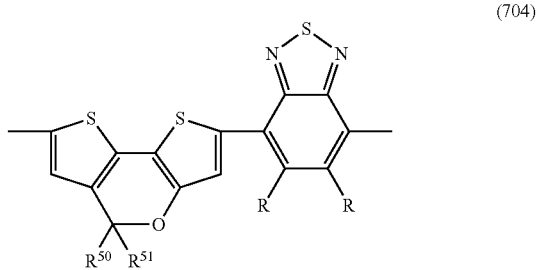

(704)

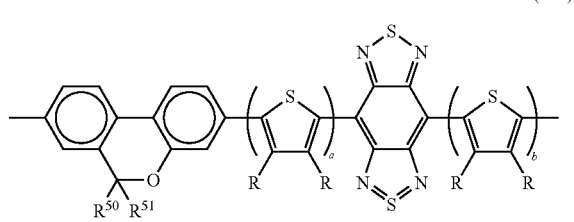

(705)

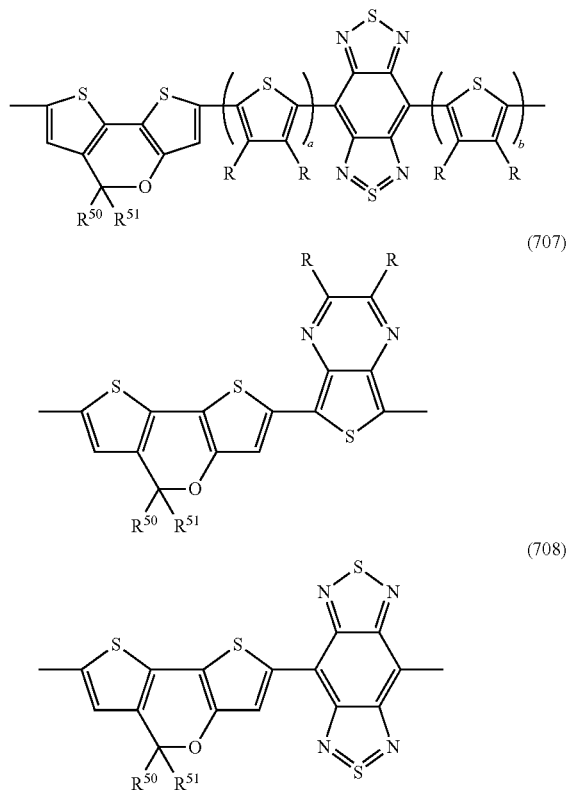

In Formulae (701) to (708), $R^{50}$, $R^{51}$, R, a, and b represent the same as defined above.

The macromolecular compound of the present invention can exhibit high electron and/or hole transport properties. Therefore, the macromolecular compound of the present invention can transport electrons or holes injected from an electrode or charges generated by light absorption, when an organic thin film containing the compound is used in a cell, a device or an element. Taking advantage of these properties, the macromolecular compound of the present invention can suitably be used in various cells, devices or elements such as a photovoltaic device, an organic thin film transistor, and an organic electroluminescent device. Hereinafter, these cells, devices or elements are individually described.

<Photovoltaic Device>

A photovoltaic device having the macromolecular compound of the present invention has one or more activated layer(s) containing the macromolecular compound of the present invention between a pair of electrodes at least one of which is transparent or translucent.

A preferred form of the photovoltaic device having the macromolecular compound of the present invention has a pair of electrodes at least one of which is transparent or translucent and an activated layer formed from an organic composition of a p-type organic semiconductor and an n-type organic semiconductor. The macromolecular compound of the present invention is preferably used as a p-type organic semiconductor. The action mechanism of the photovoltaic device in this form is described. A light energy entering through a transparent or translucent electrode is absorbed by an electron acceptor compound (n-type organic semiconductor) such as fullerene derivatives and/or an electron donor compound (p-type organic semiconductor) such as the macromolecular compound of the present invention to generate an exciton in which an electron and a hole are bonded with each other. When the generated exciton moves and reaches a heterojunction interface where an electron acceptor compound and an electron donor compound are adjacent to each other, due to the difference of an HOMO energy and a LUMO energy of the electron acceptor compound and the electron donor compound at the interface, an electron and a hole are separated to generate electric charges (an electron and a hole) that can independently move. Each of the generated electric charges moves to an electrode to become able to be taken out as an electric energy (current) to the outside.

The photovoltaic device produced using the macromolecular compound of the present invention is generally formed on a substrate. This substrate may be a substrate that does not chemically changed when an electrode and an organic layer is formed on the substrate. Examples of the material for the substrate may include a glass, a plastic, a macromolecule film, and silicon. When the substrate is opaque, it is preferred that an opposite electrode (that is, an electrode more distant from the substrate) is transparent or translucent.

Another aspect of the photovoltaic device having the macromolecular compound of the present invention is a photovoltaic device containing, between a pair of electrodes at least one of which is transparent or translucent, a first activated layer containing the macromolecular compound of the present invention and a second activated layer adjacent to the first activated layer that contains an electron acceptor compound such as fullerene derivatives.

Examples of the transparent or translucent electrode material may include a conductive metal oxide film and a translucent metal thin film. Specifically, a film produced using a conductive material such as indium oxide, zinc oxide, tin oxide, and a complex thereof such as indium-tin-oxide (ITO) and indium-zinc-oxide, NESA, gold, platinum, silver, copper and the like are used, and among them, ITO, indium-zinc-oxide, and tin oxide are preferred. Examples of the production method of the electrode may include a vacuum deposition method, a sputtering method, an ion plating method, and a plating method. As the electrode material, an organic transparent conductive film of a polyaniline or a derivative thereof, a polythiophene or a derivative thereof or the like may also be used.

One of the electrodes may be not transparent, and as the material for this electrode, a metal, a conductive macromolecule or the like may be used. Specific examples of the electrode material may include a metal such as lithium, sodium, potassium, rubidium, cesium, magnesium, calcium, strontium, barium, aluminum, scandium, vanadium, zinc, yttrium, indium, cerium, samarium, europium, terbium, and ytterbium; an alloy of two or more types of these metals; an alloy of one or more type(s) of these metals with one or more type(s) of metal selected from the group consisting of gold, silver, platinum, copper, manganese, titanium, cobalt, nickel, tungsten, and tin; graphite; a graphite intercalation compound; a polyaniline and a derivative thereof; and a polythiophene and a derivative thereof. Examples of the alloy may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

As a means for enhancing the photoelectric conversion efficiency, an additional intermediate layer other than the activated layer may also be used. Examples of the material used for the intermediate layer may include a halide of an alkali metal or an alkaline earth metal such as lithium fluoride, an oxide such as titanium oxide, and PEDOT (poly-3,4-ethylenedioxythiophene).

<Activated Layer>

The activated layer may contain one type of the macromolecular compounds of the present invention individually or in a combination of two or more types of the macromolecular compounds of the present invention. For enhancing the hole transport property of the activated layer, as the electron donor compound and/or the electron acceptor compound, a compound other than the macromolecular compound of the present invention may be blended in the activated layer to be used. Here, the electron donor compound and the electron acceptor compound are relatively determined from the energy level of energy order of these compounds.

Examples of the electron donor compound may include, in addition to the macromolecular compound of the present invention, a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having an aromatic amine residue in a side chain or main chain, polyaniline and a derivative thereof, polythiophene and a derivative thereof, polypyrrole and a derivative thereof, polyphenylenevinylene and a derivative thereof, and polythienylenevinylene and a derivative thereof.

Examples of the electron acceptor compound may include, in addition to the macromolecular compound of the present invention, a carbon material, a metal oxide such as titanium oxide, an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, metal complexes of 8-hydroxyquinoline and a derivative thereof, polyquinoline and a derivative thereof, polyquinoxaline and a derivative thereof, polyfluorene and a derivative thereof, a phenanthroline derivative such as 2,9-dimethyl-4,7-diphenyl-1,10-phenanthroline (bathocuproine), fullerene, and a fullerene derivative, and among them, preferred are titanium oxide, a carbon nanotube, fullerene, and a fullerene derivative, particularly preferred are fullerene and a fullerene derivative.

Examples of fullerene and a fullerene derivative may include $C_{60}$, $C_{70}$, $C_{76}$, $C_{78}$, $C_{84}$, and a derivative thereof. A fullerene derivative refers to a compound having a substituent.

Examples of the fullerene derivative may include a compound represented by Formula (13), a compound represented by Formula (14), a compound represented by Formula (15), and a compound represented by Formula (16).

[Chemical Formula 56]

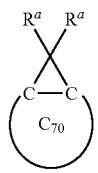

(13)

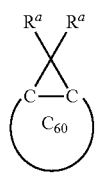

(14)

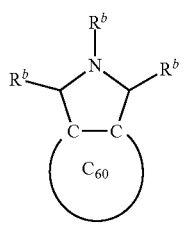

(15)

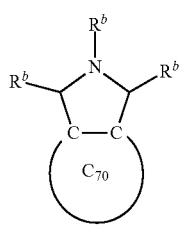

(16)

In Formulae (13) to (16), $R^a$ is an alkyl group, an aryl group, a heteroaryl group, or a group having an ester structure wherein a plurality of $R^a$s may be the same as or different from each other; and $R^b$ represents an alkyl group or an aryl group wherein a plurality of $R^b$s may be the same as or different from each other.

The definitions and specific examples of the alkyl group and the aryl group represented by $R^a$ and $R^b$ are the same as the definitions and specific examples of the alkyl group and the aryl group represented by $R^3$.

The heteroaryl group represented by $R^a$ generally has 3 to 60 carbon atoms and examples thereof may include a thienyl group, a pyrrolyl group, a furyl group, a pyridyl group, a quinolyl group, and an isoquinolyl group.

Examples of the group having an ester structure represented by $R^a$ may include a group represented by Formula (17).

[Chemical Formula 57]

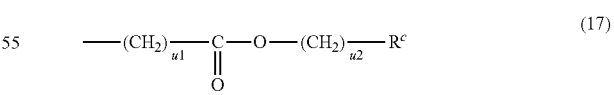

(17)

In the above Formula, u1 represents an integer of 1 to 6; u2 represents an integer of 0 to 6; and $R^c$ represents an alkyl group, an aryl group, or a heteroaryl group.

The definitions and specific examples of the alkyl group, the aryl group, and the heteroaryl group represented by $R^c$ are the same as the definitions and specific examples of the alkyl group, the aryl group, and the heteroaryl group represented by $R^a$.

Specific examples of the $C_{60}$ fullerene derivative may include the following compounds.
[Chemical Formula 58]
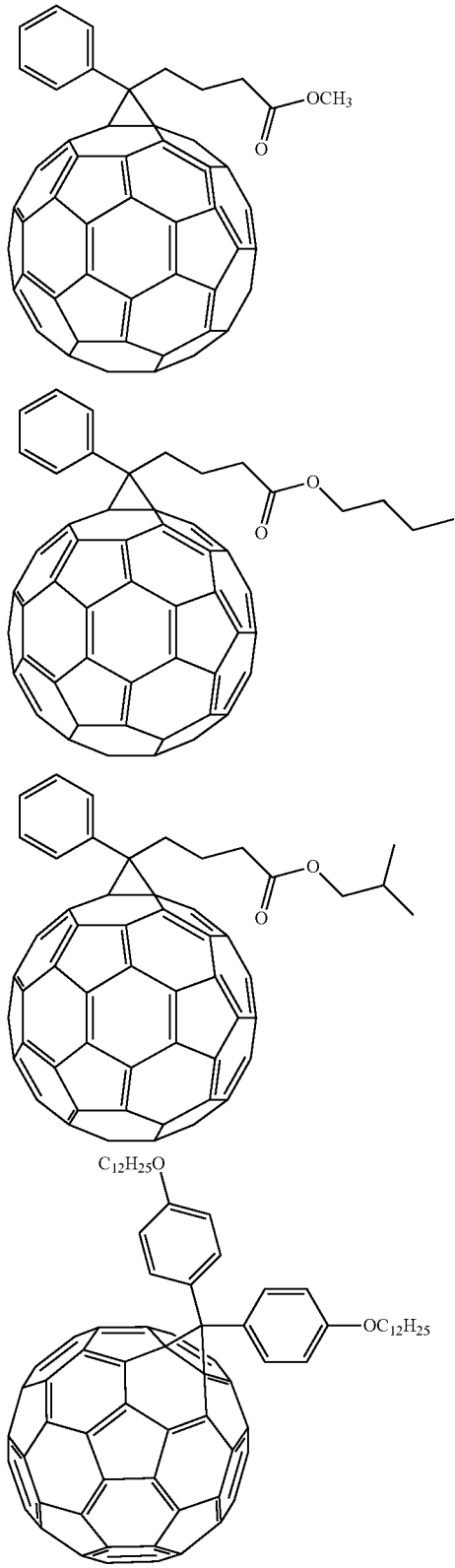
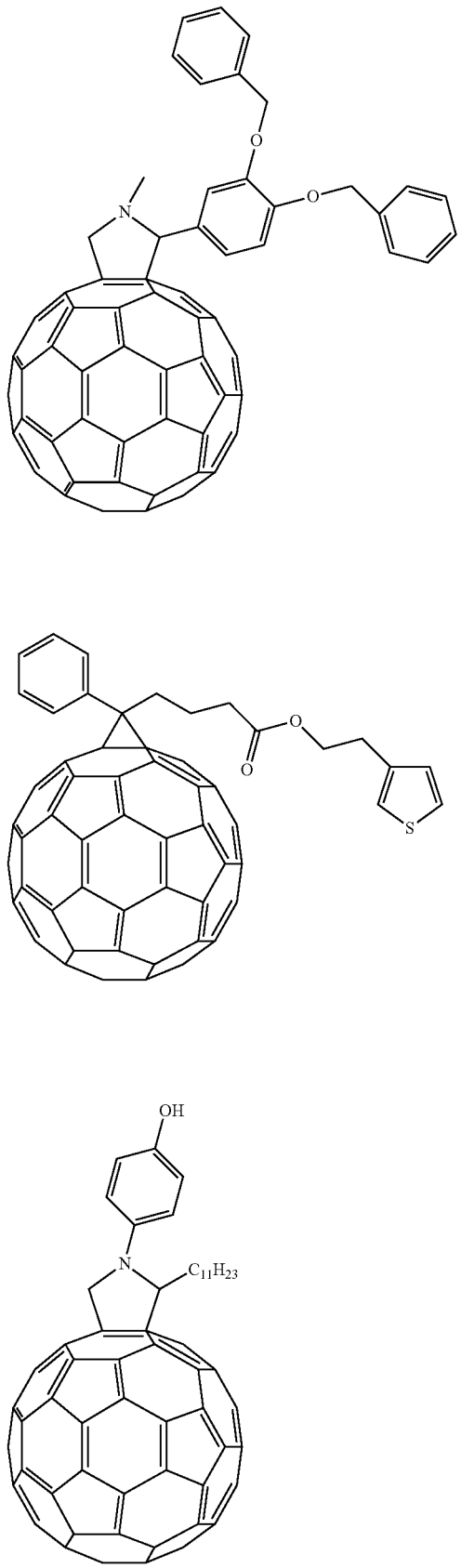

Specific examples of the $C_{70}$ derivative may include the following compounds.

[Chemical Formula 59]

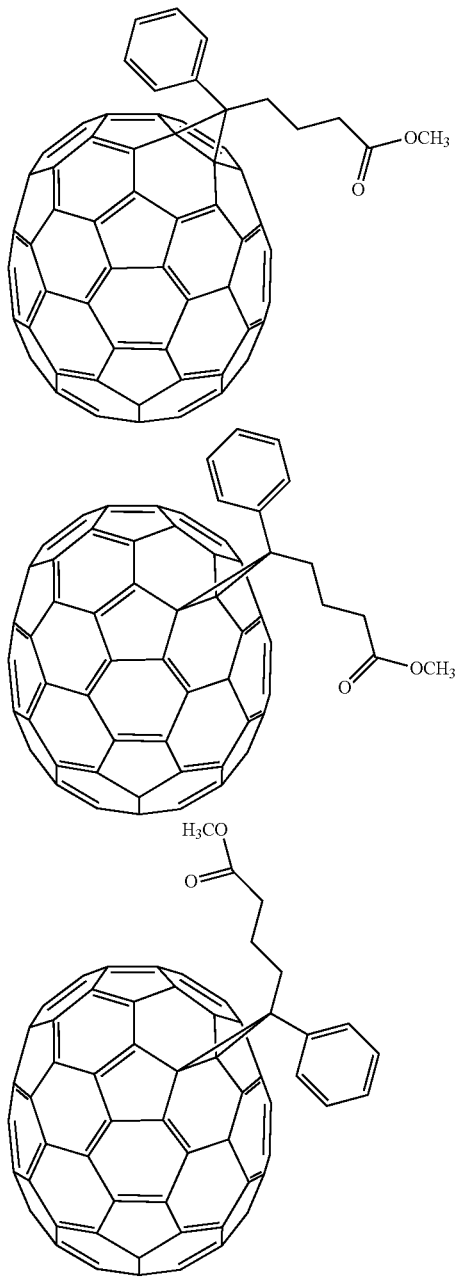

In addition, examples of the fullerene derivative may include [6,6]-phenyl C61 butyric acid methyl ester (C60 PCBM), [6,6]-phenyl C71 butyric acid methyl ester (C70 PCBM), [6,6]-phenyl C85 butyric acid methyl ester (C84 PCBM), and [6,6]-thienyl C61 butyric acid methyl ester.

When the macromolecular compound of the present invention and the fullerene derivative are contained in the activated layer, the ratio of the fullerene derivative is preferably 10 to 1,000 parts by weight, more preferably 20 to 500 parts by weight, relative to 100 parts by weight of the macromolecular compound of the present invention.

The activated layer generally has a thickness of preferably 1 nm to 100 μm, more preferably 2 nm to 1,000 nm, further preferably 5 nm to 500 nm, more preferably 20 nm to 200 nm.

The production method of the activated layer may be any production method and examples thereof may include a film forming method from a solution containing the macromolecular compound and a film forming method by a vacuum deposition method.

<Production Method of Photovoltaic Device>

A preferred production method of a photovoltaic device is a production method of a device having a first electrode and a second electrode and having an activated layer between the first electrode and the second electrode, which has a process of applying a solution (ink) containing the macromolecular compound of the present invention and a solvent on the first electrode by a coating method to form an activated layer and a process of forming the second electrode on the activated layer.

The solvent used for the film formation from the solution may be any solvent so long as the solvent dissolves the macromolecular compound of the present invention. Examples of the solvent may include an unsaturated hydrocarbon solvent such as toluene, xylene, mesitylene, tetralin, decalin, bicyclohexyl, n-butylbenzene, sec-butylbenzene, and tert-butylbenzene; a halogenated saturated hydrocarbon solvent such as carbon tetrachloride, chloroform, dichloromethane, dichloroethane, chlorobutane, bromobutane, chloropentane, bromopentane, chlorohexane, bromohexane, chlorocyclohexane, and bromocyclohexane; a halogenated unsaturated hydrocarbon solvent such as chlorobenzene, dichlorobenzene, and trichlorobenzene; and an ether solvent such as tetrahydrofuran and tetrahydropyran. The macromolecular compound of the present invention can generally be dissolved in these solvents in a concentration of 0.1% by weight or more.

When the film formation is performed using the solution, examples of the coating method applicable to the film formation may include a slit coating method, a knife coating method, a spin coating method, a casting method, a micro gravure coating method, a gravure coating method, a bar coating method, a roll coating method, a wire bar coating method, a dip coating method, a spray coating method, a screen printing method, a gravure printing method, a flexo printing method, an offset printing method, an inkjet coating method, a dispenser printing method, a nozzle coating method, and a capillary coating method, and among them, preferred are a slit coating method, a capillary coating method, a gravure coating method, a micro gravure coating method, a bar coating method, a knife coating method, a nozzle coating method, an inkjet coating method, and a spin coating method.

From the viewpoint of film forming property, the surface tension of the solvent at 25° C. is preferably more than 15 mN/m, more preferably more than 15 mN/m and less than 100 mN/m, further preferably more than 25 mN/m and less than 60 mN/m.

The macromolecular compound of the present invention can also be used in an organic thin film transistor. Examples of the organic thin film transistor may include an organic thin film transistor having a constitution containing a source electrode and a drain electrode, an organic semiconductor layer (activated layer) acting as a current path between these electrodes, and a gate electrode for controlling a current amount passing through the current path, in which the organic semiconductor layer comprises the above-described organic thin film. Examples of such an organic thin film transistor may include an electric field effect-type organic thin film transistor and an electrostatic induction-type organic thin film transistor.

The electric field effect-type organic thin film transistor preferably comprises a source electrode and a drain electrode, an organic semiconductor layer (activated layer) acting as a current path between these electrodes, a gate electrode for controlling a current amount passing through the current path, and an insulating layer disposed between the organic semiconductor layer and the gate electrode. Particularly, it is preferred that the source electrode and the drain electrode are provided as contacted with the organic semiconductor layer (activated layer), and further, the gate electrode is provided as sandwiching the insulating layer contacted with the organic semiconductor layer. In the electric field effect-type organic thin film transistor, the organic semiconductor layer comprises an organic thin film containing the macromolecular compound of the present invention.

The electrostatic induction-type organic thin film transistor has a source electrode and a drain electrode, an organic semiconductor layer (activated layer) acting as a current path between these electrodes, and a gate electrode for controlling a current amount passing through the current path, and the gate electrode is preferably provided in the organic semiconductor layer. Particularly, it is preferred the source electrode, the drain electrode, and the gate electrode provided in the organic semiconductor layer are provided as contacted with the organic semiconductor layer. Here, the structure of the gate electrode may be a structure by which a current path through which the current passes from the source electrode to the drain electrode is formed and the amount of the current passing through the current path can be controlled by a voltage applied to the gate electrode, and examples thereof may include an interdigitated electrode. Also in the electrostatic induction-type organic thin film transistor, the organic semiconductor layer comprises an organic thin film containing the macromolecular compound of the present invention.

<Use of Device>

By irradiating the photovoltaic device using the macromolecular compound of the present invention with a light such as a solar light from the transparent or translucent electrode, a photoelectromotive force is generated between the electrodes, so that the photovoltaic device can act as an organic thin film solar cell. By integrating a plurality of organic thin film solar cells, the photovoltaic device can also be used as an organic thin film solar cell module.

By irradiating the photovoltaic device with a light from the transparent or translucent electrode in a state in which a voltage is applied to between the electrodes or in a state in which a voltage is not applied, a photocurrent is flowed, so that the photovoltaic device can act as an organic optical sensor. By integrating a plurality of organic optical sensors, the photovoltaic device can also be used as an organic image sensor.

The above organic thin film transistor can be used as a pixel driving element used for controlling the pixel of, for example, an electrophoresis display, a liquid crystal display, or an organic electroluminescent display or for controlling homogeneity of the screen brightness or a screen rewrite speed.

<Solar Cell Module>

The organic thin film solar cell can fundamentally take the same module structure as that of a conventional solar cell module. The solar cell module generally takes a structure in which a cell is provided on a supporting substrate such as a metal and a ceramic, and the cell is covered with filling resin, protective glass or the like to take in light from an opposite side of the supporting substrate. However, such a structure is also possible that a transparent material such as a toughened glass is used as the supporting substrate, and on the supporting substrate, a cell is provided to take in light from the side of the transparent supporting substrate. Specific known examples of such a structure may include a module structure called a superstrate type, a substrate type, or a potting type, and a substrate built-in-type module structure used in an amorphous silicon solar cell or the like. The organic thin film solar cell produced using the macromolecular compound of the present invention can also accordingly select these module structures according to the intended purpose, the using space, and the environment.

A representative module of the superstrate type or the substrate type has a structure in which: cells are provided at a constant interval between supporting substrates that are transparent in one side or both sides thereof and have been subjected to reflection preventing treatment; adjacent cells are connected with each other by a metal lead, a flexible wiring or the like; and in an outer edge part, a power-collecting electrode is provided to take out a generated electric power to the outside. Between the substrate and the cell, various plastic materials such as ethylenevinyl acetate (EVA) may be used in a shape of a film or a filling resin according to the purpose for protecting the cell or enhancing the power-collecting efficiency. When the module is used at a position at which the surface of the module is not necessary to be coated with a hard material (for example, a position at which an impact from the outside is small), it is possible to compose the surface protecting layer with a transparent plastic film or to cure the above filling resin to impart a protecting function, for the purpose of omitting a supporting substrate on one side. The periphery of the supporting substrate is fixed by a metal frame in a sandwich-shape for securing the sealing of the inside and the rigidity of the module and between the supporting substrate and the frame is hermetically sealed with a sealing material. When a flexible material is used for the cell itself, the supporting substrate, the filling material, and the sealing material, a solar cell can also be provided on a curved surface. In the case of a solar cell using a flexible supporter such as a polymer film, a cell main body can be produced by forming cells sequentially while letting out the supporter in a roll-shape, cutting the supporter in a desired size, and then sealing the penumbra of the supporter with a moisture-resistant flexible material. In addition, there can also be prepared a module structure called "SCAF" described in "Solar Energy Materials and Solar Cells, 48, pp. 383-391." Furthermore, a solar cell using a flexible supporter can also be adhered and fixed on a curved surface glass or the like to be used.

The macromolecular compound of the present invention can also be used in an organic electroluminescent device (organic EL device). The organic EL device has a light-emitting layer between a pair of electrodes at least one of which is transparent or translucent. The organic EL device may contain a hole transport layer and an electron transport layer in addition to the light-emitting layer. In any one layer of the light-emitting layer, the hole transport layer, and the electron transport layer, the macromolecular compound of the present invention is contained. The light-emitting layer may contain an electric charge transport material (which means a general term for the electron transport material and the hole transport material) in addition to the macromolecular compound of the present invention. Examples of the organic EL device may include an device having an anode, a light-emitting layer, and a cathode; an device having an anode, a light-emitting layer, an electron transport layer, and a cathode in which the anode further has an electron transport layer containing an electron transport material and is provided between the cathode and the light-emitting layer and adjacent to the light-emitting layer; an device having an anode, a hole transport layer, a light-emitting layer, and a cathode in which the anode further has a hole transport layer containing a hole transport material and is provided between the anode and the light-emitting layer and adjacent to the light-emitting layer; and an device having an anode, a hole transport layer, a light-emitting layer, an electron transport layer, and a cathode.

EXAMPLES

Hereinafter, Examples will be described for further explaining the present invention in detail. However, the present invention is not limited to the following Examples.

(NMR Measurement)

The NMR measurement was performed by dissolving an objective compound in deuterated chloroform and using an NMR apparatus (manufactured by Varian Inc.; INOVA 300).

(Measurement of Number Average Molecular Weight and Weight-Average Molecular Weight)

As the number average molecular weight and the weight-average molecular weight, a number average molecular weight and a weight-average molecular weight in terms of polystyrene were measured by gel permeation chromatography (GPC) (manufactured by Shimadzu Corporation; trade name: LC-10Avp). The macromolecular compound to be measured was dissolved in tetrahydrofuran so that the concentration of the macromolecular compound became about 0.5% by weight and 30 μL of the resultant solution was injected into GPC. As the mobile phase of GPC, tetrahydrofuran was used and the mobile phase was flowed at a flow rate of 0.6 mL/min. As the column, two TSKgel SuperHM-H (manufactured by Tosoh Corporation) and one TSKgel SuperH2000 (manufactured by Tosoh Corporation) were connected in series. As the detector, a differential refractive index detector (manufactured by Shimadzu Corporation; trade name: RID-10A) was used.

Reference Example 1

Synthesis of Compound 1

[Chemical Formula 60]

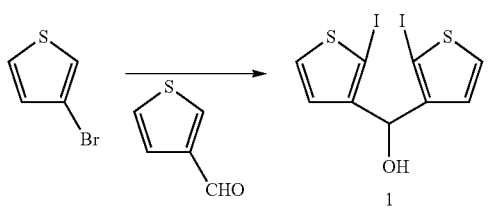

Into a 1,000 mL four-neck flask in which a gas in the flask was replaced by argon, 13.0 g (80.0 mmol) of 3-bromothiophene and 80 mL of diethyl ether were charged to prepare a homogeneous solution. While maintaining the solution at −78° C., 31 mL (80.6 mmol) of solution of n-butyl lithium (n-BuLi) (2.6 M) in hexane was dropped into the solution. At −78° C., the reaction was carried out for 2 hours and then, into the resultant reaction mixture, a solution in which 8.96 g (80.0 mmol) of 3-thiophenealdehyde was dissolved in 20 mL of diethyl ether was dropped. After the dropping, the resultant reaction mixture was stirred at −78° C. for 30 minutes and further at room temperature (25° C.) for 30 minutes. The reaction solution was cooled again to −78° C. and into the reaction solution, 62 mL (161 mmol) of solution of n-BuLi (2.6 M) in hexane was dropped over 15 minutes. After the dropping, the reaction solution was stirred at −25° C. for 2 hours and further at room temperature (25° C.) for 1 hour. Then, the reaction solution was cooled to −25° C. and into the reaction solution, a solution in which 60 g (236 mmol) of iodine was dissolved in 1,000 mL of diethyl ether was dropped over 30 minutes. After the dropping, the reaction mixture was stirred at room temperature (25° C.) for 2 hours and to the reaction mixture, 50 mL of 1N sodium thiosulfate aqueous solution was added to terminate the reaction. The reaction product was extracted with diethyl ether, was then dried over magnesium sulfate, and was filtered. The filtrate was then concentrated to obtain 35 g of crude product. The crude product was purified by recrystallization with chloroform to obtain 28 g of compound 1.

Reference Example 2

Synthesis of Compound 2

[Chemical Formula 61]

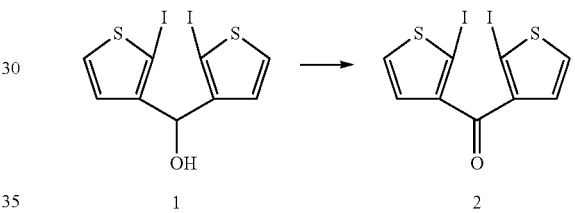

Into a 300 mL four-neck flask, 10.5 g (23.4 mmol) of bisiodothienyl methanol (compound 1) and 150 mL of methylene chloride were charged to prepare a homogeneous solution. To the solution, 7.50 g (34.8 mmol) of pyridinium chlorochromate was added and the resultant reaction mixture was stirred at room temperature (25° C.) for 10 hours. The reaction solution was filtered to remove insoluble matters and then the filtrate was concentrated to obtain 10.0 g (22.4 mmol) of compound 2.

Reference Example 3

Synthesis of Compound 3

[Chemical Formula 62]

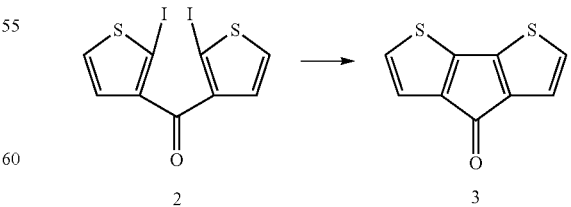

Into a 300 mL flask in which a gas in the flask was replaced by argon, 10.0 g (22.4 mmol) of the compound 2, 6.0 g (94.5 mmol) of copper powder, and 120 mL of anhydrous N,N-dimethylformamide (hereinafter, which may be called DMF)

were charged and the resultant reaction mixture was stirred at 120° C. for 4 hours. After the reaction, the flask was cooled to room temperature (25° C.) and the reaction solution was passed through a silica gel column to remove insoluble components. Then, 500 mL of water was added to the reaction mixture and the reaction product was extracted with chloroform. The oil phase that was a chloroform solution was dried over magnesium sulfate and the oil phase was filtered, followed by concentrating the filtrate to obtain crude product. The composition was purified by a silica gel column (developing solution: chloroform) to obtain 3.26 g of compound 3. The operations up to here were repeated by a plurality of times.

Reference Example 4

Synthesis of Compound 4

[Chemical Formula 63]

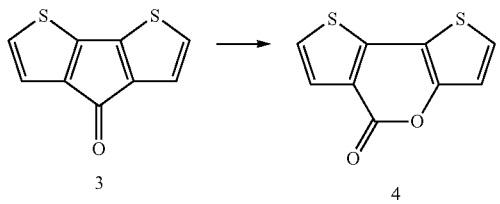

3 → 4

Into a 300 mL four-neck flask equipped with a mechanical stirrer in which a gas in the flask was replaced by argon, 3.85 g (20.0 mmol) of the compound 3, 50 mL of chloroform, and 50 mL of trifluoroacetic acid were charged to prepare a homogeneous solution. To the solution, 5.99 g (60 mmol) of sodium perborate monohydrate was added and the resultant reaction mixture was stirred at room temperature (25° C.) for 45 minutes. Then, to the reaction mixture, 200 mL of water was added and the reaction product was extracted with chloroform, followed by passing the organic phase that was a chloroform solution through a silica gel column and evaporating the solvent of the filtrate using an evaporator. Using methanol, the residue was recrystallized to obtain 534 mg of compound 4.

$^1$H NMR in $CDCl_3$ (ppm): 7.64 (d, 1H), 7.43 (d, 1H), 7.27 (d, 1H), 7.10 (d, 1H)

Reference Example 5

Synthesis of Compound 5

[Chemical Formula 64]

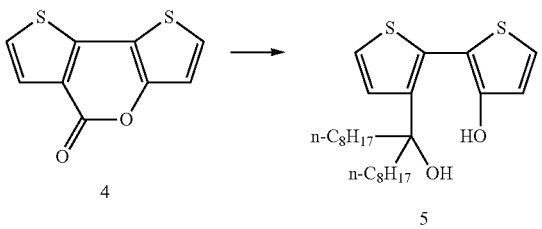

4 → 5

Into a 200 mL four-neck flask in which a gas in the flask was replaced by argon, 534 mg (2.56 mmol) of the compound 4 and 25 mL of anhydrous tetrahydrofuran (THF) were charged to prepare a homogeneous solution. The solution was cooled to −20° C. and to the solution, 10.3 mL (10.3 mmol) of solution of n-octylmagnesium bromide (1 M) in THF was added. Then, the temperature of the resultant reaction mixture was elevated to room temperature (25° C.) and the reaction mixture was stirred at room temperature (25° C.) for 1.5 hours. Then, to the reaction mixture, 50 mL of water was added to terminate the reaction and the reaction product was extracted with ethyl acetate. The organic phase that was an ethyl acetate solution was dried over sodium sulfate and then the ethyl acetate solution was passed through a silica gel column, followed by evaporating the solvent of the filtrate to obtain 433 mg of compound 5.

$^1$H NMR in $CDCl_3$ (ppm): 7.24 (d, 1H), 7.19 (d, 1H), 6.98 (d, 1H), 6.76 (d, 1H), 1.79 (b, 4H), 1.32 (b, 24H), 0.86 (s, 6H)

Reference Example 6

Synthesis of Compound 6

[Chemical Formula 65]

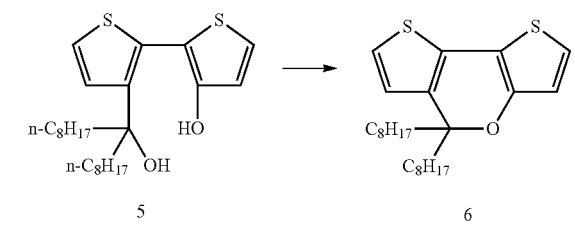

5 → 6

Into a 200 mL flask in which a gas in the flask was replaced by argon, 433 mg (0.992 mmol) of the compound 5 and 15 mL of toluene were charged to prepare a homogeneous solution. To the solution, 57 mg of sodium p-toluenesulfonate monohydrate was added and the resultant reaction mixture was stirred at 100° C. for 4 hours. The reaction solution was cooled to room temperature (25° C.) and then to the reaction solution, 50 mL of water was added, followed by extracting the reaction product with toluene. The organic phase that was a toluene solution was dried over sodium sulfate and was filtered, and then the solvent was evaporated. The resultant crude product was purified by a silica gel column (solvent: hexane) to obtain 389 mg of compound 6 (yield: 93.7%).

$^1$H NMR in $CDCl_3$ (ppm): 6.99 (d, 1H), 6.94 (d, 1H), 6.69 (d, 1H), 6.60 (d, 1H), 1.80 (b, 4H), 1.32 (b, 24H), 0.86 (s, 6H)

Reference Example 7

Synthesis of Compound 7

[Chemical Formula 66]

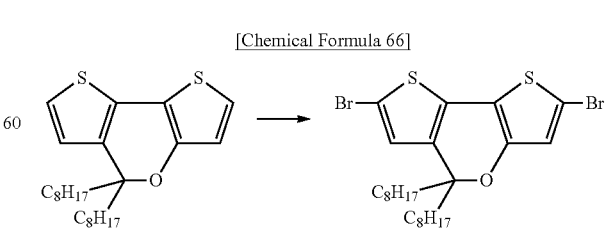

6 → 7

Into a 200 mL flask in which a gas in the flask was replaced by argon, 389 mg (0.929 mmol) of the compound 6 and 12 mL of anhydrous DMF were charged to prepare a homogeneous solution. The solution was maintained at −20° C. and to the solution, 339 mg (1.90 mmol) of N-bromosuccinimide (hereinafter, which may be called NBS) was added. The reaction was carried out at −20° C. for 3 hours and then, carried out at 0° C. for 1 hour. After the reaction, to the reaction mixture, 50 mL of 1N sodium thiosulfate aqueous solution was added to terminate the reaction and the reaction product was extracted with ether. The organic phase that was an ether solution was dried over magnesium sulfate and was filtered, and from the filtrate, the solvent was evaporated to obtain crude product. The crude product was purified by a silica gel column (solvent: hexane) to obtain 315 mg of compound 7 (yield: 58.9%).

$^1$H NMR in $CDCl_3$ (ppm): 6.65 (s, 1H), 6.63 (s, 1H), 1.81 (b, 4H), 1.33 (b, 24H), 0.87 (s, 6H)

Example 1

Synthesis of Polymer A

[Chemical Formula 67]

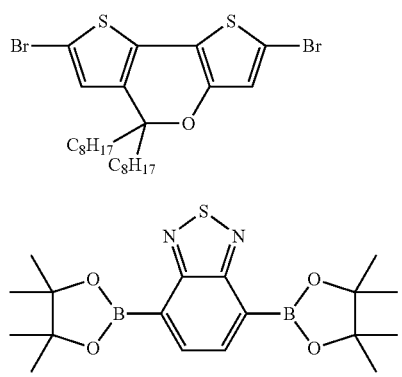

Into a 100 mL flask in which a gas in the flask was replaced by argon, 115.3 mg (0.200 mmol) of the compound 7, 77.6 mg (0.200 mmol) of compound 8 (4,7-bis(4,4,5,5-tetramethyl-1,3,2-dioxaborolan-2-yl)-2,1,3-benzothiadiazole) (manufactured by Aldrich Corp.), and 60.6 mg of methyltrialkylammonium chloride (trade name: Aliquat 336 (registered trademark); manufactured by Aldrich Corp.) were charged and the resultant reaction mixture was dissolved in 10 mL of toluene. The resultant toluene solution was bubbled with argon for 30 minutes. Then, to the toluene solution, 0.67 mg of palladium acetate, 3.7 mg of tris(2-methoxyphenyl)phosphine, and 2 mL of sodium carbonate aqueous solution (16.7% by weight) were added and the resultant reaction mixture was stirred at 100° C. for 1.5 hours. Then, to the reaction solution, 1 g of sodium diethyldithiocarbamate and 10 mL of water were added and the resultant reaction mixture was stirred under reflux for 2 hours. After the completion of the reaction, the reaction solution was cooled to around room temperature (25° C.) and then the resultant reaction solution was left stand still to recover the separated toluene phase. The toluene phase was washed with 10 mL of water twice, with 10 mL of 3% acetic acid water twice, and further with 10 mL of water twice and the resultant toluene phase was poured into methanol to recover precipitate. The precipitate was dried under reduced pressure and was then dissolved in chloroform. Next, the resultant chloroform solution was filtered to remove insoluble matters and was then passed through an alumina column to be purified. The resultant chloroform solution was concentrated under reduced pressure and was then poured into methanol to generate a precipitate and to recover the generated precipitate. The precipitate was washed with methanol and was then dried under reduced pressure to obtain 40 mg of polymer. Hereinafter, the polymer is called polymer A. For the polymer A, the weight-average molecular weight in terms of polystyrene was 17,000 and the number average molecular weight in terms of polystyrene was 5,000.

The light absorbing terminal wavelength of the polymer A was 925 nm.

Reference Example 8

Synthesis of Compound 5b

[Chemical Formula 68]

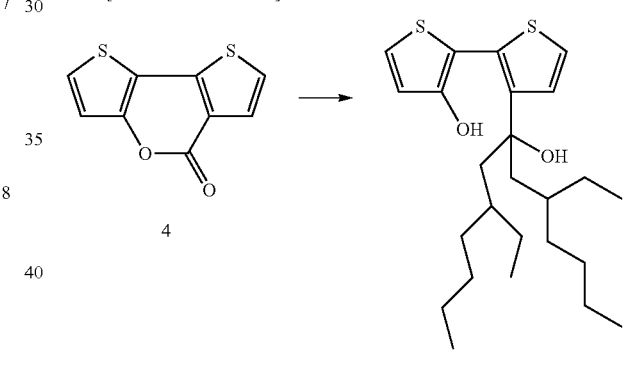

Into a 100 mL four-neck flask in which a gas in the flask was replaced by argon, 1.06 g (5.09 mmol) of the compound 4 and 30 mL of anhydrous THF were charged to prepare a homogeneous solution. While maintaining the flask at −20° C., 12.7 mL of solution of 2-ethylhexylmagnesium bromide (1 M) in ether was added to the solution. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was was stirred for 1.5 hours. Then, to the reaction mixture, water was added to terminate the reaction and the reaction product was extracted with ethyl acetate. The organic phase that was an ethyl acetate solution was dried over sodium sulfate and was filtered and then the ethyl acetate solution was passed through a silica gel column, followed by evaporating the solvent of the filtrate to obtain 1.28 g of compound 5b. The operations up to here were repeated by a plurality of times.

$^1$H NMR in CDCl$_3$ (ppm): 7.25 (d, 1H), 7.20 (d, 1H), 6.99 (d, 1H), 6.76 (d, 1H), 1.76 (s, 4H), 1.49 (b, 2H), 1.29-1.04 (m, 16H), 0.80 (s, 6H), 0.71 (s, 6H)

Reference Example 9

Synthesis of Compound 6b

[Chemical Formula 69]

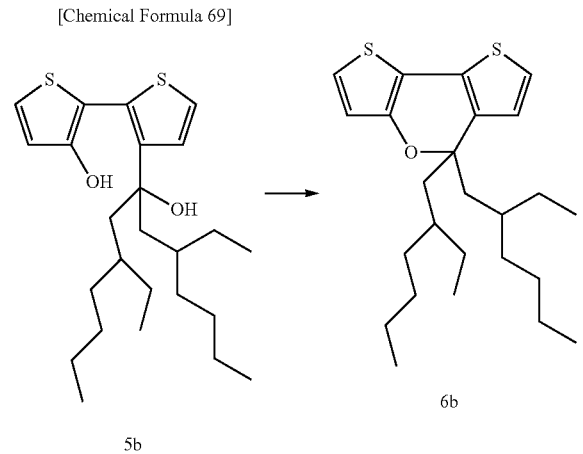

Into a 200 mL flask in which a gas in the flask was replaced by argon, 2.58 g of the compound 5b and 30 mL of toluene were charged to prepare a homogeneous solution. To the solution, 100 mg of sodium p-toluenesulfonate monohydrate was added and the resultant reaction mixture was stirred at 100° C. for 1.5 hours. The resultant reaction solution was cooled to room temperature (25° C.) and then to the reaction solution, 50 mL of water was added, followed by extracting the reaction product with toluene. The organic phase that was a toluene solution was dried over sodium sulfate and was filtered and then the solvent was evaporated. The resultant crude product was purified by a silica gel column (solvent: hexane) to obtain 741 mg of compound 6b.

$^1$H NMR in CDCl$_3$ (ppm): 6.98 (d, 1H), 6.93 (d, 1H), 6.68 (d, 1H), 6.59 (d, 1H), 1.78 (s, 4H), 1.50 (b, 2H), 1.30-1.05 (m, 16H), 0.81 (s, 6H), 0.72 (s, 6H)

Reference Example 10

Synthesis of Compound 7b

[Chemical Formula 70]

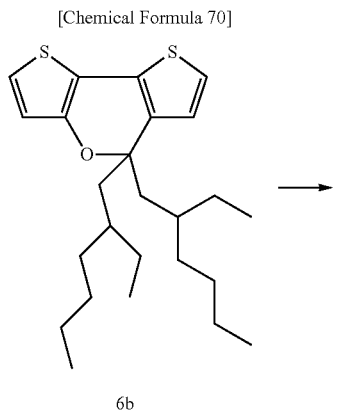

-continued

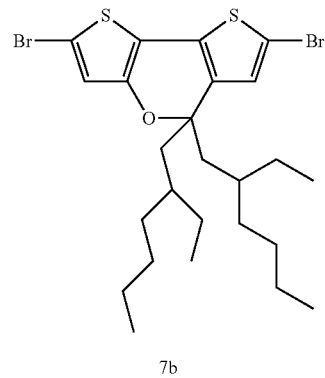

Into a 200 mL flask in which a gas in the flask was replaced by argon, 741 mg (1.77 mmol) of the compound 6b and 20 mL of anhydrous DMF were charged to prepare a homogeneous solution. While maintaining the solution at −30° C., to the solution, 646 mg (3.63 mmol) of NBS was added and the temperature of the resultant reaction mixture was elevated from −30° C. to −10° C. over 30 minutes. After the confirmation of the disappearance of the compound 6b by liquid chromatography (LC), water and sodium thiosulfate were added to the reaction mixture to terminate the reaction and the reaction product was extracted with ether. The organic phase that was an ether solution was washed with a saturated sodium chloride aqueous solution, was dried over magnesium sulfate, and was filtered and then the solvent was evaporated to obtain crude product. The crude product was purified by a silica gel column (solvent: hexane) to obtain 892 mg of compound 7b (yield: 87.4%).

$^1$H NMR in CDCl$_3$ (ppm): 6.63 (1H), 6.59 (1H), 1.74 (s, 4H), 1.50 (b, 2H), 1.37-1.01 (m, 16H), 0.87 (s, 6H), 0.77 (s, 6H)

Example 2

Synthesis of Polymer B

[Chemical Formula 71]

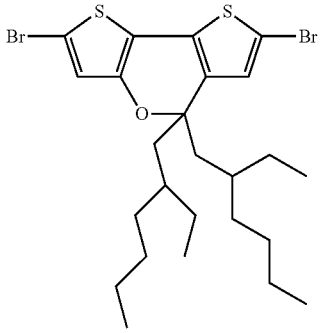

8

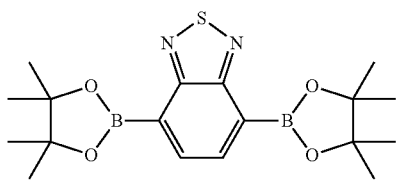

Into a 200 mL flask in which a gas in the flask was replaced by argon, 890 mg (1.54 mmol) of the compound 7b, 571.8 mg (1.47 mmol) of the compound 8 (4,7-bis(4,4,5,5-tetramethyl-1,3,2-dioxaborolan-2-yl)-2,1,3-benzothiadiazole) (manufactured by Aldrich Corp.), and 250 mg of methyltrialkylammonium chloride (trade name: Aliquat 336 (registered trademark); manufactured by Aldrich Corp.) were charged and the resultant reaction mixture was dissolved in 60 mL of toluene. The resultant toluene solution was bubbled with argon for 30 minutes. Then, to the solution, 3.74 mg of palladium acetate, 19.0 mg of tris(2-methoxyphenyl)phosphine, and 7.5 mL of sodium carbonate aqueous solution (16.7% by weight) were added and the resultant reaction mixture was stirred at 70° C. for 4 hours. Then, to the reaction solution, 50 mg of phenylboric acid was added and the reaction was further carried out at 70° C. for 2 hours. Then, to the reaction solution, 2 g of sodium diethyldithiocarbamate and 20 mL of water were added and the resultant reaction mixture was stirred under reflux for 2 hours. The aqueous phase was removed and then the organic phase was washed with 20 mL of water twice, with 20 mL of 3% by weight acetic acid aqueous solution twice, and further with 20 mL of water twice, followed by pouring the resultant solution into methanol to precipitate polymer. The polymer was filtered and then dried and the resultant polymer was dissolved in 30 mL of o-dichlorobenzene again. The resultant solution was passed through an alumina/silica gel column and the resultant solution was poured into methanol to precipitate polymer, followed by filtering and then drying the polymer to obtain 380 mg of purified polymer. Hereinafter, the polymer is called polymer B. The molecular weight of the polymer B measured by GPC (in terms of polystyrene) corresponded to Mw=77,000 and Mn=15,000. The light absorbing terminal wavelength of the polymer B was 930 nm.

Reference Example 11

Synthesis of Polymer C

[Chemical Formula 72]

9

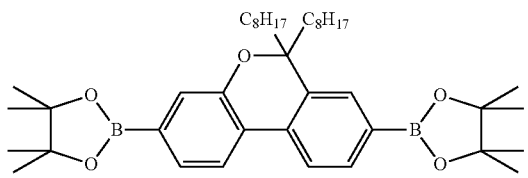

10

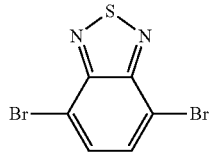

Into a 100 mL flask, 398.7 mg (0.605 mmol) of the above compound 9 synthesized according to the description in Example 10 of Japanese Patent Application Laid-open No. 2004-168999, 160.3 mg (0.5451 mmol) of compound 10 (4,7-dibromo-2,1,3-benzothiadiazole) (manufactured by Aldrich Corp.), and 200 mg of methyltrialkylammonium chloride (trade name: Aliquat 336 (registered trademark); manufactured by Aldrich Corp.) were charged and the resultant reaction mixture was dissolved in 40 mL of toluene. The resultant toluene solution was bubbled with argon for 30 minutes. Then, to the solution, 2.4 mg of palladium acetate, 12.2 mg of tris(2-methoxyphenyl)phosphine, and 2 mL of sodium carbonate aqueous solution (16.7% by weight) were added and the resultant reaction mixture was stirred under reflux for 3 hours. Then, to the reaction solution, 50 mg of phenylboric acid was added and the reaction mixture was further stirred under reflux for 2 hours. Then, to the reaction solution, 2 g of sodium diethyldithiocarbamate and 20 mL of water were added and the resultant reaction mixture was stirred under reflux for 2 hours. After the completion of the reaction, the reaction solution was cooled to around room temperature (25° C.) and then the resultant reaction solution was left stand still to recover the separated toluene phase. The toluene phase was washed with 10 mL of water twice, with 10 mL of 3% acetic acid water twice, and further with 10 mL of water twice and the resultant toluene phase was poured into methanol to recover precipitate. The precipitate was dried under reduced pressure and was then dissolved in chloroform. Next, the resultant chloroform solution was filtered to remove insoluble matters and was then passed through an alumina column to be purified. The resultant chloroform solution was concentrated under reduced pressure and was then poured into methanol to generate precipitate and to recover the generated precipitate. The precipitate was washed with methanol and was then dried under reduced pressure to obtain 320 mg of polymer. Hereinafter, the polymer is called polymer C. For the polymer C, the weight-average molecular weight in terms of polystyrene was 446,000 and the number average molecular weight in terms of polystyrene was 169,000. The light absorbing terminal wavelength of the polymer C was 550 nm.

Example 3

Production and Evaluation of Ink and Organic Thin Film Solar Cell

A glass substrate on which an ITO film was formed by a sputtering method in a thickness of 150 nm was subjected to surface treatment by ozone UV treatment. Next, the polymer B and fullerene C60PCBM (phenyl C61-butyric acid methyl ester; manufactured by Frontier Carbon Corporation) (weight ratio of the polymer B/C60PCBM was 1/3) were dissolved in o-dichlorobenzene (total weight of the polymer B and C60PCBM was 2.0% by weight) to produce an ink 1. The ink 1 was applied on the substrate by spin-coating to prepare an organic film containing the polymer B (film thickness: about 100 nm). The thus prepared organic film had a light absorbing terminal wavelength of 920 nm. Then, on the organic film, lithium fluoride was deposited by a vacuum deposition machine in a thickness of 2 nm and next thereon, Al was deposited in a thickness of 100 nm. The obtained organic thin film solar cell had a shape of 2 mm×2 mm square. The obtained organic thin film solar cell was irradiated with a constant light using a solar simulator (manufactured by BUNKOUKEIKI Co., Ltd.; trade name: OTENTO-SUNII; AM 1.5G filter, irradiance: 100 mW/cm$^2$) and the generated current and voltage were measured to calculate the photoelectric conversion efficiency, the short-circuit current density, the open-circuit voltage, and the fill factor. $J_{sc}$ (short-circuit current density) was 5.64 mA/cm$^2$; Voc (open-circuit voltage) was 0.58 V; ff (fill factor) was 0.36; and photoelectric conversion efficiency ($\eta$) was 1.18%.

Example 4

In the same manner as in Example 3, except that xylene was used instead of o-dichlorobenzene, the preparation and evaluation of the device were carried out. The result is listed in Table 1.

Comparative Example 1

In the same manner as in Example 3, except that the polymer C was used instead of the polymer B, the preparation and evaluation of the device were carried out.
The result is listed in Table 1.

Reference Example 12

Synthesis of Compound 5c

[Chemical Formula 73]

Into a 100 mL four-neck flask in which a gas in the flask was replaced by argon, 1.00 g (4.80 mmol) of the compound 4 and 30 mL of anhydrous THF were charged to prepare a homogeneous solution. While maintaining the flask at −20° C., 12.7 mL of solution of 3,7-dimethyloctylmagnesium bromide (1 M) in ether was added to the solution. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was stirred for 1.5 hours. Then, to the reaction mixture, water was added to terminate the reaction and the reaction product was extracted with ethyl acetate. The organic phase that was an ethyl acetate solution was dried over sodium sulfate and was filtered and then the ethyl acetate solution was passed through a silica gel column, followed by evaporating the solvent of the filtrate to obtain 1.50 g of compound 5c.

$^1$H NMR in CDCl$_3$ (ppm): 8.42 (b, 1H), 7.25 (d, 1H), 7.20 (d, 1H), 6.99 (d, 1H), 6.76 (d, 1H), 2.73 (b, 1H), 1.90 (m, 4H), 1.58-1.02 (b, 20H), 0.92 (s, 6H), 0.88 (s, 12H)

Reference Example 13

Synthesis of Compound 6c

[Chemical Formula 74]

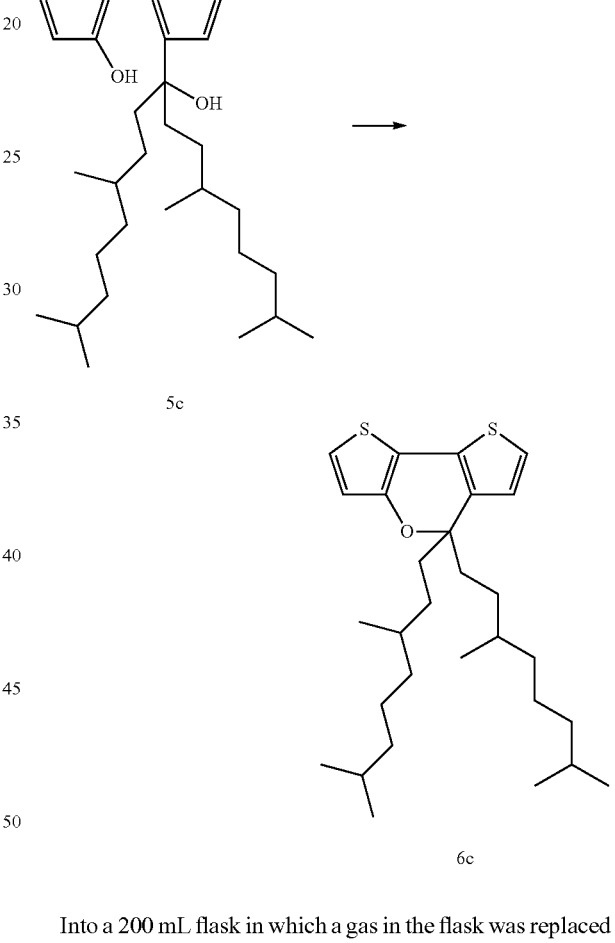

Into a 200 mL flask in which a gas in the flask was replaced by argon, 1.50 g of the compound 5c and 30 mL of toluene were charged to prepare a homogeneous solution. To the solution, 100 mg of sodium p-toluenesulfonate monohydrate was added and the resultant reaction mixture was stirred at 100° C. for 1.5 hours. The resultant reaction solution was cooled to room temperature (25° C.) and then to the reaction solution, 50 mL of water was added, followed by extracting the reaction product with toluene. The organic phase that was a toluene solution was dried over sodium sulfate and was filtered and then the solvent was evaporated. The resultant crude product was purified by a silica gel column (solvent: hexane) to obtain 1.33 g of compound 6c. The operations up to here were repeated by a plurality of times.

111

$^1$H NMR in CDCl$_3$ (ppm): 6.98 (d, 1H), 6.93 (d, 1H), 6.68 (d, 1H), 6.59 (d, 1H), 1.89 (m, 4H), 1.58-1.00 (b, 20H), 0.87 (s, 6H), 0.86 (s, 12H)

Reference Example 14

Synthesis of Compound 11

[Chemical Formula 75]

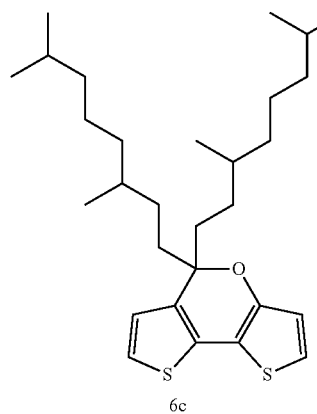

Into a 300 mL flask in which a gas in the flask was replaced by argon, the compound 6c (3.52 g, 7.41 mmol) and N,N-dimethylformamide (DMF) (100 mL) were charged to prepare a homogeneous solution. The solution was subjected to argon bubbling at 25° C. for 30 minutes and then the solution was cooled to −50° C. To the solution, NBS (1.20 g, 6.74 mmol) was added and the temperature of the resultant reaction mixture was elevated to 25° C. over 5.5 hours. To the reaction solution, 50 mL of water was added and the reaction solution was extracted with diethyl ether. The extract was dried over sodium sulfate and was then filtered, and the solvent was evaporated. The resultant crude product was purified by a silica gel column containing hexane as the solvent to obtain 3.30 g of compound 11.

112

$^1$H NMR (CDCl$_3$ (ppm)): 0.826 (m, 18H), 1.08-1.47 (m, 20H), 1.95 (m, 4H), 6.65 (d, 1H), 6.66 (s, 1H), 6.98 (s, 1H)

Reference Example 15

Synthesis of Compound 12

[Chemical Formula 76]

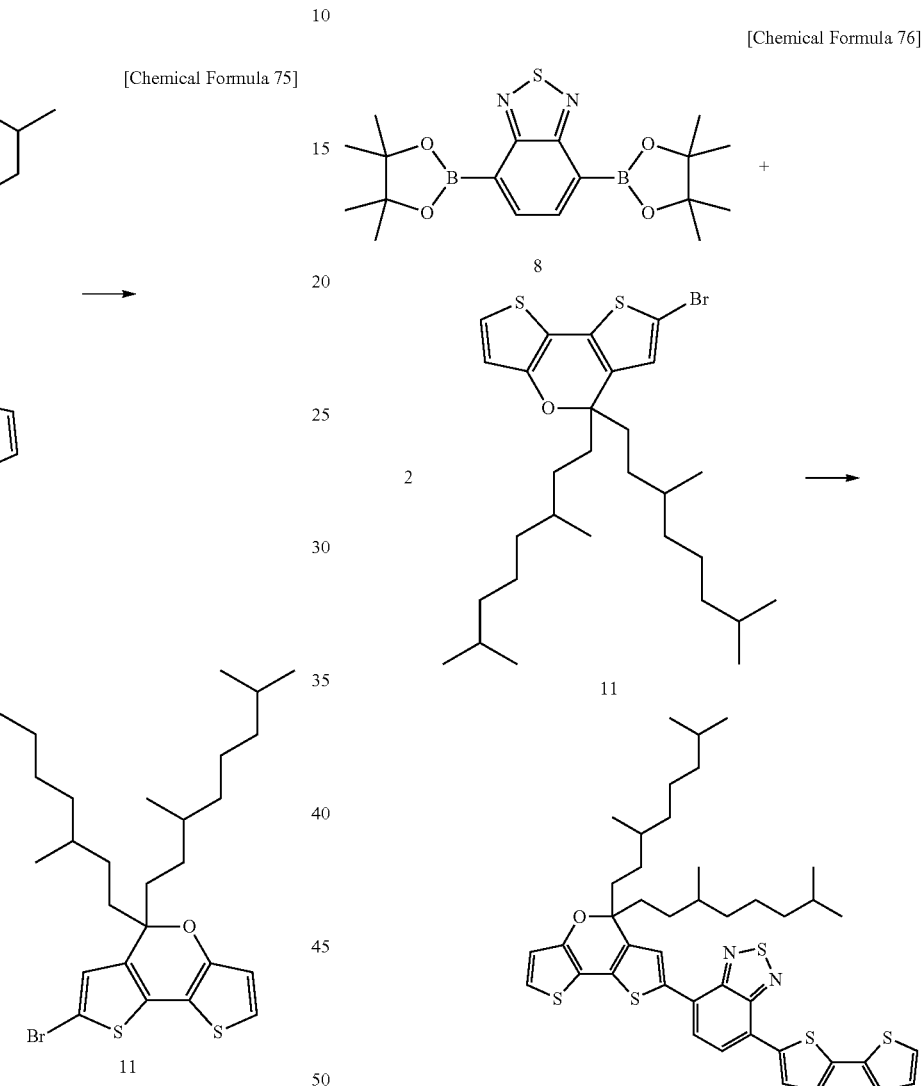

Into a 300 mL flask in which a gas in the flask was replaced by argon, the compound 8 (1.11 g, 2.85 mmol), the compound 11 (3.16 g, 5.70 mmol), toluene (90 mL), and methyltrialkylammonium chloride (trade name: Aliquat 336 (registered trademark); manufactured by Aldrich Corp.) (606 mg, 1.50 mmol) were charged to prepare a homogeneous solution and the resultant solution was subjected to argon bubbling at 25° C. for 30 minutes. The temperature of the resultant reaction mixture was elevated to 90° C. and then to the solution, palladium acetate (6.7 mg, 1% by mole) and tris(2-methoxyphenyl)phosphine (37.0 mg, 3.5% by mole) were added. Then, while stirring the reaction mixture at 100° C., a sodium carbonate aqueous solution (16.7% by weight, 19.0 g, 30.0 mmol) was dropped into the reaction mixture over 30 minutes. After the dropping, the resultant reaction mixture was stirred at 100° C. for 2 hours. Then, to the reaction solution, pure water was added to separate the toluene phase and then the toluene phase was dried over sodium sulfate to obtain crude product. The crude product was purified by a silica gel column using hexane as a developing solution to obtain 2.25 g of compound 12.

$^1$H NMR (CDCl$_3$ (ppm)): 0.826 (m, 36H), 1.08-1.47 (m, 40H), 1.95 (m, 8H), 6.71 (d, 2H), 7.04 (d, 2H), 7.77 (s, 2H), 7.79 (s, 2H)

Reference Example 16

Synthesis of Compound 13

[Chemical Formula 77]

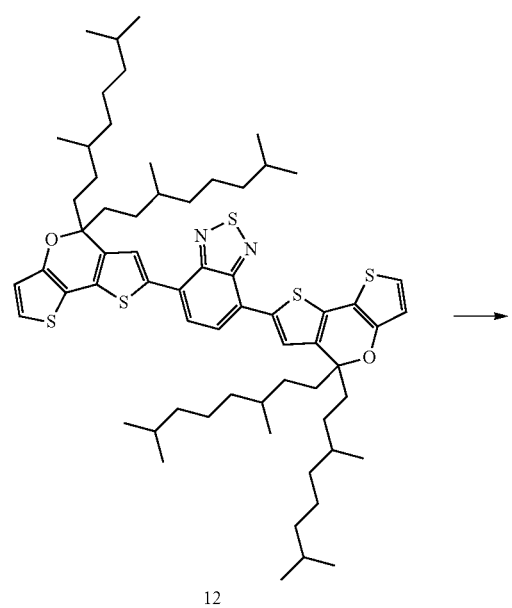

12

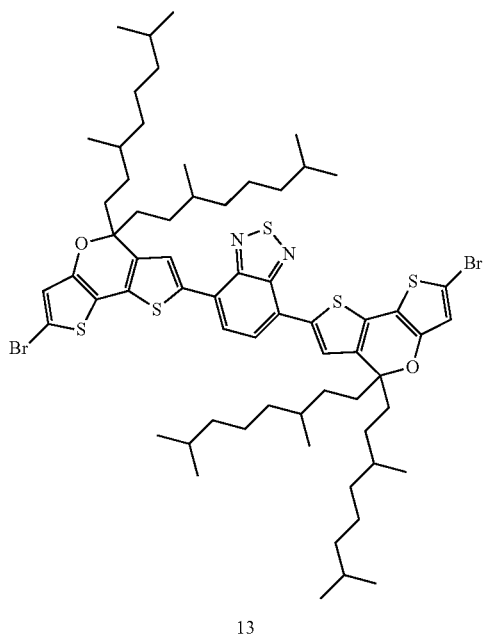

13

Into a 200 mL flask in which a gas in the flask was replaced by argon, the compound 12 (2.25 g, 2.08 mmol), DMF (40 mL), and tetrahydrofuran (THF) (40 mL) were charged to prepare a homogeneous solution. The solution was cooled to −50° C. and then to the solution, NBS (814 mg, 4.58 mmol) was added, followed by elevating the temperature of the reaction mixture to 0° C. over 2.5 hours.

Then, to the reaction solution, pure water was added and the reaction solution was extracted using hexane into an organic phase. Then to the reaction solution, pure water was added to separate a toluene phase and then the toluene phase was dried over sodium sulfate to obtain crude product. The crude product was purified by a silica gel column using hexane as a developing solution to obtain 2.11 g of compound 13.

$^1$H-NMR (CDCl$_3$ (ppm)): 0.826 (m, 36H), 1.08-1.47 (m, 40H), 1.95 (m, 8H), 6.72 (s, 2H), 7.75 (s, 2H), 7.77 (s, 2H)

Example 5

Synthesis of Polymer D

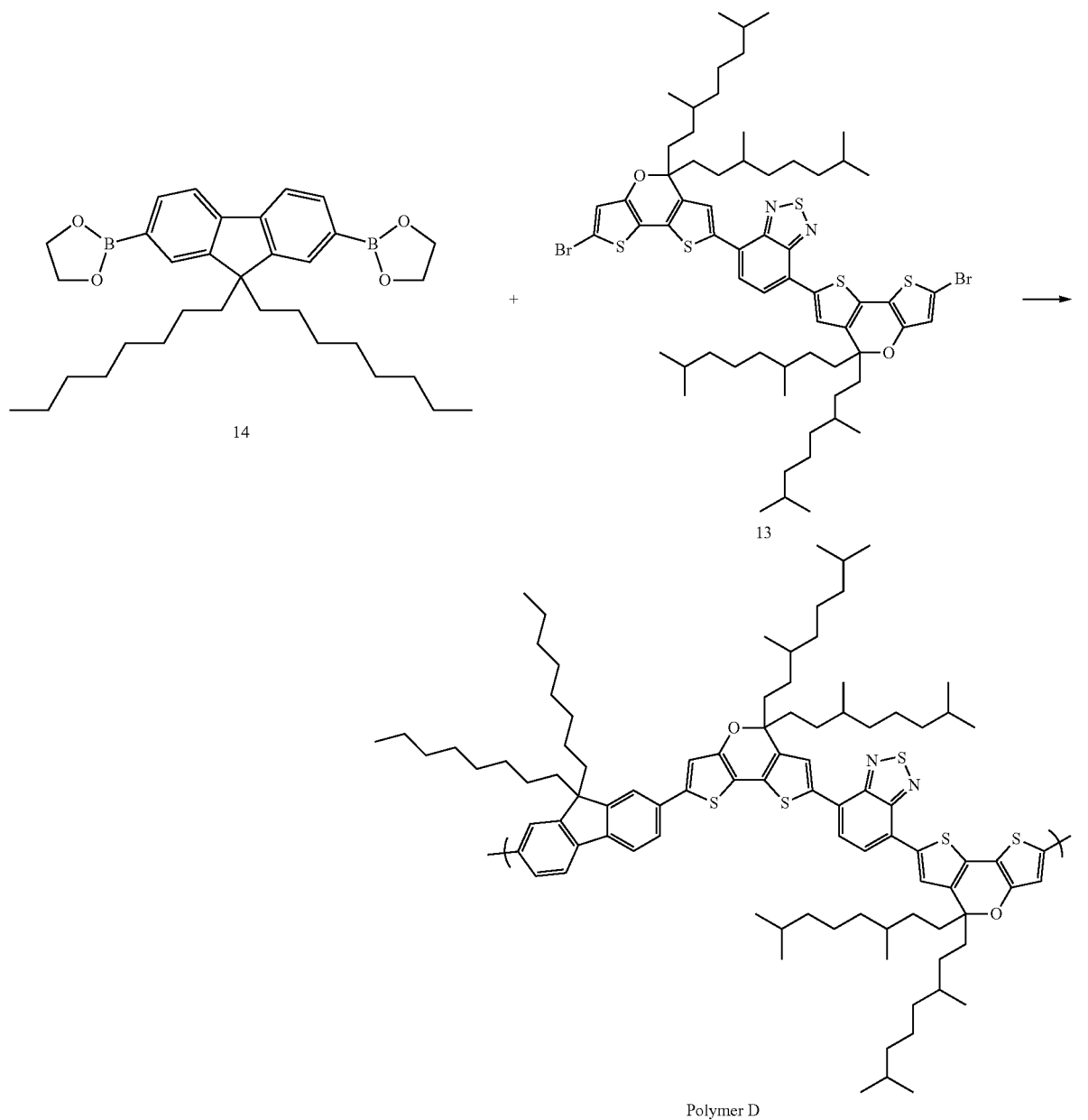

[Chemical Formula 78]

Polymer D

Into a 200 mL flask in which a gas in the flask was replaced by argon, compound 14 (manufactured by American Dye Source, Inc.) (96.9 mg, 0.183 mmol), the compound 13 (238.6 mg, 0.192 mmol), toluene (10 mL), and methyltrialkylammonium chloride (trade name: Aliquat 336 (registered trademark); manufactured by Aldrich Corp.) (60.6 mg, 0.15 mmol) were charged to prepare a homogeneous solution and the solution was subjected to argon bubbling at 25° C. for 30 minutes. The temperature of the resultant reaction mixture was elevated to 90° C. and then to the reaction mixture, palladium acetate (0.67 mg, 1% by mole) and tris(2-methoxyphenyl)phosphine (3.70 mg, 3.5% by mole) were added. Then, while stirring the resultant reaction mixture at 100° C., a sodium carbonate aqueous solution (16.7% by weight, 1.90 g, 3.00 mmol) was dropped into the reaction mixture over 30 minutes. After 4 hours, to the reaction solution, phenylboric acid (3.66 mg, 0.03 mmol), palladium acetate (0.67 mg, 1% by mole), and tris(2-methoxyphenyl)phosphine (3.70 mg, 3.5% by mole) were added and the resultant reaction mixture was stirred further for 1 hour, and then the reaction was terminated. Then, to the reaction solution, 2 g of sodium diethyldithiocarbamate and 20 mL of water were added and the resultant reaction mixture was stirred under reflux for 2 hours. The aqueous phase was removed and then the organic phase was washed with 20 mL of water twice, with 20 mL of 3% by weight acetic acid aqueous solution twice, and further with 20 mL of water twice, followed by pouring the resultant solution into methanol to precipitate polymer. The polymer was filtered and then dried and the resultant polymer was dissolved in 30 mL of o-dichlorobenzene again. The resultant solution was passed through an alumina/silica gel column and the resultant solution was poured into methanol to precipitate polymer, followed by filtering and then drying the polymer to obtain 280 mg of purified polymer. Hereinafter, the polymer is called polymer D. The molecular weight of the polymer D measured by GPC (in terms of polystyrene) corresponded to Mw=116,000 and Mn=49,000. The light absorbing terminal wavelength of the polymer D was 755 nm.

Example 6

In the same manner as in Example 3, except that the polymer A was used instead of the polymer B, the preparation and evaluation of the device were carried out. The result is listed in Table 1.

Reference Example 17

Synthesis of Compound 7c

Into a 200 mL flask in which a gas in the flask was replaced by argon, 1.33 g (2.80 mmol) of the compound 6c and 20 mL of anhydrous DMF were charged to prepare a homogeneous solution. The solution was maintained at −30° C. and to the solution, 1,040 mg (5.84 mmol) of NBS was added. The temperature of the reaction mixture was elevated from −30° C. to −10° C. over 30 minutes. After the confirmation of the disappearance of the compound 6c by liquid chromatography (LC), to the reaction mixture, 50 mL of sodium thiosulfate aqueous solution (1 M) was added to terminate the reaction and the reaction product was extracted with ether. The organic phase that was an ether solution was washed with a saturated sodium chloride aqueous solution, was dried over magnesium sulfate, and was filtered, and from the filtrate, the solvent was evaporated to obtain crude product. The crude product was purified by a silica gel column (solvent: hexane) to obtain 1.65 g of compound 7c (93%).

$^1$H NMR in CDCl$_3$ (ppm): 6.66 (1H), 6.63 (1H), 1.90 (m, 4H), 1.56-1.02 (b, 20H), 0.87 (s, 6H), 0.85 (s, 12H)

Example 7

Synthesis of Polymer F

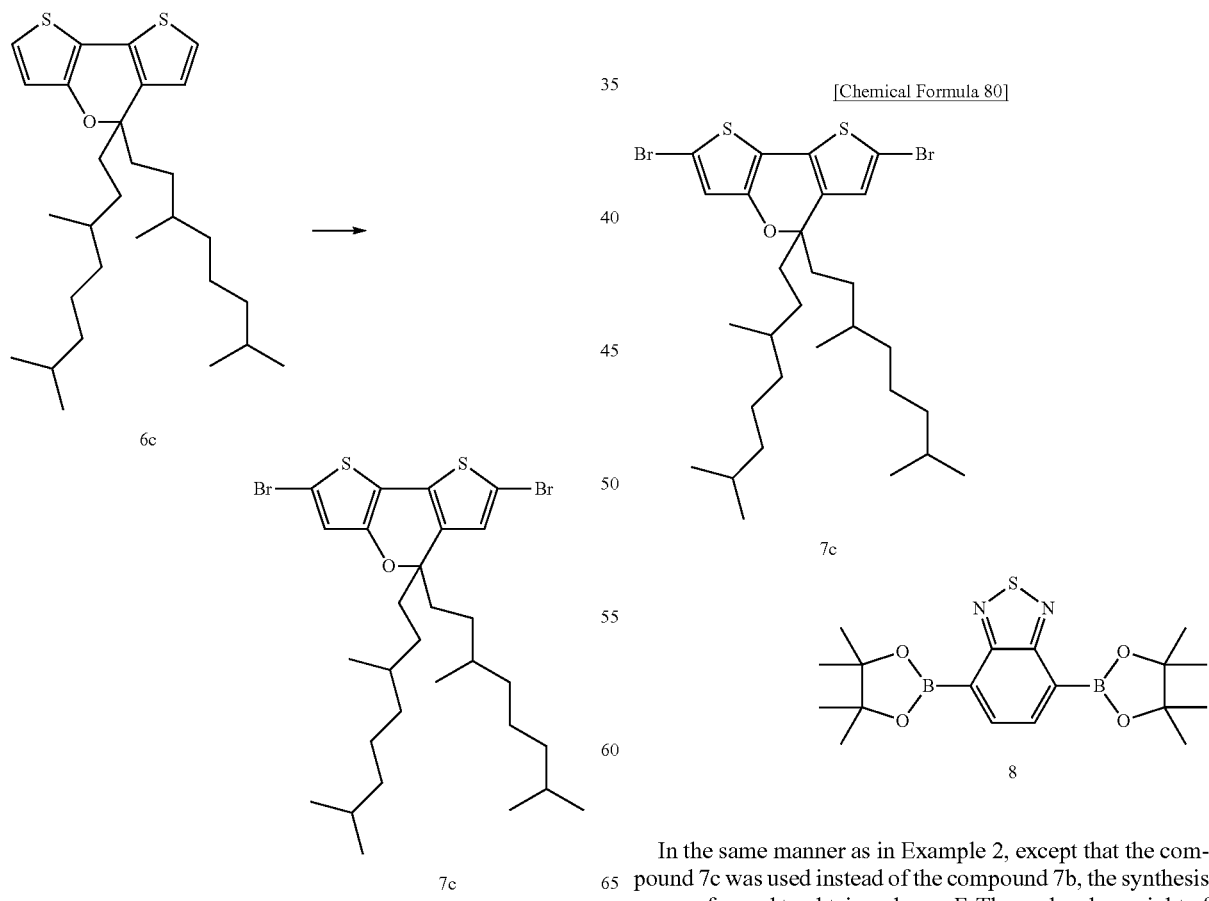

In the same manner as in Example 2, except that the compound 7c was used instead of the compound 7b, the synthesis was performed to obtain polymer F. The molecular weight of the polymer F measured by GPC (in terms of polystyrene)

corresponded to Mw=54,000 and Mn=21,000. The light absorbing terminal wavelength of the polymer F was 930 nm.

Example 8

In the same manner as in Example 3, except that the polymer F was used instead of the polymer B, the preparation and evaluation of the device were carried out. The result is listed in Table 1.

Example 9

Synthesis of Polymer G

[Chemical Formula 81]

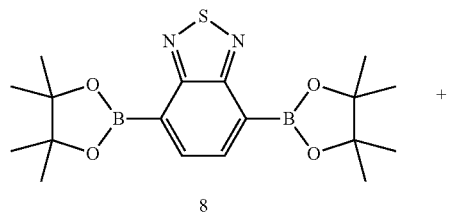

8

+

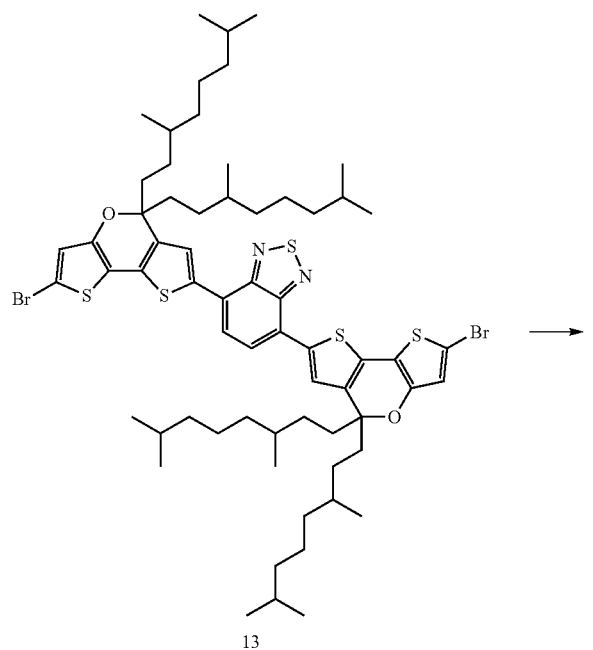

13

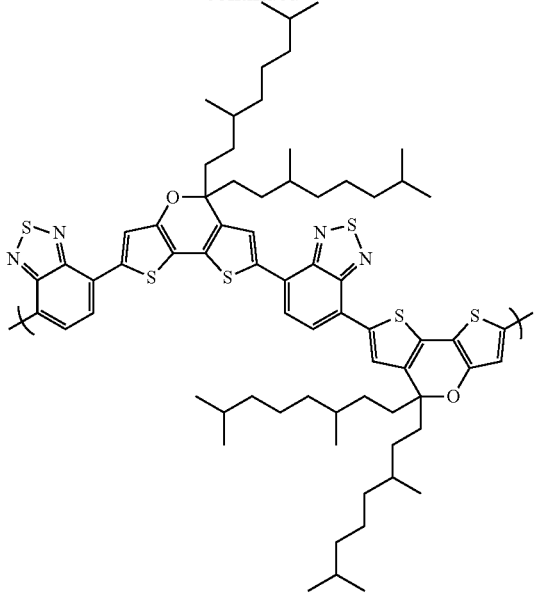

Polymer G

Into a 200 mL flask in which a gas in the flask was replaced by argon, the compound 8 (101.7 mg, 0.262 mmol), the compound 13 (343.1 mg, 0.276 mmol), and THF (10 mL) were charged to prepare a homogeneous solution and the solution was subjected to argon bubbling at 25° C. for 30 minutes. The temperature of the reaction solution was elevated to 60° C. and then to the reaction solution, tris(dibenzylideneacetone) palladium (5.49 mg, 0.006 mmol) and [tri(tert-butyl)phosphonium]tetrafluoroborate (6.96 mg, 0.024 mmol) were added. Then, while stirring the reaction mixture at a reflux temperature of THF, a potassium carbonate aqueous solution (27.6% by weight, 1.50 g, 3.00 mmol) was dropped into the reaction mixture over 30 minutes. After 30 minutes, to the reaction solution, phenylboric acid (3.66 mg, 0.03 mmol) was added, the resultant reaction mixture was stirred further for 1 hour, and then the reaction was terminated. Then, to the reaction solution, 2 g of sodium diethyldithiocarbamate and 20 mL of water were added and the resultant reaction mixture was stirred under reflux for 2 hours. The aqueous phase was removed and then the organic phase was washed with 20 mL of water twice, with 20 mL of 3% by weight acetic acid aqueous solution twice, and further with 20 mL of water twice, followed by pouring the resultant solution into methanol to precipitate polymer. The polymer was filtered and then dried and the resultant polymer was dissolved in 30 mL of o-dichlorobenzene again. The resultant solution was passed through an alumina/silica gel column and the resultant solution was poured into methanol to precipitate polymer, followed by filtering and then drying the polymer to obtain 242 mg of purified polymer. Hereinafter, the polymer is called polymer G. The molecular weight of the polymer G measured by GPC (in terms of polystyrene) corresponded to Mw=39, 000 and Mn=15,000. The light absorbing terminal wavelength of the polymer G was 930 nm.

Example 10

In the same manner as in Example 3, except that the polymer G was used instead of the polymer B, the preparation and evaluation of the device were carried out. The result is listed in Table 1.

Example 11

Synthesis of Polymer H

[Chemical Formula 82]

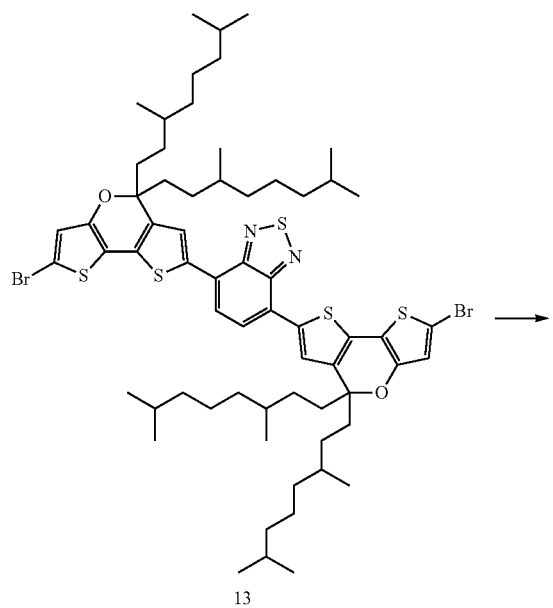

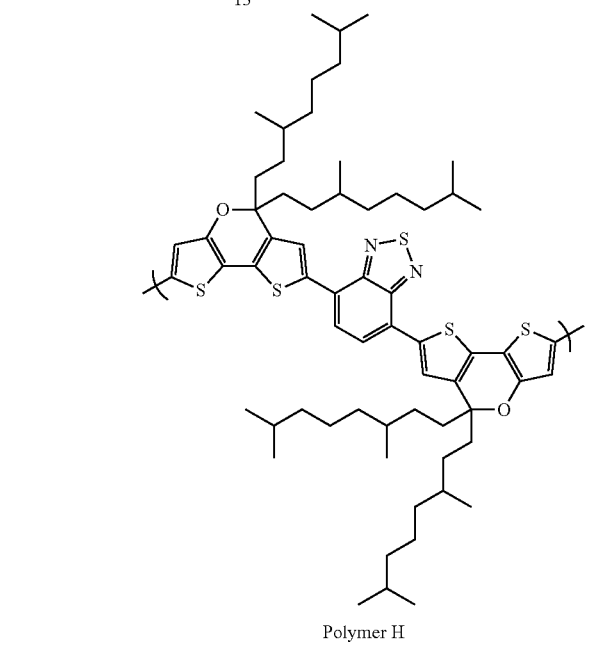

Polymer H

Into a 200 mL flask in which a gas in the flask was replaced by argon, the compound 13 (265.0 mg, 0.214 mmol), 2,2'-bipyridyl (100 mg), and toluene (10 mL) were charged and the resultant reaction mixture was subjected to argon bubbling at room temperature (25° C.) for 30 minutes. Then, to the reaction mixture, bis(1,5-cyclooctadiene) nickel (0) (177 mg, 0.643 mmol) was added and the resultant reaction mixture was stirred at room temperature (25° C.) for 30 minutes, and then the reaction was terminated.

Then, to the reaction solution, sodium diethyldithiocarbamate (1 g) and pure water (10 mL) were added and the resultant reaction mixture was stirred under reflux for 1 hour. The aqueous phase in the reaction solution was removed and then the organic phase was washed with 10 mL of water twice, with 10 mL of 3% by weight acetic acid aqueous solution twice, and further with 10 mL of water twice, followed by pouring the resultant solution into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 158 mg of polymer H.

For the molecular weight of the polymer H measured by GPC (in terms of polystyrene), the weight-average molecular weight was 64,000 and the number average molecular weight was 18,000. The light absorbing terminal wavelength of the polymer H was 910 nm.

Example 12

In the same manner as in Example 3, except that the polymer H was used instead of the polymer B, the preparation and evaluation of the device were carried out. The result is listed in Table 1.

Reference Example 18

Synthesis of Compound 19

[Chemical Formula 83]

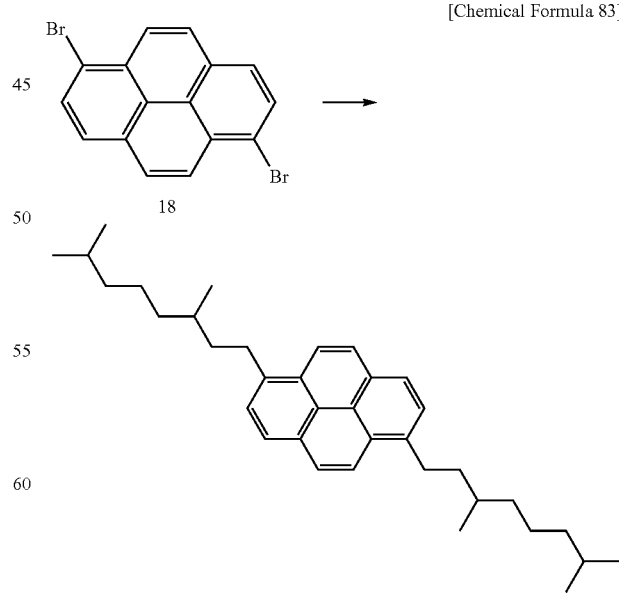

Into a 1,000 mL three-neck flask, 3.60 g (10.0 mmol) of 1,6-dibromopyrene (compound 18) and 300 mL of anhydrous THF were charged and the resultant THF solution was cooled to −78° C. Then, 15.0 mL of n-butyl lithium (1.6M hexane solution) was dropped into the THF solution through a syringe. While maintaining the THF solution at −78° C., the solution was stirred for 2 hours and then into the solution, 5.31 g (24.0 mmol) of 1-bromo-3,7-dimethyloctane was dropped. After the completion of the dropping, the temperature of the resultant reaction mixture was elevated to room temperature (25° C.) and the reaction was carried out for 15 hours. The resultant reaction solution was slowly charged into water to terminate the reaction and the resultant reaction solution was extracted with toluene into an organic phase. The organic phase was washed with water twice. The resultant organic phase was concentrated and recrystallized in hexane to obtain 1.20 g (2.49 mmol) of compound 19.

Reference Example 19

Synthesis of Compound 20

[Chemical Formula 84]

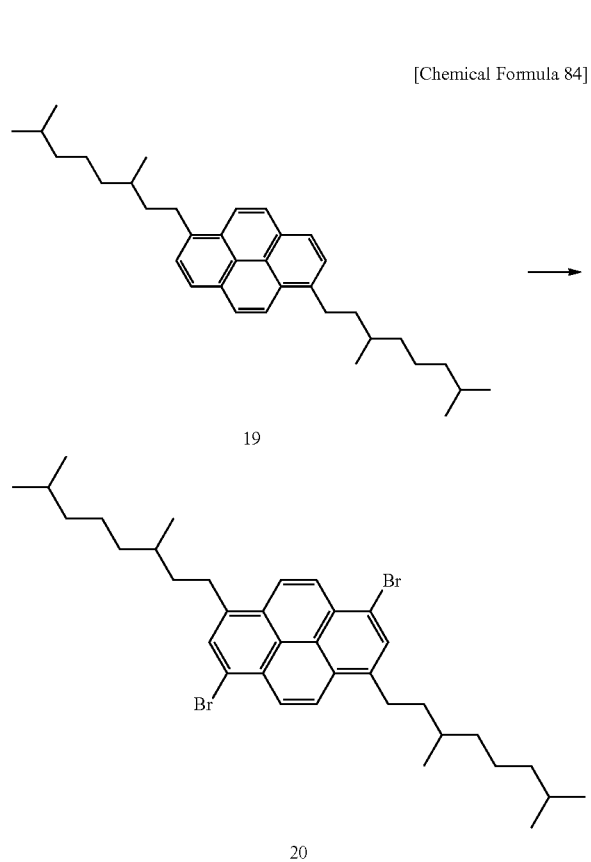

Into a 200 mL three-neck flask in which a gas in the flask was replaced by argon, 1.00 g (2.07 mmol) of the compound 19 and 50 mL of chloroform were charged and the resultant reaction mixture was stirred at room temperature (25° C.) to be dissolved. Thereinto, a solution obtained by dissolving 0.729 g (4.56 mmol) of bromine in 20 mL of chloroform was dropped at room temperature. The resultant reaction mixture was stirred for 12 hours and then further into the reaction mixture, a solution obtained by dissolving 0.300 g (1.88 mmol) of bromine in 10 mL of chloroform was dropped to carry out the reaction for 5 hours. To the resultant reaction solution, 100 mL of saturated sodium thiosulfate aqueous solution was added to terminate the reaction and the resultant reaction mixture as it was stirred at room temperature to precipitate solid. The precipitated solid (insoluble matter) was filtered to be recovered. The resultant solid was dissolved in a solvent mixture of chloroform and THF and then the resultant solution was hot-filtered and next, recrystallized to obtain 0.95 g (1.48 mmol) of compound 20.

Reference Example 20

Synthesis of Compound 21

[Chemical Formula 85]

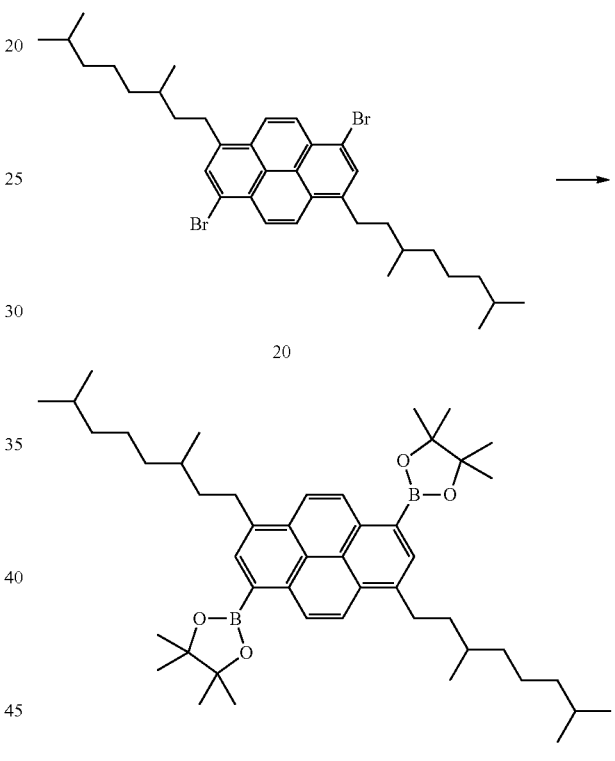

Into a 100 mL four-neck flask in which a gas in the flask was replaced by argon, 0.90 g (1.40 mmol) of the compound 20, 0.78 g (3.08 mmol) of bispinacolatodiboron, 0.049 g (0.083 mmol) of 1,1'-bis(diphenylphosphino)ferrocene (dppf), 0.069 g (0.083 mmol) of Pd(dppf)$_2$Cl$_2$, 1.82 g (18.5 mmol) of potassium acetate, and 15 mL of 1,4-dioxane were charged under a nitrogen atmosphere. The resultant mixture was heated to 100° C. and was then stirred. After 12 hours, the reaction solution was filtered with celite and from the filtrate, the solvent was removed. The residual solid was dissolved in a solvent mixture of hexane and toluene and to the resultant solution, an activated carbon was added to stir the resultant reaction mixture at 90° C. for 2 hours. The resultant suspension was hot-filtered with celite and from the filtrate, the solvent was removed, followed by recrystallizing the resultant residue in hexane to obtain 0.523 g (0.71 mmol) of compound 21.

Example 13

Synthesis of Polymer I

[Chemical Formula 86]

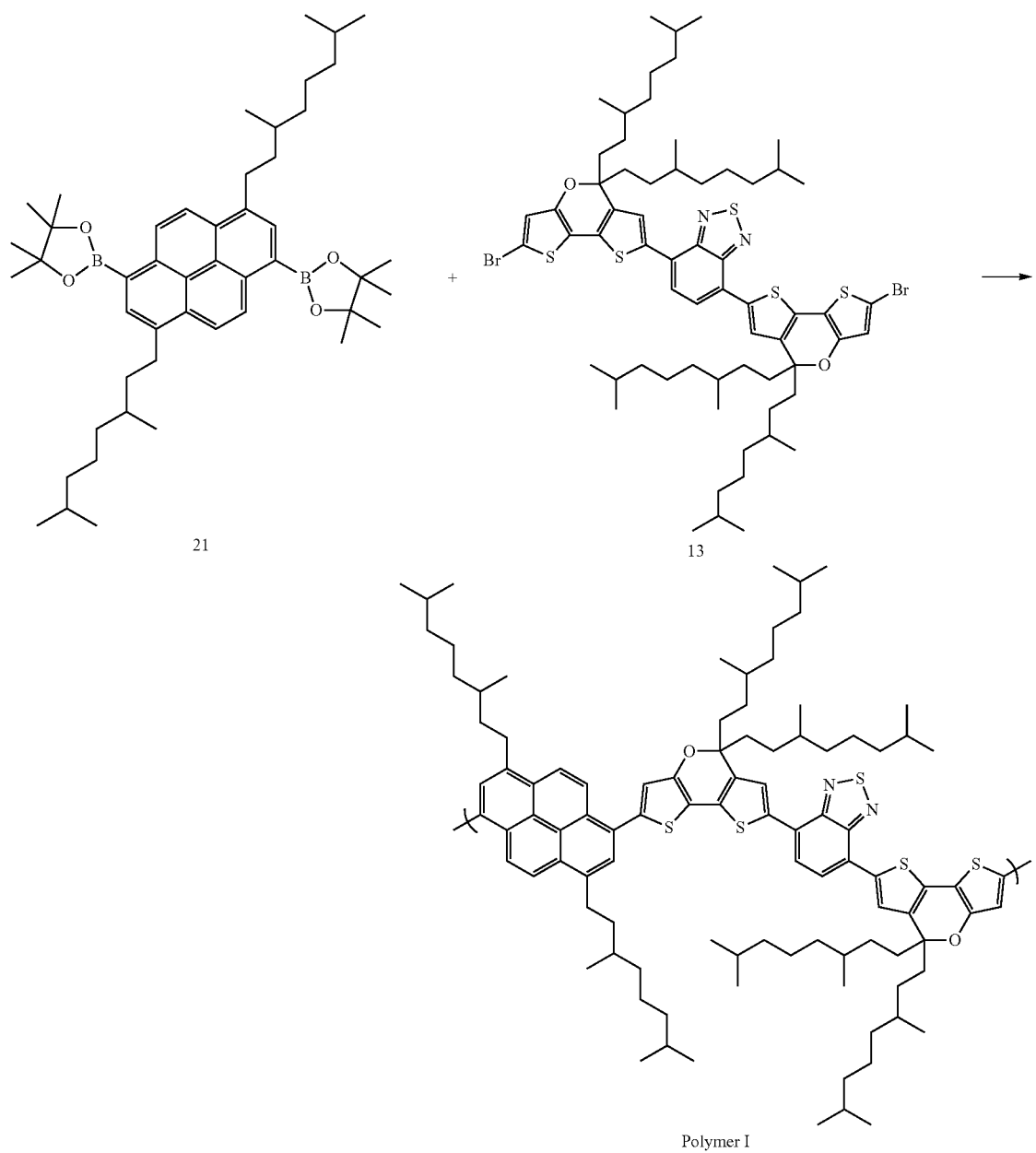

Polymer I

Into a 200 mL flask in which a gas in the flask was replaced by argon, the compound 21 (222.0 mg, 0.302 mmol), the compound 13 (395.1 mg, 0.318 mmol), toluene (10 mL), and methyltrialkylammonium chloride (trade name: Aliquat 336 (registered trademark); manufactured by Aldrich Corp.) (60.6 mg, 0.15 mmol) were charged and the resultant reaction mixture was subjected to argon bubbling at room temperature (25° C.) for 30 minutes. The temperature of the reaction mixture was elevated to 90° C. and then to the reaction mixture, palladium acetate (0.67 mg, 0.003 mmol) and tris(2-methoxyphenyl)phosphine (3.70 mg, 0.0105 mmol) were added. Then, while stirring the reaction mixture at 100° C., a sodium carbonate aqueous solution (16.7% by weight, 1.90 g, 3.00 mmol) was dropped into the reaction mixture over 30 minutes. After 50 minutes, to the reaction solution, phenylboric acid (3.66 mg, 0.03 mmol) was added, the resultant reaction mixture was stirred further for 1 hour, and then the reaction was terminated.

Then, to the reaction solution, sodium diethyldithiocarbamate (1 g) and pure water (10 mL) were added and the resultant reaction mixture was stirred under reflux for 1 hour.

The aqueous phase in the reaction solution was removed and then the organic phase was washed with 10 mL of water twice, with 10 mL of 3% by weight acetic acid aqueous solution twice, and further with 10 mL of water twice, followed by pouring the resultant solution into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 392 mg of polymer I.

For the molecular weight of the polymer I measured by GPC (in terms of polystyrene), the weight-average molecular weigh (Mw) was 103,000 and the number average molecular weight (Mn) was 50,000. The light absorbing terminal wavelength of the polymer I was 805 nm.

Example 14

In the same manner as in Example 3, except that the polymer I was used instead of the polymer B, the preparation and evaluation of the device were carried out. The result is listed in Table 1.

Reference Example 21

Synthesis of Compound 5d

[Chemical Formula 87]

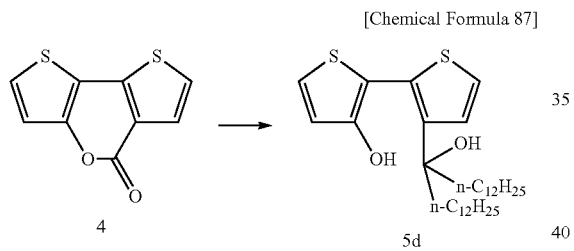

In the same manner as in Reference Example 12, except that solution of dodecylmagnesium bromide (1 M) in ether was used instead of the solution of 3,7-dimethyloctylmagnesium bromide (1 M) in ether, the synthesis was performed to obtain compound 5d.

$^1$H NMR in CDCl$_3$ (ppm): 7.24 (d, 1H), 7.20 (d, 1H), 6.98 (d, 1H), 6.77 (d, 1H), 1.80 (b, 4H), 1.33 (b, 40H), 0.87 (s, 6H)

Reference Example 22

Synthesis of Compound 6d

[Chemical Formula 88]

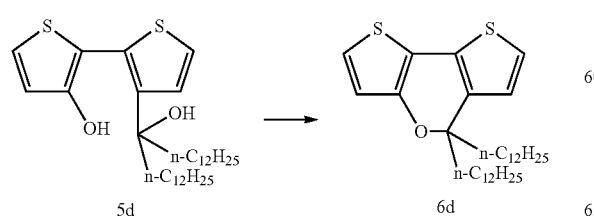

In the same manner as in Reference Example 13, except that the compound 5d was used instead of the compound 5c, the synthesis was performed to obtain compound 6d.

$^1$H NMR in CDCl$_3$ (ppm): 6.99 (d, 1H), 6.93 (d, 1H), 6.68 (d, 1H), 6.59 (d, 1H), 1.79 (b, 4H), 1.31 (b, 40H), 0.85 (s, 6H)

Reference Example 23

Synthesis of Compound 11d

[Chemical Formula 89]

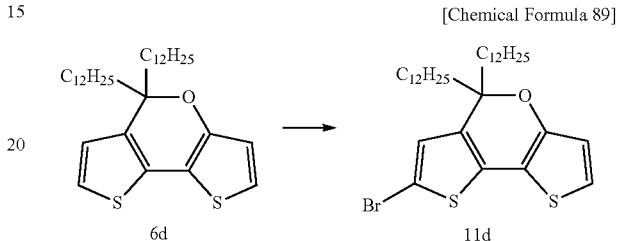

In the same manner as in Reference Example 14, except that the compound 6d was used instead of the compound 6c, the synthesis was performed to obtain compound 11d.

$^1$H-NMR (CDCl$_3$, δ (ppm)): 0.826 (t, 12H), 1.21 (m, 72H), 1.43 (m, 8H), 1.96 (t, 8H), 6.65 (d, 1H), 6.66 (s, 1H), 6.98 (s, 1H)

Reference Example 24

Synthesis of Compound 12d

[Chemical Formula 90]

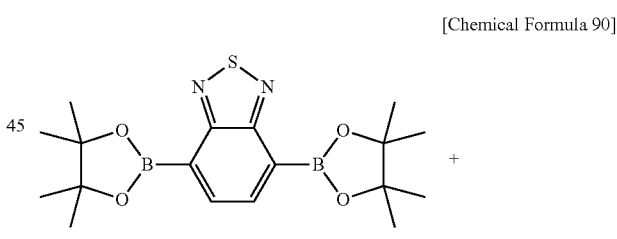

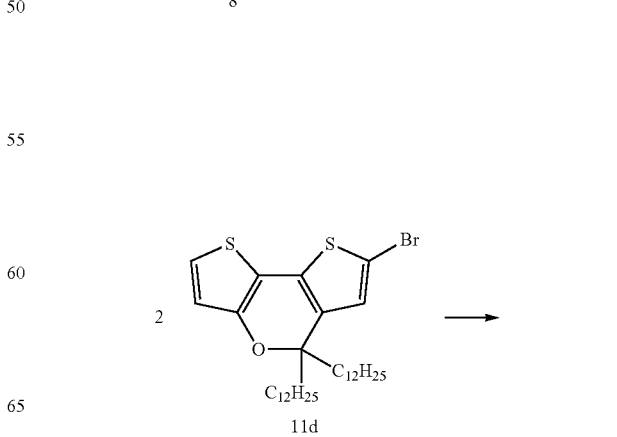

-continued

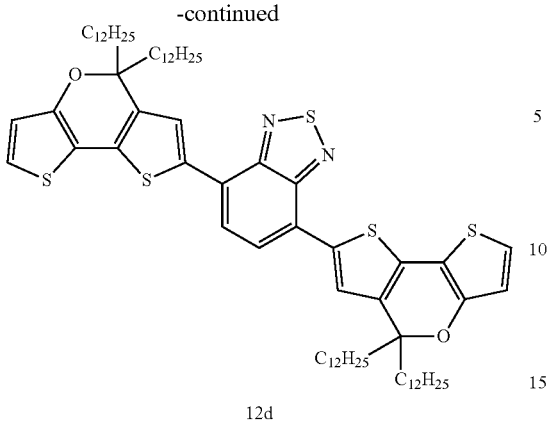

12d

In the same manner as in Reference Example 15, except that the compound 11d was used instead of the compound 11, the synthesis was performed to obtain compound 12d.

$^1$H-NMR (CDCl$_3$, δ (ppm)): 0.862 (t, 12H), 1.213 (m, 72H), 1.432 (m, 8H), 1.968 (t, 8H), 6.715 (d, 2H), 7.045 (d, 2H), 7.786 (d, 4H)

Reference Example 25

Synthesis of Compound 13d

[Chemical Formula 91]

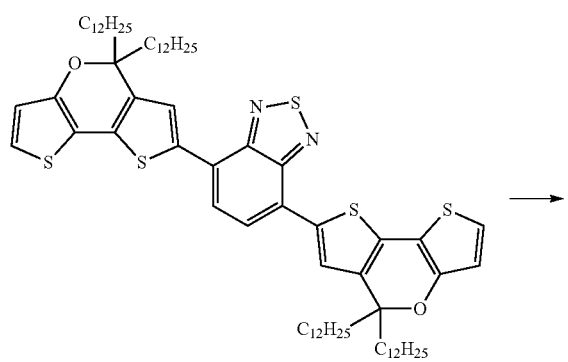

13d

In the same manner as in Reference Example 16, except that the compound 12d was used instead of the compound 12, the synthesis was performed to obtain compound 13d.

$^1$H-NMR (CDCl$_3$, δ (ppm)): 0.860 (t, 12H), 1.213 (m, 72H), 1.427 (m, 8H), 1.949 (t, 8H), 6.710 (s, 2H), 7.756 (s, 4H)

Reference Example 26

Synthesis of Compound 23

[Chemical Formula 92]

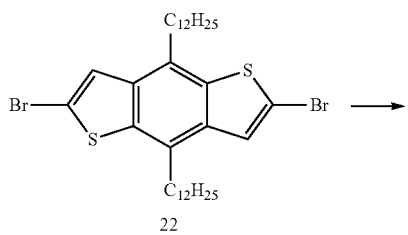

22

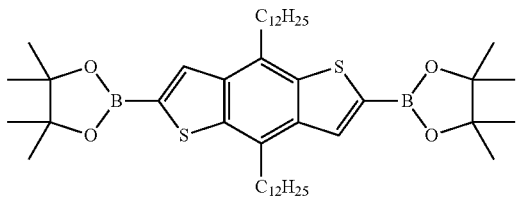

23

Into a four-neck flask, compound 22 (6.847 g, 10.00 mmol) synthesized according to a description in "Chemistry of Materials, 2006, 18 (14), pp. 3237-3241," bispinacolatodiboron (10.16 g, 40.00 mmol), and dioxane (150 mL) were charged and the resultant reaction mixture was subjected to argon bubbling at room temperature (25° C.) for 30 minutes. To the resultant reaction mixture, 1,1'-bis(diphenylphosphino)ferrocene palladium dichloride (408.3 mg, 5% by mole), 1,1'-bis(diphenylphosphino)ferrocene (277.2 mg, 5% by mole), and potassium acetate (3.926 g, 40.00 mmol) that is a base were added and then the resultant reaction mixture was refluxed with heating for 10 hours. After the reaction, the reaction solution was analyzed by HPLC to confirm the disappearance of the compound 22.

Then, a base poorly soluble in the reaction solution was separated using a filter. Next, the solvent was evaporated with an evaporator. Then, by a silica gel column using hexane as a developing solution, the reaction product was purified and the obtained component was washed with methanol for 3 hours to obtain light brown powder. The powder was dissolved in hexane (100 mL) and then a state in which ethanol (100 mL) was added to the resultant solution was left to perform recrystallization to obtain 1.386 g of compound 23.

Example 15

Synthesis of Polymer J

[Chemical Formula 93]

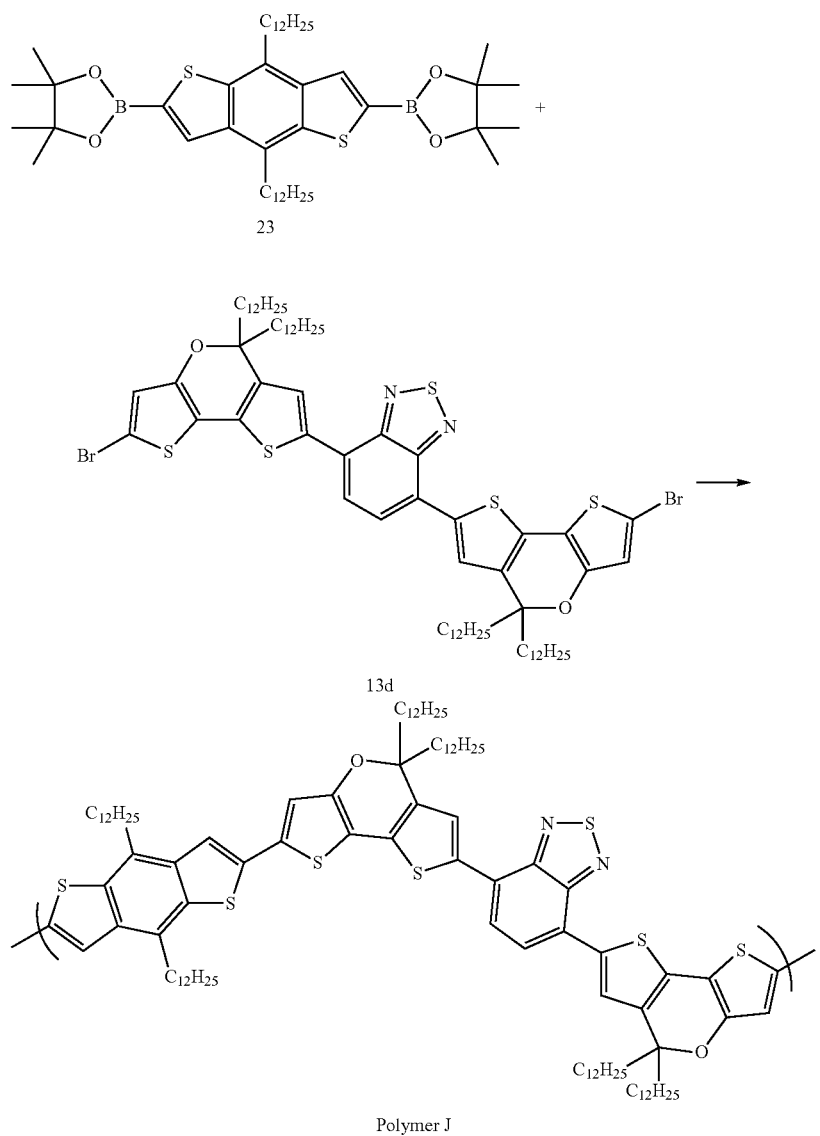

Polymer J

Into a flask in which a gas in the flask was replaced by argon, the compound 23 (223.5 mg, 0.287 mmol), the compound 13d (408.4 mg, 0.302 mmol), and THF (10 mL) were charged and the resultant reaction mixture was subjected to argon bubbling at room temperature (25° C.) for 30 minutes. Then, to the reaction solution, tris(dibenzylideneacetone) palladium (5.49 mg, 0.006 mmol) and [tri(tert-butyl)phosphonium]tetrafluoroborate (6.96 mg, 0.024 mmol) were added. While stirring the reaction mixture at 80° C., a potassium carbonate aqueous solution (27.6% by weight, 1.50 g, 3.00 mmol) was dropped into the reaction mixture over 30 minutes. After 15 minutes, to the reaction solution, phenylboric acid (3.66 mg, 0.03 mmol) was added, the resultant reaction mixture was stirred further for 1 hour, and then the reaction was terminated.

Then, to the reaction solution, sodium diethyldithiocarbamate (1 g) and pure water (10 mL) were added and the resultant reaction mixture was stirred under reflux for 1 hour. The aqueous phase in the reaction solution was removed and then the organic phase was washed with 10 mL of water twice, with 10 mL of 3% by weight acetic acid aqueous solution twice, and further with 10 mL of water twice, followed by pouring the resultant solution into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 359 mg of polymer J.

For the molecular weight of the polymer J measured by GPC (in terms of polystyrene), the weight-average molecular weigh (Mw) was 80,000 and the number average molecular weight (Mn) was 25,000. The light absorbing terminal wavelength of the polymer J was 815 nm.

Example 16

In the same manner as in Example 3, except that the polymer J was used instead of the polymer B, the preparation and evaluation of the device were carried out. The result is listed in Table 1.

Example 17

Synthesis of Polymer K

The molecular weight of the polymer K measured by GPC (in terms of polystyrene) corresponded to Mw=64,000 and Mn=22,000. The light absorbing terminal wavelength of the polymer K was 930 nm.

Example 18

In the same manner as in Example 3, except that the polymer K was used instead of the polymer B, the preparation and evaluation of the device were carried out. The result is listed in Table 1.

Reference Example 27

Synthesis of Compound 24

[Chemical Formula 95]

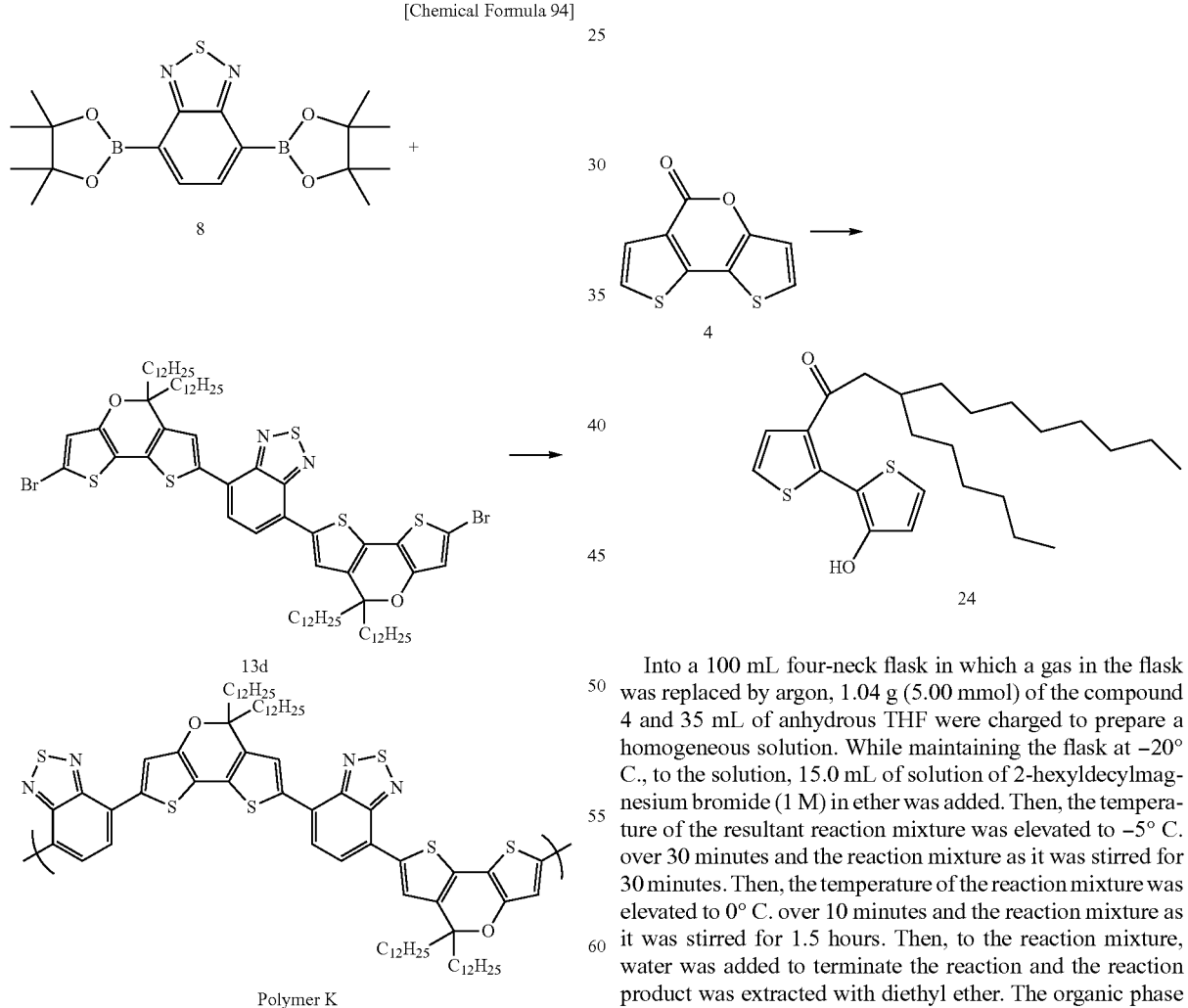

In the same manner as in Example 9, except that the compound 13d was used instead of the compound 13, the synthesis was performed to obtain polymer K.

Into a 100 mL four-neck flask in which a gas in the flask was replaced by argon, 1.04 g (5.00 mmol) of the compound 4 and 35 mL of anhydrous THF were charged to prepare a homogeneous solution. While maintaining the flask at −20° C., to the solution, 15.0 mL of solution of 2-hexyldecylmagnesium bromide (1 M) in ether was added. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was stirred for 1.5 hours. Then, to the reaction mixture, water was added to terminate the reaction and the reaction product was extracted with diethyl ether. The organic phase that was a diethyl ether solution was dried over sodium sulfate and was filtered. The resultant filtrate was then passed through a silica gel column using chloroform as a developing solution and the solvent of the resultant filtrate was evaporated to obtain 1.30 g of compound 24.

135
Reference Example 28
Synthesis of Compound 5e

[Chemical Formula 96]

136
Reference Example 29
Synthesis of Compound 6e

[Chemical Formula 97]

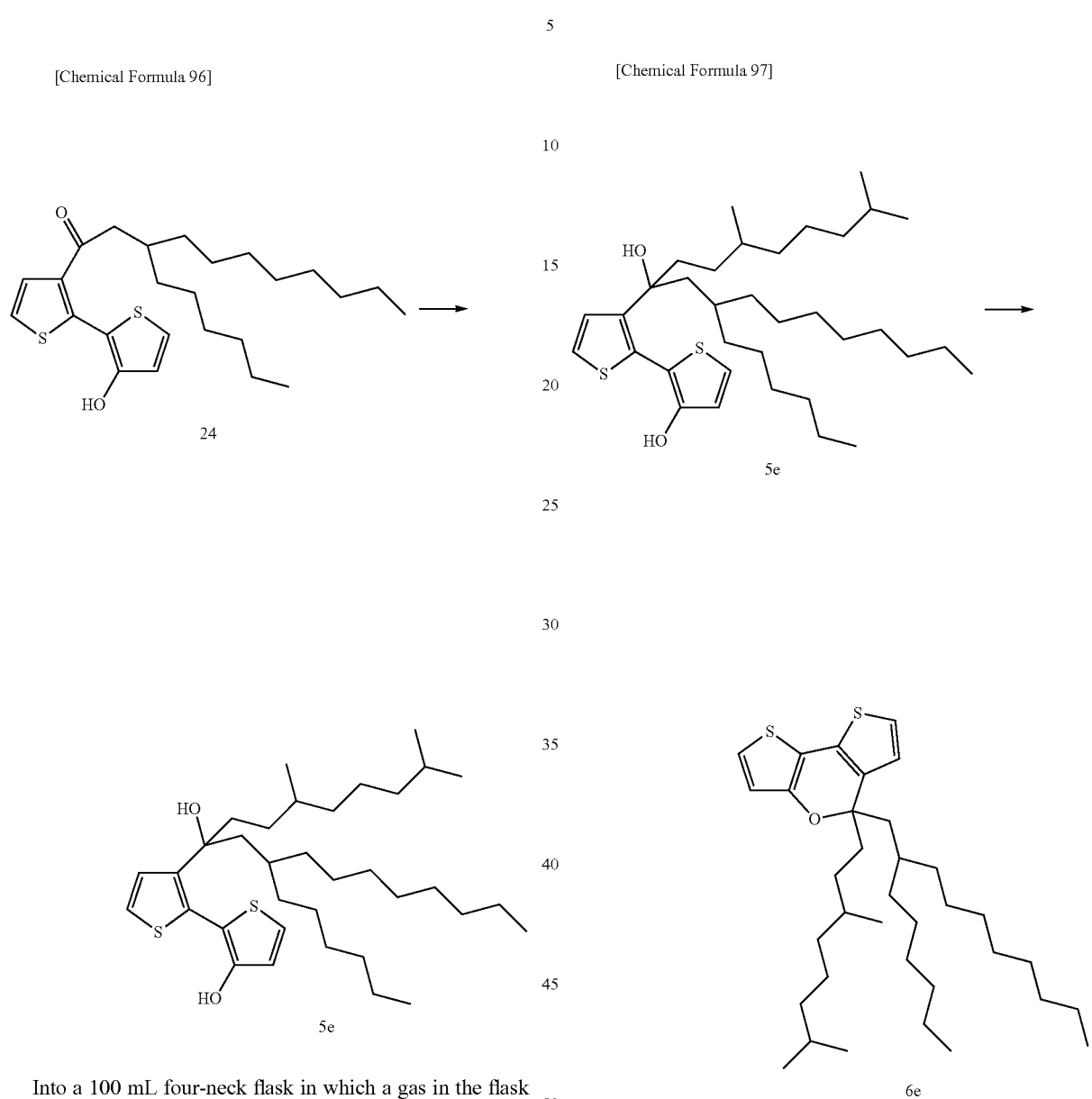

Into a 100 mL four-neck flask in which a gas in the flask was replaced by argon, 1.30 g (2.99 mmol) of the compound 24 and 30 mL of anhydrous THF were charged to prepare a homogeneous solution. While maintaining the flask at −20° C., to the solution, 15.0 mL of solution of 3,7-dimethyloctyl-magnesium bromide (1 M) in ether was added. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was stirred for 1.5 hours. Then, to the reaction mixture, water was added to terminate the reaction and the reaction product was extracted with diethyl ether. The organic phase that was a diethyl ether solution was dried over sodium sulfate and was filtered. The resultant filtrate was then passed through a silica gel column using chloroform as a developing solution and the solvent of the resultant filtrate was evaporated to obtain 1.20 g of compound 5e.

Into a 200 mL flask in which a gas in the flask was replaced by argon, 1.20 g (2.08 mmol) of the compound 5e and 30 mL of toluene were charged to prepare a homogeneous solution. To the solution, 100 mg of sodium p-toluenesulfonate monohydrate was added to stir the resultant reaction mixture at 100° C. for 1.5 hours. The reaction solution was cooled to room temperature (25° C.) and thereto, 50 mL of water was added, followed by extracting the reaction product with toluene. The organic phase that was a toluene solution was dried over sodium sulfate and was filtered and from the resultant filtrate, the solvent was evaporated. The resultant crude product was purified by a silica gel column (solvent: hexane) to obtain 802 mg of compound 6e.

$^1$H-NMR (CDCl$_3$, δ (ppm)): 0.833 (m, 15H), 1.0-1.5 (m, 35H), 1.850 (m, 4H), 6.688 (m, 2H), 6.966 (d, 1H), 7.028 (d, 1H)

Reference Example 30

Synthesis of Compound 7e

[Chemical Formula 98]

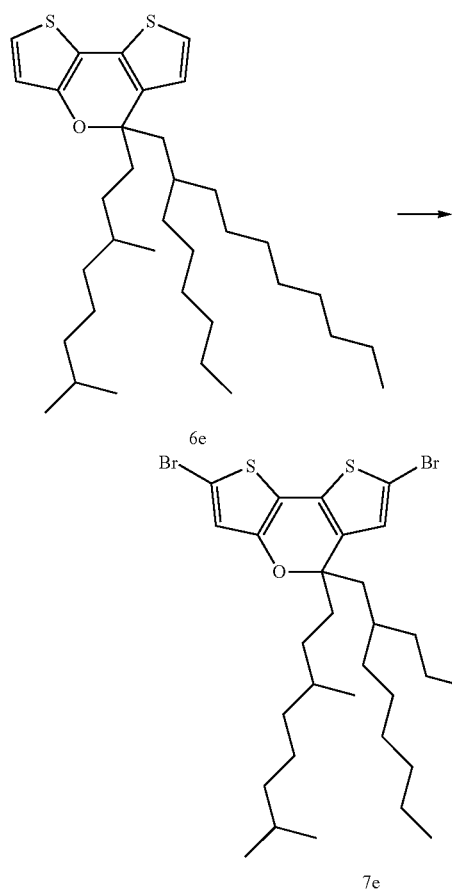

¹H-NMR (CDCl₃, δ (ppm)): 0.833 (m, 15H), 1.0-1.5 (m, 35H), 1.850 (m, 4H), 6.660 (s, 1H), 6.980 (s, 1H)

Example 19

Synthesis of Polymer L

[Chemical Formula 99]

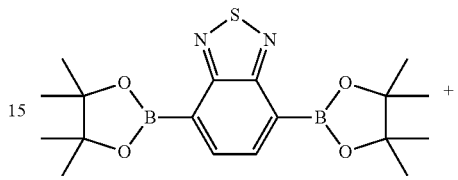

Into a 300 mL flask in which a gas in the flask was replaced by argon, the compound 6e (400 mg, 0.716 mmol) and N,N-dimethylformamide (DMF) (20 mL) were charged to prepare a homogeneous solution. The solution was subjected to argon bubbling at 25° C. for 30 minutes and was then cooled to −40° C. and to the solution, NBS (280.4 mg, 1.575 mmol) was added, followed by elevating the temperature of the resultant reaction mixture to 0° C. over 2 hours. To the reaction solution, 50 mL of water was added and the reaction product was extracted with diethyl ether. The extracted diethyl ether solution was dried over sodium sulfate and was then filtered and from the resultant filtrate, the solvent was evaporated. The resultant crude product was purified by a silica gel column using hexane as a solvent to obtain 437 mg of compound 7e.

Into a 200 mL four-neck flask in which a gas in the flask was replaced by argon, the compound 8 (110.6 mg, 0.285 mmol), the compound 7e (215.0 mg, 0.300 mmol), and tetrahydrofuran (THF) (10 mL) were charged and the resultant reaction mixture was subjected to argon bubbling at room temperature (25° C.) for 30 minutes. Then, to the reaction solution, tris(dibenzylideneacetone) palladium (5.49 mg, 0.006 mmol) and [tri(tert-butyl)phosphonium]tetrafluoroborate (6.96 mg, 0.024 mmol) were added. While stirring the reaction mixture at 80° C., a potassium carbonate aqueous solution (27.6% by weight, 1.50 g, 3.00 mmol) was dropped into the reaction mixture over 30 minutes. After 30 minutes, to the reaction solution, phenylboric acid (3.66 mg, 0.03 mmol) was added, the resultant reaction mixture was stirred further for 1 hour, and then the reaction was terminated.

Then, to the reaction solution, sodium diethyldithiocarbamate (1 g) and pure water (10 mL) were added and the resultant reaction mixture was stirred under reflux for 1 hour. The aqueous phase in the reaction solution was removed and then the organic phase was washed with 10 mL of water twice, with 10 mL of 3% by weight (wt) acetic acid aqueous solution twice, and further with 10 mL of water twice, followed by pouring the resultant solution into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 242 mg of polymer L. The light absorbing terminal wavelength of the polymer L was 930 nm.

Example 20

In the same manner as in Example 3, except that the polymer L was used instead of the polymer B, the preparation and evaluation of the device were carried out. The result is listed in Table 1.

Example 21

In the same manner as in Example 3, except that the polymer D was used instead of the polymer B, the preparation and evaluation of the device were carried out. The result is listed in Table 1.

Reference Example 31

Synthesis of Polymer M

[Chemical Formula 100]

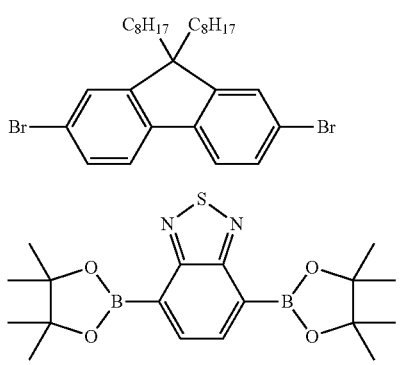

Into a 100 mL flask in which a gas in the flask was replaced by argon, 308 mg (0.560 mmol) of compound 25 (9,9-dioctyl-2,7-dibromofluorene)(manufactured by Aldrich Corp.), 110 mg (0.552 mmol) of the compound 8 (4,7-bis(4,4,5,5-tetramethyl-1,3,2-dioxaborolan-2-yl)-2,1,3-benzothiadiazole) (manufactured by Aldrich Corp.), and 200 mg of methyltrialkylammonium chloride (trade name: Aliquat 336 (registered trademark); manufactured by Aldrich Corp.) were charged to dissolve the resultant reaction mixture in 15 mL of toluene and the resultant toluene solution was subjected to argon bubbling for 30 minutes. Then, to the reaction mixture, 4.0 mg of palladium acetate, 18.8 mg of tris(2-methoxyphenyl)phosphine, and 8.0 mL of sodium carbonate aqueous solution (16.7 wt %) were added to stir the resultant reaction mixture at 100° C. for 6 hours. Then, to the reaction solution, 50 mg of phenylboric acid was added and further, the reaction was carried out at 100° C. for 2 hours. Then, to the reaction solution, 1 g of sodium diethyldithiocarbamate and 10 mL of water were added and the resultant reaction mixture was stirred under reflux for 2 hours. After the completion of the reaction, the aqueous phase was removed and the toluene phase was washed with 20 mL of water twice, with 20 mL of acetic acid aqueous solution (3 wt %) twice, and further with 20 mL of water twice, followed by pouring the resultant solution into methanol to precipitate polymer. The polymer was filtered and then dried and the resultant polymer was dissolved in 5 mL of toluene again. The resultant toluene solution was passed through an alumina/silica gel column to purify the solution and the resultant solution was poured into methanol to precipitate polymer. The polymer was filtered and then dried to obtain 92 mg of polymer. Hereinafter, the polymer is called polymer M. The molecular weight of the polymer M measured by GPC (in terms of polystyrene) corresponded to Mw=45,000 and Mn=21,000. The light absorbing terminal wavelength of the polymer M was 545 nm.

Comparative Example 2

In the same manner as in Example 3, except that the polymer M was used instead of the polymer B, the preparation and evaluation of the device were carried out. The result is listed in Table 1.

Reference Example 32

Synthesis of Compound 26

[Chemical Formula 101]

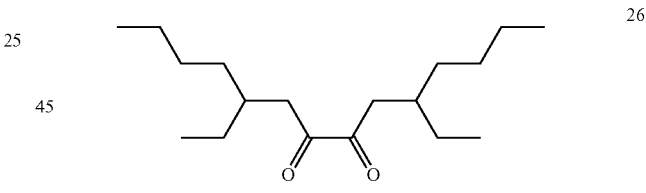

Into a 500 mL flask in which a gas in the flask was replaced by argon, 5.65 g (39.4 mmol) of copper (I) bromide, 6.84 g (78.8 mmol) of lithium bromide, and 280 mL of THF were charged to stir the resultant mixture to prepare suspension. The flask was cooled to −78° C. and into the suspension, 39.4 mL of solution of 2-ethylhexylmagnesium bromide (1 M) in diethyl ether was dropped over 10 minutes. The resultant reaction solution was stirred at −78° C. for 30 minutes and then, into the reaction solution, 2.00 g (15.8 mmol) of oxalyl chloride was dropped at −78° C. over 10 minutes. After the dropping, the reaction solution was stirred at −78° C. for 1.5 hours and further, at room temperature (25° C.) for 30 minutes and to the resultant solution, 160 mL of saturated ammonium chloride aqueous solution was added to terminate the reaction. Ethyl acetate was added to the reaction solution and the reaction solution was extracted into an organic phase. The resultant organic phase was dried over magnesium sulfate and was filtered. The filtrate was concentrated by an evaporator and the resultant oily substance was purified by a silica gel column to obtain compound 26 as 1.30 g of light yellow liquid. As the developing solution of the silica gel column, a solution prepared by mixing hexane and ethyl acetate in a volume ratio of 99:1 was used.

Reference Example 33

Synthesis of Compound 28

[Chemical Formula 102]

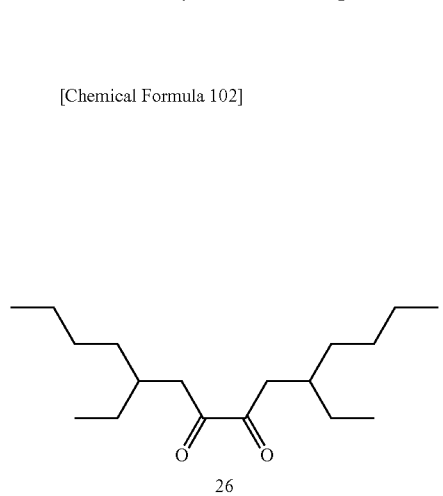

Into a 300 mL flask in which a gas in the flask was replaced by argon, 1.33 g (4.72 mmol) of the compound 26, 1.20 g (4.31 mmol) of compound 27 synthesized according to a method described in "Chemistry of Materials, Vol. 8, No. 2, (1996)," and 60 mL of ethanol were charged and the resultant reaction mixture was stirred under reflux for 5 hours. Then, from the resultant reaction mixture, the solvent was evaporated with an evaporator and the resultant dark red solid was purified by a silica gel column to obtain 1.22 g of the objective compound 28. As the developing solution of the silica gel column, a solution prepared by mixing hexane and chloroform in a volume ratio of 99:1 was used.

Reference Example 34

Synthesis of Compound 29

[Chemical Formula 103]

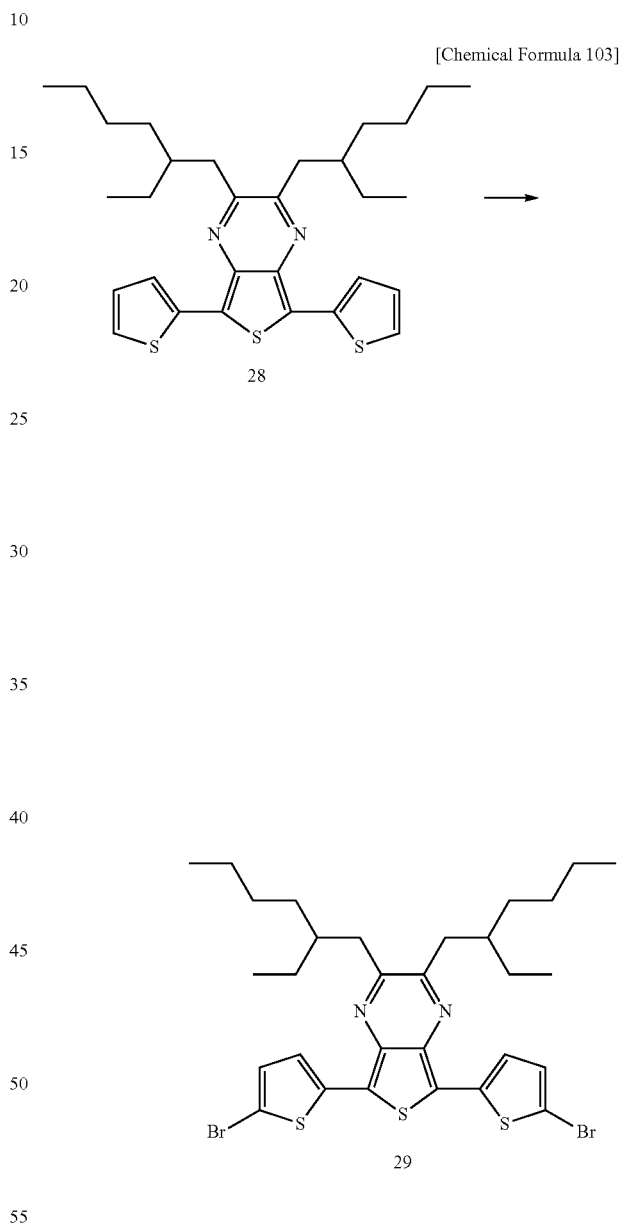

Into a 300 mL flask in which a gas in the flask was replaced by argon, 1.22 g (2.32 mmol) of the compound 28 and 100 mL of chloroform were charged to prepare a homogeneous solution. While maintaining the flask at −10° C., 0.87 g of NBS was added to the solution over 30 minutes. The flask was returned to room temperature and thereto, 100 mL of saturated sodium thiosulfate aqueous solution was added to terminate the reaction. The resultant solution was extracted with chloroform and the resultant organic phase was dried over sodium sulfate and was filtered. The filtrate was concentrated by an evaporator and the resultant wax solid was purified by a silica gel column to obtain 1.00 g of the objective compound 29. As the developing solution of the silica gel column, a solution prepared by mixing heptane and chloroform in a volume ratio of 98:2 was used.

Example 22

Synthesis of Polymer N

[Chemical Formula 104]

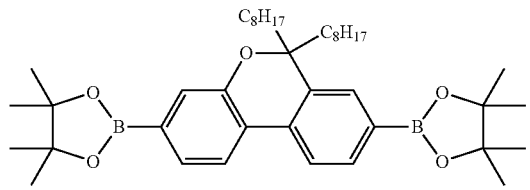

9

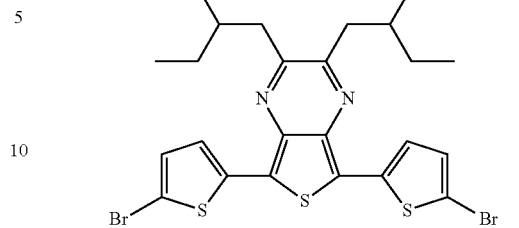

29

By using the compound 29 instead of the compound 10 in Reference Example 11, polymer N was obtained. For the polymer N, the weight-average molecular weight in terms of polystyrene was 126,000 and the number average molecular weight in terms of polystyrene was 56,000. The light absorbing terminal wavelength of the polymer N was 765 nm.

Example 23

In the same manner as in Example 3, except that the polymer N was used instead of the polymer B, the preparation and evaluation of the device were carried out. The result is listed in Table 1.

[Table 1]

TABLE 1

| | | Photovoltaic Cell Evaluation Result | | | | |
|---|---|---|---|---|---|---|
| | | Short-Circuit Current Density (mA/cm$^2$) | Open-Circuit Voltage (V) | Fill Factor | Photoelectric Conversion Efficiency (%) | Absorbing Terminal Wavelength (nm) |
| Example 3 | Polymer B | 5.64 | 0.58 | 0.36 | 1.18 | 930 |
| Example 4 | Polymer B | 7.66 | 0.58 | 0.44 | 1.95 | 930 |
| Example 6 | Polymer A | 12.46 | 0.52 | 0.52 | 3.38 | 925 |
| Example 8 | Polymer F | 10.08 | 0.56 | 0.51 | 2.86 | 930 |
| Example 10 | Polymer G | 11.64 | 0.53 | 0.52 | 3.19 | 930 |
| Example 12 | Polymer H | 5.21 | 0.51 | 0.49 | 1.30 | 910 |
| Example 14 | Polymer I | 5.28 | 0.70 | 0.40 | 1.48 | 805 |
| Example 16 | Polymer J | 5.85 | 0.61 | 0.42 | 1.50 | 815 |
| Example 18 | Polymer K | 8.38 | 0.55 | 0.51 | 2.38 | 930 |
| Example 20 | Polymer L | 10.32 | 0.57 | 0.57 | 3.34 | 930 |
| Example 21 | Polymer D | 4.95 | 0.74 | 0.56 | 2.17 | 755 |
| Example 23 | Polymer N | 4.60 | 0.67 | 0.46 | 1.42 | 565 |
| Comparative Example 1 | Polymer C | 0.11 | 0.80 | 0.43 | 0.04 | 550 |
| Comparative Example 2 | Polymer M | 0.07 | 0.80 | 0.43 | 0.03 | 545 |

Example 24

Preparation of Organic Transistor

A silicon substrate having a silicon thermal oxide film of thickness of 300 nm and n-type silicon in which antimony was doped in a high concentration was subjected to ultrasonic cleaning in acetone for 10 minutes and was then irradiated with ozone UV for 20 minutes. Then, the silicon substrate was spin-coated with a toluene solution in which 5 drops of octadecyltrichlorosilane were added to 10 mL of toluene with a syringe to subject the surface of the thermal oxide film to silane treatment. The silicon thermal oxide film acts as a gate insulating layer and the silicon in which antimony was doped in a high concentration acts as a gate electrode.

Next, the polymer J was dissolved in o-dichlorobenzene to prepare a solution in which concentration of polymer J is 0.5% by weight, and the solution was filtered with a membrane filter to prepare a coating liquid. The coating liquid was applied on the above silane-treated n-type silicon substrate by a spin coating method to form the coating film of polymer J having a thickness of about 60 nm. Then, the coating film was heated at 170° C. under a nitrogen atmosphere for 30 minutes to form the organic semiconductor thin film of polymer J.

Next, an organic transistor was produced by disposing a metal mask on the organic semiconductor thin film, and layering molybdenum trioxide and gold in this order on the organic semiconductor thin film by a vacuum deposition method to prepare a source electrode and a drain electrode that had a layered structure of molybdenum trioxide and gold.

The electric properties of the organic transistor were measured using a semiconductor properties evaluation system (semiconductor parameter analyzer 4200-SCS; manufactured by Keithley Instruments Inc.). When a negative gate voltage applied to a gate electrode increased, a negative drain current also increased, so that it could be confirmed that the organic transistor was a p-type organic transistor. The saturated electric field-effect mobility μ of a carrier in the organic transistor was calculated using Formula (a) below representing a drain current Id in a saturation region of the electric properties of the organic transistor.

$$Id = (W/2L)\mu C_i (Vg-Vt)^2 \quad (a)$$

(where L represents a channel length of the organic transistor; W represents a channel width of the organic transistor; Ci represents a capacity of the gate insulating film per unit area; Vg represents a gate voltage; and Vt represents a threshold voltage of the gate voltage).

The electric field-effect mobility of a carrier (carrier mobility) was 0.074 $cm^2/Vs$ and the ON/OFF current ratio was $10^6$.

Example 25

In the same manner as in Example 24, except that the polymer G was used instead of the polymer J, the organic transistor element was prepared and the transistor properties thereof were evaluated. The carrier mobility was 0.153 $cm^2/Vs$ and the ON/OFF current ratio was $10^6$.

Example 26

In the same manner as in Example 24, except that the polymer I was used instead of the polymer J, the organic transistor element was prepared and the transistor properties thereof were evaluated. The carrier mobility was $6.80 \times 10^{-4}$ $cm^2/Vs$ and the ON/OFF current ratio was $10^4$.

Example 27

In the same manner as in Example 24, except that the polymer H was used instead of the polymer J, the organic transistor element was prepared and the transistor properties thereof were evaluated. The carrier mobility was 0.029 $cm^2/Vs$ and the ON/OFF current ratio was $10^5$.

Example 28

In the same manner as in Example 24, except that the polymer L was used instead of the polymer J, the organic transistor element was prepared and the transistor properties thereof were evaluated. The carrier mobility was $5.49 \times 10^{-3}$ $cm^2/Vs$ and the ON/OFF current ratio was $10^4$.

Example 29

In the same manner as in Example 24, except that the polymer D was used instead of the polymer J, the organic transistor element was prepared and the transistor properties thereof were evaluated. The carrier mobility was $3.80 \times 10^{-3}$ $cm^2/Vs$ and the ON/OFF current ratio was $10^5$.

Example 30

In the same manner as in Example 24, except that: the polymer F was used instead of the polymer J; β-PTS (β-phenyltrichlorosilane) was used instead of octadecyltrichlorosilane; chloroform was used instead of o-dichlorobenzene; and the temperature for the thermal treatment was 120° C. instead of 170° C., the organic transistor element was prepared and the transistor properties thereof were evaluated. The carrier mobility was $7.3 \times 10^{-3}$ $cm^2/Vs$ and the ON/OFF current ratio was $10^4$.

[Table 2]

TABLE 2

Organic Transistor Element Evaluation Result

| | | Carrier Mobility ($cm^2/Vs$) | ON/OFF Ratio | Absorbing Terminal Wavelength (nm) |
|---|---|---|---|---|
| Example 24 | Polymer J | 0.074 | $10^6$ | 815 |
| Example 25 | Polymer G | 0.153 | $10^6$ | 930 |
| Example 26 | Polymer I | $6.80 \times 10^{-4}$ | $10^4$ | 805 |
| Example 27 | Polymer H | 0.029 | $10^5$ | 910 |
| Example 28 | Polymer L | $5.49 \times 10^{-3}$ | $10^4$ | 930 |
| Example 29 | Polymer D | $3.80 \times 10^{-3}$ | $10^5$ | 755 |
| Example 30 | Polymer F | $7.30 \times 10^{-3}$ | $10^4$ | 930 |

Reference Example 35

Synthesis of Compound 30

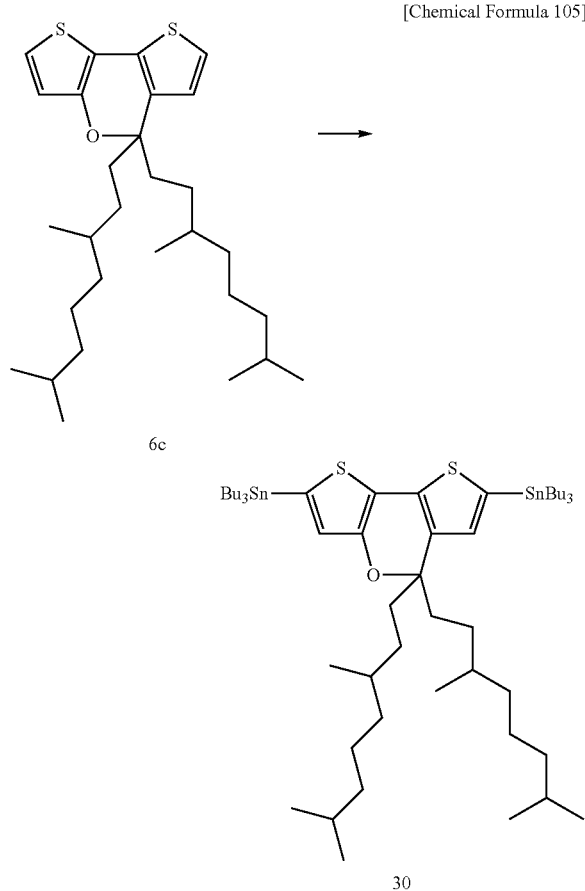

Into a 200 mL flask in which a gas in the flask was replaced by argon, 2.16 g (4.55 mmol) of the compound 6c and 100 mL of anhydrous THF were charged to prepare a homogeneous solution. While maintaining the solution at −78° C., into the solution, 4.37 mL (11.4 mmol) of solution of n-butyllithium (2.6M) in hexane was dropped over 10 minutes. After the dropping, the resultant reaction mixture was stirred at −78° C. for 30 minutes and then, stirred at room temperature (25° C.) for 2 hours. Then, the flask was cooled to −78° C. and to the reaction mixture, 4.07 g (12.5 mmol) of tributyltin chloride was added. After the addition, the resultant reaction mixture was stirred at −78° C. for 30 minutes and next, stirred at room temperature (25° C.) for 3 hours. Then, to the reaction mixture, 200 mL of water was added to terminate the reaction and the reaction product was extracted with ethyl acetate. The organic phase that was an ethyl acetate solution was dried over sodium sulfate and was filtered and then the filtrate was concentrated by an evaporator to evaporate the solvent. The resultant oily substance was purified by a silica gel column (developing solution: hexane). As the silica gel in the silica gel column, a silica gel that was immersed in hexane containing 5% by weight of triethylamine for 5 minutes beforehand and was then rinsed with hexane was used. After the purification, 3.52 g (3.34 mmol) of compound 30 was obtained.

$^1$H NMR in CDCl$_3$ (ppm): 6.72 (d, 1H), 6.68 (d, 1H), 1.95-1.80 (b, 4H), 1.65-1.00 (b, 56H), 0.90-0.83 (m, 36H)

Reference Example 36

Synthesis of Compound 31

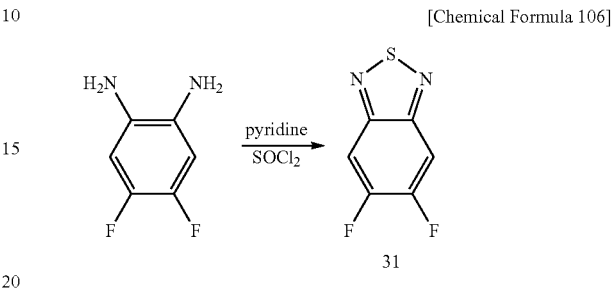

Into a 500 mL flask, 10.2 g (70.8 mmol) of 4,5-difluoro-1,2-diaminobenzene (manufactured by Tokyo Chemical Industry Co., Ltd.) and 150 mL of pyridine were charged to prepare a homogeneous solution. While maintaining the flask at 0° C., into the flask, 16.0 g (134 mmol) of thionyl chloride was dropped. After the dropping, the flask was warmed to 25° C. and the reaction was carried out for 6 hours. Then, 250 mL of water was added to the reaction mixture and the reaction product was extracted with chloroform. The organic phase that was a chloroform solution was dried over sodium sulfate and was filtered. The filtrate was concentrated by an evaporator and the precipitated solid was purified by recrystallization. As the solvent for recrystallization, methanol was used. After the purification, 10.5 g (61.0 mmol) of compound 31 was obtained.

$^1$H NMR (CDCl$_3$, ppm): 7.75 (t, 2H)
$^{19}$F NMR (CDCl$_3$, ppm): −128.3 (s, 2F)

Reference Example 37

Synthesis of Compound 32

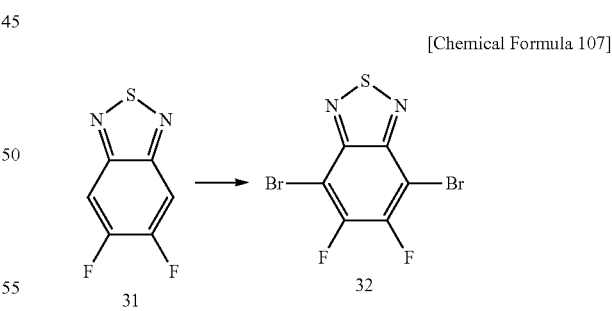

Into a 100 mL flask, 2.00 g (11.6 mmol) of the compound 31 and 0.20 g (3.58 mmol) of iron powder were charged and the flask was heated to 90° C. Into the flask, 31 g (194 mmol) of bromine was dropped over 1 hour. After the dropping, the resultant reaction mixture was stirred at 90° C. for 38 hours. Then, the flask was cooled to room temperature (25° C.) and the reaction mixture was diluted with 100 mL of chloroform. The resultant solution was charged into 300 mL of 5% by weight sodium sulfite aqueous solution and the resultant reaction mixture was stirred for 1 hour. The organic phase of the resultant mixed solution was separated by a separation funnel and the aqueous phase was extracted with chloroform three times. The resultant extract was combined with the above-separated organic phase and the combined organic phase was dried over sodium sulfate. The organic phase was filtered and then the filtrate was concentrated by an evaporator to evaporate the solvent. The resultant yellow solid was dissolved in 90 mL of methanol heated to 55° C. and then, the resultant solution was cooled to 25° C. A precipitated crystal was filtered and recovered and then, the crystal was dried at room temperature (25° C.) under reduced pressure to obtain 1.50 g of compound 32.

$^{19}F$ NMR (CDCl$_3$, ppm): −118.9 (s, 2F)

Example 31

Synthesis of Polymer P

[Chemical Formula 108]

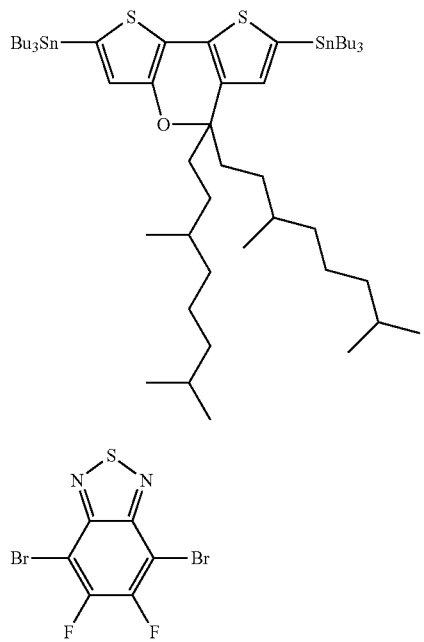

Into a 200 mL flask in which a gas in the flask was replaced by argon, 500 mg (0.475 mmol) of the compound 30, 141 mg (0.427 mmol) of the compound 32, and 32 mL of toluene were charged to prepare a homogeneous solution. The resultant toluene solution was bubbled with argon for 30 minutes. Then, to the toluene solution, 6.52 mg (0.007 mmol) of tris(dibenzylideneacetone) dipalladium and 13.0 mg of tris(2-tolyl)phosphine were added and the resultant reaction mixture was stirred at 100° C. for 6 hours. Then, to the resultant reaction solution, 500 mg of phenyl bromide was added and the reaction mixture was stirred further for 5 hours. Then, the flask was cooled to 25° C. and the reaction solution was poured into 300 mL of methanol. A precipitated polymer was filtered and recovered and the resultant polymer was charged into a thimble to extract the polymer with methanol, acetone, and hexane using a Soxhlet extractor for 5 hours respectively. The polymer remaining in the thimble was dissolved in 100 mL of toluene and to the resultant reaction solution, 2 g of sodium diethyldithiocarbamate and 40 mL of water were added to stir the resultant reaction mixture under reflux for 8 hours. The aqueous phase was removed and then the organic phase was washed with 50 mL of water twice, next with 50 mL of 3% by weight acetic acid aqueous solution twice, next with 50 mL of water twice, next with 50 mL of 5% potassium fluoride aqueous solution twice, and next with 50 mL of water twice, followed by pouring the resultant solution into methanol to precipitate polymer. The polymer was filtered and then dried and the resultant polymer was dissolved in 50 mL of o-dichlorobenzene again. The resultant solution was passed through an alumina/silica gel column. The resultant solution was poured into methanol to precipitate polymer and the polymer was filtered and then dried to obtain 185 mg of purified polymer. Hereinafter, the polymer is called polymer P. The molecular weight of the polymer P measured by GPC (in terms of polystyrene) corresponded to Mw=29,000 and Mn=14,000. The light absorbing terminal wavelength of the polymer P was 890 nm.

Example 32

Production and Evaluation of Ink and Organic Thin Film Solar Cell

A glass substrate on which an ITO film was formed by a sputtering method in a thickness of 150 nm was subjected to surface treatment by ozone UV treatment. Next, the polymer P and fullerene C60PCBM (phenyl C61-butyric acid methyl ester; manufactured by Frontier Carbon Corporation) were dissolved in o-dichlorobenzene so that the weight ratio of C60PCBM relative to the polymer P became 3 to produce an ink 2. In the ink 2, the total of the weight of the polymer P and the weight of C60PCBM was 2.0% by weight, relative to the weight of the ink 2. The ink 2 was applied on the substrate by spin-coating to prepare an organic film containing the polymer P. The organic film had a film thickness of about 100 nm. The light absorbing terminal wavelength of the organic film was measured and was 890 nm. Then, on the organic film, lithium fluoride was deposited by a vacuum deposition machine in a thickness of 2 nm and next thereon, Al was deposited in a thickness of 100 nm. The obtained organic thin film solar cell had a shape of 2 mm×2 mm square. The obtained organic thin film solar cell was irradiated with a constant light using a solar simulator (manufactured by BUNKOUKEIKI Co., Ltd.; trade name: OTENTO-SUNII; AM 1.5G filter, irradiance: 100 mW/cm$^2$) and the generated current and voltage were measured to calculate the photoelectric conversion efficiency, the short-circuit current density, the open-circuit voltage, and the fill factor. $J_{sc}$ (short-circuit current density) was 12.2 mA/cm$^2$; Voc (open-circuit voltage) was 0.71 V; ff (fill factor) was 0.64; and photoelectric conversion efficiency (η) was 5.54%.

Example 33

Production and Evaluation of Ink and Organic Thin Film Solar Cell

In the same manner as in Example 32, except that fullerene C70PCBM ([6,6]-phenyl C71 butyric acid methyl ester) was used instead of fullerene C60PCBM, the organic thin film solar cell was prepared and the photoelectric conversion efficiency, the short-circuit current density, the open-circuit voltage, and the fill factor were measured. The organic film had the light absorbing terminal wavelength of 890 nm, $J_{sc}$ (short-circuit current density) of 15.9 mA/cm$^2$, Voc (open-circuit voltage) of 0.715 V, ff (fill factor) of 0.59, and the photoelectric conversion efficiency (η) of 6.72%.

[Table 3]

TABLE 3

| | | Photovoltaic Cell Evaluation Result | | | | |
|---|---|---|---|---|---|---|
| | | Short-Circuit Current Density (mA/cm²) | Open-Circuit Voltage (V) | Fill Factor | Photoelectric Conversion Efficiency (%) | Light Absorbing Terminal Wavelength (nm) |
| Example 32 | Polymer P | 12.2 | 0.71 | 0.64 | 5.54 | 890 |
| Example 33 | Polymer P | 15.9 | 0.71 | 0.59 | 6.72 | 890 |

Reference Example 38

Synthesis of Compound 36

[Chemical Formula 109]

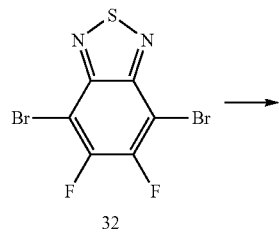

32

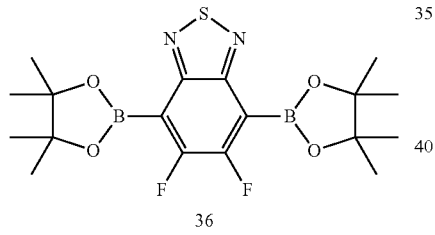

36

Into a four-neck flask, 12.30 g (37.28 mmol) of the compound 32, 23.67 g (93.20 mmol) of bis(pinacolato)diboron, 9.15 g (93.20 mmol) of potassium acetate, and 500 mL of dioxane were charged and the resultant reaction mixture was subjected to argon bubbling at room temperature (25° C.) for 30 minutes. To the resultant reaction solution, 1.52 g (1.86 mmol) of diphenylphosphinoferrocene palladium dichloride and 1.03 mg (1.86 mmol) of diphenylphosphinoferrocene were added and the resultant reaction mixture was refluxed with heating for 60 hours. After the reflux, the disappearance of the raw material was confirmed by liquid chromatography. The reaction solution was filtered with celite to separate insoluble contents and then the filtrate was dried to remove the solvent to obtain a brown solid. To the obtained brown solid, 200 mL of hot hexane was added and the resultant mixture was filtered to dry the filtrate, followed by removing the solvent to obtain a crude crystal. Subsequently, the crude crystal was recrystallized in hexane. The recrystallization was performed twice to obtain 3.12 g of compound 36.

$^1$H-NMR (CDCl$_3$, δ (ppm)): 1.45 (s, 24H)

$^{19}$F-NMR (CDCl$_3$, δ (ppm)): −117 (s, 2F)

Reference Example 39

Synthesis of Compound 37

[Chemical Formula 110]

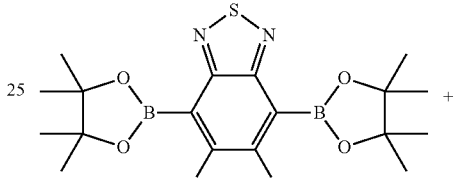

36

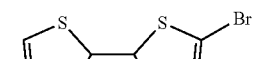

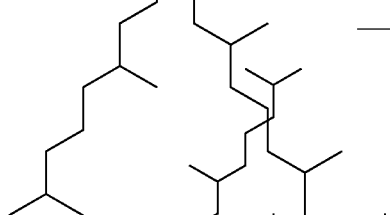

2

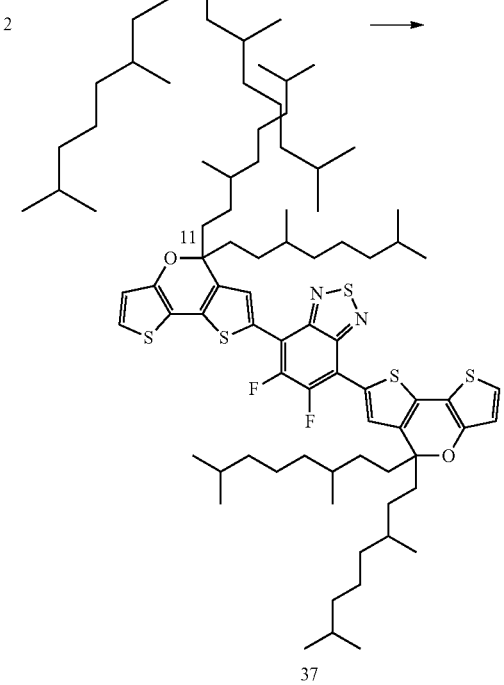

37

A four-neck flask was used and thereinto, the compound 11 (1.352 g, 2.442 mmol) and tetrahydrofuran (25 mL) were charged, followed by subjecting the resultant reaction mixture to argon bubbling at room temperature (25° C.) for 30 minutes. Then, to the resultant reaction solution, tris(dibenzylideneacetone) palladium (21.6 mg, 0.024 mmol), [tri(tert-butyl)phosphonium]tetrafluoroborate (27.4 mg, 0.094 mmol), and a potassium phosphate aqueous solution (2 mol/L, 5.90 g, 11.79 mmol) were added. While stirring the resultant reaction mixture at 80° C., into the reaction mixture, a solution of the compound 36 (0.500 g, 1.179 mmol) dissolved in tetrahydrofuran (10 mL) was dropped over 20 minutes. After 2 hours, the disappearance of the raw material was confirmed by liquid chromatography. Water was added to the system and the resultant reaction mixture was extracted with hexane, followed by subjecting the resultant extract to column-purification using hexane as a developing solution and then drying the purified extract to obtain 665 mg of compound 37.

$^1$H-NMR (CDCl$_3$, δ (ppm)): 0.82 (m, 36H), 1.08-1.47 (m, 40H), 1.95 (m, 8H), 6.71 (d, 2H), 7.07 (d, 2H), 7.92 (d, 2H)

$^{19}$F-NMR (CDCl$_3$, δ (ppm)): −125 (s, 2F)

Reference Example 40

Synthesis of Compound 38

[Chemical Formula 111]

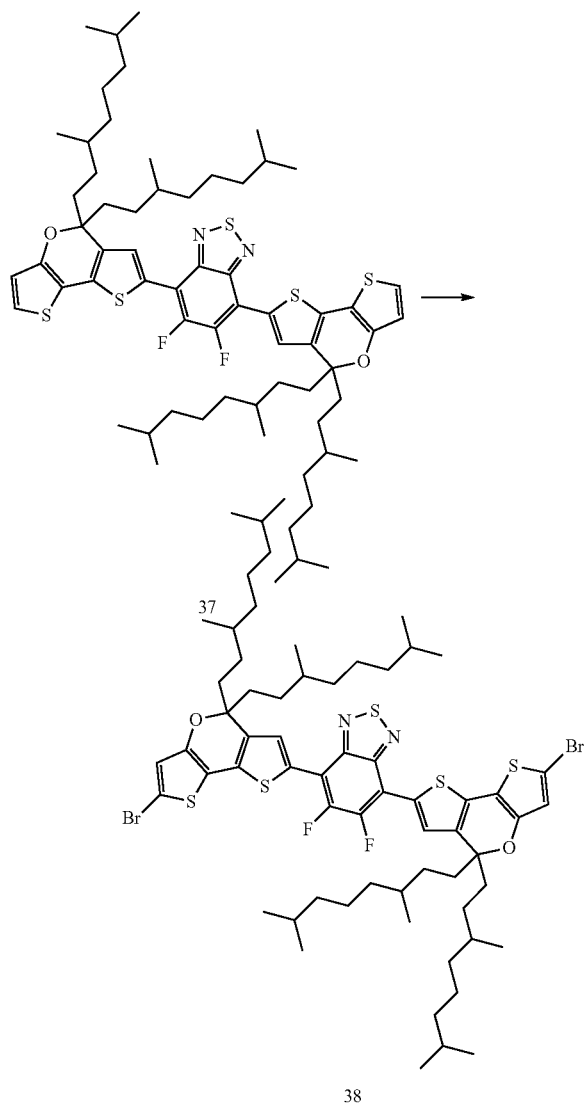

A four-neck flask was used and thereinto, the compound 37 (657 mg, 0.588 mmol) and tetrahydrofuran (THF) (10 mL) were charged, followed by subjecting the resultant reaction mixture to argon bubbling at room temperature (25° C.) for 30 minutes. The resultant reaction mixture was cooled to 0° C. and then to the reaction mixture, NBS (230 mg, 1.30 mmol) was added, followed by elevating the temperature of the reaction mixture to 40° C. After 1 hour, the disappearance of the raw material was confirmed. Then, to the reaction solution, a sodium thiosulfate aqueous solution was added and the resultant reaction mixture was extracted with hexane into an organic phase. Then, the organic phase was separated by a column using hexane as a developing solution and a component obtained by the separation was dried to obtain 685 mg of compound 38.

$^1$H-NMR (CDCl$_3$, δ (ppm)): 0.82 (m, 36H), 1.08-1.47 (m, 40H), 1.95 (m, 8H), 6.73 (s, 2H), 7.90 (s, 2H)

$^{19}$F-NMR (CDCl$_3$, δ (ppm)): −129 (s, 2F)

Reference Example 41

Synthesis of Compound 39

[Chemical Formula 112]

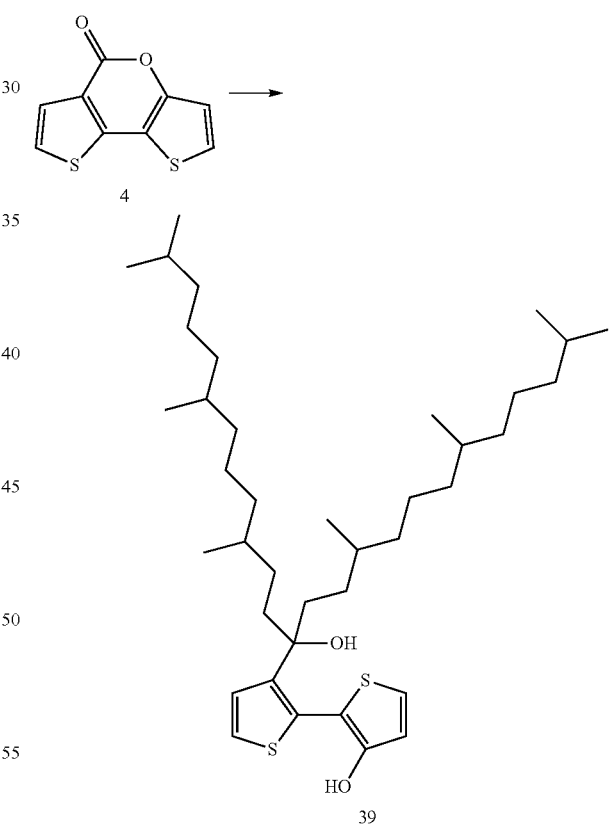

A four-neck flask was used and thereinto, magnesium (3.50 g, 144.1 mmol), tetrahydrofuran (72 mL), and 3,7,11-trimethyldodecyl bromide (20.98 g, 72.03 mmol) were charged to prepare a Grignard reagent (1 mol/L). Another four-neck flask was used and thereinto, the compound 4 (5.00 g, 24.01 mmol) and tetrahydrofuran (200 mL) were charged, followed by subjecting the resultant reaction mixture to argon bubbling at room temperature (25° C.) for 30 minutes. The resultant reaction mixture was cooled to −40° C. and then thereto, the above-prepared Grignard reagent was added. While elevating the temperature of the resultant reaction mixture to 0° C., the reaction mixture was stirred and after 3 hours, the disappearance of the raw material was confirmed.

Water was added to the system and the resultant reaction mixture was extracted with chloroform, followed by subjecting the resultant extract to column-purification using chloroform and then drying the purified extract to obtain a mixed oil containing compound 39.

Reference Example 42

Synthesis of Compound 40 mL) were charged, followed by subjecting the resultant reaction mixture to argon bubbling at room temperature (25° C.) for 30 minutes. Next, to the resultant reaction mixture, p-toluenesulfonic acid monohydrate (500 mg) was added and then the temperature of the reaction mixture was elevated to 120° C., followed by stirring the reaction mixture to confirm the disappearance of the raw material after 1 hour. Water was added to the system and the resultant reaction mixture was extracted with ethyl acetate. The resultant extract was subjected to column-purification using hexane and then the purified extract was dried to obtain 15.6 g of compound 40.

$^1$H-NMR (CDCl$_3$, δ (ppm)): 0.80-0.88 (m, 24H), 0.97-1.62 (m, 34H), 1.87 (q, 4H), 6.67 (d, 1H), 6.69 (d, 1H), 6.96 (d, 1H), 7.03 (d, 1H)

Reference Example 43

Synthesis of Compound 41

[Chemical Formula 113]

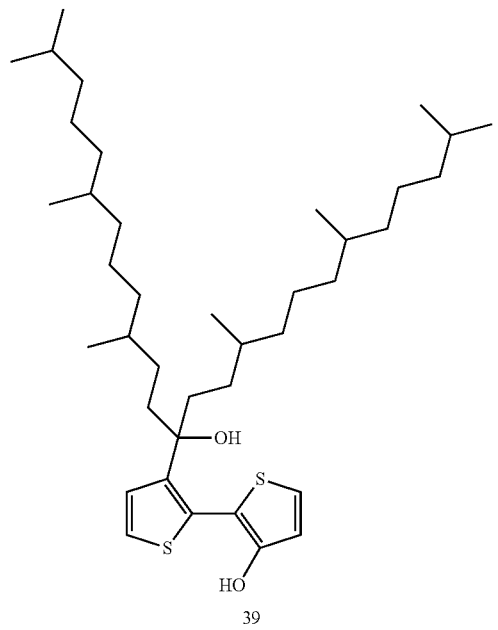

[Chemical Formula 114]

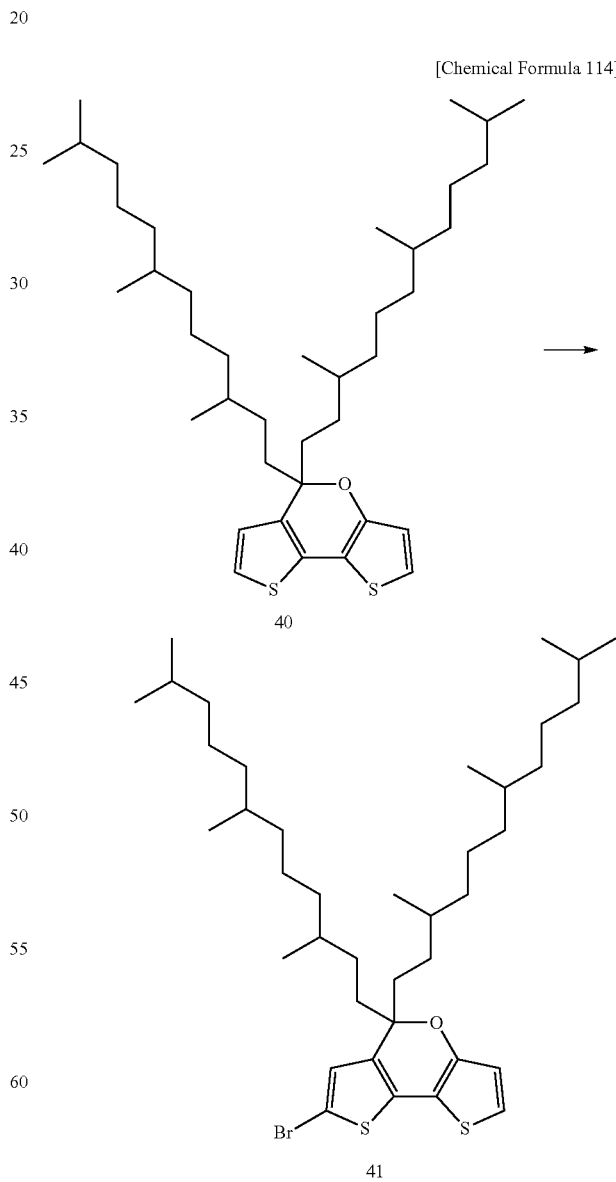

A four-neck flask was used and thereinto, the whole amount of the oil mixture containing the compound 39 that was synthesized in Reference Example 42 and toluene (100

A four-neck flask was used and thereinto, the compound 40 (7.995 g, 13.00 mmol) and tetrahydrofuran (160 mL) were charged, followed by subjecting the resultant reaction mixture to argon bubbling at room temperature (25° C.) for 30 minutes. The reaction mixture was cooled to −30° C. and then to the reaction mixture, N-bromosuccinimide (1.85 g, 10.4 mmol) was added. When the resultant reaction mixture was stirred at −10° C. for 2 hours, 90% of the raw material was disappeared. Accordingly, the reaction was terminated. Water was added to the system and the resultant reaction mixture was extracted with diethyl ether, followed by subjecting the resultant extract to column-purification using hexane. The purified extract was dried to obtain 7.47 g of compound 41.

$^1$H-NMR (CDCl$_3$, δ (ppm)): 0.82-0.88 (m, 24H), 0.95-1.60 (m, 34H), 1.82 (q, 4H), 6.64 (s, 1H), 6.65 (s, 1H), 6.98 (d, 1H)

Reference Example 44

Synthesis of Compound 42

[Chemical Formula 115]

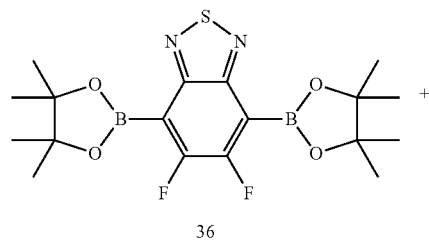

36

+

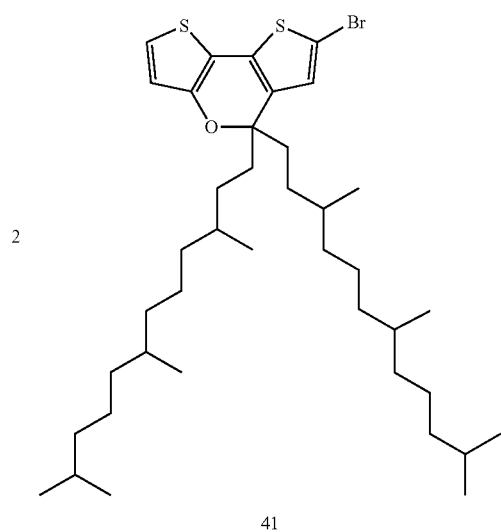

41

→

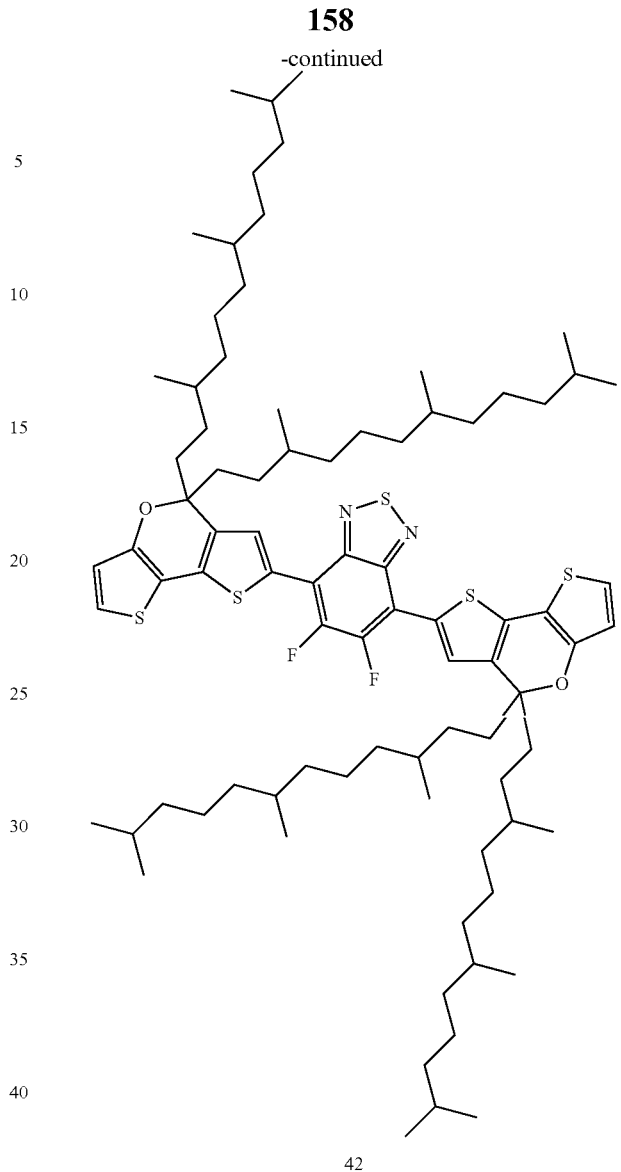

42

A four-neck flask was used and thereinto, the compound 41 (1.729 g, 2.491 mmol) and methylene chloride (25 mL) were charged, followed by subjecting the resultant reaction mixture to argon bubbling at room temperature (25° C.) for 30 minutes. Then, to the resultant reaction solution, tris(dibenzylideneacetone) palladium (21.6 mg, 0.024 mmol), [tri(tert-butyl)phosphonium]tetrafluoroborate (27.4 mg, 0.094 mmol), and a potassium phosphate aqueous solution (2 mol/L, 5.90 g, 11.79 mmol) were added. While stirring the resultant reaction mixture at 45° C., into the reaction mixture, a solution of the compound 36 (0.500 g, 1.179 mmol) dissolved in methylene chloride (20 mL) was dropped over 20 minutes. After 2 hours, the disappearance of the raw material was confirmed by liquid chromatography. Water was added to the system and the resultant reaction mixture was extracted with hexane, followed by subjecting the resultant extract to column-purification using hexane as a developing solution and then drying the purified extract to obtain 1.21 g of compound 42.

$^1$H-NMR (CDCl$_3$, δ (ppm)): 0.70-0.95 (m, 48H), 0.96-1.60 (m, 68H), 1.97 (m, 8H), 6.72 (d, 2H), 7.08 (d, 2H), 7.93 (d, 2H)

$^{19}$F-NMR (CDCl$_3$, δ (ppm)): −125 (s, 2F)

Reference Example 45

Synthesis of Compound 43

[Chemical Formula 116]

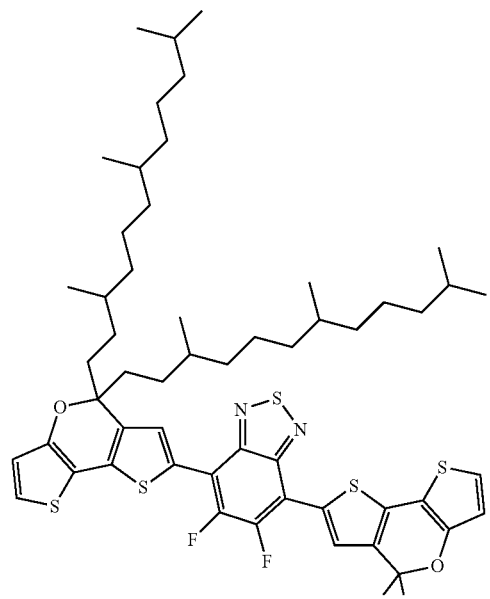

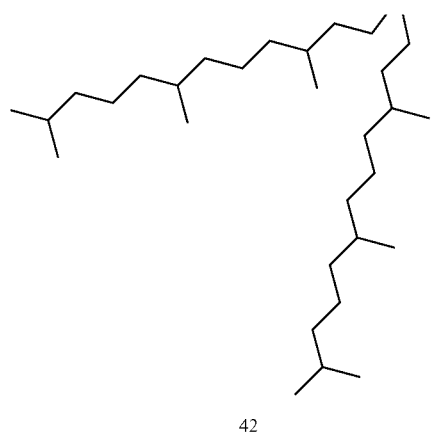

42

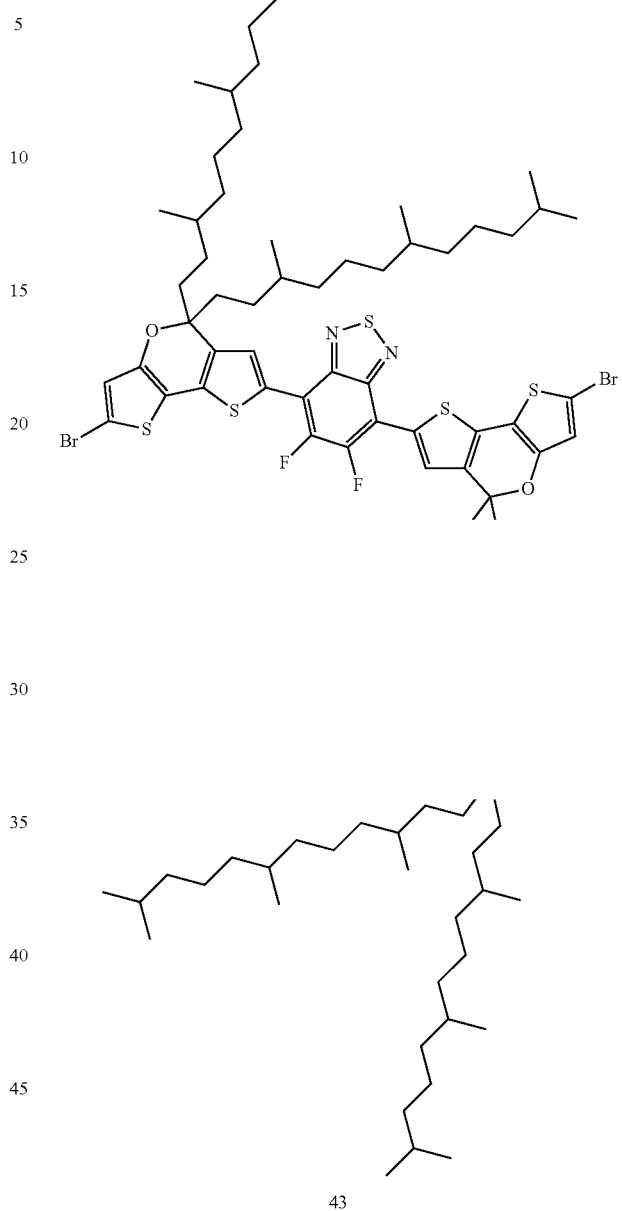

43

A four-neck flask was used and thereinto, the compound 42 (1.214 g, 0.868 mmol) and tetrahydrofuran (THF) (40 mL) were charged, followed by subjecting the resultant reaction mixture to argon bubbling at room temperature (25° C.) for 30 minutes. The resultant reaction mixture was cooled to 0° C. and then to the reaction mixture, NBS (340 mg, 1.91 mmol) was added, followed by elevating the temperature of the reaction mixture to 40° C. After 1 hour, the disappearance of the raw material was confirmed. Then, to the reaction solution, a sodium thiosulfate aqueous solution was added and the resultant reaction mixture was extracted with hexane into an organic phase. Then, the organic phase was separated by a column using hexane as a developing solution and the component obtained by the separation was dried to obtain 1.23 g of compound 43.

$^1$H-NMR (CDCl$_3$, δ (ppm)): 0.65-0.96 (m, 48H), 0.98-1.62 (m, 68H), 1.95 (m, 8H), 6.73 (s, 2H), 7.90 (s, 2H)

$^{19}$F-NMR (CDCl$_3$, δ (ppm)): −129 (s, 2F)

Reference Example 46

Synthesis of Compound 44

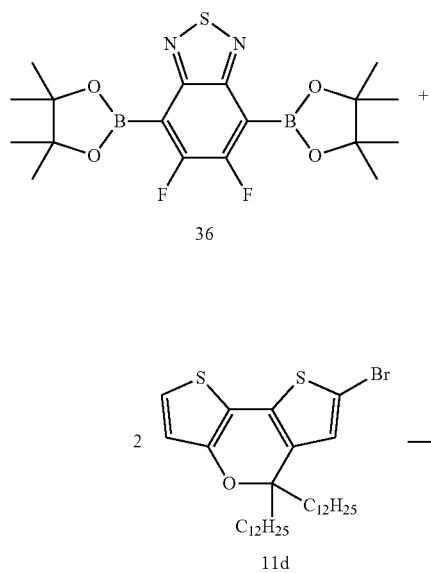

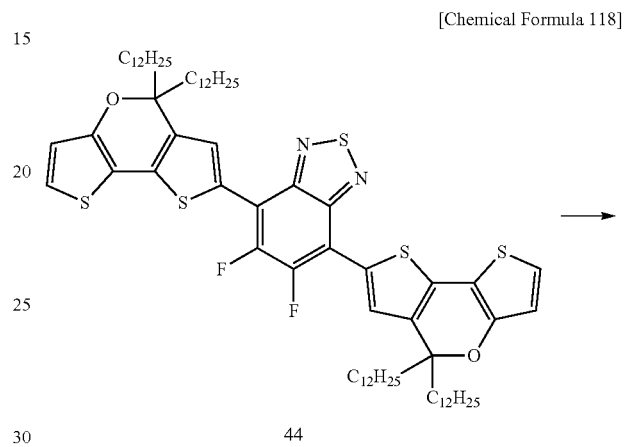

A four-neck flask was used and thereinto, the compound 11d (3.388 g, 5.556 mmol) and methylene chloride (50 mL) were charged, followed by subjecting the resultant reaction mixture to argon bubbling at room temperature (25° C.) for 30 minutes. Then, to the resultant reaction solution, tris(dibenzylideneacetone) palladium (86.4 mg, 0.094 mmol), [tri(tert-butyl)phosphonium]tetrafluoroborate (109.5 mg, 0.377 mmol), and a potassium phosphate aqueous solution (2 mol/L, 11.79 g, 23.58 mmol) were added. While stirring the resultant reaction mixture at 45° C., into the reaction mixture, a solution of the compound 36 (1.000 g, 2.358 mmol) dissolved in methylene chloride (50 mL) was dropped over 20 minutes. After 2 hours, the disappearance of the raw material was confirmed by liquid chromatography. Water was added to the system and the resultant reaction mixture was extracted with hexane, followed by subjecting the resultant extract to column-purification using hexane as a developing solution and then drying the purified extract to obtain 1.88 g of compound 44.

$^1$H-NMR (CDCl$_3$, δ (ppm)): 0.86 (t, 12H), 0.95-1.50 (m, 80H), 1.97 (m, 8H), 6.71 (d, 2H), 7.07 (d, 2H), 7.92 (d, 2H)
$^{19}$F-NMR (CDCl$_3$, δ (ppm)): −125 (s, 2F)

Reference Example 47

Synthesis of Compound 45

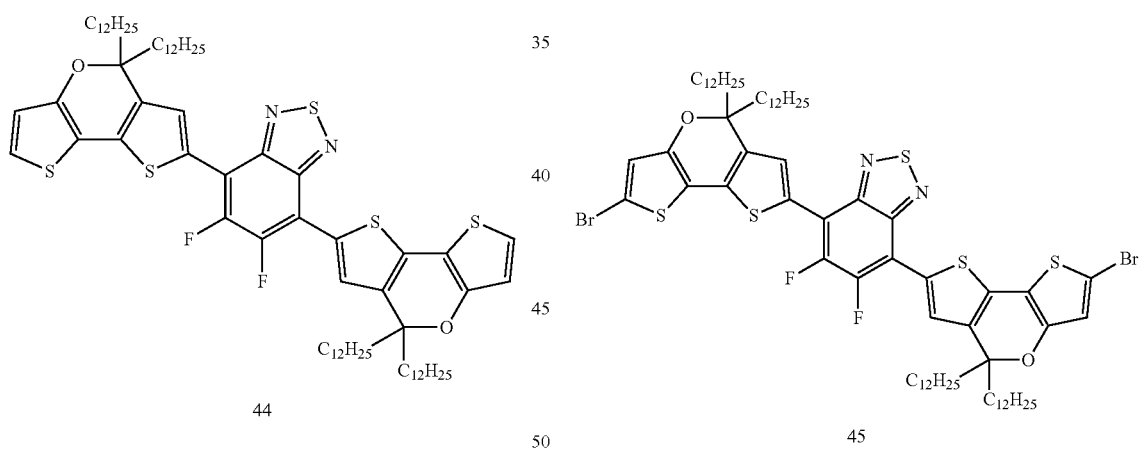

A four-neck flask was used and thereinto, the compound 44 (1.884 g, 1.532 mmol) and tetrahydrofuran (THF) (60 mL) were charged, followed by subjecting the resultant reaction mixture to argon bubbling at room temperature (25° C.) for 30 minutes. The resultant reaction mixture was cooled to 0° C. and then to the reaction mixture, NBS (600 mg, 3.37 mmol) was added, followed by elevating the temperature of the reaction mixture to 40° C. After 1 hour, the disappearance of the raw material was confirmed. Then, to the reaction solution, a sodium thiosulfate aqueous solution was added and the resultant reaction mixture was extracted with hexane into an organic phase. Then, the organic phase was separated by a column using hexane as a developing solution and the component obtained by the separation was dried to obtain 1.88 g of compound 45.

$^1$H-NMR (CDCl$_3$, δ (ppm)): 0.86 (t, 12H), 1.18-1.50 (m, 80H), 1.95 (m, 8H), 6.72 (s, 2H), 7.90 (s, 2H) $^{19}$F-NMR (CDCl$_3$, δ (ppm)): −129 (s, 2F)

Reference Example 48

Synthesis of Compound 46

[Chemical Formula 119]

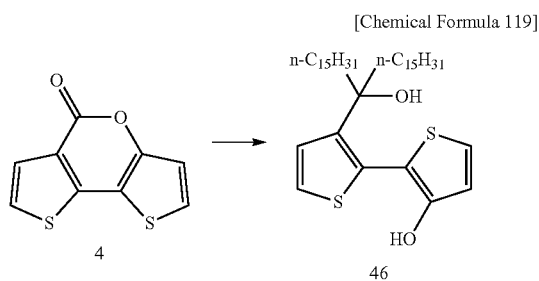

A four-neck flask was used and thereinto, the compound 4 (6.00 g, 28.81 mmol) and tetrahydrofuran (240 mL) were charged, followed by subjecting the resultant reaction mixture to argon bubbling at room temperature (25° C.) for 30 minutes. The resultant reaction mixture was cooled to −40° C. and then to the reaction mixture, n-pentadecylmagnesium bromide (0.5 mol/L tetrahydrofuran solution, 173 mL) was added. While elevating the temperature of the resultant reaction mixture to 0° C., the reaction mixture was stirred and after 3 hours, the disappearance of the raw material was confirmed.

Water was added to the system and the resultant reaction mixture was extracted with chloroform, followed by subjecting the resultant extract to column-purification using chloroform and then drying the purified extract to obtain a mixed oil containing compound 46.

Reference Example 49

Synthesis of Compound 47

[Chemical Formula 120]

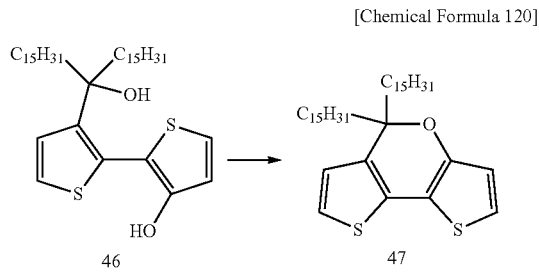

A four-neck flask was used and thereinto, the whole amount of the oil mixture containing the compound 46 that was synthesized in Reference Example 48 and toluene (120 mL) were charged, followed by subjecting the resultant reaction mixture to argon bubbling at room temperature (25° C.) for 30 minutes. Next, to the resultant reaction mixture, p-toluenesulfonic acid monohydrate (600 mg) was added and the temperature of the resultant reaction mixture was elevated to 120° C., followed by stirring the resultant reaction mixture.

After 1 hour, the disappearance of the raw material was confirmed. Water was added to the system and the resultant reaction mixture was extracted with ethyl acetate. The resultant extract was subjected to column-purification using hexane and then the purified extract was dried to obtain 18.4 g of compound 47.

$^1$H-NMR (CDCl$_3$, δ (ppm)): 0.82 (t, 6H), 1.21 (m, 48H), 1.43 (m, 4H), 1.96 (t, 4H), 6.67 (d, 1H), 6.69 (d, 1H), 6.96 (d, 1H), 7.03 (d, 1H)

Reference Example 50

Synthesis of Compound 48

[Chemical Formula 121]

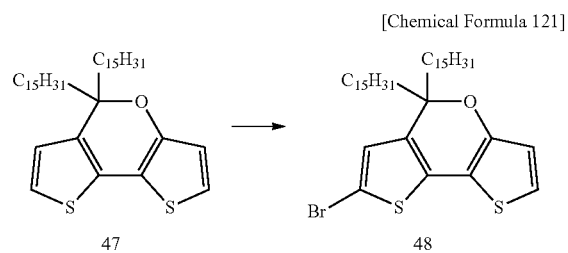

A four-neck flask was used and thereinto, the compound 47 (23.2 g, 37.8 mmol) and tetrahydrofuran (340 mL) were charged, followed by subjecting the resultant reaction mixture to argon bubbling at room temperature (25° C.) for 30 minutes. The resultant reaction mixture was cooled to −30° C. and then to the reaction mixture, N-bromosuccinimide (6.05 g, 34.0 mmol) was added. The resultant reaction mixture was stirred at −10° C. for 2 hours and 90% of the raw material was disappeared. Accordingly, the reaction was terminated. Water was added to the system and the resultant reaction mixture was extracted with diethyl ether, followed by subjecting the resultant extract to column-purification using hexane and drying the purified extract to obtain 23.3 g of compound 48.

$^1$H-NMR (CDCl$_3$, δ (ppm)): 0.83 (t, 6H), 1.23 (m, 48H), 1.44 (m, 4H), 1.98 (t, 4H), 6.65 (d, 1H), 6.66 (s, 1H), 6.98 (s, 1H)

Reference Example 51

Synthesis of Compound 49

[Chemical Formula 122]

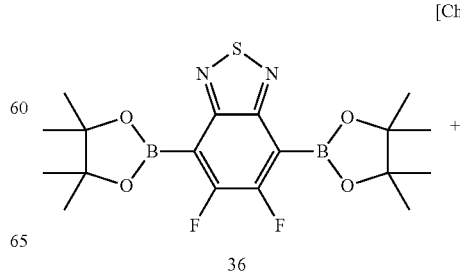

36

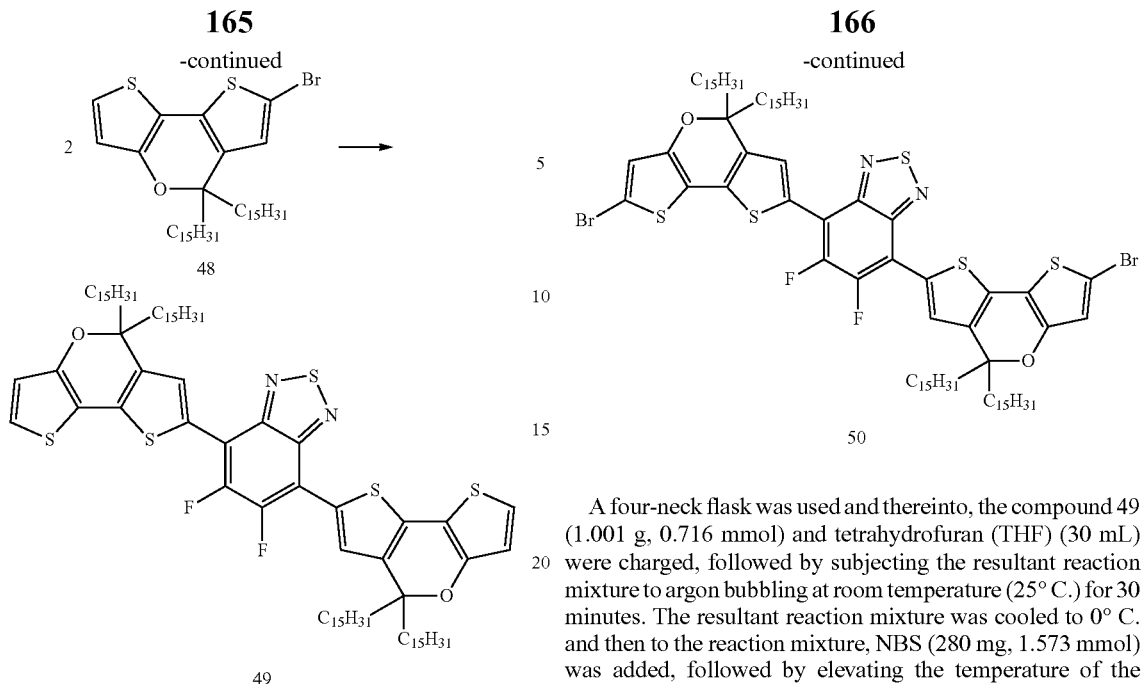

48

49

A four-neck flask was used and thereinto, the compound 48 (1.695 g, 2.442 mmol) and methylene chloride (50 mL) were charged, followed by subjecting the resultant reaction mixture to argon bubbling at room temperature (25° C.) for 30 minutes. Then, to the resultant reaction solution, tris(dibenzylideneacetone) palladium (21.6 mg, 0.024 mmol), [tri(tert-butyl)phosphonium]tetrafluoroborate (27.4 mg, 0.094 mmol), and a potassium phosphate aqueous solution (2 mol/L, 5.90 g, 11.79 mmol) were added. While stirring the resultant reaction mixture at 45° C., into the reaction mixture, a solution of the compound 36 (0.500 g, 1.179 mmol) dissolved in methylene chloride (10 mL) was dropped over 20 minutes. After 2 hours, the disappearance of the raw material was confirmed by liquid chromatography. Water was added to the system and the resultant reaction mixture was extracted with hexane, followed by subjecting the resultant extract to column-purification using hexane as a developing solution and then drying the purified extract to obtain 1.00 g of compound 49.

$^1$H-NMR (CDCl$_3$, δ (ppm)): 0.87 (t, 12H), 0.90-1.46 (m, 104H), 1.97 (m, 8H), 6.71 (d, 2H), 7.07 (d, 2H), 7.93 (s, 2H)
$^{19}$F-NMR (CDCl$_3$, δ (ppm)): −125 (s, 2F)

Reference Example 52

Synthesis of Compound 50

[Chemical Formula 123]

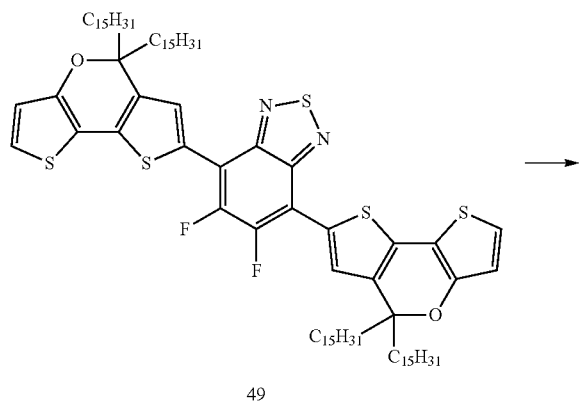

49

50

A four-neck flask was used and thereinto, the compound 49 (1.001 g, 0.716 mmol) and tetrahydrofuran (THF) (30 mL) were charged, followed by subjecting the resultant reaction mixture to argon bubbling at room temperature (25° C.) for 30 minutes. The resultant reaction mixture was cooled to 0° C. and then to the reaction mixture, NBS (280 mg, 1.573 mmol) was added, followed by elevating the temperature of the resultant reaction mixture to 40° C. After 1 hour, the disappearance of the raw material was confirmed. Then, to the reaction solution, a sodium thiosulfate aqueous solution was added and the resultant reaction mixture was extracted with hexane into an organic phase. Then, the organic phase was separated by a column using hexane as a developing solution and the component obtained by the separation was dried to obtain 1.04 g of compound 50.

$^1$H-NMR (CDCl$_3$, δ (ppm)): 0.87 (t, 12H), 0.95-1.50 (m, 104H), 1.95 (m, 8H), 6.72 (s, 2H), 7.90 (s, 2H)
$^{19}$F-NMR (CDCl$_3$, δ (ppm)): −129 (s, 2F)

Reference Example 53

Synthesis of Compound 51

[Chemical Formula 124]

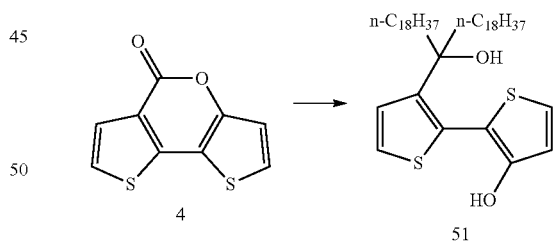

4

51

A four-neck flask was used and thereinto, magnesium (3.50 g, 144.1 mmol), tetrahydrofuran (72 mL), and n-octadecyl bromide (24.01 g, 72.03 mmol) were charged to prepare a Grignard reagent (1 mol/L). Another four-neck flask was used and thereinto, the compound 4 (5.00 g, 24.01 mmol) and tetrahydrofuran (200 mL) were charged, followed by subjecting the resultant reaction mixture to argon bubbling at room temperature (25° C.) for 30 minutes. The resultant reaction mixture was cooled to −40° C. and then to the reaction mixture, the above-prepared Grignard reagent was added. While elevating the temperature of the reaction mixture to 0° C., the reaction mixture was stirred and after 3 hours, the disappearance of the raw material was confirmed.

Water was added to the system and the resultant reaction mixture was extracted with chloroform, followed by subjecting the resultant extract to column-purification using chloroform and then drying the purified extract to obtain a mixed oil containing compound 51.

Reference Example 54

Synthesis of Compound 52

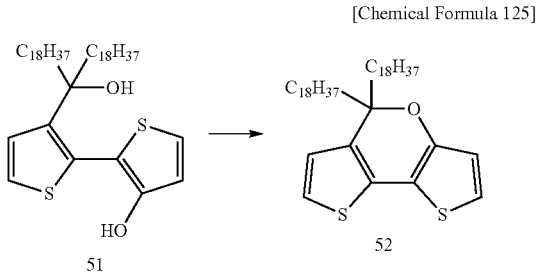

[Chemical Formula 125]

A four-neck flask was used and thereinto, the whole amount of the oil mixture containing the compound 51 that was synthesized in Reference Example 53 and toluene (200 mL) were charged, followed by subjecting the resultant reaction mixture to argon bubbling at room temperature (25° C.) for 30 minutes. Next, to the resultant reaction mixture, p-toluenesulfonic acid monohydrate (1,000 mg) was added and then the temperature of the reaction mixture was elevated to 120° C., followed by stirring the reaction mixture to confirm the disappearance of the raw material after 1 hour. Water was added to the system and the resultant reaction mixture was extracted with ethyl acetate. The resultant extract was subjected to column-purification using hexane and then the purified extract was dried to obtain 23.1 g of compound 52.

$^1$H-NMR (CDCl$_3$, δ (ppm)): 0.81 (t, 6H), 1.21 (m, 60H), 1.43 (m, 4H), 1.96 (t, 4H), 6.67 (d, 1H), 6.69 (d, 1H), 6.96 (d, 1H), 7.03 (d, 1H)

Reference Example 55

Synthesis of Compound 53

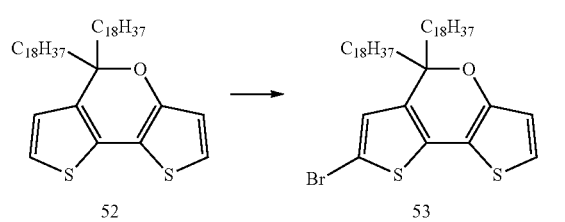

[Chemical Formula 126]

A four-neck flask was used and thereinto, the compound 52 (1.500 g, 2.145 mmol) and tetrahydrofuran (150 mL) were charged, followed by subjecting the resultant reaction mixture to argon bubbling at room temperature (25° C.) for 30 minutes. The resultant reaction mixture was cooled to −30° C. and then to the reaction mixture, N-bromosuccinimide (343.3 mg, 1.931 mmol) was added. The resultant reaction mixture was stirred at −10° C. for 2 hours and 90% of the raw material was disappeared. Accordingly, the reaction was terminated.

Water was added to the system and the resultant reaction mixture was extracted with diethyl ether, followed by subjecting the resultant extract to column-purification using hexane and drying the purified extract to obtain 1.657 g of compound 53.

$^1$H-NMR (CDCl$_3$, δ (ppm)): 0.83 (t, 6H), 1.21 (m, 60H), 1.43 (m, 4H), 1.97 (t, 4H), 6.65 (d, 1H), 6.66 (s, 1H), 6.97 (s, 1H)

Reference Example 56

Synthesis of Compound 54

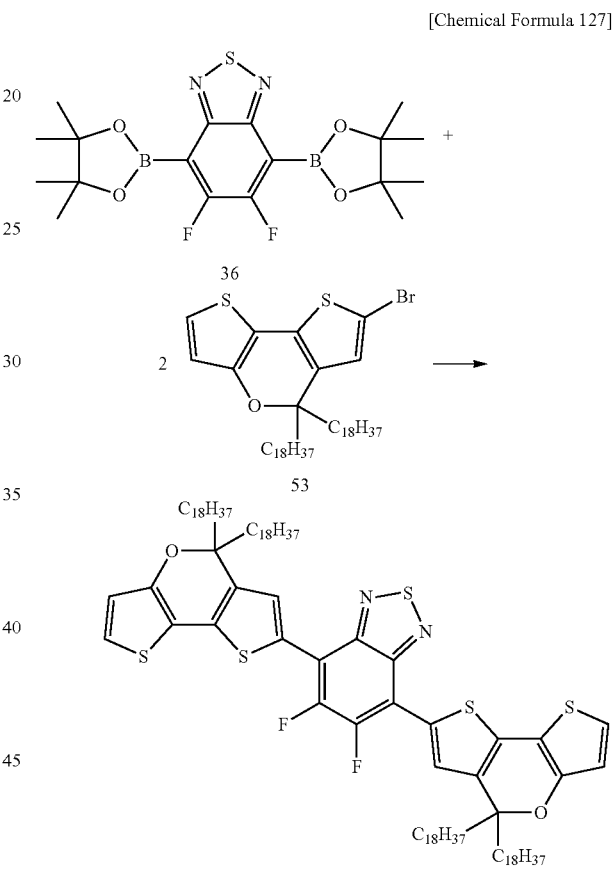

[Chemical Formula 127]

A four-neck flask was used and thereinto, the compound 53 (1.657 g, 2.129 mmol) and methylene chloride (22 mL) were charged, followed by subjecting the resultant reaction mixture to argon bubbling at room temperature (25° C.) for 30 minutes. Then, to the resultant reaction solution, tris(dibenzylideneacetone) palladium (38.8 mg, 0.042 mmol), [tri(tert-butyl)phosphonium]tetrafluoroborate (49.2 mg, 0.170 mmol), and a potassium phosphate aqueous solution (2 mol/L, 5.30 g, 10.60 mmol) were added. While stirring the resultant reaction mixture at 45° C., into the reaction mixture, a solution of the compound 36 (0.450 g, 1.061 mmol) dissolved in methylene chloride (20 mL) was dropped over 20 minutes. After 2 hours, the disappearance of the raw material was confirmed by liquid chromatography. Water was added to the system and the resultant reaction mixture was extracted with Reference Example 57

Synthesis of Compound 55

[Chemical Formula 128]

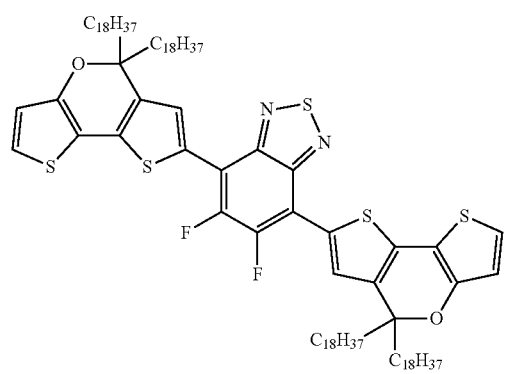

2 →

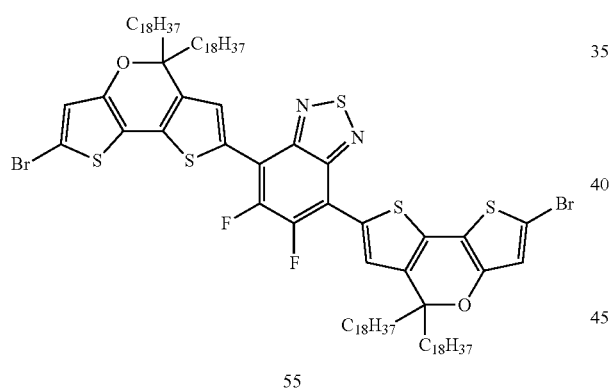

A four-neck flask was used and thereinto, the compound 54 (1.166 g, 0.744 mmol) and tetrahydrofuran (THF) (120 mL) were charged, followed by subjecting the resultant reaction mixture to argon bubbling at room temperature (25° C.) for 30 minutes. The resultant reaction mixture was cooled to 0° C. and then to the reaction mixture, NBS (291 mg, 1.64 mmol) was added, followed by elevating the temperature of the resultant reaction mixture to 40° C. After 1 hour, the disappearance of the raw material was confirmed. Then, to the reaction solution, a sodium thiosulfate aqueous solution was added and the resultant reaction mixture was extracted with hexane into an organic phase. Then, the organic phase was separated by a column using hexane as a developing solution and the component obtained by the separation was dried to obtain 1.18 g of compound 55.

$^1$H-NMR (CDCl$_3$, δ (ppm)): 0.87 (t, 12H), 0.95-1.50 (m, 128H), 1.95 (m, 8H), 6.72 (s, 2H), 7.90 (s, 2H)
$^{19}$F-NMR (CDCl$_3$, δ (ppm)): −129 (s, 2F)

Reference Example 58

Synthesis of Compound 56

[Chemical Formula 129]

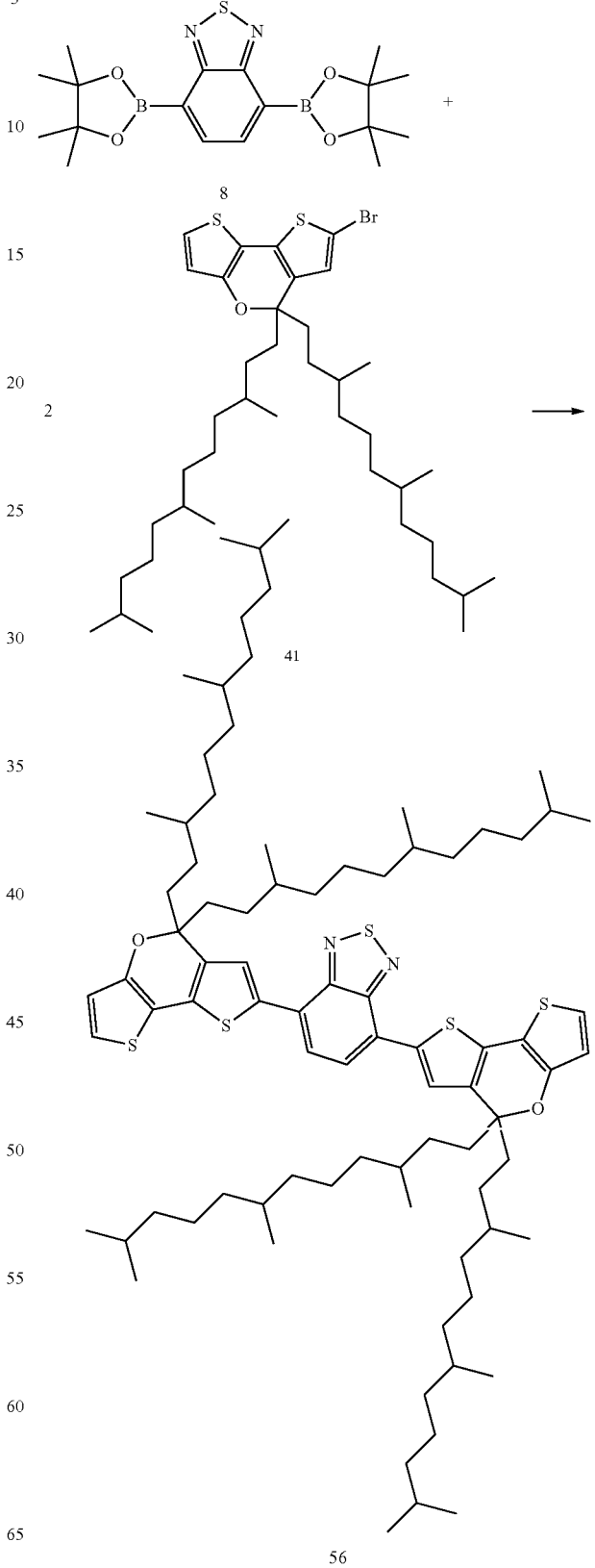

A four-neck flask was used and thereinto, the compound 8 (1.501 g, 3.868 mmol), the compound 41 (6.045 g, 8.710 mmol), and tetrahydrofuran (150 mL) were charged, followed by subjecting the resultant reaction mixture to argon bubbling at room temperature (25° C.) for 30 minutes. Then, to the resultant reaction solution, tris(dibenzylideneacetone) palladium (70.8 mg, 0.0773 mmol) and [tri(tert-butyl)phosphonium]tetrafluoroborate (89.7 mg, 0.309 mmol) were added. While stirring the resultant reaction solution at 45° C., into the reaction solution, a potassium phosphate aqueous solution (2 mol/L, 19.36 g, 38.65 mmol) was dropped over 10 minutes. After 2 hours, the disappearance of the raw material was confirmed by liquid chromatography. Water was added to the system and the resultant reaction mixture was extracted with hexane into an organic phase, followed by purifying the organic phase by a column using hexane as a developing solution and then drying the organic phase to obtain 5.432 g of compound 56.

$^1$H-NMR (CDCl$_3$, δ (ppm)): 0.70-0.86 (m, 48H), 0.90-1.60 (m, 68H), 1.97 (m, 8H), 6.71 (d, 2H), 7.04 (d, 2H), 7.77 (d, 2H), 7.80 (d, 2H)

Reference Example 59

Synthesis of Compound 57

[Chemical Formula 130]

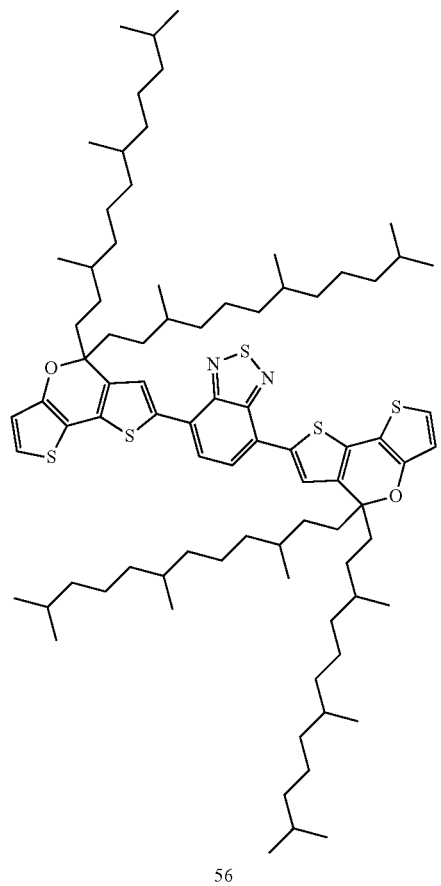

56

→

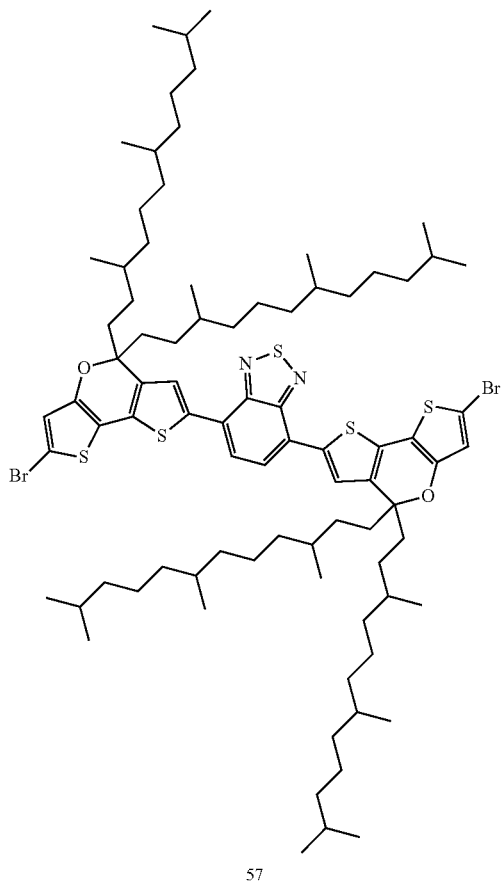

57

A four-neck flask was used and thereinto, the compound 56 (5.265 g, 3.865 mmol) and tetrahydrofuran (THF) (100 mL) were charged, followed by subjecting the resultant reaction mixture to argon bubbling at room temperature (25° C.) for 30 minutes. The resultant reaction solution was cooled to −30° C. and then to the reaction solution, NBS (1.513 g, 8.501 mmol) was added, followed by elevating the temperature of the resultant reaction mixture to −10° C. over 30 minutes. After 1 hour, the disappearance of the raw material was confirmed by liquid chromatography. Then, to the reaction solution, a sodium thiosulfate aqueous solution was added and the resultant reaction mixture was extracted with hexane into an organic phase. Then, the organic phase was separated by a column using hexane as a developing solution and the component obtained by the separation was dried to obtain 4.24 g of compound 57.

$^1$H-NMR (CDCl$_3$, δ (ppm)): 0.77-0.91 (m, 48H), 0.95-1.60 (m, 68H), 1.96 (m, 8H), 6.72 (s, 2H), 7.75 (s, 2H), 7.77 (s, 2H)

Reference Example 60

Synthesis of Compound 58

[Chemical Formula 131]

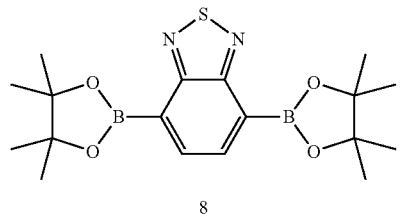

8

+

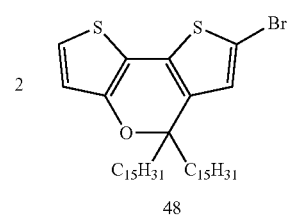

48

→

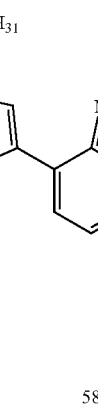

58

$^1$H-NMR (CDCl$_3$, δ (ppm)): 0.87 (t, 12H), 0.90-1.46 (m, 104H), 1.97 (m, 8H), 6.71 (d, 2H), 7.04 (d, 2H), 7.77 (d, 2H), 7.80 (d, 2H)

Reference Example 61

Synthesis of Compound 59

[Chemical Formula 132]

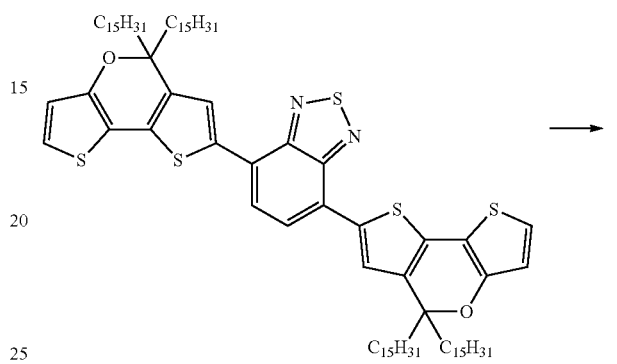

58

→

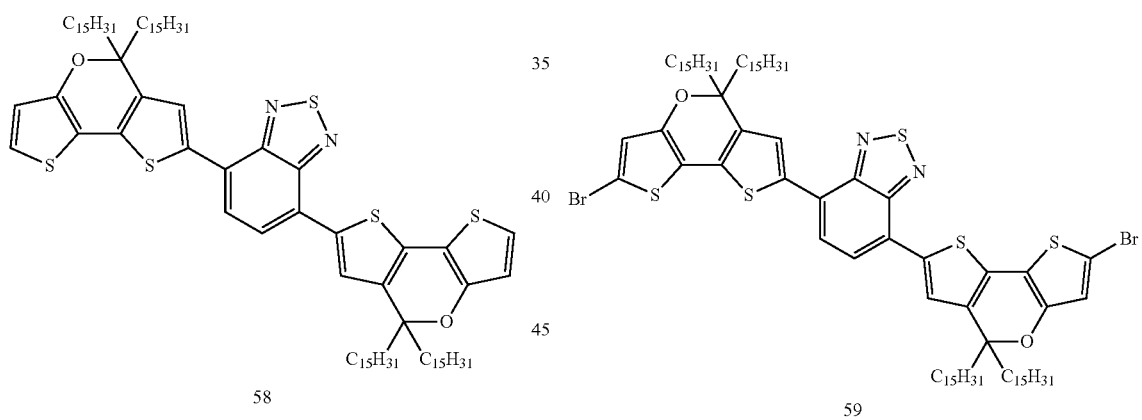

59

A four-neck flask was used and thereinto, the compound 8 (6.36 g, 16.39 mmol), the compound 48 (23.32 g, 33.60 mmol), and tetrahydrofuran (600 mL) were charged, followed by subjecting the resultant reaction mixture to argon bubbling at room temperature (25° C.) for 30 minutes. Then, to the resultant reaction solution, tris(dibenzylideneacetone) palladium (300.2 mg, 0.328 mmol) and [tri(tert-butyl)phosphonium]tetrafluoroborate (380.5 mg, 1.311 mmol) were added. While stirring the resultant reaction solution at 45° C., into the reaction solution, a potassium phosphate aqueous solution (2 mol/L, 81.97 g, 163.94 mmol) was dropped over 10 minutes. After 2 hours, the disappearance of the raw material was confirmed by liquid chromatography. Water was added to the system and the resultant reaction mixture was extracted with hexane into an organic phase, followed by purifying the organic phase by a column using hexane as a developing solution and then drying the organic phase to obtain 15.02 g of compound 58.

A four-neck flask was used and thereinto, the compound 58 (15.89 g, 11.66 mmol) and tetrahydrofuran (THF) (320 mL) were charged, followed by subjecting the resultant reaction mixture to argon bubbling at room temperature (25° C.) for 30 minutes. The reaction temperature was lowered to −30° C. and then to the reaction mixture, NBS (4.57 g, 25.68 mmol) was added, followed by elevating the temperature of the resultant reaction mixture to −10° C. over 30 minutes. By liquid chromatography, after 1 hour, the disappearance of the raw material was confirmed. After 1 hour, the disappearance of the raw material was confirmed. Then, to the reaction solution, a sodium thiosulfate aqueous solution was added and the resultant reaction mixture was extracted with hexane into an organic phase. Then, the organic phase was separated by a column using hexane as a developing solution and the component obtained by the separation was dried to obtain 15.24 g of compound 59.

¹H-NMR (CDCl₃, δ (ppm)): 0.88 (t, 12H), 0.93-1.52 (m, 104H), 1.95 (m, 8H), 6.72 (s, 2H), 7.75 (s, 2H), 7.77 (s, 2H)

Reference Example 62

Synthesis of Compound 60

[Chemical Formula 133]

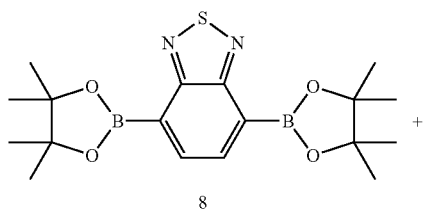

8

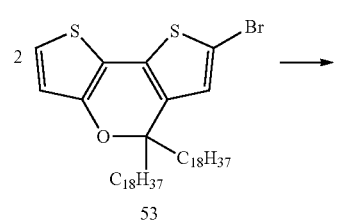

53

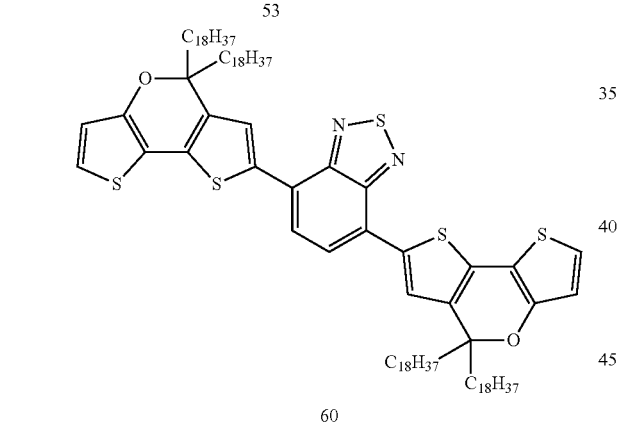

60

¹H-NMR (CDCl₃, δ (ppm)): 0.88 (t, 12H), 0.95-1.53 (m, 128H), 1.97 (m, 8H), 6.71 (d, 2H), 7.04 (d, 2H), 7.76 (d, 2H), 7.80 (d, 2H)

Reference Example 63

Synthesis of Compound 61

[Chemical Formula 134]

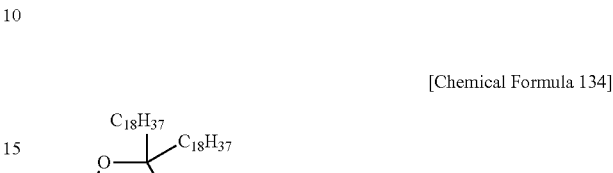

61

A four-neck flask was used and thereinto, the compound 8 (1.164 g, 3.000 mmol), the compound 53 (4.669 g, 6.000 mmol), and tetrahydrofuran (100 mL) were charged, followed by subjecting the resultant reaction mixture to argon bubbling at room temperature (25° C.) for 30 minutes. Then, to the resultant reaction solution, tris(dibenzylideneacetone) palladium (27.47 mg, 0.030 mmol) and [tri(tert-butyl)phosphonium]tetrafluoroborate (34.82 mg, 0.120 mmol) were added. While stirring the resultant reaction solution at 45° C., into the reaction solution, a potassium phosphate aqueous solution (2 mol/L, 15.00 g, 30.00 mmol) was dropped over 10 minutes. After 2 hours, the disappearance of the raw material was confirmed by liquid chromatography. Water was added to the system and the resultant reaction mixture was extracted with hexane into an organic phase, followed by purifying the organic phase by a column using hexane as a developing solution and then drying the organic phase to obtain 2.985 g of compound 60.

A four-neck flask was used and thereinto, the compound 60 (2.985 g, 1.950 mmol) and tetrahydrofuran (THF) (60 mL) were charged, followed by subjecting the resultant reaction mixture to argon bubbling at room temperature (25° C.) for 30 minutes. The reaction solution was cooled to −30° C. and then to the reaction solution, NBS (970 mg, 4.875 mmol) was added, followed by elevating the temperature of the resultant reaction mixture to −10° C. over 30 minutes. After 1 hour, the disappearance of the raw material was confirmed by liquid chromatography. After 1 hour, the disappearance of the raw material was confirmed. Then, to the reaction solution, a sodium thiosulfate aqueous solution was added and the resultant reaction mixture was extracted with hexane into an organic phase. Then, the organic phase was separated by a column using hexane as a developing solution and the component obtained by the separation was dried to obtain 2.72 g of compound 61.

¹H-NMR (CDCl₃, δ (ppm)): 0.87 (t, 12H), 0.95-1.50 (m, 128H), 1.95 (m, 8H), 6.72 (s, 2H), 7.75 (s, 2H), 7.78 (s, 2H)

Example 34

Synthesis of Polymer V

[Chemical Formula 135]

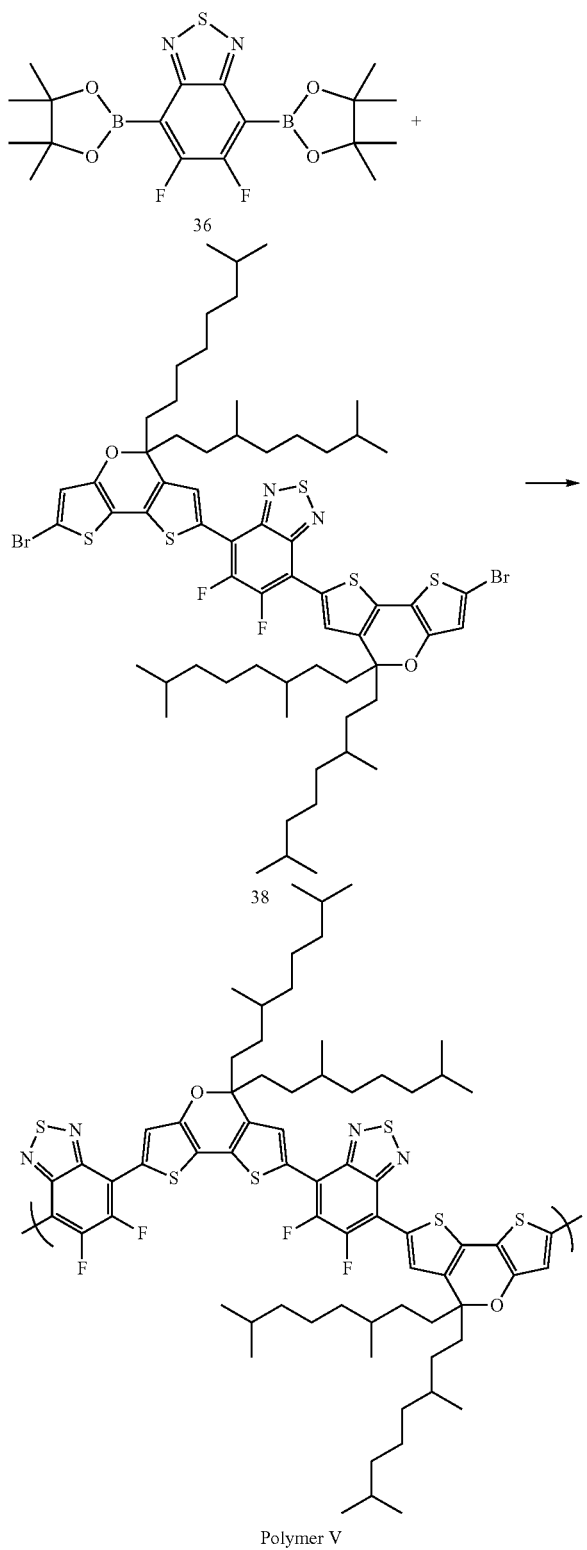

A four-neck flask was used and thereinto, the compound 38 (191.3 mg, 0.150 mmol) and methylene chloride (24 mL) were charged, followed by subjecting the resultant reaction mixture to argon bubbling at room temperature (25° C.) for 30 minutes. Then, to the resultant reaction solution, tris(dibenzylideneacetone) palladium (2.75 mg, 0.003 mmol), [tri(tert-butyl)phosphonium]tetrafluoroborate (3.48 mg, 0.012 mmol), and a potassium phosphate aqueous solution (2 mol/L, 0.8 g, 1.6 mmol) were added. While stirring the resultant reaction solution at an oil-bath temperature of 40° C., into the reaction solution, a solution of the compound 36 (63.6 mg, 0.150 mmol) dissolved in methylene chloride (6 mL) was dropped over 10 minutes and the resultant reaction mixture was stirred for 30 minutes. Then, to the reaction solution, phenylboric acid (15.0 mg, 0.123 mmol) was added, the resultant reaction mixture was stirred further for 1 hour, and then the reaction was terminated. The reaction was carried out under an argon atmosphere.

Then, to the resultant reaction solution, sodium diethyldithiocarbamate (1 g) and pure water (10 mL) were added to stir the resultant reaction mixture under reflux for 3 hours. The aqueous phase in the reaction solution was removed and then the organic phase was washed with 50 mL of water twice, with 50 mL of acetic acid aqueous solution (3% by weight) twice, and further with 50 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 50 mg of polymer V.

For the molecular weight of the polymer V measured by GPC (in terms of polystyrene), the weight-average molecular weight (Mw) was 25,000 and the number average molecular weight (Mn) was 10,000. The absorbing terminal wavelength of the polymer V was 940 nm.

Example 35

Synthesis of Polymer W

[Chemical Formula 136]

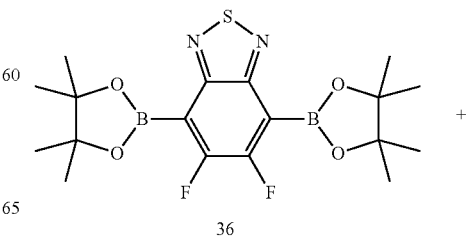

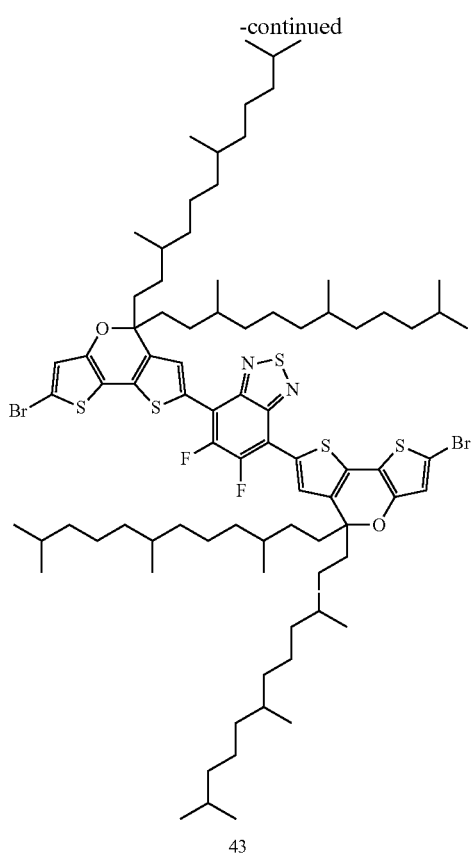

43

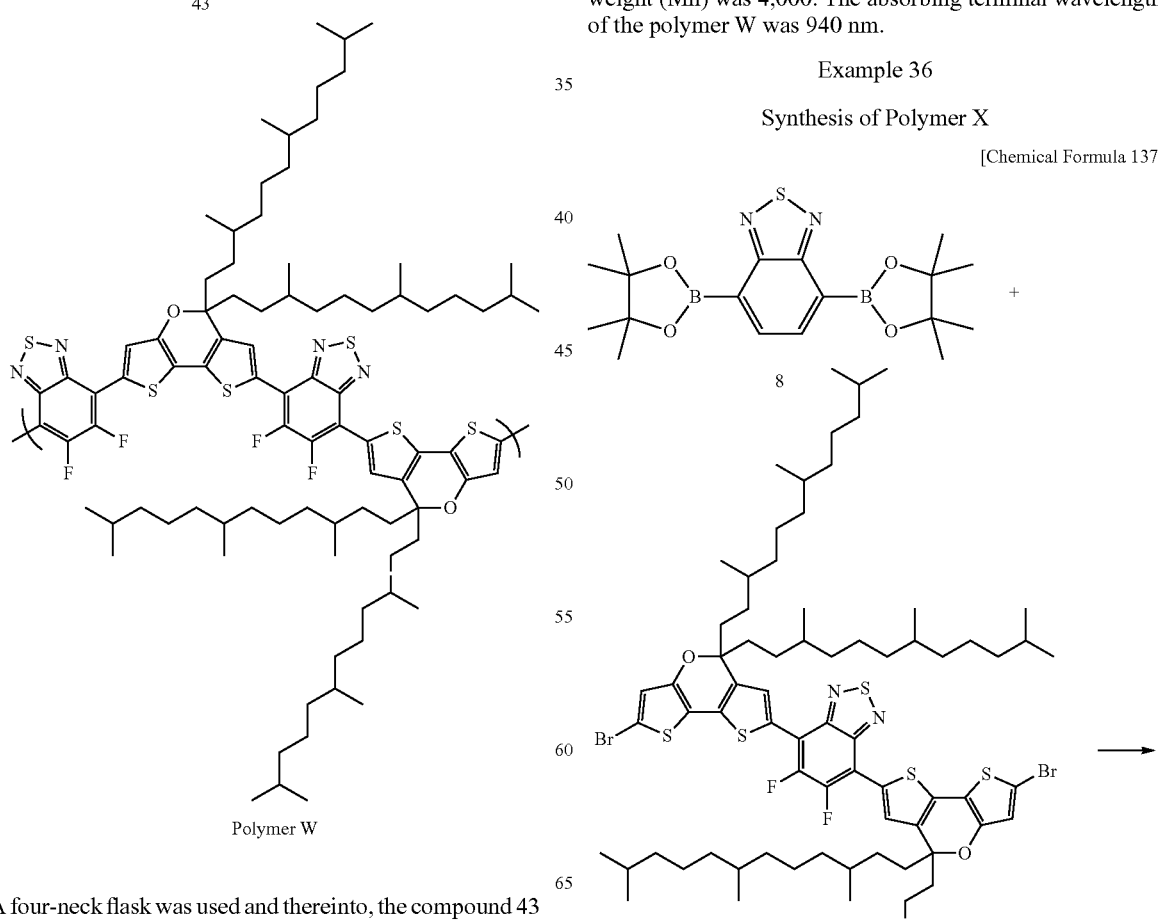

Polymer W

A four-neck flask was used and thereinto, the compound 43 (440.0 mg, 0.280 mmol) and methylene chloride (50 mL) were charged, followed by subjecting the resultant reaction mixture to argon bubbling at room temperature (25° C.) for 30 minutes. Then, to the resultant reaction solution, tris(dibenzylideneacetone) palladium (5.49 mg, 0.006 mmol), [tri(tert-butyl)phosphonium]tetrafluoroborate (6.96 mg, 0.024 mmol), and a potassium phosphate aqueous solution (2 mol/L, 1.5 g, 3.0 mmol) were added. While stirring the resultant reaction solution at an oil-bath temperature of 40° C., into the reaction solution, a solution of the compound 36 (120.0 mg, 0.280 mmol) dissolved in methylene chloride (12 mL) was dropped over 10 minutes and the resultant reaction mixture was stirred for 30 minutes. Then, to the reaction solution, phenylboric acid (150 mg, 1.23 mmol) was added, the resultant reaction mixture was stirred further for 1 hour, and then the reaction was terminated. The reaction was carried out under an argon atmosphere.

Then, to the resultant reaction solution, sodium diethyldithiocarbamate (10 g) and pure water (100 mL) were added to stir the resultant reaction mixture under reflux for 3 hours. The aqueous phase in the reaction solution was removed and then the organic phase was washed with 500 mL of water twice, with 200 mL of acetic acid aqueous solution (3% by weight) twice, and further with 200 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 150 mg of polymer W.

For the molecular weight of the polymer W measured by GPC (in terms of polystyrene), the weight-average molecular weight (Mw) was 8,500 and the number average molecular weight (Mn) was 4,000. The absorbing terminal wavelength of the polymer W was 940 nm.

Example 36

Synthesis of Polymer X

[Chemical Formula 137]

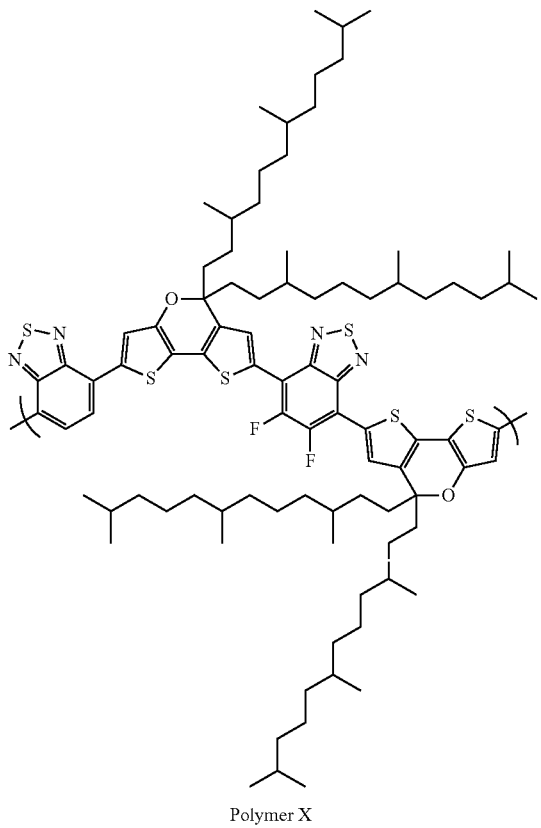

Polymer X

A four-neck flask was used and thereinto, the compound 43 (50.5 mg, 0.032 mmol) and tetrahydrofuran (10 mL) were charged, followed by subjecting the resultant reaction mixture to argon bubbling at room temperature (25° C.) for 30 minutes. Then, to the resultant reaction solution, tris(dibenzylideneacetone) palladium (5.49 mg, 0.006 mmol), [tri(tert-butyl)phosphonium]tetrafluoroborate (6.96 mg, 0.024 mmol), and a potassium phosphate aqueous solution (2 mol/L, 1.5 g, 3.0 mmol) were added. While stirring the resultant reaction solution at an oil-bath temperature of 40° C., into the reaction solution, a solution of the compound 8 (12.4 mg, 0.032 mmol) dissolved in tetrahydrofuran (5 mL) was dropped over 10 minutes and the resultant reaction mixture was stirred for 30 minutes. Then, to the reaction solution, phenylboric acid (30.0 mg, 0.246 mmol) was added, the resultant reaction mixture was stirred further for 1 hour, and then the reaction was terminated. The reaction was carried out under an argon atmosphere.

Then, to the resultant reaction solution, sodium diethyldithiocarbamate (1.5 g) and pure water (13.5 mL) were added to stir the resultant reaction mixture under reflux for 3 hours. The aqueous phase in the reaction solution was removed and then the organic phase was washed with 15 mL of water twice, with 15 mL of acetic acid aqueous solution (3% by weight) twice, and further with 15 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 24 mg of polymer X.

For the molecular weight of the polymer X measured by GPC (in terms of polystyrene), the weight-average molecular weight (Mw) was 25,000 and the number average molecular weight (Mn) was 10,000. The absorbing terminal wavelength of the polymer X was 940 nm.

Example 37

Synthesis of Polymer Y

[Chemical Formula 138]

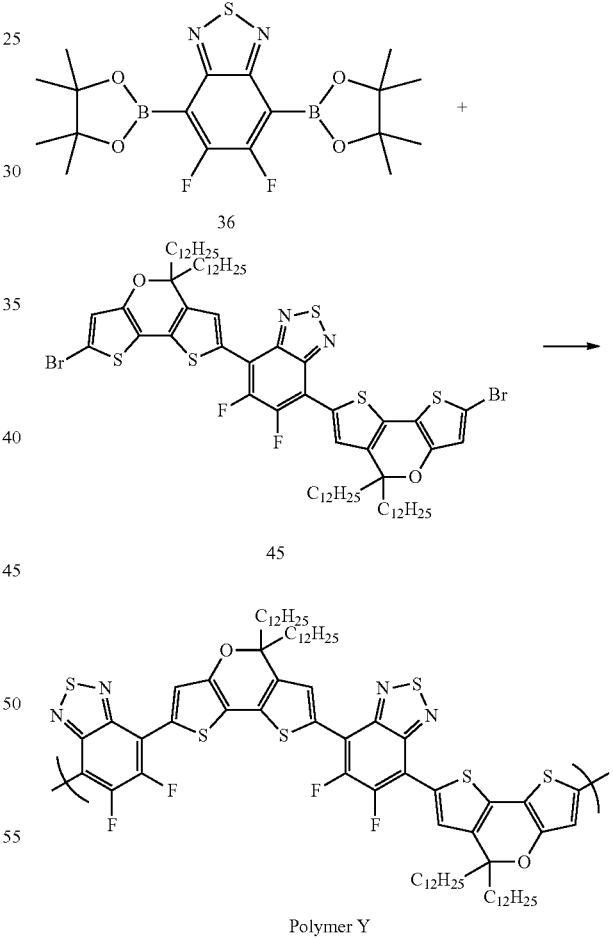

Polymer Y

A four-neck flask was used and thereinto, the compound 45 (416.3 mg, 0.300 mmol) and methylene chloride (10 mL) were charged, followed by subjecting the resultant reaction mixture to argon bubbling at room temperature (25° C.) for 30 minutes. Then, to the resultant reaction solution, tris(dibenzylideneacetone) palladium (10.99 mg, 0.012 mmol), [tri(tert-butyl)phosphonium]tetrafluoroborate (13.93 mg, 0.048 mmol), and a potassium phosphate aqueous solution (2 mol/L, 1.5 g, 3.0 mmol) were added. While stirring the resultant reaction solution at an oil-bath temperature of 40° C., into the reaction solution, a solution of the compound 36 (127.2 mg, 0.300 mmol) dissolved in methylene chloride (10 mL) was dropped over 10 minutes and the resultant reaction mixture was stirred for 30 minutes. Then, to the reaction solution, phenylboric acid (30.0 mg, 0.246 mmol) was added, the resultant reaction mixture was stirred further for 1 hour, and then the reaction was terminated. The reaction was carried out under an argon atmosphere.

Then, to the resultant reaction solution, sodium diethyldithiocarbamate (2.5 g) and pure water (22.5 mL) were added to stir the resultant reaction mixture under reflux for 3 hours. The aqueous phase in the reaction solution was removed and then the organic phase was washed with 30 mL of water twice, with 30 mL of acetic acid aqueous solution (3% by weight) twice, and further with 30 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 156 mg of polymer Y.

For the molecular weight of the polymer Y measured by GPC (in terms of polystyrene), the weight-average molecular weight (Mw) was 76,000 and the number average molecular weight (Mn) was 31,000. The absorbing terminal wavelength of the polymer Y was 940 nm.

Example 38

Synthesis of Polymer Z

[Chemical Formula 139]

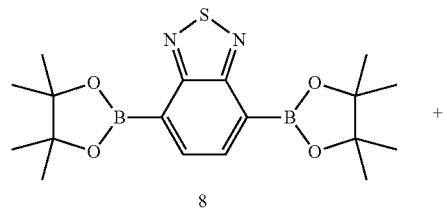

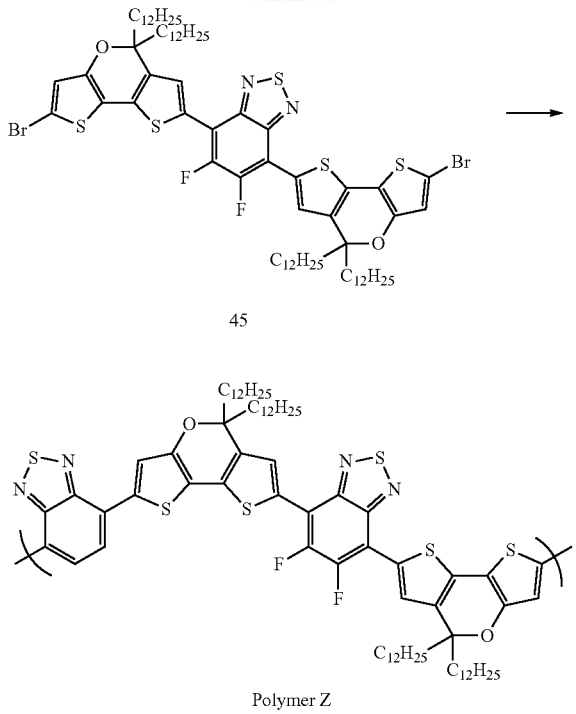

Polymer Z

A four-neck flask was used and thereinto, the compound 45 (277.5 mg, 0.200 mmol) and tetrahydrofuran (40 mL) were charged, followed by subjecting the resultant reaction mixture to argon bubbling at room temperature (25° C.) for 30 minutes. Then, to the resultant reaction solution, tris(dibenzylideneacetone) palladium (3.66 mg, 0.004 mmol), [tri(tert-butyl)phosphonium]tetrafluoroborate (4.64 mg, 0.016 mmol), and a potassium phosphate aqueous solution (2 mol/L, 1.0 g, 2.0 mmol) were added. While stirring the resultant reaction solution at an oil-bath temperature of 40° C., into the reaction solution, a solution of the compound 8 (77.6 mg, 0.200 mmol) dissolved in tetrahydrofuran (10 mL) was dropped over 10 minutes and the resultant reaction mixture was stirred for 30 minutes. Then, to the reaction solution, phenylboric acid (20.0 mg, 0.164 mmol) was added, the resultant reaction mixture was stirred further for 1 hour, and then the reaction was terminated. The reaction was carried out under an argon atmosphere.

Then, to the resultant reaction solution, sodium diethyldithiocarbamate (1.0 g) and pure water (9.0 mL) were added to stir the resultant reaction mixture under reflux for 3 hours. The aqueous phase in the reaction solution was removed and then the organic phase was washed with 10 mL of water twice, with 10 mL of acetic acid aqueous solution (3% by weight) twice, and further with 10 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 44 mg of polymer Z.

For the molecular weight of the polymer Z measured by GPC (in terms of polystyrene), the weight-average molecular weight (Mw) was 35,000 and the number average molecular weight (Mn) was 15,000. The absorbing terminal wavelength of the polymer Z was 950 nm.

Example 39

Synthesis of Polymer Z2

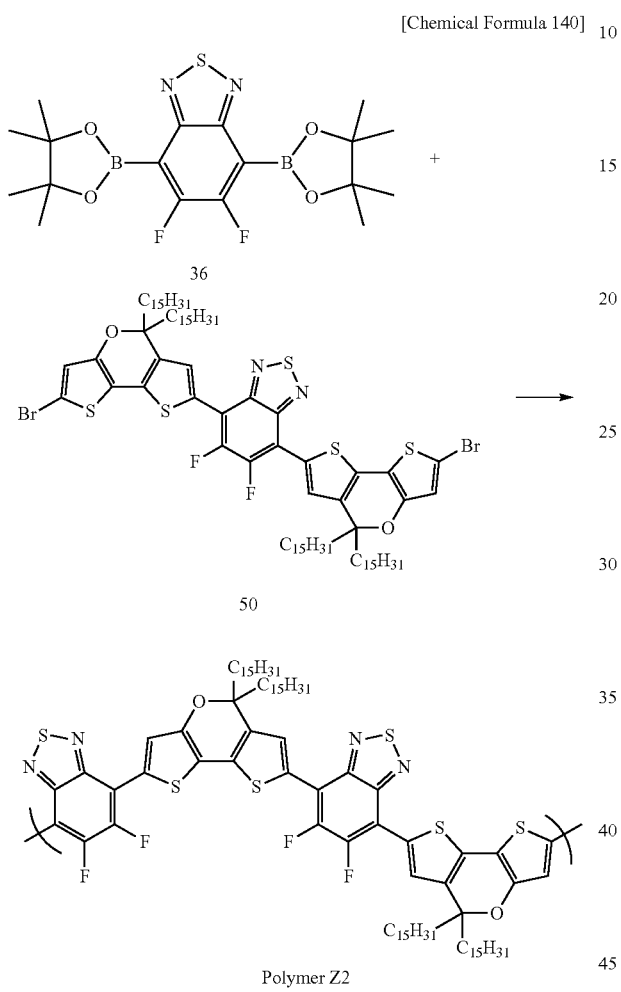

A four-neck flask was used and thereinto, the compound 50 (311.2 mg, 0.200 mmol) and methylene chloride (10 mL) were charged, followed by subjecting the resultant reaction mixture to argon bubbling at room temperature (25° C.) for 30 minutes. Then, to the resultant reaction solution, tris(dibenzylideneacetone) palladium (7.32 mg, 0.008 mmol), [tri(tert-butyl)phosphonium]tetrafluoroborate (9.28 mg, 0.032 mmol), and a potassium phosphate aqueous solution (2 mol/L, 1.0 g, 2.0 mmol) were added. While stirring the resultant reaction solution at an oil-bath temperature of 40° C., into the reaction solution, a solution of the compound 36 (84.8 mg, 0.200 mmol) dissolved in methylene chloride (10 mL) was dropped over 10 minutes and the resultant reaction mixture was stirred for 30 minutes. Then, to the reaction solution, phenylboric acid (20.0 mg, 0.164 mmol) was added, the resultant reaction mixture was stirred further for 1 hour, and then the reaction was terminated. The reaction was carried out under an argon atmosphere.

Then, to the resultant reaction solution, sodium diethyldithiocarbamate (1.7 g) and pure water (15.0 mL) were added to stir the resultant reaction mixture under reflux for 3 hours. The aqueous phase in the reaction solution was removed and then the organic phase was washed with 20 mL of water twice, with 20 mL of acetic acid aqueous solution (3% by weight) twice, and further with 20 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 197 mg of polymer Z2.

For the molecular weight of the polymer Z2 measured by GPC (in terms of polystyrene), the weight-average molecular weight (Mw) was 240,000 and the number average molecular weight (Mn) was 90,000. The absorbing terminal wavelength of the polymer Z2 was 950 nm.

Example 40

Synthesis of Polymer Z3

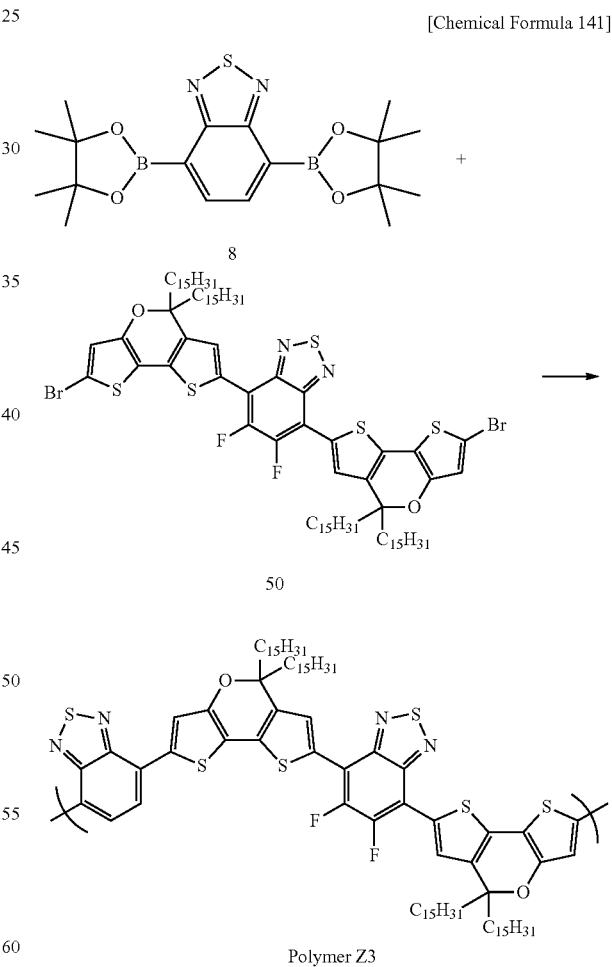

A four-neck flask was used and thereinto, the compound 50 (252.2 mg, 0.162 mmol) and tetrahydrofuran (20 mL) were charged, followed by subjecting the resultant reaction mixture to argon bubbling at room temperature (25° C.) for 30 minutes. Then, to the resultant reaction solution, tris(dibenzylideneacetone) palladium (3.66 mg, 0.004 mmol), [tri(tert-butyl)phosphonium]tetrafluoroborate (4.64 mg, 0.016 mmol), and a potassium phosphate aqueous solution (2 mol/L, 1.0 g, 2.0 mmol) were added. While stirring the resultant reaction solution at an oil-bath temperature of 40° C., into the reaction solution, a solution of the compound 8 (62.9 mg, 0.162 mmol) dissolved in tetrahydrofuran (10 mL) was dropped over 10 minutes and the resultant reaction mixture was stirred for 30 minutes. Then, to the reaction solution, phenylboric acid (20.0 mg, 0.164 mmol) was added, the resultant reaction mixture was stirred further for 1 hour, and then the reaction was terminated. The reaction was carried out under an argon atmosphere.

Then, to the resultant reaction solution, sodium diethyldithiocarbamate (1.0 g) and pure water (9.0 mL) were added to stir the resultant reaction mixture under reflux for 3 hours. The aqueous phase in the reaction solution was removed and then the organic phase was washed with 10 mL of water twice, with 10 mL of acetic acid aqueous solution (3% by weight) twice, and further with 10 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 165 mg of polymer Z3.

For the molecular weight of the polymer Z3 measured by GPC (in terms of polystyrene), the weight-average molecular weight (Mw) was 300,000 and the number average molecular weight (Mn) was 100,000. The absorbing terminal wavelength of the polymer Z3 was 950 nm.

Example 41

Synthesis of Polymer Z4

[Chemical Formula 142]

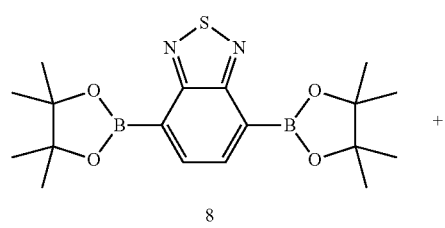

8

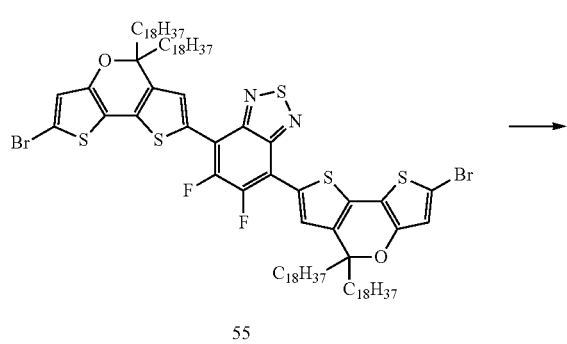

55

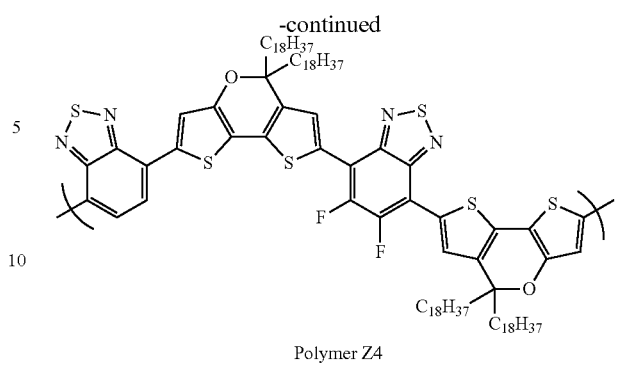

Polymer Z4

A four-neck flask was used and thereinto, the compound 55 (344.9 mg, 0.200 mmol) and tetrahydrofuran (12 mL) were charged, followed by subjecting the resultant reaction mixture to argon bubbling at room temperature (25° C.) for 30 minutes. Then, to the resultant reaction solution, tris(dibenzylideneacetone) palladium (3.66 mg, 0.004 mmol), [tri(tert-butyl)phosphonium]tetrafluoroborate (4.64 mg, 0.016 mmol), and a potassium phosphate aqueous solution (2 mol/L, 1.0 g, 2.0 mmol) were added. While stirring the resultant reaction solution at an oil-bath temperature of 40° C., into the reaction solution, a solution of the compound 8 (77.6 mg, 0.200 mmol) dissolved in tetrahydrofuran (10 mL) was dropped over 10 minutes and the resultant reaction mixture was stirred for 30 minutes. Then, to the reaction solution, phenylboric acid (20.0 mg, 0.164 mmol) was added, the resultant reaction mixture was stirred further for 1 hour, and then the reaction was terminated. The reaction was carried out under an argon atmosphere.

Then, to the resultant reaction solution, sodium diethyldithiocarbamate (1.0 g) and pure water (9.0 mL) were added to stir the resultant reaction mixture under reflux for 3 hours. The aqueous phase in the reaction solution was removed and then the organic phase was washed with 10 mL of water twice, with 10 mL of acetic acid aqueous solution (3% by weight) twice, and further with 10 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 236 mg of polymer Z4.

For the molecular weight of the polymer Z4 measured by GPC (in terms of polystyrene), the weight-average molecular weight (Mw) was 101,000 and the number average molecular weight (Mn) was 32,000. The absorbing terminal wavelength of the polymer Z4 was 940 nm.

Example 42

Synthesis of Polymer Z5

[Chemical Formula 143]

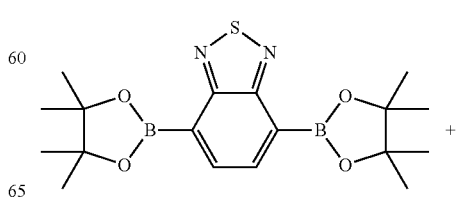

8

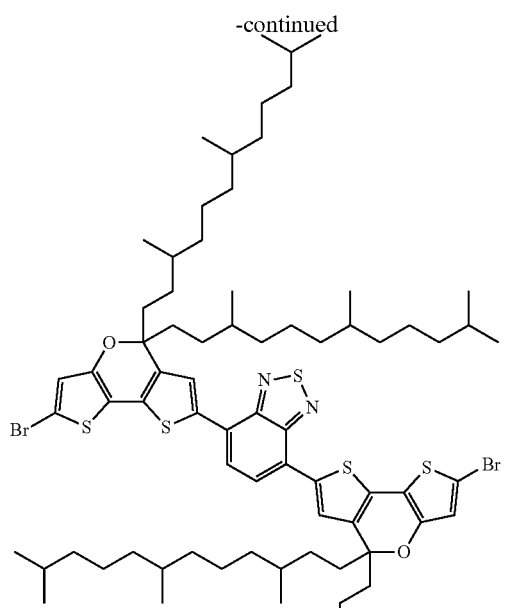

Polymer Z5

A four-neck flask was used and thereinto, the compound 57 (455.3 mg, 0.300 mmol) and tetrahydrofuran (30 mL) were charged, followed by subjecting the resultant reaction mixture to argon bubbling at room temperature (25° C.) for 30 minutes. Then, to the resultant reaction solution, tris(dibenzylideneacetone) palladium (5.50 mg, 0.006 mmol), [tri(tert-butyl)phosphonium]tetrafluoroborate (7.0 mg, 0.024 mmol), and a potassium phosphate aqueous solution (2 mol/L, 1.5 g, 3.0 mmol) were added. While stirring the resultant reaction solution at an oil-bath temperature of 40° C., into the reaction solution, a solution of the compound 8 (122.3 mg, 0.315 mmol) dissolved in tetrahydrofuran (10 mL) was dropped over 10 minutes and the resultant reaction mixture was stirred for 30 minutes. Then, to the reaction solution, phenylboric acid (30.0 mg, 0.246 mmol) was added, the resultant reaction mixture was stirred further for 1 hour, and then the reaction was terminated. The reaction was carried out under an argon atmosphere.

Then, to the resultant reaction solution, sodium diethyldithiocarbamate (2.5 g) and pure water (22.5 mL) were added to stir the resultant reaction mixture under reflux for 3 hours. The aqueous phase in the reaction solution was removed and then the organic phase was washed with 30 mL of water twice, with 30 mL of acetic acid aqueous solution (3% by weight) twice, and further with 30 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 343.9 mg of polymer Z5.

For the molecular weight of the polymer Z5 measured by GPC (in terms of polystyrene), the weight-average molecular weight (Mw) was 70,000 and the number average molecular weight (Mn) was 27,000. The absorbing terminal wavelength of the polymer Z5 was 940 nm.

Example 43

Synthesis of Polymer Z6

[Chemical Formula 144]

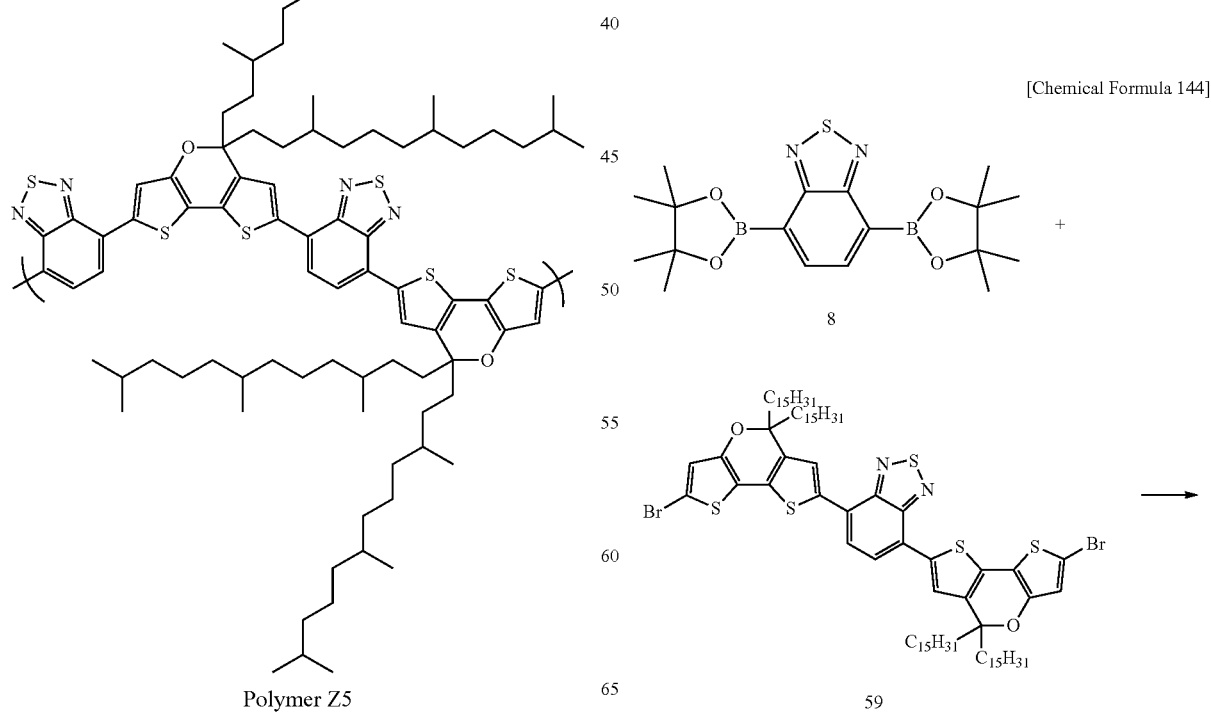

-continued

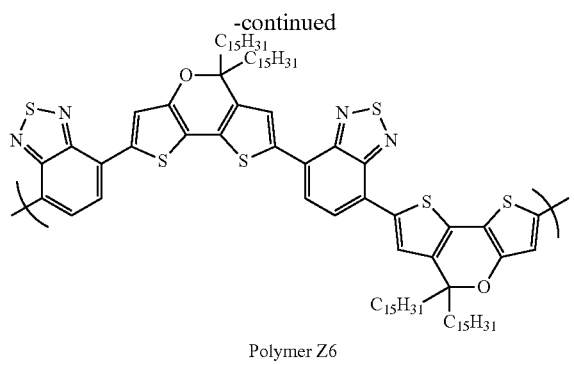

Polymer Z6

A four-neck flask was used and thereinto, the compound 59 (912.0 mg, 0.600 mmol) and tetrahydrofuran (42 mL) were charged, followed by subjecting the resultant reaction mixture to argon bubbling at room temperature (25° C.) for 30 minutes. Then, to the resultant reaction solution, tris(dibenzylideneacetone) palladium (5.49 mg, 0.006 mmol), [tri(tert-butyl)phosphonium]tetrafluoroborate (6.96 mg, 0.024 mmol), and a potassium phosphate aqueous solution (2 mol/L, 3.0 g, 6.0 mmol) were added. While stirring the resultant reaction solution at an oil-bath temperature of 40° C., into the reaction solution, a solution of the compound 8 (232.9 mg, 0.600 mmol) dissolved in tetrahydrofuran (18 mL) was dropped over 10 minutes and the resultant reaction mixture was stirred for 30 minutes. Then, to the reaction solution, phenylboric acid (60.0 mg, 0.492 mmol) was added, the resultant reaction mixture was stirred further for 1 hour, and then the reaction was terminated. The reaction was carried out under an argon atmosphere.

Then, to the resultant reaction solution, sodium diethyldithiocarbamate (5.0 g) and pure water (45.0 mL) were added to stir the resultant reaction mixture under reflux for 3 hours. The aqueous phase in the reaction solution was removed and then the organic phase was washed with 60 mL of water twice, with 60 mL of acetic acid aqueous solution (3% by weight) twice, and further with 60 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 779.0 mg of polymer Z6.

For the molecular weight of the polymer Z6 measured by GPC (in terms of polystyrene), the weight-average molecular weight (Mw) was 116,000 and the number average molecular weight (Mn) was 40,000. The absorbing terminal wavelength of the polymer Z6 was 950 nm.

Example 44

Synthesis of Polymer Z7

[Chemical Formula 145]

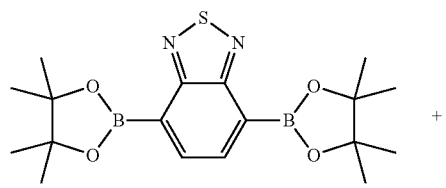

-continued

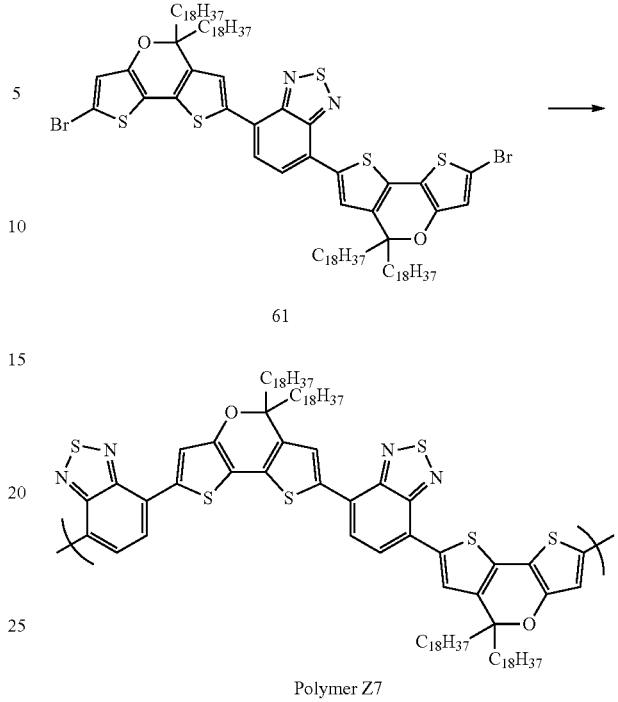

A four-neck flask was used and thereinto, the compound 61 (506.5 mg, 0.300 mmol) and tetrahydrofuran (21 mL) were charged, followed by subjecting the resultant reaction mixture to argon bubbling at room temperature (25° C.) for 30 minutes. Then, to the resultant reaction solution, tris(dibenzylideneacetone) palladium (2.75 mg, 0.003 mmol), [tri(tert-butyl)phosphonium]tetrafluoroborate (3.48 mg, 0.012 mmol), and a potassium phosphate aqueous solution (2 mol/L, 1.5 g, 3.0 mmol) were added. While stirring the resultant reaction solution at an oil-bath temperature of 40° C., into the reaction solution, a solution of the compound 8 (116.4 mg, 0.300 mmol) dissolved in tetrahydrofuran (9 mL) was dropped over 10 minutes and the resultant reaction mixture was stirred for 30 minutes. Then, to the reaction solution, phenylboric acid (30.0 mg, 0.246 mmol) was added, the resultant reaction mixture was stirred further for 1 hour, and then the reaction was terminated. The reaction was carried out under an argon atmosphere.

Then, to the resultant reaction solution, sodium diethyldithiocarbamate (2.5 g) and pure water (22.5 mL) were added to stir the resultant reaction mixture under reflux for 3 hours. The aqueous phase in the reaction solution was removed and then the organic phase was washed with 30 mL of water twice, with 30 mL of acetic acid aqueous solution (3% by weight) twice, and further with 30 mL of water twice, followed by pouring the resultant reaction mixture into methanol to precipitate polymer. The polymer was filtered and then dried and the resultant polymer was dissolved in toluene. The resultant toluene solution was passed through an alumina/silica gel column and the resultant solution was poured into methanol to precipitate polymer. The polymer was filtered and then dried to obtain 440.5 mg of polymer Z7.

For the molecular weight of the polymer Z7 measured by GPC (in terms of polystyrene), the weight-average molecular weight (Mw) was 55,000 and the number average molecular weight (Mn) was 20,000. The absorbing terminal wavelength of the polymer Z7 was 940 nm.

Example 45

Preparation of Organic Transistor

An n-type silicon substrate having a thermal oxide film of thickness 300 nm which was doped in a high concentration was subjected to ultrasonic cleaning in acetone for 10 minutes and was then irradiated with ozone UV for 20 minutes. Then, the n-type silicon substrate was spin-coated with β-phenethyltrichlorosilane diluted in a ratio of 5 drops thereof (dropped by taking with a syringe) in 10 mL of toluene to subject the surface of the thermal oxide film to silane treatment.

Next, the polymer X was dissolved in o-dichlorobenzene to prepare a solution in which concentration of polymer X is 0.5% by weight, and the solution was filtered with a membrane filter to prepare a coating liquid. The coating liquid was applied on the above surface-treated substrate by a spin coating method to form the coating film of polymer X (thickness: about 30 nm). Further, the coating film was subjected to thermal treatment at 170° C. under a nitrogen atmosphere for 30 minutes to form the organic semiconductor thin film of polymer X.

Further, on the organic semiconductor thin film, a source electrode and a drain electrode that had a layered structure of molybdenum trioxide and gold from the side of the organic semiconductor thin film were prepared by a vacuum deposition method using a metal mask to produce an organic transistor.

Example 46

Evaluation of Organic Transistor

The electric properties of the organic transistor were measured using a semiconductor parameter 4200 (manufactured by Keithley Instruments Inc.). As a result, the change curve of the drain current (Id) relative to the drain voltage (Vd) for an organic transistor using the polymer X was good. When a negative gate voltage applied to a gate electrode increased, a negative drain current also increased. Therefore, it could be confirmed that the organic transistor was a p-type organic transistor. The electric field-effect mobility μ of a carrier in the organic transistor was calculated using Formula (a) below representing a drain current Id in a saturation region of the electric properties of the organic transistor.

$$Id = (W/2L)\mu Ci(Vg - Vt)^2 \quad \text{(a)}$$

(where L represents a channel length of the organic transistor; W represents a channel width of the organic transistor; Ci represents a capacity of the gate insulating film per unit area; Vg represents a gate voltage; and Vt represents a threshold voltage of the gate voltage).

As a result, the electric field-effect mobility of a carrier (carrier mobility) was 0.03 cm$^2$/Vs and an ON/OFF current ratio was 10$^5$. The result is listed in Table 4.

Example 47

In the same manner as in Example 45, except that the polymer Y was used instead of the polymer X, the organic transistor element was prepared and the transistor properties thereof were evaluated in the same manner as in Example 46. The carrier mobility was 0.07 cm$^2$/Vs and the ON/OFF current ratio was 10$^6$. The result is listed in Table 4.

Example 48

In the same manner as in Example 45, except that the polymer Z was used instead of the polymer X, the organic transistor element was prepared and the transistor properties thereof were evaluated in the same manner as in Example 46. The carrier mobility was 0.06 cm$^2$/Vs and the ON/OFF current ratio was 10$^6$. The result is listed in Table 4.

Example 49

In the same manner as in Example 45, except that the polymer Z2 was used instead of the polymer X, the organic transistor element was prepared and the transistor properties thereof were evaluated in the same manner as in Example 46. The carrier mobility was 0.13 cm$^2$/Vs and the ON/OFF current ratio was 10$^6$. The result is listed in Table 4.

Example 50

In the same manner as in Example 45, except that the polymer Z3 was used instead of the polymer X, the organic transistor element was prepared and the transistor properties thereof were evaluated in the same manner as in Example 46. The carrier mobility was 0.25 cm$^2$/Vs and the ON/OFF current ratio was 10$^6$. The result is listed in Table 4.

Example 51

In the same manner as in Example 45, except that the polymer Z4 was used instead of the polymer X, the organic transistor element was prepared and the transistor properties thereof were evaluated in the same manner as in Example 46. The carrier mobility was 0.12 cm$^2$/Vs and the ON/OFF current ratio was 10$^6$. The result is listed in Table 4.

Example 52

In the same manner as in Example 45, except that the polymer Z5 was used instead of the polymer X, the organic transistor element was prepared and the transistor properties thereof were evaluated in the same manner as in Example 46. The carrier mobility was 0.04 cm$^2$/Vs and the ON/OFF current ratio was 10$^5$. The result is listed in Table 4.

Example 53

In the same manner as in Example 45, except that the polymer Z6 was used instead of the polymer X, the organic transistor element was prepared and the transistor properties thereof were evaluated in the same manner as in Example 46. The carrier mobility was 0.32 cm$^2$/Vs and the ON/OFF current ratio was 10$^6$. The result is listed in Table 4.

Example 54

In the same manner as in Example 45, except that the polymer K was used instead of the polymer X, the organic transistor element was prepared and the transistor properties thereof were evaluated in the same manner as in Example 46. The carrier mobility was 0.30 cm$^2$/Vs and the ON/OFF current ratio was 10$^6$. The result is listed in Table 4.

[Table 4]

TABLE 4

Organic Transistor Element Evaluation Result

| | | Carrier Mobility (cm$^2$/V$_s$) | ON/OFF Ratio |
|---|---|---|---|
| Example 46 | Polymer X | 0.03 | 10$^5$ |
| Example 47 | Polymer Y | 0.07 | 10$^6$ |

TABLE 4-continued

Organic Transistor Element Evaluation Result

|  |  | Carrier Mobility ($cm^2/V_s$) | ON/OFF Ratio |
|---|---|---|---|
| Example 48 | Polymer Z | 0.06 | $10^6$ |
| Example 49 | Polymer Z2 | 0.13 | $10^6$ |
| Example 50 | Polymer Z3 | 0.25 | $10^6$ |
| Example 51 | Polymer Z4 | 0.12 | $10^6$ |
| Example 52 | Polymer Z5 | 0.04 | $10^5$ |
| Example 53 | Polymer Z6 | 0.32 | $10^6$ |
| Example 54 | Polymer K | 0.30 | $10^6$ |

Example 55

Production and Evaluation of Ink and Organic Thin Film Solar Cell

A glass substrate on which an ITO film was formed by a sputtering method in a thickness of 150 nm was subjected to surface treatment by ozone UV treatment. Next, the polymer X and fullerene C60PCBM (phenyl C61-butyric acid methyl ester; manufactured by Frontier Carbon Corporation) were dissolved in o-dichlorobenzene so that the weight ratio of C60PCBM relative to the weight of the polymer X became 3 to produce an ink. The total of the weight of the polymer X and the weight of C60PCBM was 2.0% by weight, relative to the weight of the ink. The ink was applied on the glass substrate by spin-coating to prepare an organic film containing the polymer X. The organic film had a film thickness of about 100 nm. The light absorbing terminal wavelength of the thus prepared organic film was 940 nm. Then, on the organic film, lithium fluoride was deposited by a vacuum deposition machine in a thickness of 2 nm and next thereon, Al was deposited in a thickness of 100 nm to produce an organic thin film solar cell. The obtained organic thin film solar cell had a shape of 2 mm×2 mm square. The obtained organic thin film solar cell was irradiated with a constant light using a solar simulator (manufactured by BUNKOUKEIKI Co., Ltd.; trade name: OTENTO-SUNII; AM 1.5G filter, irradiance: 100 mW/$cm^2$) and the generated current and voltage were measured to calculate the photoelectric conversion efficiency, the short-circuit current density, the open-circuit voltage, and the fill factor. $J_{sc}$ (short-circuit current density) was 11.20 mA/$cm^2$; Voc (open-circuit voltage) was 0.62 V; ff (fill factor) was 0.67; and photoelectric conversion efficiency ($\eta$) was 4.63%. The result is listed in Table 5.

Example 56

In the same manner as in Example 55, except that the polymer Y was used instead of the polymer W, the ink and the organic thin film solar cell were prepared, and were evaluated. $J_{sc}$ (short-circuit current density) was 5.00 mA/$cm^2$; Voc (open-circuit voltage) was 0.69 V; ff (fill factor) was 0.56; and photoelectric conversion efficiency ($\eta$) was 1.96%. The result is listed in Table 5.

Example 57

In the same manner as in Example 55, except that the polymer Z2 was used instead of the polymer W, the ink and the organic thin film solar cell were prepared, and were evaluated. $J_{sc}$ (short-circuit current density) was 6.67 mA/$cm^2$; Voc (open-circuit voltage) was 0.71 V; ff (fill factor) was 0.66; and photoelectric conversion efficiency ($\eta$) was 3.11%. The result is listed in Table 5.

Example 58

In the same manner as in Example 55, except that the polymer Z3 was used instead of the polymer W, the ink and the organic thin film solar cell were prepared, and were evaluated. $J_{sc}$ (short-circuit current density) was 10.73 mA/$cm^2$; Voc (open-circuit voltage) was 0.58 V; ff (fill factor) was 0.65; and photoelectric conversion efficiency ($\eta$) was 4.02%. The result is listed in Table 5.

[Table 5]

TABLE 5

Photovoltaic Cell Evaluation Result

|  |  | Short-Circuit Current Density (mA/$cm^2$) | Open-Circuit Voltage (V) | Fill Factor | Photoelectric Conversion Efficiency (%) |
|---|---|---|---|---|---|
| Example 55 | Polymer X | 11.20 | 0.62 | 0.67 | 4.63 |
| Example 56 | Polymer Y | 5.00 | 0.69 | 0.56 | 1.96 |
| Example 57 | Polymer Z2 | 6.67 | 0.71 | 0.66 | 3.11 |
| Example 58 | Polymer Z3 | 10.73 | 0.58 | 0.65 | 4.02 |

The invention claimed is:

1. A macromolecular compound comprising a structural unit represented by Formula (1) and a structural unit represented by Formula (B-2):

(1)

(B-2)

wherein $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —SO$_2$—, —C($R^{50}$)($R^{51}$)—, —Si($R^3$)($R^4$)—, —N($R^5$)—, —B($R^6$)—, —P($R^7$)—, or —P(=O)($R^8$)—; $R^{50}$, $R^{51}$, $R^3$, $R^4$, $R^5$, $R^6$, $R^7$, and $R^8$ are the same as or different from each other and represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group;

wherein $X^1$ and $X^2$ are not the same as each other, and $X^1$ and $Ar^2$ are bonded with atoms adjacent to each other on a ring that constitutes $Ar^1$, and $X^2$ and $Ar^1$ are bonded with atoms adjacent to each other on a ring that constitutes $Ar^2$; $Q^3$ represents a sulfur atom, an oxygen atom, a selenium atom, —$N(R^{30})$—, or —$CR^{31}$=$CR^{32}$— wherein $R^{30}$, $R^{31}$, and $R^{32}$ are the same as or different from each other and represent a hydrogen atom or a substituent; $R^{42}$ to $R^{43}$ are the same as or different from each other and represent a hydrogen atom or a halogen atom provided that at least one of $R^{42}$ to $R^{43}$ is a halogen atom; and $Y^3$ and $Y^4$ are the same as or different from each other and represent a nitrogen atom or =CH—, wherein the macromolecular compound has a light absorbing terminal wavelength of 700 nm or more.

2. The macromolecular compound according to claim 1, wherein $X^2$ is —$C(R^{50})(R^{51})$—.

3. The macromolecular compound according to claim 1, wherein $X^1$ is —O—.

4. A thin film, comprising the macromolecular compound according to claim 1.

5. A composition, comprising:
the macromolecular compound according to claim 1; and
an electron acceptor compound.

6. The composition according to claim 5, wherein the electron acceptor compound is a fullerene derivative.

7. A thin film, comprising the composition according to claim 5.

8. An ink, comprising:
the composition according to claim 5; and
a solvent.

* * * * *